(12) United States Patent
Watanabe et al.

(10) Patent No.: US 8,310,852 B2
(45) Date of Patent: Nov. 13, 2012

(54) CONTENT ADDRESSABLE MEMORY

(75) Inventors: Naoya Watanabe, Tokyo (JP); Isamu Hayashi, Tokyo (JP); Teruhiko Amano, Tokyo (JP); Fukashi Morishita, Tokyo (JP); Kenji Yoshinaga, Itami (JP); Mihoko Akiyama, Itami (JP); Shinya Miyazaki, Kodaira (JP); Masakazu Ishibashi, Kodaira (JP); Katsumi Dosaka, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/419,217

(22) Filed: Mar. 13, 2012

(65) Prior Publication Data

US 2012/0170344 A1    Jul. 5, 2012

Related U.S. Application Data

(60) Division of application No. 12/720,561, filed on Mar. 9, 2010, now Pat. No. 8,164,934, which is a continuation of application No. 11/730,969, filed on Apr. 5, 2007, now abandoned.

(30) Foreign Application Priority Data

| Apr. 25, 2006 | (JP) | ................................ 2006-120890 |
| Apr. 25, 2006 | (JP) | ................................ 2006-120891 |
| Nov. 14, 2006 | (JP) | ................................ 2006-308145 |

(51) Int. Cl.
*G11C 15/00* (2006.01)
*G11C 15/04* (2006.01)
*G11C 7/14* (2006.01)
*G11C 7/06* (2006.01)
*G11C 7/12* (2006.01)
*G11C 7/22* (2006.01)

(52) U.S. Cl. ..................... 365/49.17; 365/49.1; 365/203; 365/207; 365/210.1; 365/189.07; 365/189.09; 365/189.15; 711/108

(58) Field of Classification Search ............. 365/189.07, 365/189.09, 189.15, 203, 207, 210.1, 49.1, 365/49.17; 711/108
See application file for complete search history.

(56) References Cited

U.S. PATENT DOCUMENTS 4,363,111 A    12/1982    Heightley et al.
(Continued)

FOREIGN PATENT DOCUMENTS

JP    4-134792 A    5/1992
(Continued)

OTHER PUBLICATIONS

Noda, H. et al., "A Cost-Efficient High-Performance Dynamic TCAM With Pipelined Hierarchical Searching and Shift Redundancy Architecture", IEEE Journal of Solid Stated Circuits, Jan. 2005, p. 245-253, vol. 40, No. 1.

(Continued)

*Primary Examiner* — J. H. Hur
(74) *Attorney, Agent, or Firm* — McDermott Will & Emery LLP

(57) ABSTRACT

An entry including multiple bits of unit cells each storing data bit is coupled to a match line. The match line is supplied with a charging current having a restricted current value smaller than a match line current flowing in a one-bit miss state in one entry, but larger than a match line current flowing in an all-bit match state in one entry. A precharge voltage level of a match line is restricted to a voltage level of half a power supply voltage or smaller. Power consumption in a search cycle of a content addressable memory can be reduced, and a search operation speed can be increased.

1 Claim, 62 Drawing Sheets

U.S. PATENT DOCUMENTS

| | | | |
|---|---|---|---|
| 4,547,868 A | 10/1985 | Childers et al. | |
| 4,633,443 A | 12/1986 | Childers | |
| 5,285,414 A | 2/1994 | Yamauchi et al. | |
| 5,590,070 A | 12/1996 | Harrand et al. | |
| 5,602,770 A | 2/1997 | Ohira | |
| 5,657,264 A | 8/1997 | Yamauchi et al. | |
| 6,442,090 B1 | 8/2002 | Ahmed et al. | |
| 6,560,133 B2 | 5/2003 | Yanagawa | |
| 6,842,359 B2 | 1/2005 | Hata et al. | |
| 2001/0026464 A1 | 10/2001 | Hata et al. | |
| 2003/0156440 A1* | 8/2003 | Hata et al. | 365/49 |

FOREIGN PATENT DOCUMENTS

| | | |
|---|---|---|
| JP | 10-27481 | 1/1998 |
| JP | 11-149366 A | 6/1999 |
| JP | 2001-319481 | 11/2001 |
| JP | 2001-319488 A | 11/2001 |
| JP | 2002-245783 | 8/2002 |
| JP | 2002-358791 | 12/2002 |
| JP | 2003-100086 | 4/2003 |
| JP | 2003-132686 | 5/2003 |
| JP | 2004-192695 | 7/2004 |

OTHER PUBLICATIONS

Japanese Notice of Grounds of Rejection, w/ English translation thereof, issued in Japanese Patent Application No. JP 2006-120891 dated Oct. 25, 2011.

Japanese Office Action, and English translation thereof, issued in Japanese Patent Application No. 2011-260351 dated Jul. 24, 2012.

* cited by examiner

MISMATCH: ML_DISCHARGED
MATCH: ML_PRECHARGED

MISMATCH: ML_DISCHARGED
MATCH: ML_PRECHARGED
DON'T CARE: ML_PRECHARGED
(0, 0)

|  | ML_OUT | SRCH | /CHRG | I_charge |
|---|---|---|---|---|
| SEARCH | H | H | H | OFF |
|  | L | H | L | ON |
| STANDBY | H | L | L | ON |
|  | L | L | H | OFF |

FIG.41

| VOLTAGE CHANGE LINE NUMBER | VDD PRECHARGE | GND PRECHARGE | EMBODIMENT | |
|---|---|---|---|---|
| | | | ALTERNATE MISMATCH /MATCH | CONTINUOUS MATCH OR MISMATCH TO SAME ENTRY |
| 1 | $(M-1)C_m \cdot V$ | $C_m \cdot V$ | $(1/2)C_m \cdot V$ | 0 |
| M/2 | $(M/2)C_m \cdot V$ | $(M/2)C_m \cdot V$ | $(M/4)C_m \cdot V$ | 0 |
| N | $N \cdot C_s \cdot V$ | $N \cdot C_s \cdot V$ | $(N/2)C_s \cdot V$ | 0 |

M: NUMBER OF MATCH LINES, N: NUMBER OF SEARCH LINES,
$C_m$: CAPACITANCE OF MATCH LINE, $C_s$: CAPACITANCE OF SEARCH LINE

CONTENT ADDRESSABLE MEMORY

RELATED APPLICATIONS

This application is a Divisional of U.S. application Ser. No. 12/720,561, filed on Mar. 9, 2010 now U.S. Pat. No. 8,164,934, which is a Continuation of U.S. application Ser. No. 11/730,969, filed on Apr. 5, 2007, now abandoned, claiming priority of Japanese Patent Application Nos. 2006-120890, filed on Apr. 25, 2006, 2006-120891, filed on Apr. 25, 2006 and 2006-308145, filed on Nov. 14, 2006, the entire contents of each of which are hereby incorporated by reference.

BACKGROUND OF THE INVENTION

1. Field of the Invention

The present invention relates to a content addressable memory, and particularly to a construction for reducing current consumption and a peak current in a search operation and for speeding up the search operation.

2. Description of the Background Art

A CAM (Content Addressable Memory) has, in addition to a function of reading/writing data, a function of determining matching of stored data with supplied search data. One entry storing a search data word is configured by a plurality of CAM cells, and stores word bits of a search candidate. Each entry is provided with a match line coupled to corresponding CAM cells in parallel. When a search data word matches a stored data word, a corresponding match line is kept at a state of "1". When mismatch occurs, the corresponding match line is driven to a state of "0".

By determining the voltage level of the match line, it is possible to determine whether the data corresponding to the search data is stored, e.g., in a table. This type of content addressable memory is used for determining cache-miss/hit in a cache memory and a router for communications application. A network router or the like performs routing of an LP packet through comparison of an IP address stored in a content addressable memory provided in the router with an externally supplied LP address. For example, a value indicating a next destination address is written into an IP packet based on match line information of the matching state in the content addressable memory in the router, and then the IP packet is delivered from a corresponding port.

Usually, in the CAM used in the communications router or the like, search data has a bit width from 72 bits to 288 bits, and the number of the entries is about 64 K.

In a conventional CAM, the match lines are precharged to a power supply voltage VDD (or a ground voltage GND level) during a precharge period. During a search period for detecting matching between the stored data and the search data, the search data is compared with data bits of entry CAM cells. When mismatch occurs, transistors in the CAM cells discharge (or charge) the corresponding match line to the ground voltage (or power supply voltage level) different from the precharge voltage. Therefore, when n CAM cells are in the mismatch state in one entry, a current of (I_miss×n) is discharged (or charged) through one match line, where I_miss represents a current driven by one CAM cell in the mismatch state. When the match occurs in all the data bits of the CAM cells in the entry, no discharge (or charge) path is present in the CAM cells. Therefore, the match line in the match state is kept at the level of the precharge voltage of power supply voltage VDD or ground voltage GND.

In the CAM, the search data is supplied in parallel to the plurality of entries, and the search operations are executed in parallel in the respective entries. Search line transmitting the search data and the match line producing a signal indicative of a match result are precharged to predetermined voltage levels in each search cycle of performing the search operation. As an example, the search line is precharged to the ground voltage level, and the match line is precharged to the power supply voltage level. The search line is coupled to the CAM cells in all entries. Therefore, the search line has a large capacitive load. A majority of the match lines except the line exhibiting the match state in the search operation change between the power supply voltage level and the ground voltage level in each search cycle. Therefore, the charge and discharge currents of the search line and the match line are large, resulting in a problem that current dissipation and power consumption are large.

An article 1 (H. Noda, et al., "A Cost-Efficient High-Performance Dynamic TCAM With Pipelined Hierarchical Searching and Shift Redundancy Architecture", IEEE JSSC, Vol. 40, No. 1, January 2005, pp. 245-253) has disclosed a construction for reducing current consumption of a content addressable memory and achieving a fast search operation. In the construction disclosed in the article 1, the match line has a hierarchical configuration. A plurality of local match lines are arranged for one entry. These plurality of local match lines are commonly coupled to a global match line. Searching operation is performed for each local match line in a pipelined fashion. For example, search data of 144 bits is divided into 72-bit data. On the local match line of the block in which no matching occurs in first 72 bits, it is no longer necessary to perform the subsequent search. Therefore, in the entries corresponding to the mismatch block, the search line is not activated in the next stage, and the local match lines are not discharged. The number of the local match lines to be charged and discharged can be reduced, and the power consumption can be reduced.

In the article 1, a DRAM-type cell construction is employed for storing search data, and each DRAM cell stores a data bit, to store ternary data. The CAM cell storing the ternary data is generally referred to as a TCAM (Ternary CAM) cell, and can store a "don't care" state.

A publication 1 (Japanese Patent Laying-Open No. 10-027481) has disclosed a construction aiming to achieve a fast search operation. In the construction disclosed in the publication 1, a match line is precharged to a ground voltage level during standby. In a search operation, each match line is supplied with a current of a magnitude substantially equal to that flowing when one-bit mismatch occurs with respect to the search data. Voltage rising of the match line in the mismatch entry is suppressed to or below a reference voltage for reducing the current consumption.

A publication 2 (Japanese Patent Laying-Open No. 2004-192695) has likewise disclosed a construction aiming to reduce the current consumption in a search operation. In the publication 2, complementary search lines are short-circuited to precharge the search lines to an intermediate voltage level during standby. A match line is precharged to the ground voltage level during standby, and is charged up by accumulated charges supplied from a capacitance element when the search operation starts. A capacitive division by the capacitance element and the match line sets an upper limit of the voltage level of the match line to an intermediate voltage level lower than the power supply voltage. A buffer circuit is employed for sensing the voltage level of the match line.

A publication (Japanese Patent Laying-Open No. 2003-100086) has disclosed a construction for executing a fast search operation even when a match line load is large. In the publication 3, a reference voltage generating circuit and a differential amplifier circuit are arranged for each match line.

The differential amplifier circuit compares a reference voltage with a match line voltage for increasing a speed of a search and determination operation.

A publication 4 (Japanese Patent Laying-Open No. 2002-358791) has disclosed a construction for reducing a precharge current in a search operation. In the publication 4, CAM entries are divided. For the divided CAM entries, precharge voltages and the drive voltage of the match line in the miss state are set oppositely. Specifically, on one divided entry, the match line is precharged to an H level (logical higH level), and is set to an L level (logical low level) in the mismatch. On another divided entry, the match line is precharged to the L level, and is set to the H level in the mismatch. By short-circuiting the match lines in the divided CAM entries, redistribution of electric charges occurs in the mismatch entry during precharging, and the divided match lines therein are driven to an intermediate voltage, so that the current consumption is reduced.

A publication 5 (Japanese Patent Laying-Open No. 2002-245783) has also disclosed a construction for reducing current consumption in a search operation. In the construction disclosed in the publication 5, a dummy match line is provided to have the same capacitance as an entry in a match state. A match line and the dummy match line are precharged to a ground voltage, and are supplied with a current in a search operation. When the dummy match line is determined to be at the voltage level of an H level, a determination timing signal is produced to stop charging of the match line. Current consumption is reduced by reducing a period for supplying the current to the match line. A differential amplifier circuit is used for determining the voltage level of the match line, and compares a reference voltage with the match line voltage.

A publication 6 (Japanese Patent Laying-Open No. 2001-319481) has disclosed a construction for reducing current consumption in a search operation and for increasing a speed of the search operation. In the construction disclosed in the publication 6, a bit line for writing/reading data is provided separately from a search line for transferring search data. The bit line is precharged to the H level, and the search line is precharged to the L level. In a search operation, the search and bit lines are short-circuited according to the search data so that the search line at a high level is set to an intermediate voltage level, and an amplitude of a search line voltage is set to be between the ground voltage and the intermediate voltage level. The match line is precharged to the intermediate voltage level, and is charged up via a decouple transistor in the search operation. Via such decouple transistor, the match line is coupled to a sense amplifier. Even when a sense node of input nodes of the sense amplifier is charged, the decouple transistor suppresses voltage rising of the match line. Upon mismatch, the sense node is discharged via the match line. The voltage amplitude(s) of the match line and/or search line is (are) restricted, so that the current consumption is reduced, and the search operation is speeded up.

In the CAM and TCAM, as described above, the search line and the match line are charged and discharged in each search cycle, and the current consumption is large. In the article 1 described above, the match line has a hierarchical configuration, and the search operation is performed in a pipelined fashion for each of the plurality of local match line blocks. For the entry of the mismatching in a certain pipeline stage (local match line block), the subsequent discharging of the search line and the local match line is not performed for reducing the current consumption.

In the article 1, the match line has the hierarchical configuration, but the search line is arranged commonly to all the entries. Therefore, the search line of a large load capacitance is charged and discharged between the power supply voltage level and the ground voltage level according to the search data, and there is a room for improvement in reducing the current consumption.

The search operation is performed concurrently on many search and local match lines. Therefore, a simultaneous operation current (peak current) is large, which may cause switching noises.

In the article 1, the global and local match lines are charged and discharged between the levels of the power supply voltage and the ground voltage. Therefore, signal amplitudes of the local and global match lines indicating a result of the match-detection are large, and such a problem arises that there is a limit in reduction of the current consumption and the reduction of the time required until settlement of the match result. The power supply voltage may be lowered to reduce the signal amplitude. In this case, however, the operation speed of the transistor element determines the lower limit of the power supply voltage level, to pose the restriction on the increase in operation speed.

In the construction disclosed in the publication 1, a transistor similar to the CAM cell is used to produce and supply a current of one-bit miss state to the match line. The transistor receiving a reference voltage on its gate is used for charging the match line, to suppress the voltage level increase of the match line in the mismatch, at or below the reference voltage. However, such a problem occurs that the match line in the match state is charged to the power supply voltage level, and the voltage amplitude thereof becomes large. The publication 1 has not disclosed a construction for setting the voltage amplitude of the match line to or below an intermediate voltage level regardless of the match and mismatch states. Also, no consideration is given to an influence that is exerted on the match line precharging current by an off-leakage current flowing via the CAM cells in the match state of an entry.

In the construction disclosed in the publication 2, by the charge redistribution performed by the capacitance division by the match line and a capacitance element, the precharge voltage level of the match line is set. Therefore, the capacitance values must be adjusted between the match line and the capacitance element with high precision, and it is difficult to charge up precisely the match line in the match state to a desired intermediate voltage level. In the publication 2, the search line is precharged by short-circuiting the complementary search lines for reducing the charge/discharge currents of the search lines. However, no consideration is given to reduction of the capacitance of the search line. Accordingly, the search line is charged from the intermediate voltage level to the power supply voltage level according to the search data, and such problem arises that as the number of entries increases, the load capacitance accordingly increases and the current consumption cannot be reduced.

In the construction disclosed in the publication 3, the reference voltage generating circuit and the differential amplifier circuit are arranged for each match line. In this publication 3, however, the match line is precharged to the power supply voltage level. Therefore, the voltage amplitude of the match line is large, resulting in a problem that the fast search operation and the reduced current consumption cannot be achieved.

In the construction disclosed in the publication 4, the CAM entry is divided and such a problem arises that the divided entries are precharged to different voltage levels, and it is difficult to achieve a uniform operation speed between the divided entries. In each entry, it is necessary to control the connection of the match line in the divided entry according to the match/mismatch of the divided entries, and a circuit for such connection requires a large occupation area. Further, the match line of each divided entry has the voltage amplitude of the power supply voltage level, so that the fast search operation cannot be achieved. When the number of bits of the search data increases and accordingly the number of bits of the CAM cells of the entry increases, the load of the match line increases to increase the current consumption for precharging from the intermediate voltage level to the power supply voltage level.

In the construction disclosed in the publication 5, the determination timing is set by detecting the voltage level of the dummy match line, and thereby the precharge period of the match line is adjusted. However, no consideration is given to the restriction of the precharge current value. Also, the charging of the match line in the match state is not stopped, and the current consumption in the search operation can be reduced to a limited extent.

In the construction disclosed in the publication 6, the search line and the bit line are short-circuited to set the voltage amplitude of the search line to the intermediate voltage smaller than the power supply voltage. Therefore, the bit line must be precharged to the power supply voltage level, resulting in a problem that the current consumption cannot be reduced. The match line is coupled to the buffer (sense amplifier) via the decouple transistor for charging up the match line in the match state to the intermediate voltage level and for pulling up the sense node to the power supply voltage level. Accordingly, the discharge speed of the sense node slows in the state of one-bit miss for the search data, resulting in a problem that the search operation cannot be performed fast. The publication 6 discloses another embodiment, in which redistribution of the accumulated charges of the capacitance element sets the voltage level of the match line in the match state. This scheme results in a problem that adjustment of the load capacitances of the capacitance element and the match line cannot be made easily, similarly to the publication 2.

SUMMARY OF THE INVENTION

An object of the invention is to provide a content addressable memory that can reduce current consumption and can achieve a fast search operation even when a bit number of search data is large.

Briefly stated, in a content addressable memory according to the invention, an isolation gate is used to isolate a match line from an amplifier circuit of a match amplifier, to perform a detection operation. The match line is precharged to a voltage at or below an intermediate voltage level between the power supply voltage and the ground voltage.

According to an embodiment of a first aspect of the invention, a content addressable memory includes a plurality of entries each having a plurality of content addressable memory cells; a plurality of match lines arranged corresponding to the respective entries, each match line coupled to the content addressable memory cells in a corresponding entry; a search data bus coupled in parallel to the entries and transferring search data in parallel to the entries; and a plurality of match amplifiers coupled to the match lines, respectively. Each of the match amplifiers includes a precharge circuit for precharging a corresponding match line to a precharge voltage level equal to or lower than an intermediate value between a power supply voltage and a ground voltage, an amplifier circuit for comparing the voltage on the corresponding match line with a reference voltage at a voltage level equal to or lower than the precharge voltage, and an isolation gate for isolating the amplifier circuit from the corresponding match line before activation of the amplifier circuit.

According to an embodiment of a second aspect of the invention, a content addressable memory includes a plurality of entries each having a plurality of content addressable memory cells; a plurality of match lines arranged corresponding to the respective entries, each match line coupled to the content addressable memory cells in a corresponding entry; a search data bus coupled in parallel to the entries and transferring search data commonly to the entries; and match amplifiers arranged corresponding to the respective match lines and coupled to the corresponding match lines. Each of the match amplifiers includes an amplifier circuit for comparing a voltage on the corresponding match line with a reference voltage to produce a signal indicating a result of the comparison, a precharge circuit for precharging the corresponding match line to a ground voltage level after completion of an amplifying operation of the amplifier circuit, and a pull-up current supply circuit for supplying a current having a restricted current value to the corresponding match line when the precharge circuit is inactive.

According to an embodiment of a third aspect of the invention, a content addressable memory includes a plurality of entries each having a plurality of content addressable memory cells; a plurality of match lines arranged corresponding to the respective entries, each match line coupled to the content addressable memory cells in the corresponding entry; a search data bus coupled in parallel to the entries and transferring search data in parallel to the entries; and a plurality of match amplifiers arranged corresponding to the respective match lines and coupled to the corresponding match lines. Each of the match amplifiers includes a precharge circuit for precharging the corresponding match line to a ground voltage level, and a pull-up current supply/determination circuit for supplying a current of a restricted current value to the corresponding match line when the precharge circuit is inactive, and producing a signal at a voltage level corresponding to the voltage level of the corresponding match line. The current of this restricted current value is smaller than a current flowing through the corresponding match line in the case of one bit of the content addressable memory cells in one entry is made conductive, and is larger than a current flowing through the corresponding match line when the content addressable memory cells of all the bits are non-conductive.

According to an embodiment of a fourth aspect of the invention, a content addressable memory includes a plurality of entries each having a plurality of content addressable memory cells; a plurality of match lines arranged corresponding to the respective entries, each match line coupled to the content addressable memory cells in the corresponding entry; a search data bus coupled in parallel to the entries and transferring search data in parallel to the entries; and a plurality of match amplifiers arranged corresponding to the respective match lines and coupled to the corresponding match lines. Each of the match amplifiers includes a sensing circuit for producing a signal at a voltage level corresponding to the voltage level of the corresponding match line, a latch circuit for latching a signal received from the sensing circuit and corresponding to a voltage level of the match line in a preceding match and detection cycle, and a charge circuit for selectively supplying a current to the corresponding match line according to a latched signal of the latch circuit in a search operation.

According to an embodiment of a fifth aspect of the invention, a content addressable memory has a plurality of search blocks including a plurality of entries. Each entry includes a plurality of content addressable memory cells storing candidate data, and a match line coupled to the plurality of content addressable memory cells, and being driven in a predetermined voltage level direction by the corresponding content addressable memory cells according to a result of match searching with respect to search data. Each search block further includes a search data bus coupled commonly to the plurality of entries and transferring the search data. The content addressable memory according to the embodiment of the fifth aspect further includes a plurality of search data input circuits arranged corresponding to the search blocks, respectively, and each supplying the search data to the search data bus of the corresponding search block, and an activation control circuit for successively activating the plurality of search blocks and the plurality of search data input circuits according to a clock signal.

According to an embodiment of a sixth aspect of the invention, a content addressable memory includes a plurality of entries each having a plurality of content addressable memory cells; a plurality of match lines arranged corresponding to the respective entries, each match line coupled to the content addressable memory cells in the corresponding entry; a search data bus coupled in parallel to the entries and transferring search data in parallel to the entries; and a plurality of match amplifiers arranged corresponding to the plurality of match lines, respectively. Each of the match amplifiers includes a precharge circuit for precharging a reference voltage node and a corresponding match line, and an amplifier circuit for comparing the voltages on first and second nodes, and producing a signal indicative of a result of the comparison. The precharge voltage is at a level equal to or lower than an intermediate voltage between a power supply voltage and a ground voltage. The first node of the amplifier circuit receives the voltage on the corresponding match line, and the second node is coupled to the reference voltage node. The match amplifier further includes an isolation gate for isolating the corresponding match line and the reference voltage node from the first and second nodes of the amplifier circuit before activation of the amplifier circuit, and a capacitance element for boosting the first node according to a boost instructing signal before the activation of the amplifier circuit after isolation of the isolation gate.

According to an embodiment of a seventh aspect of the invention, a content addressable memory includes a plurality of entries each having a plurality of content addressable memory cells; a plurality of match lines arranged corresponding to the respective entries, each match line coupled to the content addressable memory cells in the corresponding entry; a search data bus for transferring search data in parallel to the entries; and a plurality of match amplifiers arranged corresponding to the plurality of match lines, respectively. Each of the match amplifiers includes a precharge circuit for precharging the corresponding match line, and an amplifier circuit for comparing voltages on first and second nodes, and producing a signal indicative of a result of the comparison. The precharge voltage is at a level equal to or lower than an intermediate voltage between a power supply voltage and a ground voltage. The first node receives the voltage on the corresponding match line. The second node receives a sense reference voltage. The match amplifier further includes an isolation gate for confining charges on the first and second nodes before activation of the amplifier circuit. The sense voltage is produced by changing the voltage at a precharge voltage level using a capacitance element.

According to an embodiment of an eighth aspect of the invention, a content addressable memory includes a plurality of entries each having a plurality of content addressable memory cells; a plurality of match lines arranged corresponding to the respective entries, each match line coupled to the content addressable memory cells in a corresponding entry; a search data bus for transferring search data in parallel to the entries; and a plurality of match amplifiers coupled to the match lines, respectively. Each of the match amplifiers includes a precharge circuit for precharging the corresponding match line to a precharge voltage level equal to or lower than an intermediate value between a power supply voltage and a ground voltage, an amplifier circuit for comparing the voltage on the corresponding match line with a reference voltage at the same voltage level as the precharge voltage, and a capacitance element for supplying accumulated charges to the corresponding match line in the operation of comparing the search data on the search data bus with the stored data of the entry.

According to an embodiment of a ninth aspect of the invention, a content addressable memory includes a plurality of entries each having a plurality of content addressable memory cells; a plurality of match lines arranged corresponding to the respective entries, each match line coupled to the content addressable memory cells in a corresponding entry; a search data bus for transferring search data commonly to the entries; and a plurality of match amplifiers coupled to the respective match lines. Each of the match amplifiers includes a precharge circuit for precharging the corresponding match line to a ground voltage level, and a pull-up current supply/determination circuit supplying, in an operation of comparing the search data on the search data bus with stored data of each of the entries, a current of a restricted current value to the corresponding match line, clamping an upper limit value of the voltage on the corresponding match line at a predetermined value or lower and for producing a signal corresponding to the voltage level of the corresponding match line on an internal node.

The invention implements the content addressable memory that performs fast search/determination operations with low current consumption.

Representative effects achieved by the embodiments of the invention are as follows. Since the precharge voltage level of the match line is set to the intermediate voltage level or lower, the charge/discharge currents of the match line can be reduced. Also, a signal amplitude of the match line is made small, to achieve a fast search operation. In the search operation, the amplifier circuit of the match amplifier is activated while isolating the match line from the amplifier circuit. Thus, full swing of the match line is not required in the operation of the amplifier circuit. Thus, the precharge or pull-up of the match line from the intermediate voltage level can be performed, so that the signal amplitude of the match line can be reduced, and the current consumption can be reduced. When using a cross-coupled type latch amplifier for the amplifier circuit, the driving capacitance of the amplifier circuit is reduced, and the fast amplifying operation can be achieved.

By supplying the current of the restricted current value to the match line, the match line precharged to the ground voltage level can be charged to the predetermined voltage level according to the comparison with the search data, and rising of the voltage level can be suppressed so that the fast search operation and the low current consumption can be achieved. The voltage amplitude of the match line in the search mismatch state (miss state) in which the charge and discharge of the match line are performed, can be made smaller than the power supply voltage, and the current consumption can be reduced.

The restricted current value is smaller than the current flowing from the match line through the entry in one-bit miss state, and is larger than the match line current flowing through the entry in the all-bit non-conductive state. Thereby, the voltage rising of the match line can be suppressed even when one-bit mismatch occurs. It is possible to compensate for voltage lowering due to a leakage current of the match line in the match state. Thereby, the voltage amplitude of the match line can be small, and the fast search operation can be achieved with low current consumption.

The entry is divided into the plurality of search blocks, and the search operation is successively performed in the search blocks, so that the construction can be equivalent to the construction having divided search lines. Therefore, it is possible to reduce the charging/discharging currents of the search line, and the fast search operation can be performed. By successively performing the search operation in the search blocks, the peak current in the search operation can be reduced, and influences by switching noises can be suppressed.

When the sense operation at the voltage level of the match line is performed by confining the charges, the capacitance element is used to change the match line voltage. The interconnection capacitance connected to the capacitance element is small, and the capacitance element can have a smaller size than that in a construction that uses the capacitance element for changing the voltage level of the whole match line, and an occupation area of the capacitance element can be small. A small amount of charges can change the voltage significantly. A load capacitance of the node that fully swings in the amplifying operation is small, so that the power consumption can be small.

In the case of producing the sense reference voltage by changing the precharge voltage using the capacitance element, the precharge voltage level is changed using a charge pump operation (capacitive coupling action) of the capacitance element. In the case of changing the sense reference voltage for the production after confining the charges, the occupation area of the capacitance element can be small. In the case of changing the sense reference voltage by the capacitance element for the production before confining the charges, the match amplifier does not require a capacitance element for capacitance balance of the sense nodes so that the occupation area can be small. Even when the amplitude of the sense nodes (first and second nodes) of the amplifier circuit fully swings, the sense nodes have no capacitance element so that the current consumption required for charging/discharging the sense nodes can be small.

In this search operation, the capacitance element supplies the accumulated charges to the match line to pull up the match line. This can prevent flow of a through current from the power supply node to the ground node in the search operation, and can reduce the current consumption. The accumulated charges of the capacitance element are used to pull up the potential of the match line so that the pull-up potential can be low, and the increase in voltage amplitude of the match line can be suppressed.

The current of the restricted value is supplied to the match line, and the upper limit value of the potential of the match line is clamped so that the voltage amplitude of the match line can be restricted. Since the signal at the voltage level corresponding to the match line potential is produced, no differential amplifier circuit is required, and the current consumption of the match amplifier can be reduced.

Through the clamp function, the internal node of the pull-up current supply/determination circuit is isolated from the match line, so that the load of the internal node can be reduced, and the voltage level of the internal node can be raised fast to the power supply voltage level. Thus, the current consumption can be reduced, and the fast search/determination operation can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 41 illustrates, in a table form, charge consumption per search cycle of the content addressable memory shown in FIG. 38.

DESCRIPTION OF THE PREFERRED EMBODIMENTS

First Embodiment

Figure 1:
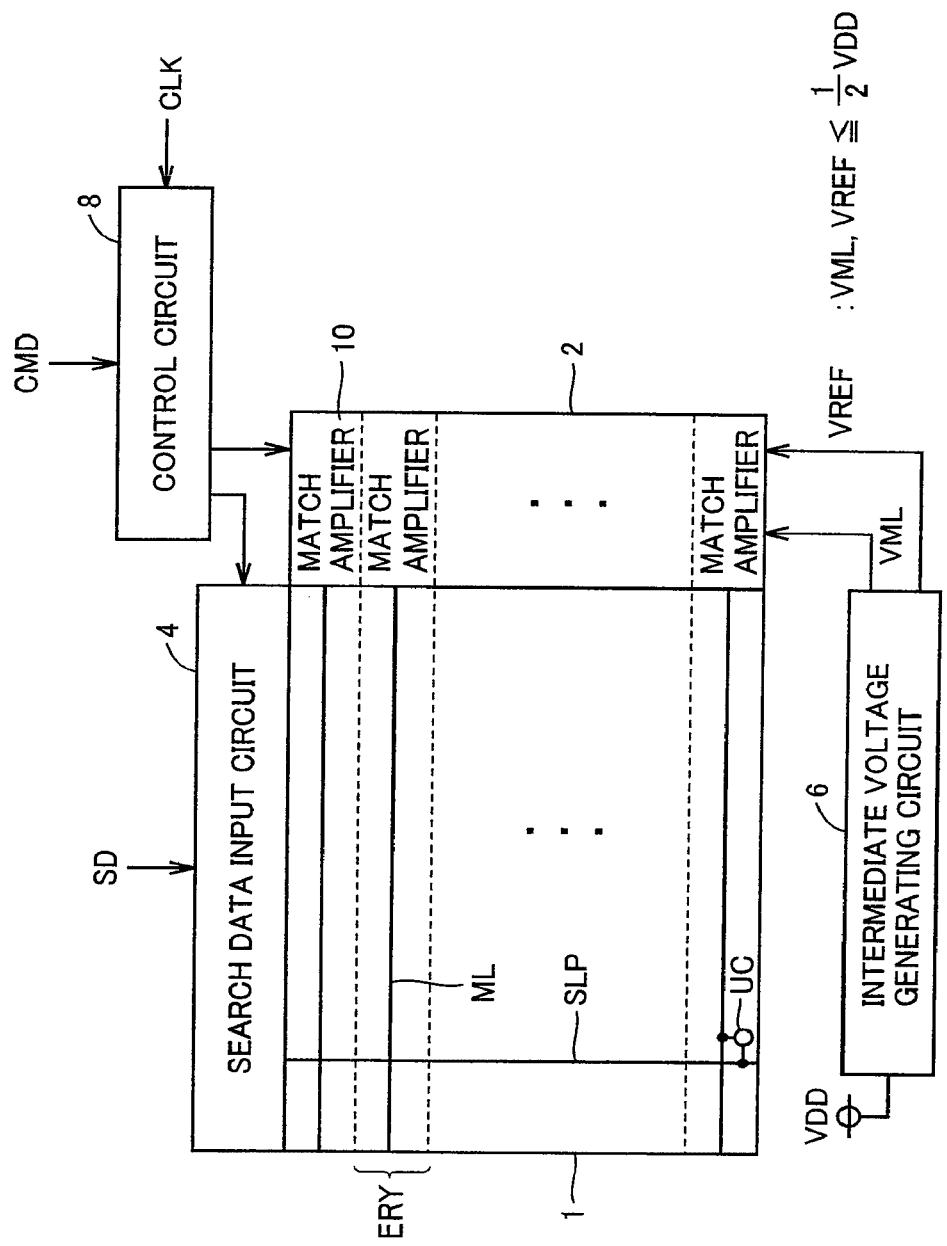
FIG. 1 schematically shows a whole construction of a content addressable memory according to a first embodiment of the invention.

FIG. 1 schematically shows a whole construction of a content addressable memory according to a first embodiment of the invention. In FIG. 1, the content addressable memory includes a memory cell array 1 having unit cells UC arranged in rows and columns. Memory cell array 1 is divided into a plurality of entries ERY. A match line ML is arranged for each entry ERY, and each match line ML is coupled to unit cells UC in a corresponding entry in parallel. Each of search line pairs SLP for transmitting search data is arranged commonly to entries ERY in memory cell array 1. Unit cell UC is arranged corresponding each crossing between search line pairs SLP and match lines ML. Unit cell UC has a construction as described later and has a function of storing and searching data. The unit cell can have various constructions. Accordingly, the term "unit cell" is used instead of "content addressable memory cell" and "CAM cell" in the following description.

The content addressable memory further includes a match determining circuit 2 arranged corresponding to entries ERY for determining match/mismatch of the search data with stored data of each entry. Match determining circuit 2 includes match amplifiers 10 coupled to the respective match lines. The content addressable memory further includes an intermediate voltage generating circuit 6 for supplying an intermediate voltage VML and a comparison reference voltage VREF to match amplifiers 10 in match determining circuit 2, a search data input circuit 4 that receives externally supplied search data SD and transmits the search data SD to search line pairs SLP of memory cell array 1, and a control circuit 8 responsive to a clock signal CLK for controlling operations of match determining circuit 2 and search data input circuit 4 according to an externally supplied command CMD instructing an operation mode.

Intermediate voltage generating circuit 6 produces an intermediate voltage at a voltage level of half a power supply voltage VDD or lower from power supply voltage VDD. Intermediate voltage VML and comparison reference voltage VREF may be at the same voltage level, or intermediate voltage VML may be higher than comparison reference voltage VREF. Intermediate voltage VML is used as a precharge voltage for precharging each match line ML via match amplifier 10. An amplitude of match line ML is set to or lower than half the power supply voltage VDD/2, whereby the current consumption is reduced, and a search operation speed is increased.

Figure 2:
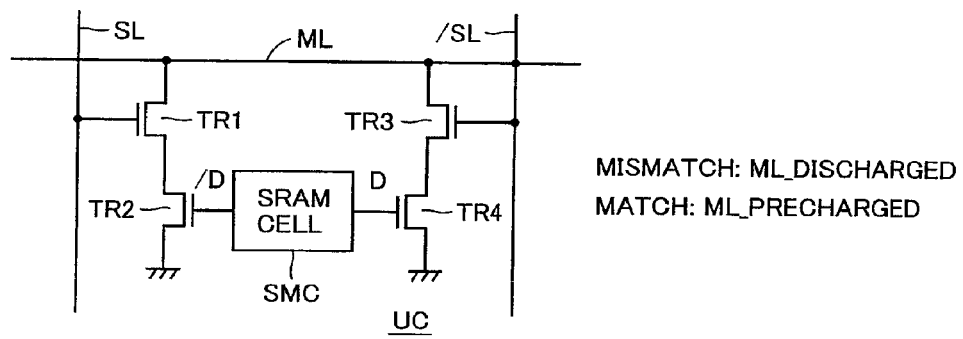
FIG. 2 shows an example of a construction of a unit cell shown in FIG. 1.

FIG. 2 shows an example of a construction of unit cell UC shown in FIG. 1. In FIG. 2, unit cell UC includes an SRAM cell SMC storing one bit of data, N-channel MOS transistors (insulated gate field effect transistors) TR1 and TR2 connected in series between match line ML and a ground node, and N-channel MOS transistors TR3 and TR4 arranged in series between match line ML and the ground node. MOS transistors TR1 and TR3 have gates coupled to search lines SL and /SL, respectively. MOS transistors TR2 and TR4 have gates coupled to internal storage nodes /D and D of SRAM cell SMC, respectively. These internal storage nodes D and /D store data bits complementary to each other. When SRAM cell SMC stores "1", internal storage nodes D and /D are at H and L levels, respectively. In this state, therefore, MOS transistor TR2 is conductive, and MOS transistor TR4 is non-conductive. When SRAM cell SMC stores data "0", the opposite state is attained.

Search lines SL and /SL form search line pair SLP shown in FIG. 1, and transmit complementary data in a search operation. For unit cell UC shown in FIG. 2, there are provided a word line and a bit line pair for writing and reading data into/from SRAM cell SMC, although FIG. 2 does not show the word line and bit line pair.

In the search operation, when search data "1" is supplied while SRAM cell SMC has stored "1" (internal storage node D is at the H level), search line SL is at the H level, and complementary search line /SL is at the L level. Therefore, MOS transistors TR2 and TR3 are off, and match line ML is kept at the precharge voltage level. Conversely, when the search data of "0" is transferred to search line SL while the potential of internal storage node D of SRAM cell SMC is at the H level, search line SL attains the L level, and complementary search line /SL attains the H level. In this case, MOS transistors TR3 and TR4 are both made conductive, and match line ML is discharged from the precharge voltage level to the ground voltage level.

Therefore, with the construction using unit cell UC shown in FIG. 2, binary determination can be made on match/mismatch between the search data and the storage data of the entry. Unit cells UC in the entry are coupled in parallel to corresponding match line ML. When all unit cells UC in entry ERY are in the match state, match line ML holds the precharge voltage level. When the entry includes at least one bit of unit cell in the mismatch state (miss state), match line ML is discharged via this unit cell in the mismatch state, and the potential of match line ML lowers from the precharge voltage level. Therefore, by amplifying the potential level of match line ML by match amplifier 10 in match determining circuit 2, it is possible to perform the binary determination on match/mismatch between the search data and the stored data of each entry.

Figure 3:
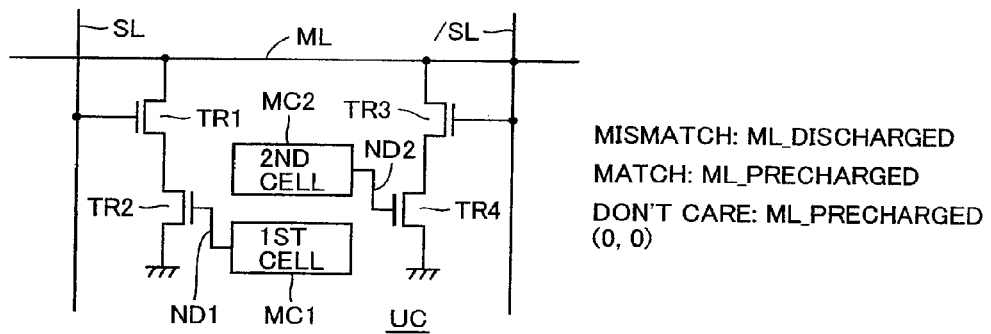
FIG. 3 shows another construction of the unit cell shown in FIG. 1.

FIG. 3 shows another construction of unit cell UC shown in FIG. 1. In FIG. 3, unit cell UC differs from unit cell UC shown in FIG. 2 in the following construction. As the data storage element, first and second cells MC1 and MC2 each having a logical value of storage data set separately and individually are employed in place of SRAM cell SMC. Storage nodes ND1 and ND2 of first and second cells MC1 and MC2 are coupled to the gates of MOS transistors TR2 and TR4, respectively. Each of first and second cells MC1 and MC2 is implemented using a DRAM memory cell as described in the article 1. Charges accumulated in a capacitor are used to store data. Other constructions of unit cell UC shown in FIG. 3 are the same as those of unit cell UC shown in FIG. 2. Corresponding portions are allotted with the same reference numbers, and description thereof is not repeated.

In FIG. 3, the word and bit lines for writing/reading data are arranged for each of first and second cells MC1 and MC2. However, FIG. 3 does not show the word and bit lines for writing/reading data for the sake of simplicity, similarly to FIG. 2.

In unit cell UC shown in FIG. 3, when first and second cells MC1 and MC2 store the complementary data, unit cell UC performs the search operation according to the same logic as unit cell UC in FIG. 2. Thus, match line ML is discharged when mismatch (miss) occurs. When match (hit) occurs, match line ML is kept at the precharge voltage.

When both first and second cells MC1 and MC2 store data "0" at the L level, both MOS transistors TR2 and TR4 are off. In this state, therefore, match line ML is not discharged regardless of the logical value of search data, and match line ML keeps the precharged state. This can implement the "don't care" state.

When both first and second cells MC1 and MC2 have stored data "1" at the H level, both MOS transistors TR2 and TR4 are on. In this case, match line ML is discharged regardless of the value of search data. In this state, the stored data of the entry is invalid (i.e., normally in the mismatch state) regardless of the search data. Unit cell UC of the construction shown in FIG. 3 can make ternary determination of match, mismatch and don't care.

By using unit cell UC shown in either of FIGS. 2 and 3 for the CAM (Content Addressable Memory) cell, match line ML is discharged via a path of MOS transistors TR1 and TR2 or a path of MOS transistors TR3 and TR4 in the miss state.

Figure 4:
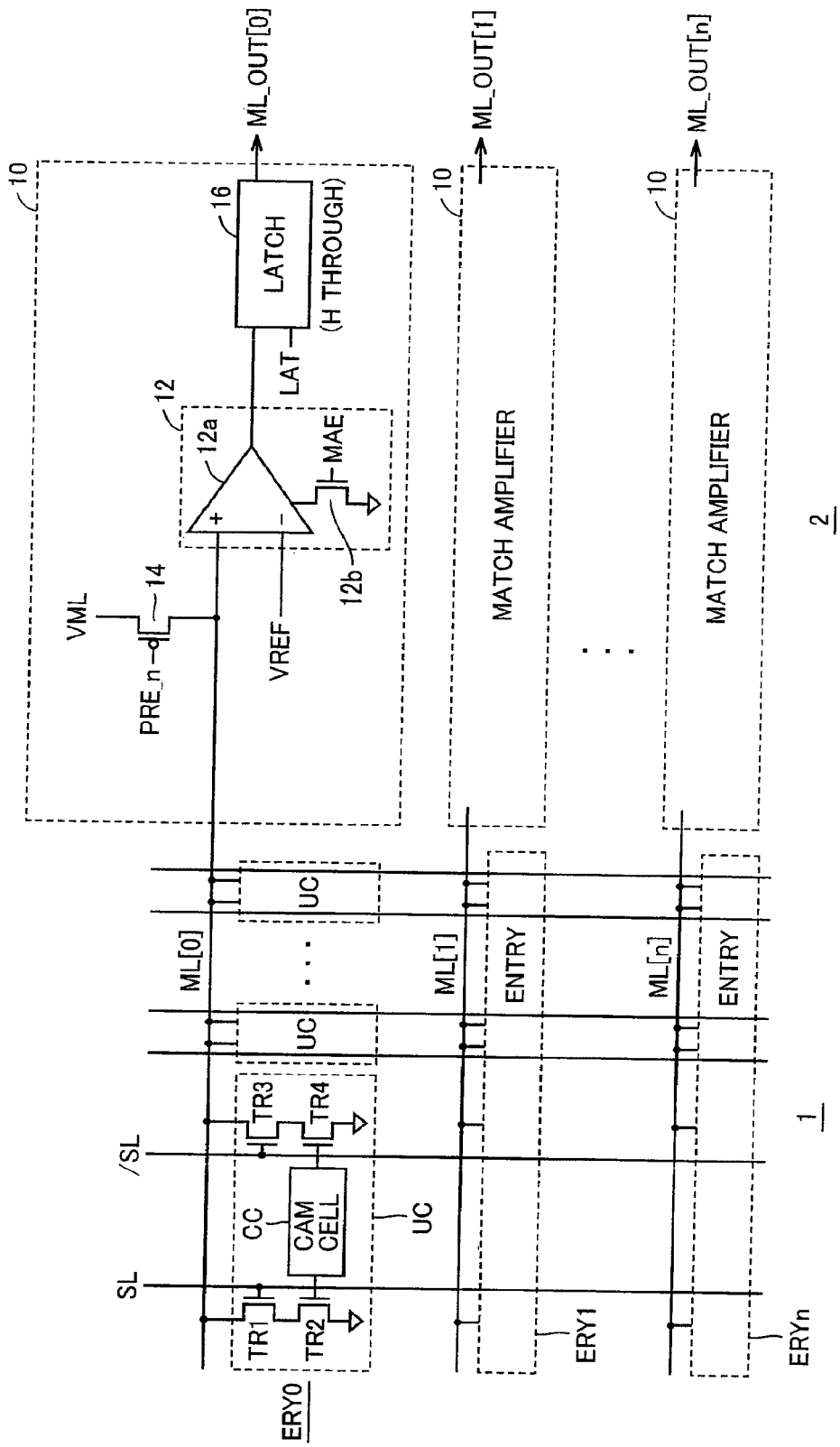
FIG. 4 schematically shows a main portion of the content addressable memory according to the first embodiment of the invention.

FIG. 4 shows a specific construction of match amplifier 10 in the content addressable memory according to the first embodiment of the invention. In FIG. 4, in memory cell array 1, there are (n+1) entries ERY0-ERYn. Match lines ML[0]-ML[m] are arranged corresponding to entries ERY0-ERYn, respectively. Each of entries ERY0-ERYn includes a plurality of unit cells UC. A memory cell (CAM cell) CC arranged for data storage in each unit cell UC may be formed of SRAM cell SMC shown in FIG. 2 or memory cells MC1 and MC2 shown in FIG. 3. In the following description, CAM cell CC refers to either of the unit cell performing the binary determination and the unit cell performing the ternary determination.

Match amplifiers 10 are arranged corresponding to entries ERY0-ERYn, respectively. FIG. 4 representatively shows a construction of match amplifier 10 arranged corresponding to entry ERY0. Match amplifier 10 includes a differential amplifier circuit 12 for comparing a voltage on corresponding match line ML (ML[0]) with a reference voltage VREF, a latch 16 for latching an output signal of differential amplifier circuit 12 according to a latch instructing signal LAT and producing a search result indicating signal ML_OUT (ML_OUT[0]), and a precharge transistor 14 for transmitting precharge voltage VML to corresponding match line ML (ML[0]) in response to activation of a precharge instructing signal PRE_n.

Differential amplifier circuit 12 includes a differential amplifier 12a having a positive input (+) coupled to match line ML and a negative input (−) receiving reference voltage VREF, and an amplifier activation transistor 12b for activating differential amplifier 12a in response to a match amplifier activating signal MAE.

Precharge voltage VML is at a level of half power supply voltage VDD, and reference voltage VREF is lower than precharge voltage VML (0<VREF<VML≦VDD/2).

Search lines SL and /SL are precharged to the ground voltage level during standby, and are selectively driven to the power supply voltage level according to the search data in the search operation.

Figure 5:
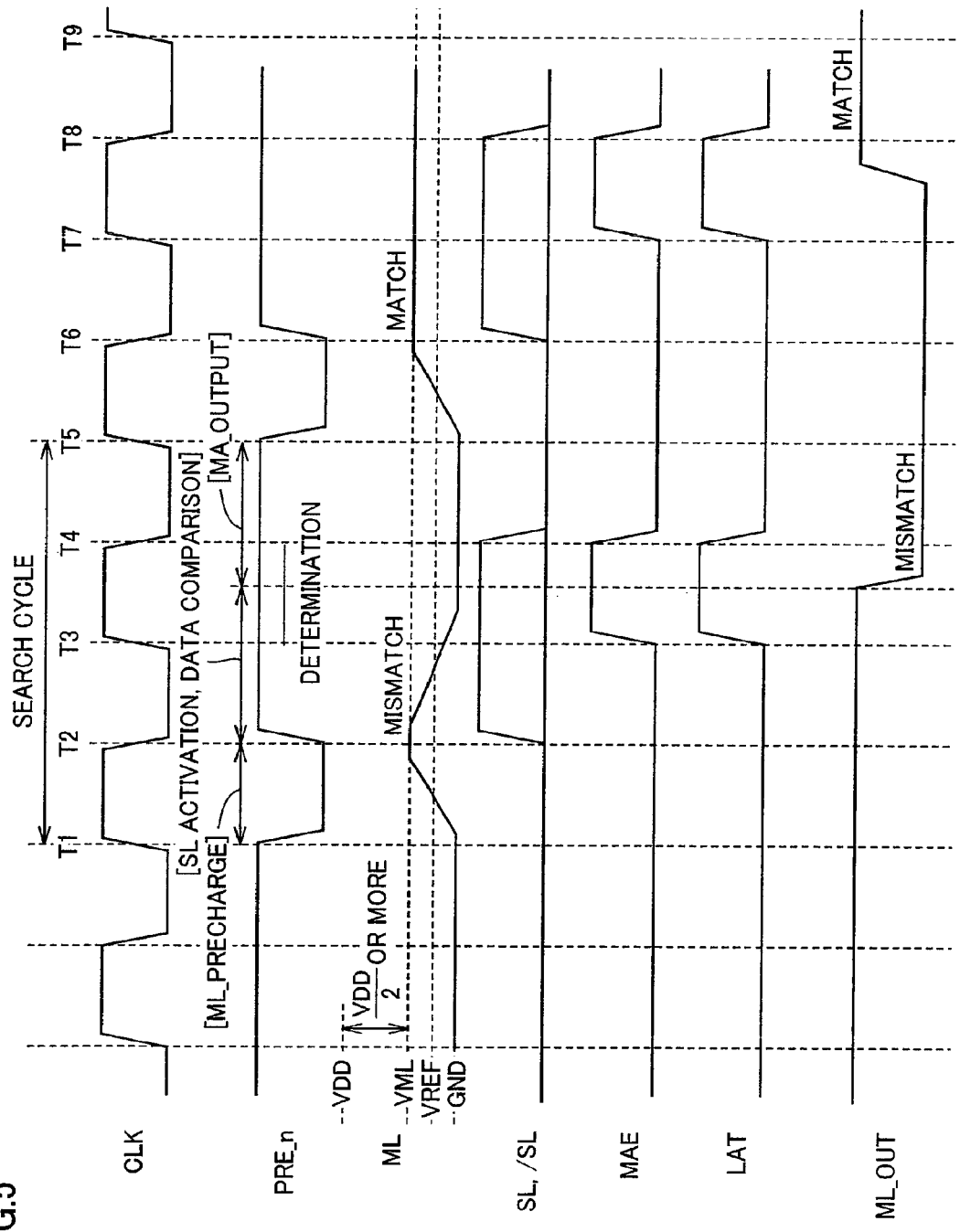
FIG. 5 is a timing chart representing an operation of the content addressable memory shown in FIG. 4.

FIG. 5 is a timing chart representing an operation of the content addressable memory shown in FIG. 4. FIG. 5 shows operating waveforms relating to one entry. Referring to FIG. 5, a search operation of the content addressable memory shown in FIG. 4 will now be described.

In a standby state before a time T1, search lines SL and /SL are at the level of ground voltage GND, and match line ML is also at the level of ground voltage GND.

The search operation starts at time T1. In response to start of the search operation at time T1, precharge instructing signal PRE_n attains the L level so that precharge transistor 14 is turned on for each entry, to precharge each of match lines ML (ML[0]-ML[n]) to the intermediate voltage level, the level of precharge voltage VML. During a period between times T1 and T2, both search lines SL and /SL are kept at the ground voltage level.

At time T2, the precharge operation completes, search lines SL and /SL are activated and a comparison is made between the stored data and the search data. In this activation/comparison cycle, precharge instructing signal PRE_n is at the H level to maintain precharge transistor 14 off. Search lines SL and /SL receive the search data, and are each driven to the voltage level corresponding to the bit value of the search data. Thereby, in entries ERY0-ERYn, the search operation is performed in parallel. According to match/mismatch between the stored data of CAM cell CC and the search data, each unit cell UC selectively discharges the corresponding match line. As shown in FIG. 5, when at least one bit of the unit cell in the entry is in the mismatch state, match line ML of this miss-state entry is discharged via a path of MOS transistors TR1 and TR2 or transistors TR3 and TR4 in unit cell UC in the mismatch state, and the precharge voltage level of match line ML lowers.

At a time T3, when the voltage level of match line ML is sufficiently developed, match amplifier activating signal MAE is made active. Thereby, a determination cycle starts overlapping with a data comparison cycle, and differential amplifier circuit 12 performs the differential amplification. Thus, differential amplifier circuit 12 produces a signal corresponding to a difference between reference voltage VREF and the potential of corresponding match line ML. At time T3, latch instructing signal LAT attains the H level, and a match amplifier output cycle starts in parallel. In this cycle, latch 16 enters the through state and latches the output signal of differential amplifier circuit 12 and transfers the latched data to an output node. In FIG. 5, the corresponding entry is in the mismatch state, and search result indicating signal ML_OUT (one of ML_OUT[0]-ML_OUT[n]) changes to the ground voltage level.

When the output signal of latch 16 is made definite, the determination cycle ends at a time T4, and a cycle for outputting the search result starts. Match amplifier activating signal MAE is made inactive, and latch instructing signal LAT is driven to the L level. Search lines SL and /SL are precharged to the ground voltage level again. When latch instructing signal LAT attains the L level, latch 16 enters the latch state to keep its output signal ML_OUT at the L level indicative of the mismatch state.

One search cycle is formed of the period between times T1 and T5. In synchronization with clock signal CLK, the content addressable memory successively execute a series of searching operations including the match line precharging, search line activation, data comparison, determination and output of the determination result.

At time T5, a next search cycle starts, and precharge instructing signal PRE_n attains the L level so that match line ML is precharged to the intermediate voltage level of precharge voltage VML again. The voltage level of the match line in the match state slightly lowers due to an off-leakage current of the unit cell in the corresponding entry. However, the amount of voltage lowering over consecutive cycles in the match entry is small, and the match line in the match state substantially is held at the precharge voltage level. The "off-leakage current" represents a current flowing through the paths of transistors TR1 and TR2 or transistors TR3 and TR4 in the off state.

At a time T6, the voltage levels of search lines SL and /SL are set again according to the search data, and the comparison between the stored data and the search data is performed in each entry.

At a time T7, match amplifier activating signal MAE is made active again, and latch instructing signal LAT is driven to the H level. In the match state where the search data matches the stored data of the entry, all unit cells UC in the entry are non-conductive, and a discharging path is not present for the corresponding match line, and therefore, match line ML is held substantially at the level of precharge voltage VML. Accordingly, latch 16 produces and latches signal ML_OUT at the H level indicative of the match state.

At a time T8, match amplifier activating signal MAE is made inactive, and latch 16 enters the latch state. Subsequently, the search cycle is repeated a number of times corresponding to the number of search data.

In the construction shown in FIG. 4, as described above, match line ML changes between ground voltage GND and precharge voltage VML, and the potential of match line ML is compared with reference voltage VREF. Match amplifier 10 converts a signal of a small amplitude appearing on match line ML into a signal of a full amplitude of the power supply voltage level, to produce search result indicating signal ML_OUT. Therefore, the voltage amplitude of the match line can be small in the search cycle, and the charging/discharging currents of match line ML can be small. Match lines ML in the mismatch state are much larger in number than match line ML in the match state, and the amplitude restriction of the match lines can significantly reduce the charging/discharging currents of the match lines.

Differential amplifier circuit 12 is used for comparing reference voltage VREF with the voltage on match line ML, so that the fast sense operation can be performed. In the one-bit miss state, i.e., when one bit (unit cell) out of unit cells is in the mismatch state in entry ERY, the current of the corresponding match line is pulled out slowly. However, precharge voltage VML of match line ML is equal to or lower than intermediate voltage VDD/2, and the voltage level of the corresponding match line can rapidly attain the level lower than reference voltage VREF even in the one-bit miss state so that the potential level of the match line can be determined at a faster timing. Thereby, the content addressable memory can be implanted to achieve the fast search with low current consumption. Here, the term "mismatch state" is used to refer to the state where the search data mismatches the stored data in an entry as a whole, and the term "miss state" is used to refer to the state where storage data bit a unit cell mismatches the corresponding search data bit, or the mismatch on a unit cell basis.

Figure 6:
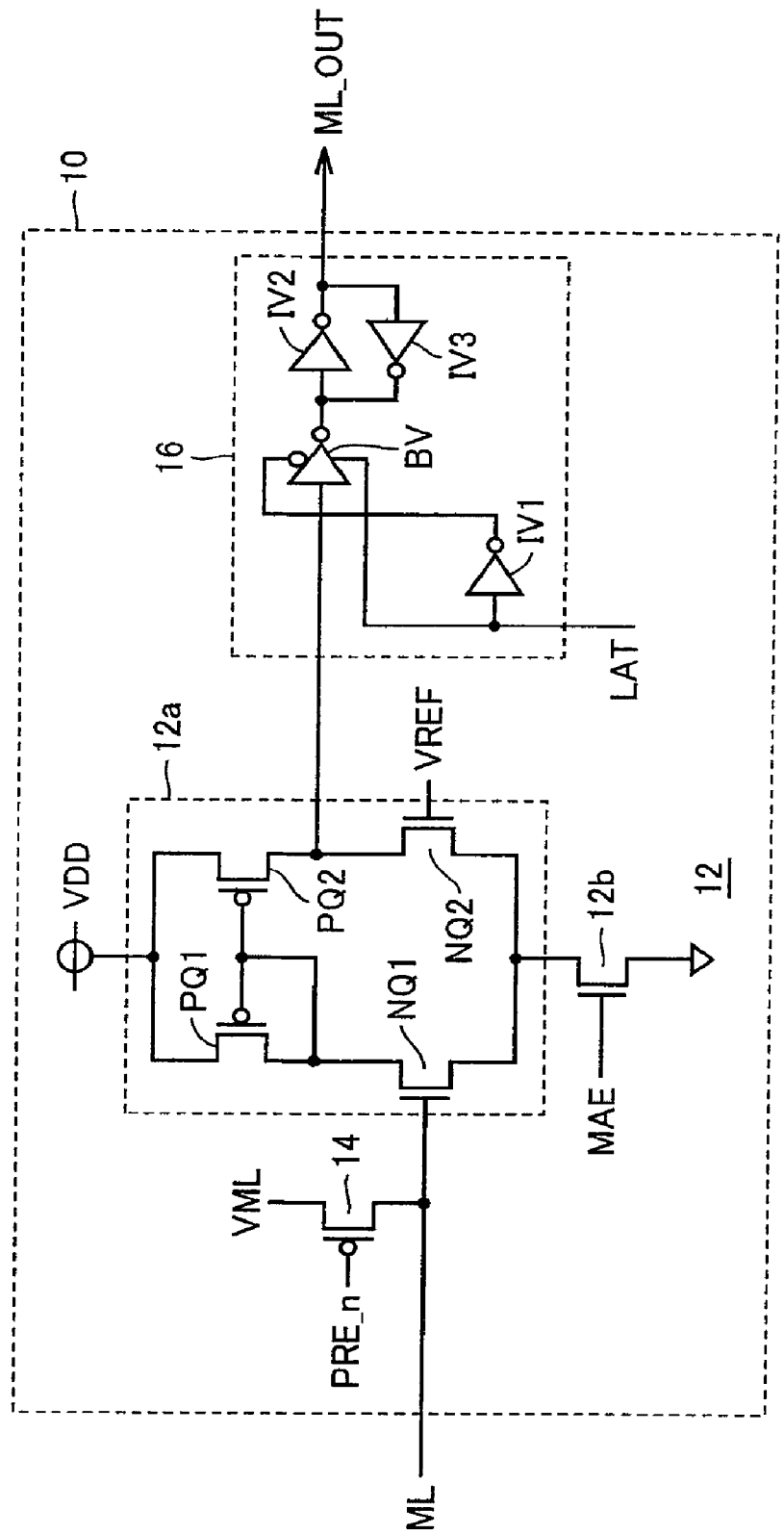
FIG. 6 shows an example of a specific construction of a match amplifier shown in FIG. 4.

FIG. 6 shows an example of specific constructions of differential amplifier circuit 12 and latch 16 shown in FIG. 4. In FIG. 6, differential amplifier 12a of differential amplifier circuit 12 includes an N-channel MOS transistor NQ1 having a gate coupled to match line ML, an N-channel MOS transistor NQ2 receiving reference voltage VREF on its gate, and P-channel MOS transistors PQ1 and PQ2 supplying currents to MOS transistors NQ1 and NQ2, respectively. Sources of MOS transistors NQ1 and NQ2 are commonly coupled to a drain of activation transistor 12b. MOS transistors PQ1 and PQ2 form a current mirror stage. MOS transistor PQ1 has a gate and a drain interconnected with each other, and serves as a master of the current mirror stage.

Latch 16 includes an inverter IV1 inverting latch instructing signal LAT, a tristate inverter buffer BV that selectively becomes active according to latch instructing signal LAT and the output signal of inverter IV1, and inverters IV2 and IV3 coupled to the output of tristate inverter buffer BV. Inverter IV2 inverts the output signal of tristate inverter buffer BV to produce search result indicating signal ML_OUT. Inverter IV3 inverts the output signal of inverter IV2, and provides the inverted signal to an input of inverter IV2. Inverters IV1 and IV2 form a so-called inverter latch.

In differential amplifier circuit 12, currents of the same magnitude flow through MOS transistors PQ1 and PQ2, respectively. When the voltage level of match line ML is higher than reference voltage VREF, MOS transistor NQ1 causes a current flow larger than MOS transistor NQ2 does. MOS transistor PQ2 supplies a mirror current of the current flowing through MOS transistor PQ1 to MOS transistor NQ2. In this case, therefore, MOS transistor NQ2 cannot wholly discharge the current supplied from MOS transistor PQ2, and differential amplifier 12a generates an output signal at the H level.

When the voltage level of match line ML is lower than reference voltage VREF, MOS transistor NQ2 has a larger conductance than MOS transistor NQ1. In this state, the current supplied from MOS transistor PQ2 is entirely discharged via MOS transistor NQ2 and activation transistor 12b, and differential amplifier 12a generates the output signal at the L level.

In latch 16, when latch instructing signal LAT is at the L level, tristate inverter buffer BV is in the output high-impedance state, and output signal ML_OUT thereof does not change. When latch instructing signal LAT attains the H level, tristate inverter buffer BV operates as an inverter to amplify further the output signal of differential amplifier circuit 12. Inverters IV2 and IV3 latch and output the signal thus amplified.

Therefore, precharge transistor 14 precharges match line ML to the level of intermediate voltage VML, and the sense operation can be performed fast immediately when the difference between the voltage on match line ML and reference voltage VREF attains a value sensible by differential amplifier 12a, even in the case where the signal amplitude of match line ML is small.

Figure 7:
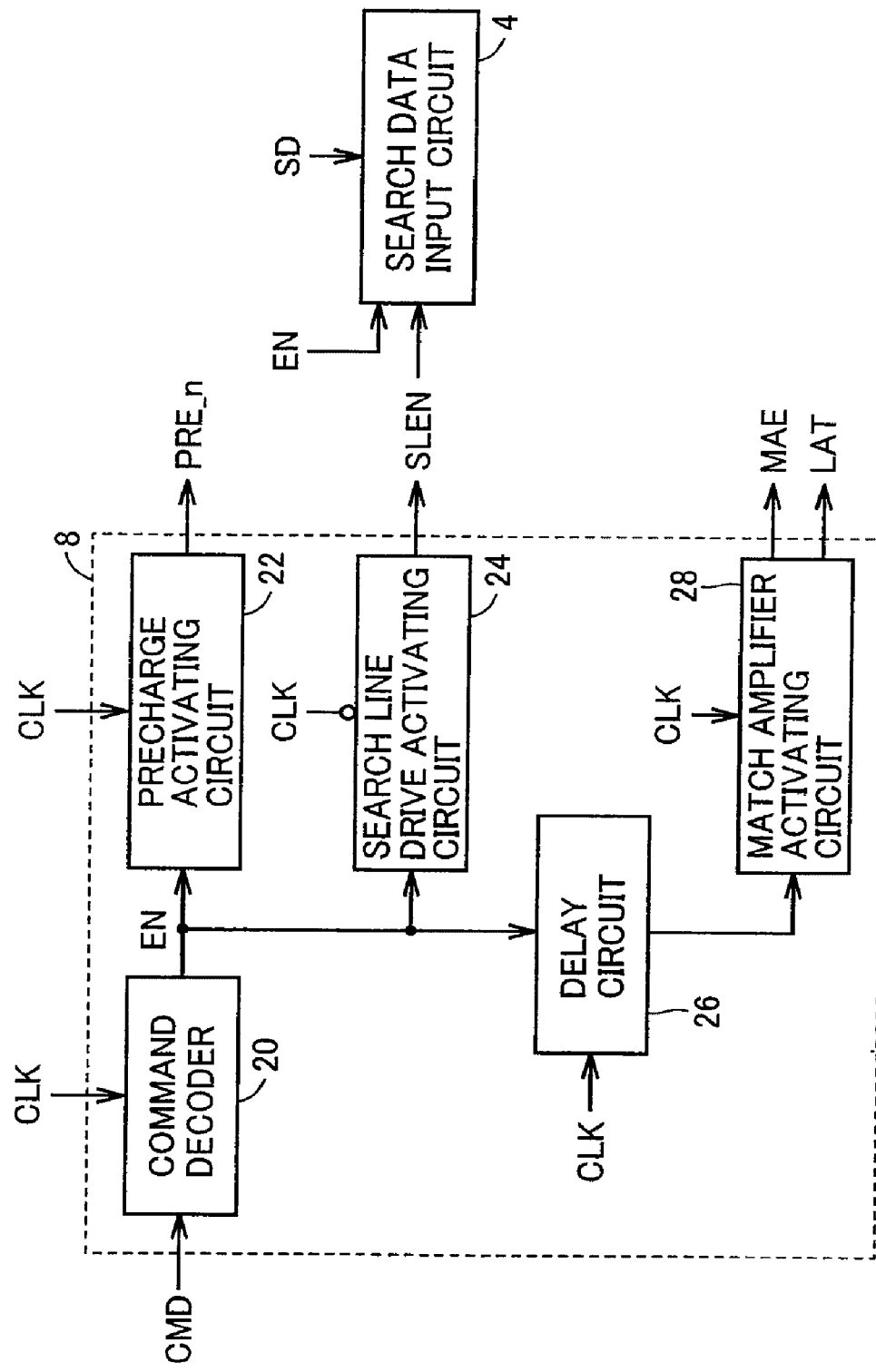
FIG. 7 schematically shows a construction of a control circuit shown in FIG. 1.

FIG. 7 shows an example of a construction of control circuit 8 shown in FIG. 1. In FIG. 7, control circuit 8 includes a command decoder 20 that decodes command CMD supplied in synchronization with clock signal CLK, and a precharge activating circuit 22 that drives and maintains precharge instructing signal PRE_n to and at the L level for a predetermined period according to a search operation instruction EN supplied from command decoder 20.

Control circuit 8 includes a search line drive activating circuit 24 changes its output logical level using the change of clock signal CLK to the L level as a trigger when search operation instruction EN is active, a delay circuit 26 that delays search operation instruction EN by one clock cycle of clock signal CLK, and a match amplifier activating circuit 28 that produces match amplifier activating signal MAE and latch instructing signal LAT according to the output signal of delay circuit 26 and clock signal CLK.

Command decoder 20 decodes command CMD in synchronization with the rising of clock signal CLK, and activates search operation instruction EN when decoded command CMD instructs the search operation. Precharge activating circuit 22 is formed of, e.g., a gate circuit receiving clock signal CLK and search operation instruction EN, and supplies precharge instructing signal PRE_n at the L level when clock signal CLK is at the H level and search operation instruction EN is at the H level.

Search line drive activating circuit 24 is formed of, e.g., a T-type flip-flop, and activates its output signal (i.e., a search line drive enable signal SLEN) using the falling of clock signal CLK as a trigger when search operation instruction EN is active. Search line drive activating circuit 24 supplies search line activation instructing signal SLEN to search data input circuit 4. Search data input circuit 4 takes in search data SD that is supplied when search operation instruction EN is active, and drives the search line according to taken search data SD when search line drive activation instructing signal SLEN is active. When search line drive activation instructing signal SLEN is inactive, search data input circuit 4 keeps both search lines SL and /SL at the L level.

Match amplifier activating circuit 28 is formed of, e.g., a gate circuit receiving the output signal of delay circuit 26 and clock signal CLK, and holds match amplifier activating signal MAE and latch instructing signal LAT at the H level when clock signal CLK and the output signal of delay circuit 26 are both at the H level.

By using control circuit 8 shown by way of example in FIG. 7, the match line can be precharged at the start of the search operation, and subsequently the search line can be driven according to the search data after completion of the precharging. Further, in a next cycle of clock signal CLK during driving of the search line, match amplifier activating signal MAE and latch instructing signal LAT can be driven to the H level for half the clock cycle period. Thereby, the control circuit can achieve the timings of the timing control signals as shown in FIG. 5.

For the circuit for generating intermediate voltage VML to be transmitted to the match line, any circuit that can produce a voltage at a level not higher than half the power supply voltage VDD and not lower than reference voltage VREF, can be used. Intermediate voltage generating circuits having various constructions can be used for the precharge voltage generating circuit.

According to the first embodiment of the invention, the precharge voltage level of the match line is set to the level of half the power supply voltage or lower, and the match line voltage is compared with the reference voltage lower than the precharge voltage, to produce the signal indicative of the search result. Therefore, the charge/discharge currents of the match line can be small, and the signal amplitude of the match line can be small. Thereby, the content addressable memory can sense the match line voltage at high speed, and can achieve the fast operation with low current consumption.

Second Embodiment

Figure 8:
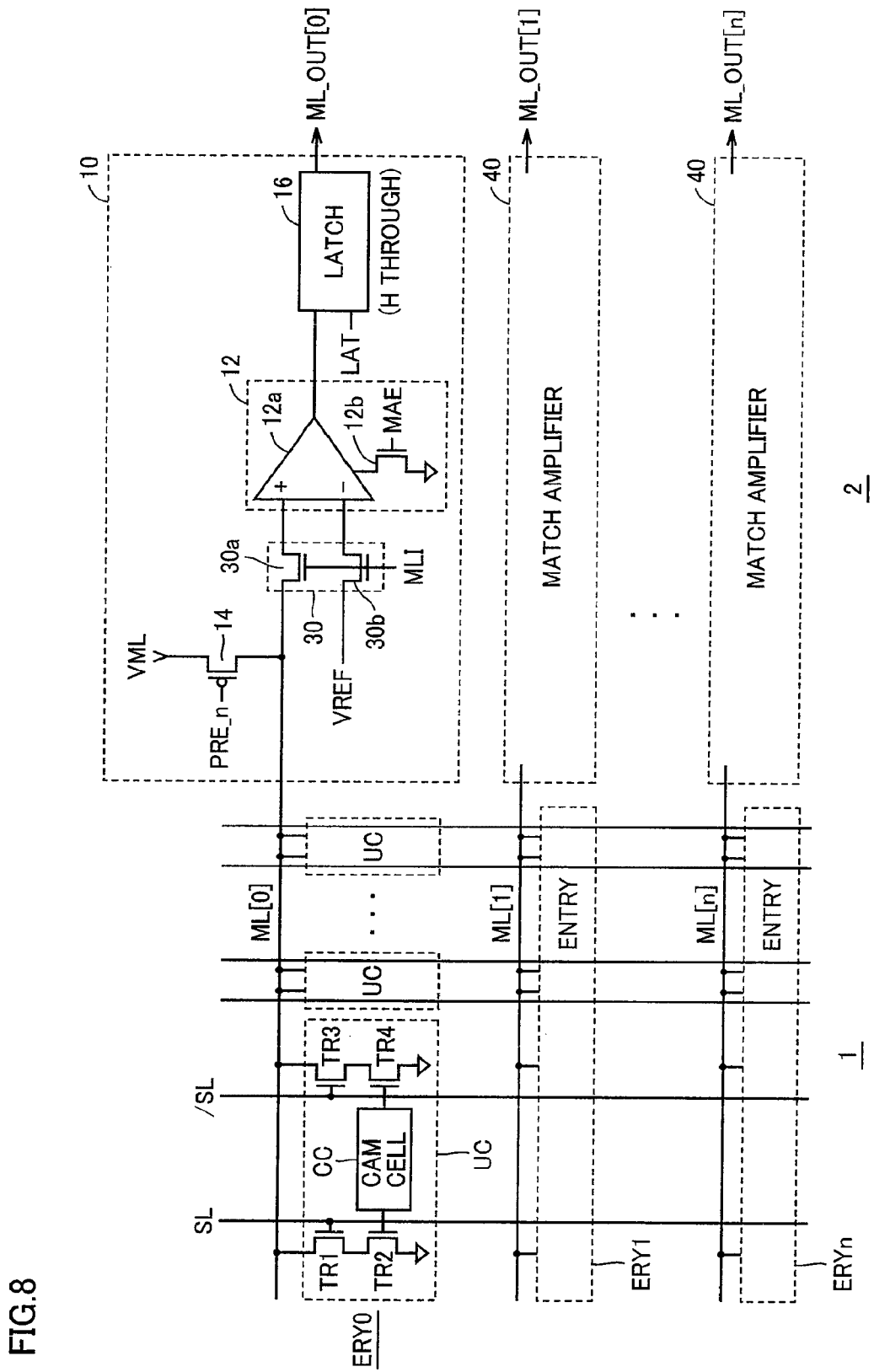
FIG. 8 schematically shows a main portion of a content addressable memory according to a second embodiment of the invention.

FIG. 8 shows a main portion of a content addressable memory according to a second embodiment of the invention. The content addressable memory shown in FIG. 8 differs from that shown in FIG. 4 in internal construction of latch amplifier 10. Specifically, an isolation gate circuit 30 is arranged at a preceding stage of differential amplifier circuit 12. Isolation gate circuit 30 includes isolation gates (charge confining gates) 30a and 30b that are selectively turned off according to an isolation instructing signal MLI. Isolation gate 30a selectively isolates match line ML from a positive input (+) of differential amplifier 12a. Isolation gate 30b shuts off transmission of reference voltage VREF to a negative input (−) of differential amplifier 12a. Other internal constructions shown in FIG. 8 are the same as those of the content addressable memory shown in FIG. 4. Corresponding portions are allotted the same reference numerals, and description thereof is not repeated.

Figure 9:
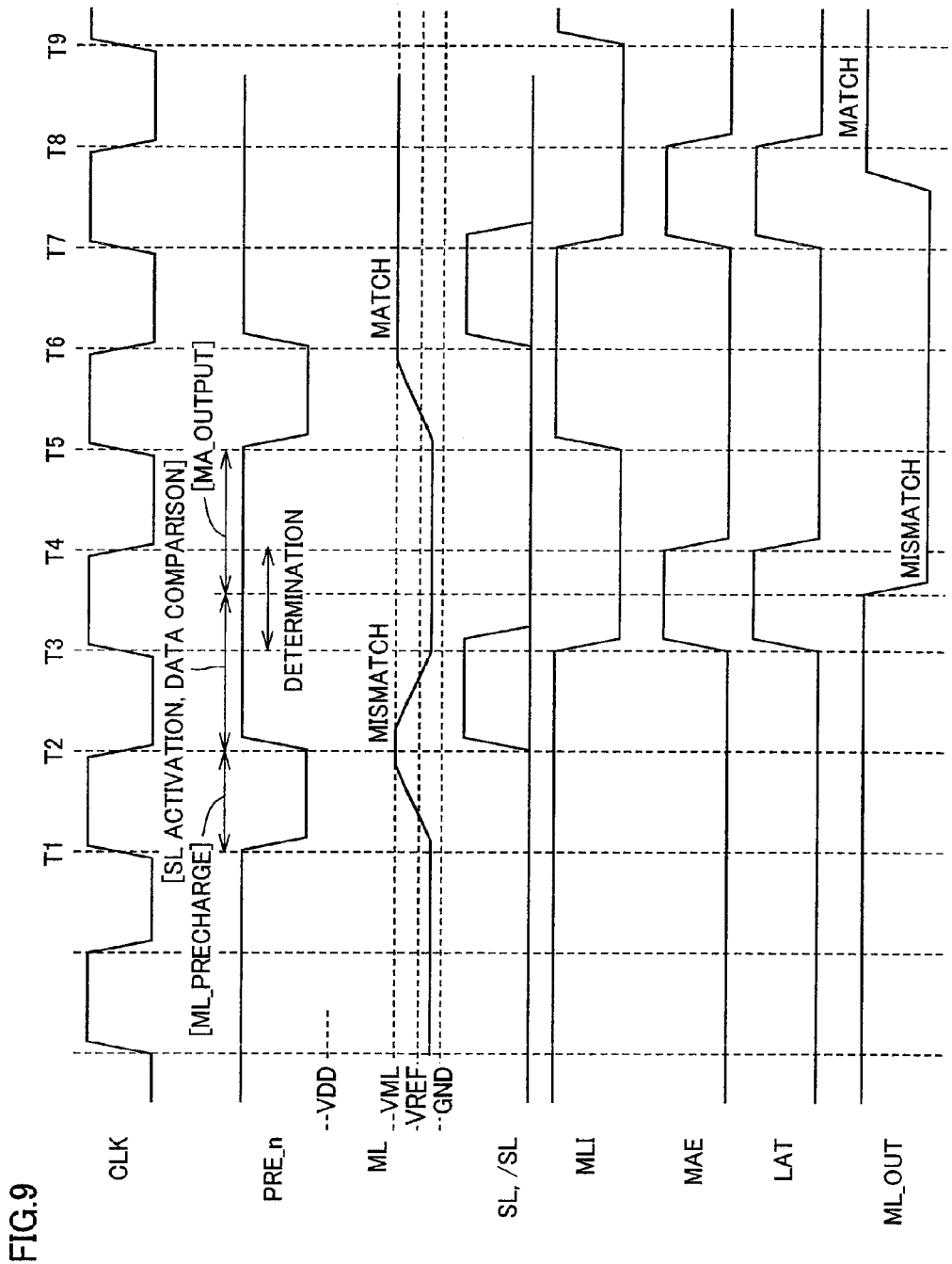
FIG. 9 is a timing chart representing an operation of the content addressable memory shown in FIG. 8.

FIG. 9 is a timing chart representing the search operation of the content addressable memory shown in FIG. 8. Referring to FIG. 9, the search operation of the content addressable memory shown in FIG. 8 will now be described.

The search cycle starts at time T1. At time T1, precharge instructing signal PRE_n attains the L level in synchronization with the rising of clock signal CLK, and each match line ML is precharged to the intermediate voltage level of precharge voltage VML.

Subsequently at time T2, search lines SL and /SL are driven from the ground voltage level to the voltage level corresponding to the search data according to the falling of clock signal CLK. When there is mismatch between the search data and the stored data in the entry corresponding to match line ML, the voltage level of match line ML lowers below reference voltage VREF.

At time T3, isolation instructing signal MLI is driven to the L level, and isolation gates 30a and 30b are turned off. Concurrently, match amplifier activating signal MAE and latch instructing signal LAT are driven to the H level. Thereby, differential amplifier circuit 12 is activated to perform the differential amplification. Also, latch 16 enters the through state to produce a signal according to the output signal of differential amplifier circuit 12.

At time T3, differential amplifier circuit 12 has already received on its positive and negative inputs the change in voltage level of match line ML and reference voltage VREF, respectively. Differential amplifier circuit 12 makes comparison (determination) between the transmitted match line voltage and the reference voltage. Isolation gate circuit 30 has already isolated match line ML from differential amplifier circuit 12. In this state, therefore, it is not necessary to drive search lines SL and /SL according to the search data, and search lines SL and /SL are driven to the ground voltage level again.

Differential amplifier circuit 12 differentially amplifies the voltages on its positive and negative inputs according to the voltage levels corresponding to the charges confined by isolation gate circuit 30.

In the amplifying operation of differential amplifier circuit 12, match line ML is isolated from differential amplifier circuit 12, and search lines SL and /SL are set to the ground voltage level. Therefore, match line ML has the charge/discharge operation stopped, and is not discharged to the level of ground voltage GND.

At time T4, the data determining operation is completed, and latch instructing signal LAT attains the L level. Thereby, latch 16 enters the latch state, and signal ML_OUT indicative of a result of the comparison enters a definite state. FIG. 9 shows the miss state, and signal ML_OUT at the L level is produced.

At time T5, the search cycle restarts, and match line ML is precharged. In this case, match line ML is at a voltage level higher than ground voltage GND, and is driven fast to the level of precharge voltage VML. Similarly to the previous search cycle, the search line is driven according to the search data, isolation gates 30a and 30b confine the charges and differential amplifier circuit 12 performs the amplification.

In the search cycle starting from time T5 in FIG. 9, the search data matches the stored data, and signal ML_OUT at the H level indicative of the match state is produced.

By using isolation gates 30a and 30b of isolation gate circuit 30, match line ML is isolated from differential amplifier circuit 12 during the sense operation (operation of the match amplifier). Thereby, the voltage amplitude of match line ML can be further reduced, and the current consumption can be further reduced. Also, it is possible to complete the precharge operation at a faster timing.

When the sense (sensing operation) is performed according to the charge confining scheme using isolation gate circuit 30, the differential amplifier circuit of the current mirror type shown in FIG. 6 may be used as differential amplifier circuit 12. However, when the sensing operation is to be performed according to the charge confining scheme, a so-called cross-coupled, latch type sense amplifier may be used for the differential amplifier circuit, whereby the search operation can be performed fast and efficiently.

Figure 10:
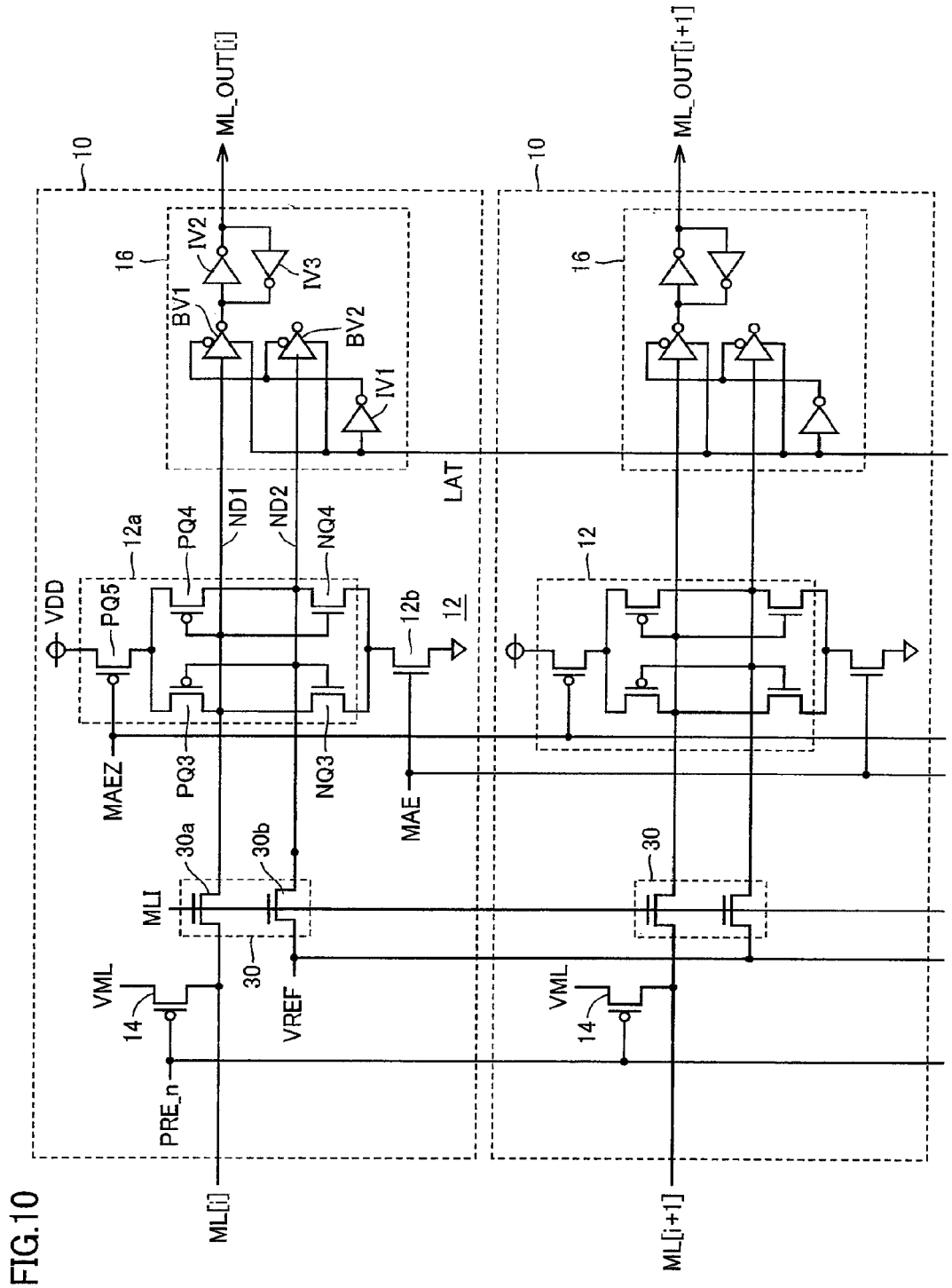
FIG. 10 schematically shows a construction of a modification of the content addressable memory according to the second embodiment of the invention.

FIG. 10 shows another construction of differential amplifier circuit 12 shown in FIG. 8. FIG. 10 shows constructions of the match amplifiers corresponding to match lines ML[i] and ML[i+1]. Differential amplifier circuit 12 and latch 16 for each match line have the same configurations. In FIG. 10, components in the match amplifier arranged for match line ML[i] representatively are allotted reference numerals.

In FIG. 10, differential amplifier 12a includes P-channel MOS transistors PQ3 and PQ4 having their gates and drains cross-coupled, N-channel MOS transistors NQ3 and NQ4 having their gates and drains cross-coupled, and an activating P-channel MOS transistor PQ5. When a complementary match amplifier activating signal MAEZ is active, P-channel MOS transistor PQ5 couples the power supply node to source nodes of MOS transistors PQ3 and PQ4 when complementary match amplifier activating signal MAEZ.

The drains of MOS transistors PQ3 and NQ3 as well as the gates of MOS transistors PQ4 and NQ4 are coupled to match line ML[i] via isolation gate 30a. The gates of MOS transistors PQ3 and NQ3 as well as the drains of MOS transistors PQ4 and NQ4 commonly receive reference voltage VREF via isolation gate 30b.

A match amplifier activation transistor 12b is further employed for differential amplifier 12a. Match amplifier activation transistor 12b couples the sources of MOS transistors NQ3 and NQ4 to the ground in response to match amplifier activating signal MAE.

Latch 16 includes inverter IV1 receiving latch instructing signal LAT, a tristate inverter buffer BV1 coupled to the drain of MOS transistor PQ3 and the gate of MOS transistor PQ4 in differential amplifier 12a, and a tristate inverter buffer BV2 coupled to the gate of MOS transistor NQ3 and the drain node of MOS transistor NQ4. Tristate inverter buffer BV1 is selectively activated in response to the output signal of inverter IV1 and latch instructing signal LAT. Tristate inverter buffer BV2 is selectively activated according to latch instructing signal LAT and the output signal of inverter IV1, but its output is in an open state.

Latch 16 further includes inverters IV2 and IV3 forming an inverter latch. Inverters IV2 and IV3 latches the output signal of tristate inverter buffer BV1 to produce search result indicating signal ML_OUT[i].

In latch 16 shown in FIG. 10, tristate inverter buffer BV2 is arranged to the node receiving reference voltage VREF for the following reason. Sense nodes ND1 and ND2 of differential amplifier 12a are made the same in load in the sense operation. Since the sense nodes ND1 and ND2 are the same in load, the cross-coupled sense amplifier forming differential amplifier 12a can precisely perform the sense operation.

In differential amplifier circuit 12 shown in FIG. 10, match amplifier activating signals MAE and MAEZ are inactive during the precharge period and search line drive period, and MOS transistor PQ4 and match amplifier activation transistor 12b are off in these periods. In isolation gate circuit 30a, isolation gates 30a and 30b are conductive. Even when sense nodes ND1 and ND2 are precharged to the levels of intermediate voltage VML and reference voltage VREF, respectively, the movement of the charges is prevented between the reference voltage line and the corresponding match line via the internal nodes of differential amplifier 12a. Thus, sense node ND1 is at a higher level than reference voltage VREF, and MOS transistor PQ4 is non-conductive. Also, MOS transistor 12b is non-conductive. Therefore, even when MOS transistor NQ4 is turned on, the source node potential thereof is at the level of reference voltage VREF, and MOS transistor NQ4 is kept non-conductive.

MOS transistor PQ3 receives reference voltage VREF on its gate. Therefore, even when MOS transistor PQ3 is turned conductive, the voltages on its source and drain are equalized when its source node rises to the level of precharge voltage VML, so that MOS transistor PQ3 is turned non-conductive. Likewise, even when MOS transistor NQ3 is turned on according to reference voltage VREF, MOS transistor NQ4 charges the common source node of MOS transistors NQ3 and NQ4 to the level of reference voltage VREF. Therefore, MOS transistor NQ3 has the same potential at its gate and source, and keeps the non-conductive state. Therefore, sense nodes ND1 and ND2 are held at the levels of precharge voltage VML and reference voltage VREF during the precharge operation, respectively.

Then, the search (data comparison) operation is executed. Even when the potential of match line ML changes according to the search data, and the potential of sense node ND1 changes, the common source node of MOS transistors PQ3 and PQ4 is kept at the level of precharge voltage VML, and the common source node of MOS transistors NQ3 and NQ4 is kept at the level of reference voltage VREF. Thereby, MOS transistors PQ3, PQ4, NQ3 and NQ4 keep the non-conductive state. Therefore, sense node ND1 is set to the voltage level corresponding to the potential of match line ML[i].

Isolation instructing signal MLI is set to the L level, and thereby isolation gate circuit 30 is turned non-conductive to confine the charges. Also, match amplifier activating signal MAE is activated. Accordingly, MOS transistor PQ5 and activation transistor 12b are turned conductive, and the sense operation (determination operation) is performed. Of sense node ND1 or ND1, the node at a higher potential is pulled up to the level of power supply voltage VDD by MOS transistor PQ3 or PQ4. The sense node at a lower potential is discharged to the level of the ground voltage by MOS transistor NQ3 or NQ4. Differential amplifier 12a is a latch type of differential amplifier circuit. While match amplifier activating signals MAE and MAEZ are active, sense nodes ND1 and ND2 latch the signals at the levels of amplified power supply voltage VDD and ground voltage.

As shown in FIG. 10, the cross-coupled sense amplifier is used for the amplifier in the match amplifier circuit, and the voltage sensing is performed according to the charge confining scheme. Thereby, the loads on sense nodes ND1 and ND2 of differential amplifier 12a can be small, and the amplifying operation can be performed fast. During the amplifying operation of differential amplifier 12a, isolation gate circuit 30 is off, and for each of match lines ML (ML[i] and ML[i+1]), the discharging operation can be stopped.

In the second embodiment of the invention, for the control circuit, the circuit substantially the same construction as the first embodiment can be employed. Thus, in the construction of control circuit 8 shown in FIG. 7, the search line drive activating circuit activates search line activating signal SLEN while clock signal CLK is at the L level. Further, as for isolation instructing signal MLI, isolation instructing signal MLI is driven to and maintained at the L level according to the output signal of delay circuit 26 shown in FIG. 8 during one clock cycle of clock signal CLK.

According to the second embodiment of the invention, as described above, the match amplifier senses the voltage level of the match line according to the charge confining scheme. Therefore, the voltage amplitude of the match line can be further reduced, and the voltage sensing of the match line can be performed fast.

Third Embodiment

Figure 11:
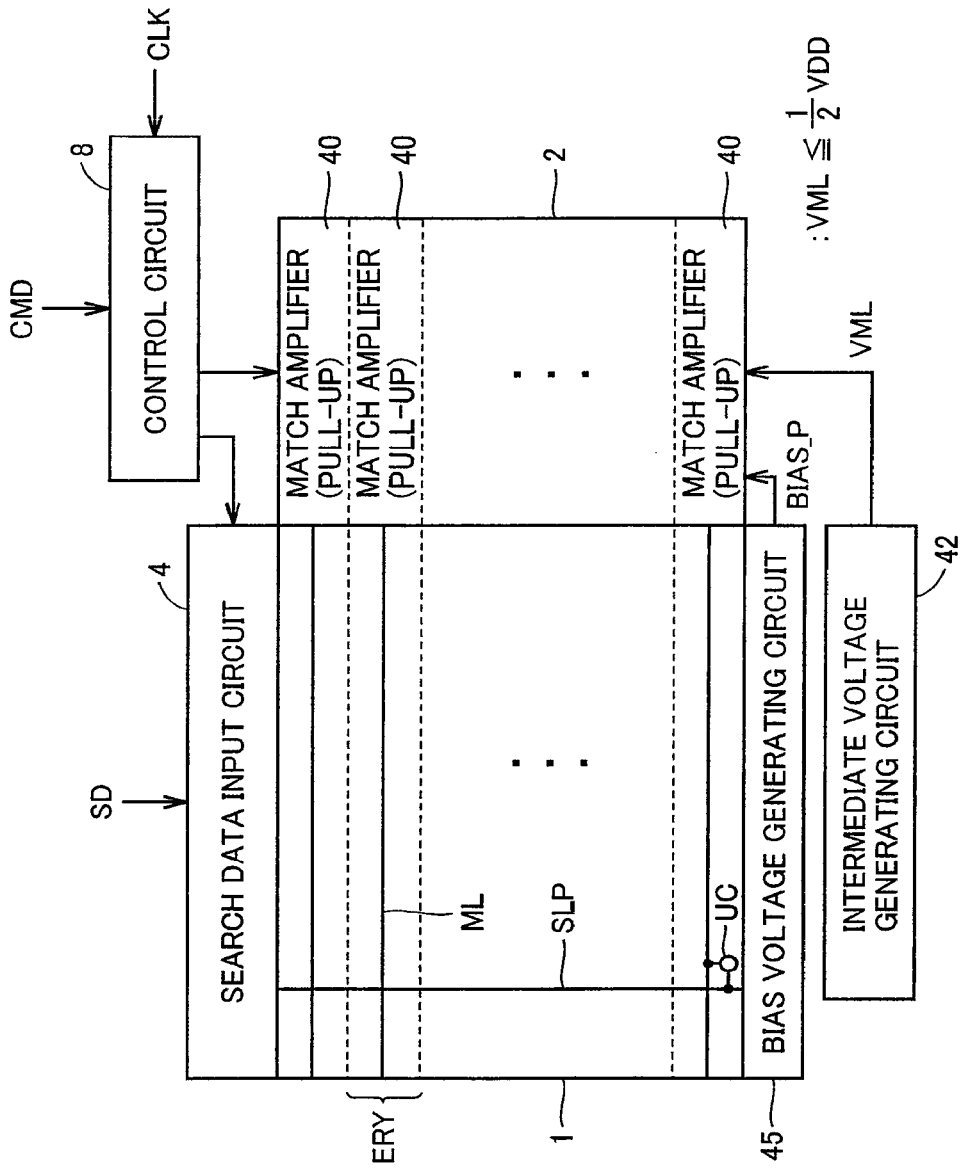
FIG. 11 schematically shows a whole construction of a content addressable memory according to a third embodiment of the invention.

FIG. 11 schematically shows a whole construction a content addressable memory according to a third embodiment of the invention. Similarly to the first and second embodiments, in the content addressable memory shown in FIG. 11, memory cell array 1 is divided into a plurality of entries ERY. Match line ML is arranged for each entry ERY, and each search line pair SLP (search lines SL and /SL) is arranged for all entries ERY. The plurality of search line pairs constitute a search data bus.

Match determining circuit 2 includes match amplifiers 40 provided corresponding to respective entries ERY. Match amplifier 40 has a pull-up function of supplying a pulling-up current to a corresponding match line in the data comparing operation. A bias voltage generating circuit 45 is arranged for controlling the pull-up current supply in match amplifier 40. Match amplifier 40 supplies a pull-up current of a restricted current value to corresponding match line ML according to a bias voltage BIAS_P provided from bias voltage generating circuit 45.

An intermediate voltage generating circuit 42 produces precharge voltage VML, as a comparison determination reference voltage, to match amplifier 40 in match determining circuit 2. Therefore, reference voltage VREF is not used. Precharge voltage VML is used as a precharge voltage of the match line, and is also used in the operation of determining the voltage level of the match line so that the occupation area and current consumption of intermediate voltage generating circuit 42 can be made small.

Similarly to the first and second embodiments, this content addressable memory includes search data input circuit 4 and control circuit 8, and the respective internal operation cycles in the search cycle are set under the control of control circuit 8 (based on clock signal CLK).

Figure 12:
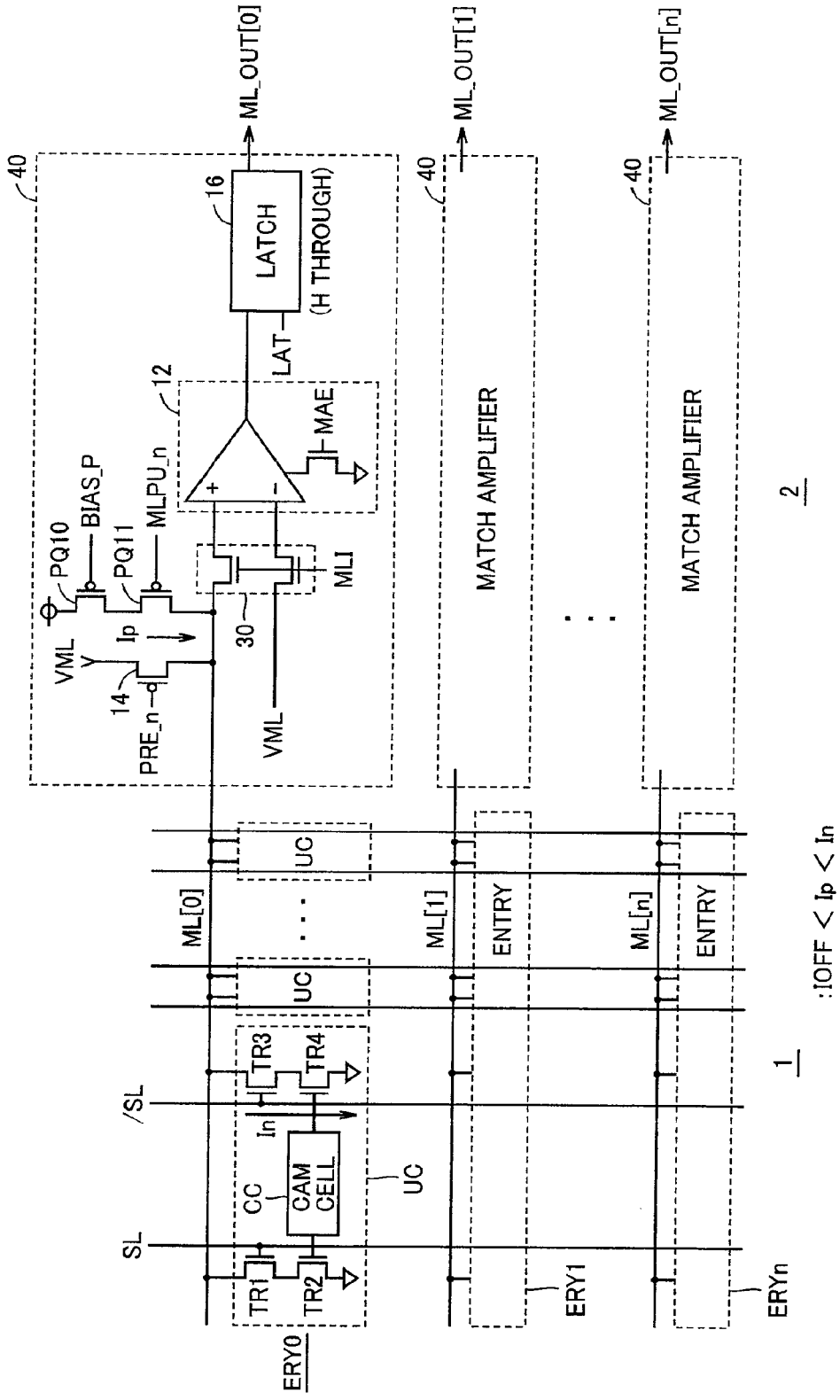
FIG. 12 schematically shows a main portion of the content addressable memory according to the third embodiment of the invention.

FIG. 12 specifically shows a construction of match amplifier 40 shown in FIG. 11. FIG. 12 representatively shows a construction of the match amplifier arranged for match line ML[0]. Match amplifiers having the same constructions as that in FIG. 12 are arranged for the other match lines, respectively.

Match amplifier 40 shown in FIG. 12 differs from the match amplifier shown in FIG. 8 in the following construction. P-channel MOS transistors PQ10 and PQ11 are arranged in series between the power supply node and corresponding match line ML (ML[0]). MOS transistor PQ10 receives bias voltage BIAS_P on its gate, and MOS transistor PQ11 receives a pull-up instructing signal MLPU_n on its gate. Other constructions of match amplifier 40 shown in FIG. 12 as we as the constructions of respective entries ERY (ERY0-ERYn) are the same as those shown in FIG. 8. Corresponding portions bear the same reference numbers, and description thereof is not repeated.

MOS transistor PQ10 supplies a current of a constant magnitude according to bias voltage BIAS_P. This current is smaller than a one-bit pull-out current, In, that flows through one-bit unit cell out of the unit cells in one entry when the unit cell is conductive and is larger than a leakage current IOFF that flows when all the unit cells in the corresponding entry are non-conductive.

One-bit pull-out current In indicates a current flowing through a series connection of the conductive transistors in the unit cell in the miss state, and does not includes a leakage current in a path of a non-conductive transistor(s). In the unit cell in the miss state, one-bit pull-out current In and the off-leakage current flow. However, this one-bit pull-out current In is much larger than a current flowing through the series connection of the non-conductive transistors (TR1 and TR2, or TR3 and TR4). In the unit cell in the miss state, the series connection of the non-conductive MOS transistors (TR1 and TR2) in the unit cell in the miss state has a combined resistance value smaller than that of the series connection of the MOS transistors in the unit cell in the match state, and causes a leakage current much smaller than an off-leakage current Ioff. In the following description, it is assumed that a one-bit miss current Imiss including an off-leakage component has the same magnitude as one-bit pull-out current In unless otherwise specified. One-bit miss current Imiss is a current flowing through the unit cell in the miss state.

Precharge voltage VML is used as the comparison reference voltage for sensing the voltage level of the match line. Differential amplifier circuit 12 may be formed of either the differential amplifier circuit of the current mirror type shown in FIG. 6 or the differential amplifier circuit of the cross-coupled type (the cross-coupled, latch type sense amplifier) shown in FIG. 10.

Figure 13:
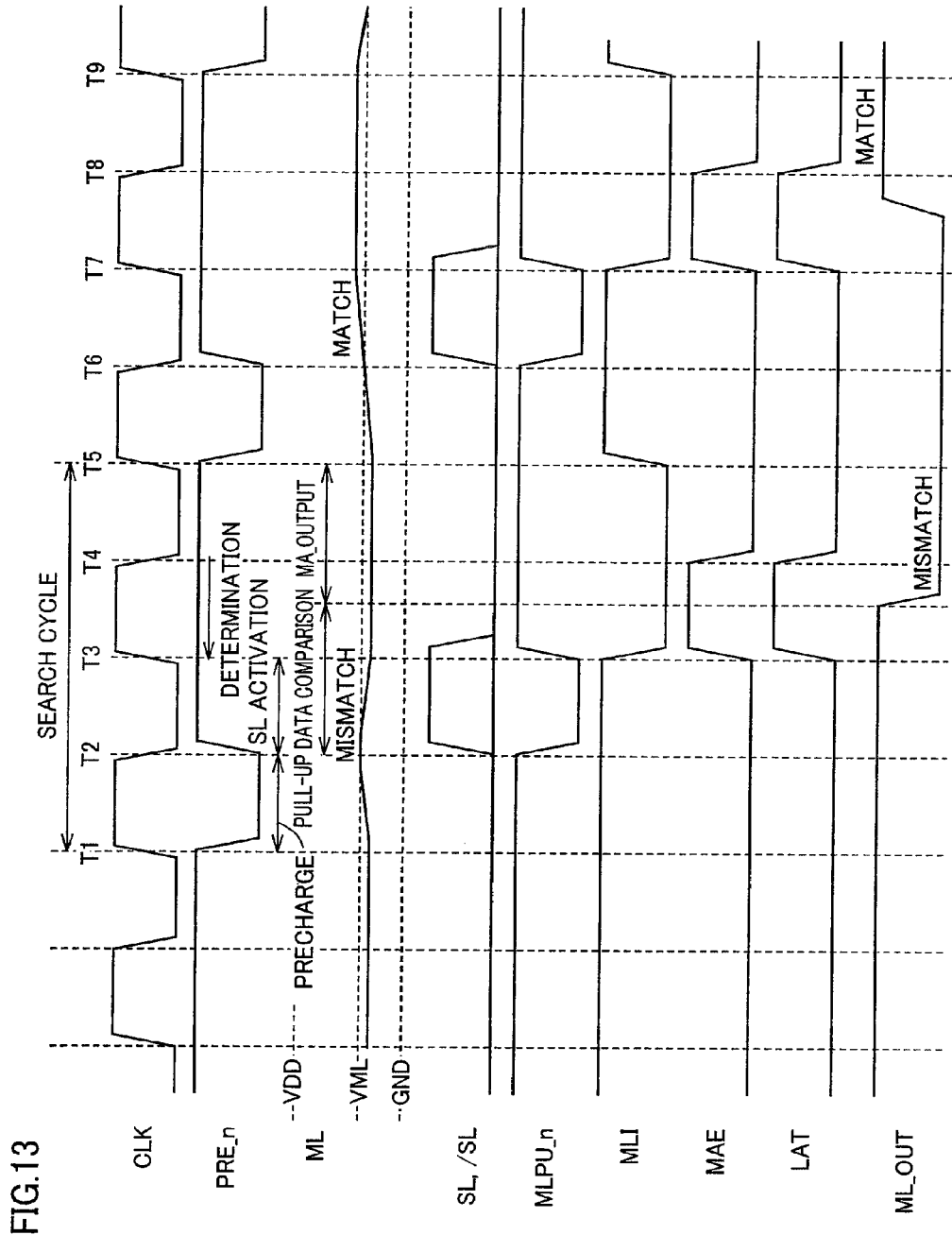
FIG. 13 is a timing chart representing an operation of the content addressable memory shown in FIG. 12.

FIG. 13 is a timing chart representing a search operation of a content addressable memory shown in FIG. 12. Referring to FIG. 13, the search operation of the content addressable memory shown in FIG. 12 will now be described.

At time T1, the search cycle starts. When the search cycle starts, precharge instructing signal PRE_n is driven to the L level and precharge transistor 14 turns conductive. Accordingly, match line ML is charged, and has the voltage level driven to the intermediate voltage level of precharge voltage VML.

When the precharge operation is completed, precharge instructing signal PRE_n is made inactive at time T2. Subsequently or concurrently, search lines SL and /SL are driven to the levels of the power supply voltage and ground voltage according to the search data. Also, pull-up instructing signal MLPU_n attains the L level. Thereby, MOS transistor PQ11 is turned on to supply a pull-up current Ip from the power supply node to corresponding match line ML via MOS transistors PQ10 and PQ11. Pull-up current Ip is smaller than one-bit pull-out current In, and is larger than all-bit off-leakage current IOFF. Therefore, when the search data does not match the stored data in the entry, corresponding match line ML is discharged, and the voltage level thereof lowers below precharge voltage VML. The match line in the match state has the voltage lowering due to the leakage current compensated for by pull-up current and has the voltage level raised as will be described later.

At time T3, the active period of search lines SL and /SL expires. Also, the pull-up current supplying period expires, and pull-up instructing signal MLPU_n attains the H level to stop the supply of the pull-up current to the match line. At time T3, the determination cycle starts, and isolation instructing signal MLI attains the L level. Also, match amplifier activating signal MAE is made active, and latch instructing signal LAT attains the H level. Therefore, at the sense nodes (+ and −) of differential amplifier circuit 12, the voltage of corresponding match line ML and precharge voltage VML are confined, and differential amplifier circuit 12 performs the differential amplification of the voltages on the sense nodes. In the miss state (mismatch state), the output signal of differential amplifier circuit 12 attains the L level of the ground voltage, and search result indicating signal ML_OUT is set to the L level via latch 16.

At time T4, the period of the data comparison and latch amplifier output ends. Thereby, match amplifier activating signal MAE and latch instructing signal LAT are driven to the L level. Thereby, latch 16 enters the latch state, and differential amplifier circuit 12 becomes inactive. At this time, isolation instructing signal MLI is at the L level, and isolation gate circuit 30 is off. In this state, the search operation is already completed, and search lines SL and /SL are both at the ground voltage level. Therefore, the discharging path of match line ML is not present, and only the off-leakage current of unit cell UC in the entry is present. Thereby, the match line substantially is kept at the voltage level attained at time T3 for a period between times T3 and T5.

At time T5, a next search cycle starts, so that precharge instructing signal PRE_n attains the L level again, and match line ML is driven to the level of precharge voltage VML.

At time T6, the voltage levels of search lines SL and /SL are set according to the search data. Also, pull-up instructing signal MLPU_n is made active and pull-up current Ip is supplied to match line ML. In the match state where the search data matches the stored data of the corresponding entry, match line ML allows the flow of only off-leakage current IOFF of all the bits of unit cells UC in the corresponding entry (=m·Ioff where m is the number of unit cells in the entry). This all-bit off-leakage current IOFF is compensated for by pull-up current Ip (IOFF<In), and pull-up current Ip raises the voltage level of match line ML in the match state.

At time T7, match amplifier activating signal MAE becomes active, and isolation instructing signal MLI attains the L level. Accordingly, isolation gate circuit 30 is turned non-conductive, and differential amplifier circuit 12 executes the amplification in the charge confining state. In the match state, search result indicating signal ML_OUT supplied from latch 16 attains the H level of the power supply voltage level.

The voltage level of match line ML in the match state is higher than that of precharge voltage VML. In the next search cycle, the precharging by precharge transistor 14 drives match line ML at the raised voltage level to the level of precharge voltage VML. It is sufficient for Intermediate voltage generating circuit 42 (see FIG. 11) generating intermediate voltage VML to include a construction for discharging the raised potential of match line ML upon rise of the match line voltage. Thereby, even when match line ML has the voltage level raised above precharge voltage VML, it can be reliably set to precharge voltage VML through the precharging.

The pull-up operation performed on match line ML by MOS transistor PQ10 can be stopped after isolation gate circuit 30 is turned off to confine the charges. Therefore, even when match line ML is in the match state, the match line does not fully swing to the level of power supply voltage VDD, and the current consumption can be small.

Figure 14:
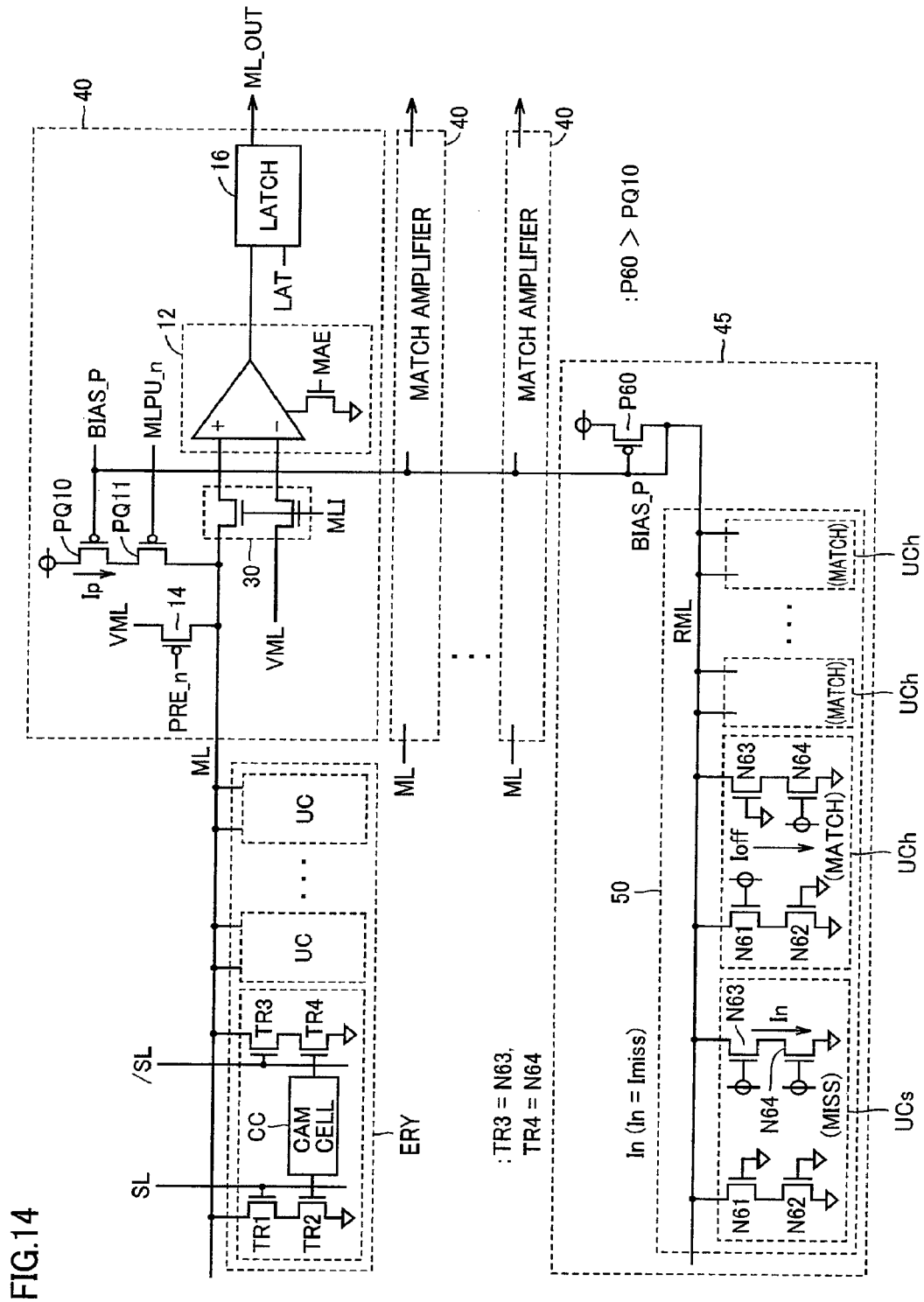
FIG. 14 schematically shows a main portion of a content addressable memory of a modification of the third embodiment of the invention.

FIG. 14 shows an example of a construction of bias voltage generating circuit 45 shown in FIG. 11. In FIG. 14, bias voltage generating circuit 45 includes a replica entry 50 having substantially the same construction as the path for discharging the match line of one entry ERY. Replica entry 50 includes replica unit cells equal in number to unit cells UC included in one entry ERY of the memory cell array. One replica unit cell UCs is set to the miss state or in the mismatch state, and the other replica unit cells UCh are set to the match state. Replica unit cells UCs and UCh are coupled to a common replica match line RML. Replica match line RML supplies a current via a diode-connected P-channel MOS transistor P60. P-channel MOS transistor P60 functions as a current/voltage converting element to produce bias voltage BIAS_P on its gate.

Each of replica unit cells UCs and UCh has transistors N61, N62, N63 and N64 of the same size (the same ratio of a channel width to a channel length) as transistors TR1, TR2, TR3 and TR4 in the match line discharging path of unit cell UC in entry ERY, respectively, and causes a current flow of the same magnitude as unit cell UC. In replica unit cell UCs in the miss state, MOS transistors N61 and N62 are non-conductive, and MOS transistors N63 and N64 are conductive.

In replica unit cell UCs in the miss state or the mismatch state, therefore, a current of the same magnitude as one-bit pull-out current In of unit cell. UC is discharged from replica match line RML to the ground node. In replica unit cell UCh, one of MOS transistors N61 and N62 is non-conductive, and the other is conductive. Also, one of MOS transistors N63 and N64 is conductive, and the other is non-conductive. In this discharging path, one of the MOS transistors is conductive, and the other is non-conductive, whereby the same state as the match state in unit cell UC of entry ERY can be achieved. In unit cell UC in the match state, one of MOS transistors TR1 and TR2 is off, and one of MOS transistors TR3 and TR4 is off. Therefore, replica unit cell UCh discharges the current of the same magnitude as off-leakage current Ioll in unit cell UC.

Therefore, MOS transistor P60 supplies a current of (In+ (m−1)·Ioff), where m represents a total number of replica unit cells UCh and UCs in the replica entry, or the number of unit cells in one entry ERY.

MOS transistor P60 is larger in size (the ratio of the channel width to the channel length) than MOS transistor PQ10. Therefore, current Ip passing through MOS transistor PQ10 is smaller than the current passing through the match line corresponding to the entry in the one-bit miss state. Using replica entry 50, replica unit cell UCs of one bit is set to the miss state, and other replica unit cells UCh are set to the match state. Thereby, replica match line RML can cause a flow of the current of the same magnitude as the current that passes through the match line in the one-bit miss state.

MOS transistors P60 and PQ10 form the current mirror circuit, and the transistor sizes (current supplying capability) of these transistors are adjusted. Thereby, match line ML can cause a flow of the current smaller than one-bit pull-out current In and larger than leakage current IOFF flowing in the all-bit off state. Thereby, the comparison and search operation can be performed using precharge voltage VML as comparison reference voltage.

In the above description, a current smaller than one-bit pull-out current In flows as pull-up current Ip of the match line. However, the current value of the pull-up current may be restricted to be smaller than that of current Imiss flowing through the match line in the one-bit miss state. The bias voltage generating circuit shown in FIG. 14 produces bias voltage BIAS_P is configured to satisfy this condition.

[Modification]

Figure 15:
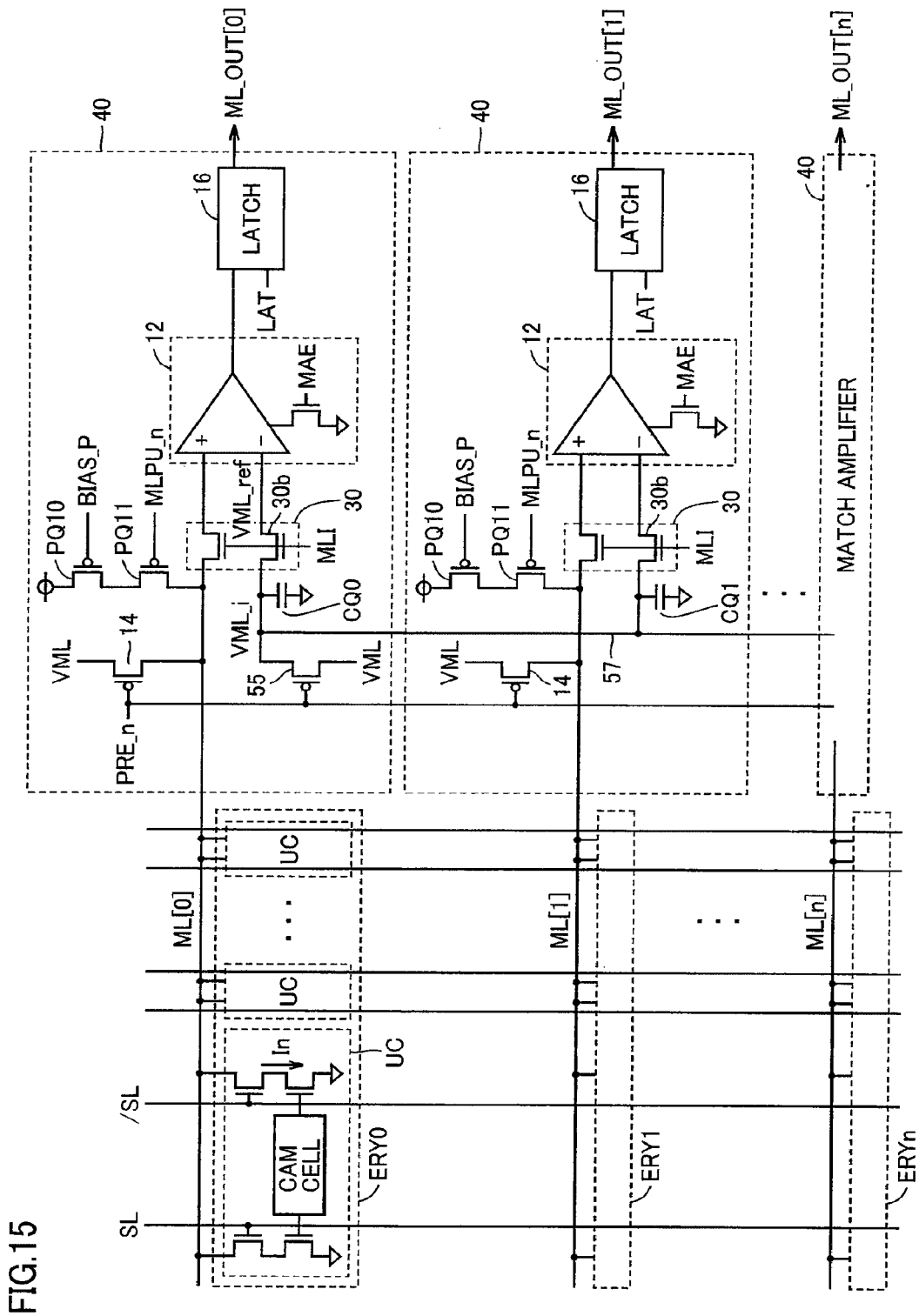
FIG. 15 schematically shows a main portion of a content addressable memory according to a second modification of the third embodiment of the invention.

FIG. 15 shows a construction of a modification of the third embodiment according to the invention. The content addressable memory shown in FIG. 15 differs from the content addressable memory shown in FIG. 14 in the following construction. In each match amplifier 40, a capacitance element CQ (CQ0, CQ1, . . . ) is arranged neighboring to isolation gate 30b of isolation gate circuit 30 and spaced from differential amplifier circuit 12 with isolation gate circuit 30 in between. These capacitance elements CQ are commonly supplied with precharge voltage VML via a P-channel MOS transistor 55 that is selectively turned on according to precharge instructing signal PRE_n. Other constructions of the content addressable memory shown in FIG. 15 are the same as those of the content addressable memories shown in FIGS. 12 and 14. Corresponding portions are allotted the same reference numerals, and description thereof is not repeated.

In the construction of the content addressable memory shown in FIG. 15, MOS transistors 14 and 55 are made conductive when precharge instructing signal PRE_n is active. Therefore, precharge voltage VML is supplied to capacitance elements CQ (CQ1, CQ2, . . . ) in parallel with the operation of precharging the match lines ML (ML[0]-ML[n]) to the level of precharge voltage VML. When precharge instructing signal PRE_n is inactive, a charged voltage VML_i of capacitance elements CQ (CQ1, CQ2, . . . ) is at the same level as the precharge voltage on the match line when the precharging is completed. In the search operation, precharge voltage VML_i of capacitance elements CQ (CQ1, CQ2, . . . ) is confined by isolation gate circuit 30, and is used as a comparison reference voltage VML_ref for comparison with the potential of the corresponding match line. When differential amplifier circuit 12 operates, this comparison reference voltage VML_ref can be kept at substantially the same level as the precharge voltage of the match line. Even when variations occur in voltage level of precharge voltage VML produced by the intermediate voltage generating circuit in the memory, the precharge voltage level attained by the precharge can be reliably used as the comparison reference voltage in each search cycle. Thereby, a sufficient margin can be ensured for the amplifying operation (sense operation) of differential amplifier circuit 12.

Even when the voltage level of precharge voltage VML produced by the intermediate voltage generating circuit lowers due to the precharge operation, it can be restored to the original voltage level. The various methods for restoring the voltage level can be considered depending on the construction of the intermediate voltage generation circuit. Therefore, precharge voltage VML attained at the end of the precharging may be different in level from precharge voltage VML attained at the start of the sense operation (differential amplification). However, precharge voltage VML is held in capacitance elements CQ (CQ1, CQ2, . . . ) when the precharging is completed, and such voltage difference of the precharge potential can reliably avoided to set comparison reference voltage VML_ref to the same voltage level as the precharge voltage of the match line.

A signal line 57 is arranged commonly to capacitance elements CQ0, CQ1, . . . , and a precharge voltage transistor 55 is shared among match amplifiers 40, so that match amplifiers 40 can use the same comparison reference voltage level. Accordingly, in the determination cycle, match amplifier 40 can perform accurately the differential amplification, using the comparison reference voltage at the same level so that the deviations in definition timing of determination result can be small.

According to the third embodiment of the invention, as described above, the same voltage level as the precharge voltage level is used as the comparison reference voltage. Therefore, the occupation area and power consumption of the internal voltage generating circuit can be reduced. Further, by supplying the pulling-up current in activation of the match line, the voltage level of the match line can be reliably set higher or lower than the precharge voltage level depending on the search result, so that the search and determination operation can be accurately performed. Provision of isolation gate circuit 30 can reduce the pull-up period of the match line, and can reduce the voltage amplitude of the match line so that the current consumption can be small.

The capacitance element holds the precharge voltage attained at the end of the match line precharging. Therefore, the determination operation can be performed using the precharge voltage level of the match line as the comparison reference voltage, and thus can be performed with a large noise margin and high accuracy.

The same effects as those of the first to third embodiments can also be provided.

Fourth Embodiment

Figure 16:
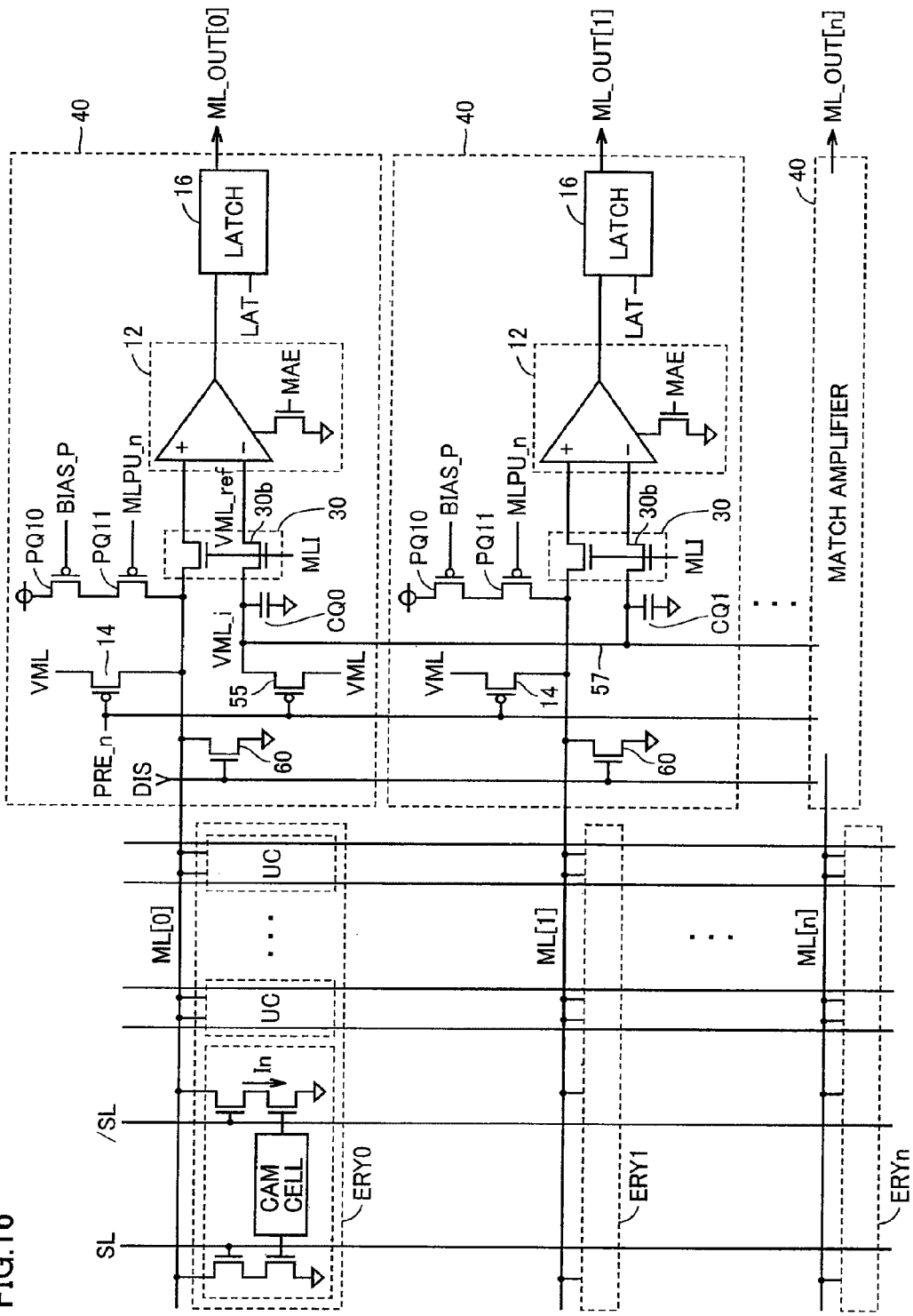
FIG. 16 schematically shows a main portion of a content addressable memory according to a fourth embodiment of the invention.

FIG. 16 shows a main portion of a content addressable memory according to a fourth embodiment of the invention. The content addressable memory shown in FIG. 16 differs from the content addressable memory shown in FIG. 15 in the following construction. An N-channel MOS transistor 60 is arranged corresponding to each of match lines ML (ML[0]-ML[n]) for discharging the corresponding match line to the ground voltage level in response to a discharge instructing signal DIS. Other constructions of the content addressable memory shown in FIG. 16 are the same as those of the content addressable memory shown in FIG. 15. Corresponding portions bear the same reference numbers, and description thereof is not repeated.

Figure 17:
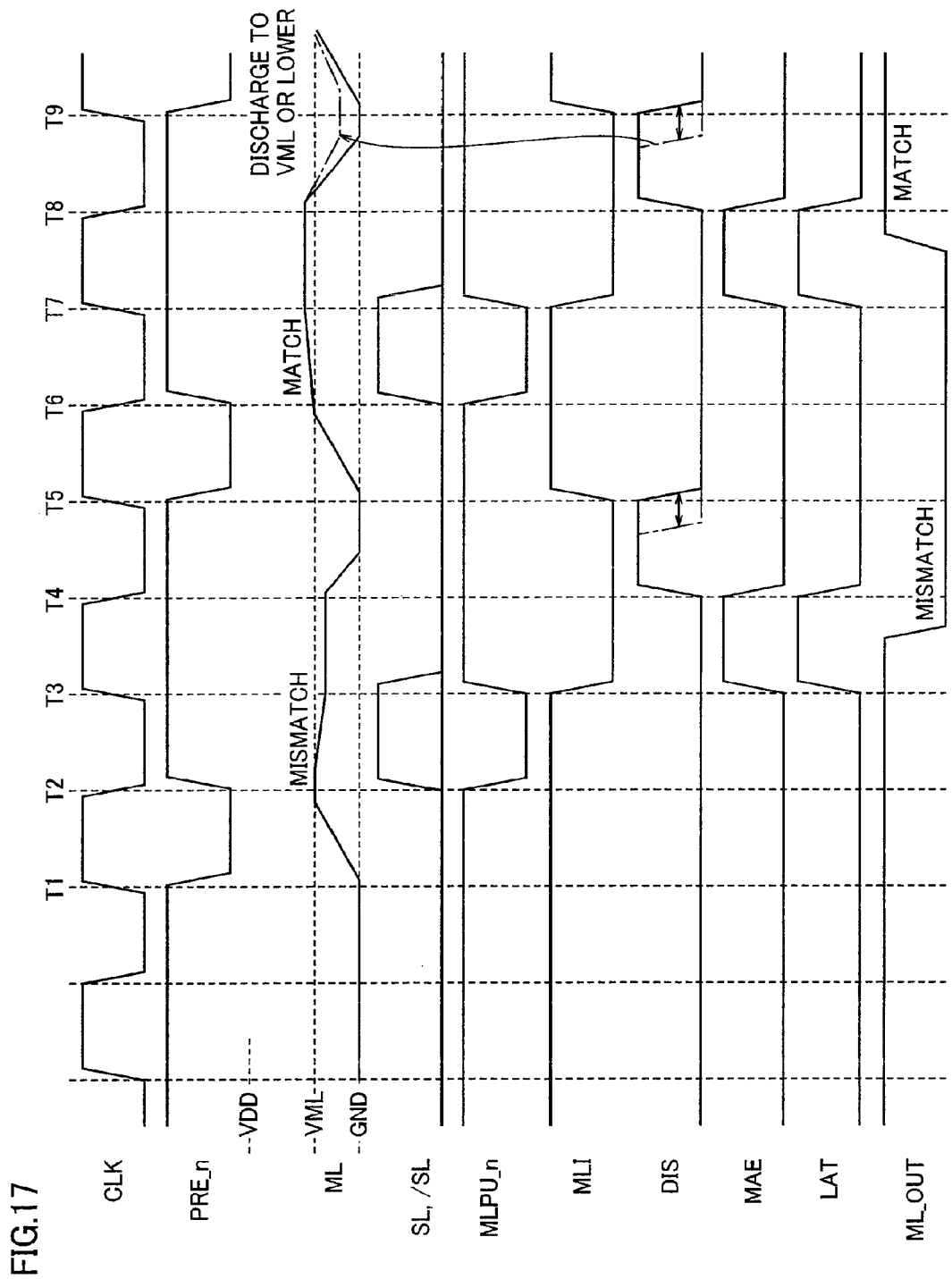
FIG. 17 is a timing chart representing an operation of the content addressable memory shown in FIG. 16.

FIG. 17 is a timing chart representing a search operation of the content addressable memory shown in FIG. 16. Referring to FIG. 17, the operation of the content addressable memory shown in FIG. 16 will now be described.

At time T1, the search cycle starts. When the search cycle starts at time T1, precharge instructing signal PRE_n is first activated. Accordingly, match lines ML (ML[0]-ML[n]) are precharged to precharge voltage VML at the intermediate voltage level via corresponding precharge transistors 14, respectively.

At time T2, the search line activation and the pull-up operation are performed, pull-up instructing signal MLPU_n becomes active and search lines SL and /SL are supplied with the search data. When the corresponding entry is in the mismatch state, the operation similar in the third and fourth embodiments is performed. Thus, match line ML is discharged via the unit cell in the miss state, and the voltage level thereof lowers from precharge voltage VML.

At time T3, the search line activation and pull-up operation are completed, and sensing the data and outputting the result of sensing are performed. Specifically, at time T3, pull-up instructing signal MLPU_n is driven to the H level, and both search lines SL and /SL are driven to the ground voltage level. Also, match amplifier activating signal MAE becomes active, and latch instructing signal LAT attains the H level. Discharging of match line ML ends, isolation gate circuit 30 enters the cut-off state in response to isolation instructing signal MLI. Differential amplifier circuit 12 performs the differential amplification according to the charge confining manner, and latch 16 produces output ML_OUT. In the mismatch state, search result indicating signal ML_OUT is at the ground voltage level.

When search result indicating signal ML_OUT is in the definite state, discharge instructing signal DIS becomes active at time T4, and also match amplifier activating signal MAE becomes inactive. Further, latch instructing signal LAT attains the L level, and latch 16 enters the latch state. In this state, isolation gate circuit 30 is in the shut-off state. Match line ML is discharged to the ground voltage level via MOS transistor 60.

A next search cycle starts at time T5. According to the activation of precharge instructing signal PRE_n, match line ML is driven from the ground voltage level to the level of precharge voltage VML. Thereafter, the search line is activated and the pull-up current is supplied at time T6. The pull-up current raises the voltage level of match line ML in the match state to the level above precharge voltage VML.

At time T7, a cycle of determining and outputting the data search result is executed. In this cycle, isolation gate circuit 30 attains the shut-off state in response to isolation instructing signal MLI being at the L level. Match amplifier activating signal MAE becomes active, and further latch instructing signal LAT attains the H level. Search result indicating signal ML_OUT is driven to the H level indicating the match state.

At time T8, the operation of determining the comparison result and outputting the search result ends, and match amplifier activating signal MAE is made inactive. Also, latch instructing signal LAT attains the L level, and search result indicating signal ML_OUT is kept in the latched state at the H level. At time T8, discharge instructing signal DIS attains the H level again, and discharging transistors 60 are turned on to discharge the respective match lines ML. Match line ML in the match state is at a voltage level higher than precharge voltage VML, and is driven by the discharging to a voltage level (the ground voltage level in FIG. 17) lower than precharge voltage VML.

Precharging is performed in the search cycle starting at time T9 to drive match line ML in the match state to the level of precharge voltage VML.

As indicated by an alternate long and short dash line in FIG. 17, where discharge instructing signal DIS is produced in a one-shot pulse form, match line ML in the match state may be configured to stop the discharging at a voltage level higher than ground voltage level. In the next search cycle, the match line in the match state is precharged to the precharge voltage level from the voltage level between precharge voltage VML and ground voltage GND.

By using this discharging transistor 60, the precharging of match line ML is always performed in the charging direction and therefore is the pulling-up operation. Thus, there is no need in the intermediate voltage generating circuit for generating precharge voltage VML to provide a construction for discharging the voltage level of precharge voltage VML to hold a predetermined voltage level, and the circuit configuration can be simple. For example, a circuit that produces precharge voltage VML can be implemented by a circuit construction similar to a feed-back type internal voltage down converter (VDC) configured by a comparison circuit and a current drive transistor. Alternatively, the circuit for producing precharge voltage VML may be implemented by utilizing a source-follower mode operation of an N-channel MOS transistor to hold a gate potential of the source-follower transistor at a predetermined voltage level.

In this case, a circuit for lowering the voltage level of intermediate voltage VML upon rising thereof is not required in the feed-back type control circuit. When the source-follower transistor is utilized, a source-follower transistor (P-channel MOS transistor) discharging precharge voltage VML is not required as the source-follower transistor. Therefore, the circuit construction can be simple, and the current consumption of the circuit for generating precharge voltage VML can be reduced.

Figure 18:
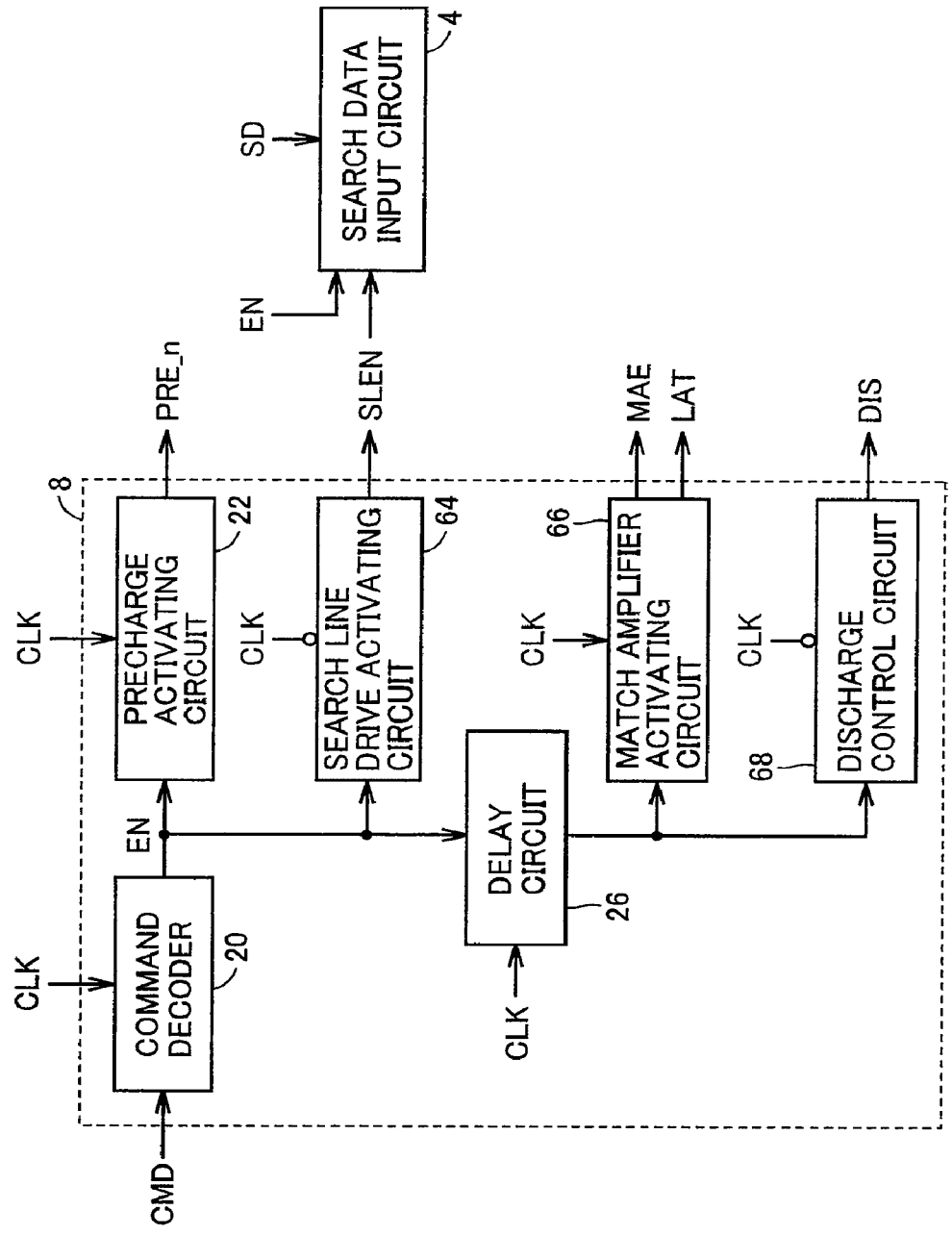
FIG. 18 schematically shows a construction of a control circuit used in a fourth embodiment of the invention.

FIG. 18 schematically shows a construction of a control circuit used in the fourth embodiment. In FIG. 18, control circuit 8 includes command decoder 20 that decodes externally supplied command CMD in synchronization with clock signal CLK, and precharge activating circuit 22 that produces precharge activating signal PRE_n according to search operation instruction EN supplied from command decoder 20 and clock signal CLK.

Control circuit 8 further includes a search line drive activating circuit 64 for producing search line activating signal SLEN, delay circuit 26 for delaying search operation instruction EN, a match amplifier activating circuit 65 for producing match amplifier activating signal MAE, and latch instructing signal LAT according to the output signal of delay circuit 26, and a discharge control circuit 68 for producing the discharge instructing signal according to the output signal of delay circuit 26.

When search operation instruction EN is active, search line drive activating circuit 64 maintains search line activating signal SLEN for activating the search line in the active state during a period of the L level of clock signal CLK.

Delay circuit 26 delays search operation instruction EN by one clock cycle period. When the output signal of delay circuit 26 is active, match amplifier activating circuit 66 drives match amplifier activating signal MAE and latch instructing signal LAT to the H level in response to the H level of clock signal CLK.

Discharge control circuit 68 activates, according to the output signal of delay circuit 26, discharge instructing signal DIS in synchronization with the falling of clock signal CLK.

Discharge control circuit 68 may drive discharge instructing signal DIS to the L level while clock signal CLK is at the L level, or may drive discharge instructing signal DIS to the H level in a one-shot pulse form in synchronization with the falling of clock signal CLK (in a manner corresponding to a waveform represented by alternate long and short dash line in FIG. 17).

According to the fourth embodiment of the invention, as described above, each match line is provided with the discharge transistor for driving the corresponding match line to the ground voltage level when the search operation ends. Therefore, the precharge voltage generating circuit can be configured of a charging type circuit, and the circuit construction can be simple, and the current consumption can be small.

In addition, the effects similar to those in the first to third embodiments can be achieved.

Fifth Embodiment

Figure 19:
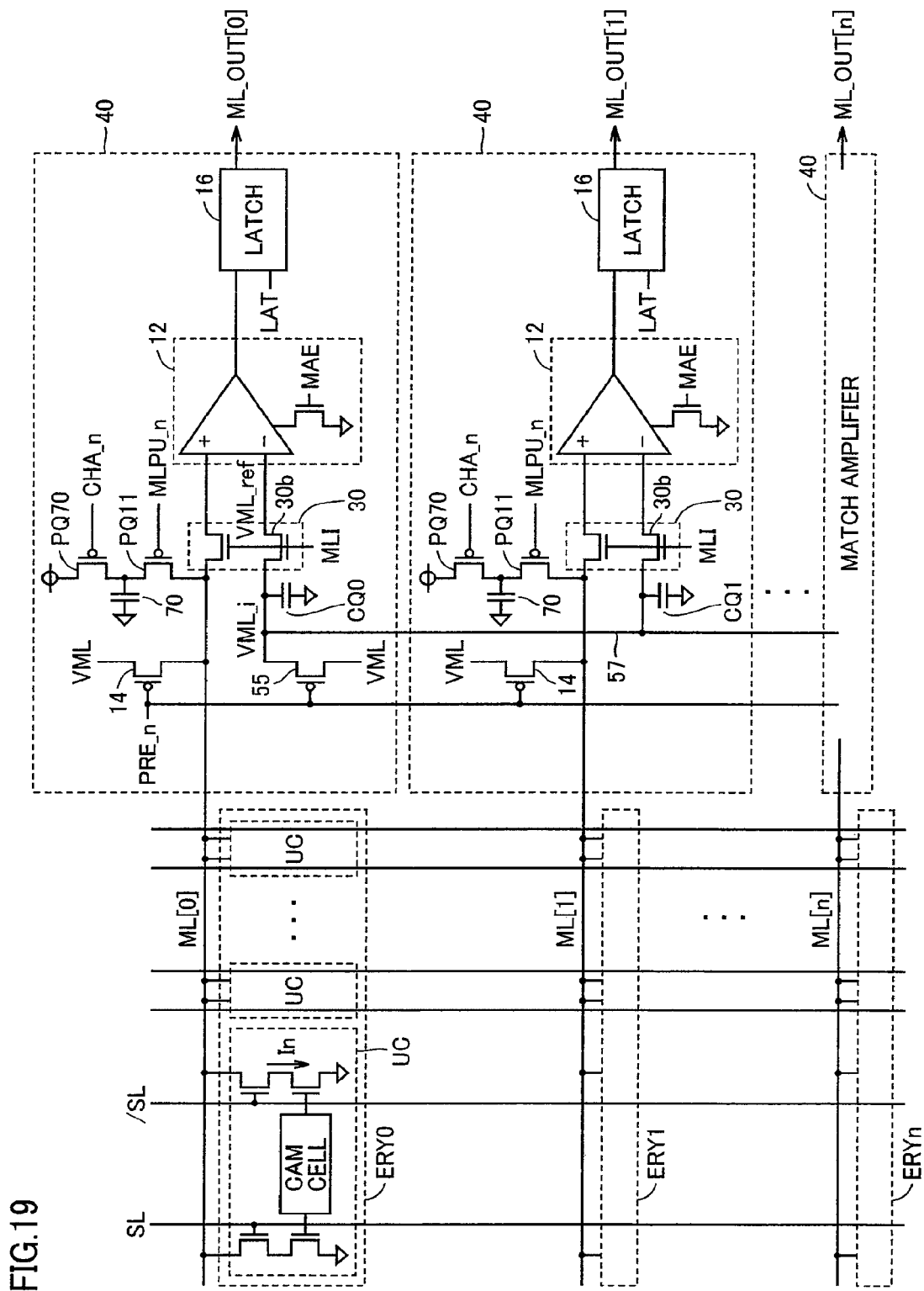
FIG. 19 schematically shows a main portion of a content addressable memory according to a fifth embodiment of the invention.

FIG. 19 shows a main portion of a content addressable memory according to a fifth embodiment of the invention. The content addressable memory shown in FIG. 19 differs from the content addressable memory shown in FIG. 15 in the following construction. Match amplifier 40 includes P-channel MOS transistors PQ70 and PQ11 as well as a capacitance element 70 serving as a pull-up current supplying source for match line ML (ML[0]-ML[n]). P-channel MOS transistor PQ70 is turned on in response to a charge instructing signal CHA_n. Capacitance element 70 is charged to the level of power supply voltage VDD through conductive P-channel MOS transistor PQ70. The accumulated charges of capacitance element 70 are supplied to corresponding match line ML via P-channel MOS transistor PQ11 that is selectively made conductive according to pull-up instructing signal MLPU_n.

Other constructions of the content addressable memory shown in FIG. 19 are the same as those of the content addressable memory shown in FIG. 15. Corresponding portions are allotted the same reference numerals, and description thereof is not repeated.

Figure 20:
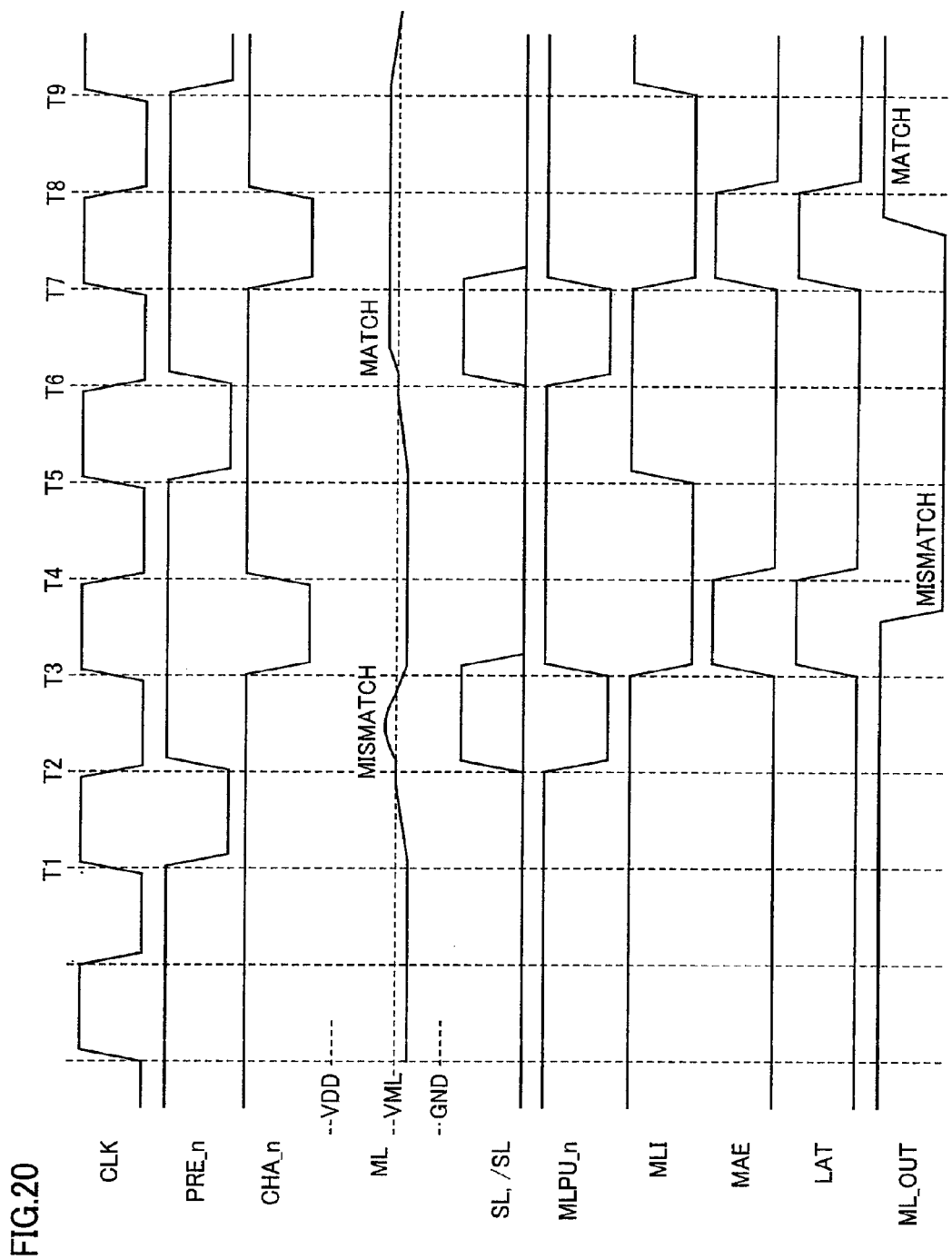
FIG. 20 is a timing chart representing an operation of the content addressable memory shown in FIG. 19.

FIG. 20 is a timing chart representing the search operation of the content addressable memory shown in FIG. 19. Referring to FIG. 20, description will now be given on the search operation of the content addressable memory shown in FIG. 19.

At time T1, the search cycle for the search operation starts. When the search cycle starts, precharge instructing signal PRE_n is first activated. Accordingly, each MOS transistor 14 for precharging turns conductive to precharge corresponding match line ML to the level of precharge voltage VML.

At time T2, the search line is made active. Concurrently with the activation of the search line, pull-up instructing signal MLPU_n attains the L level. Accordingly, MOS transistor PQ11 is turned on to supply the accumulated charges of capacitance element 70 to the match line, and accordingly the voltage level thereof rises. When match line ML is in the mismatch state, one-bit pull-out current In flows through one bit of unit cell UC in the miss state in the entry, and the voltage level of match line ML lowers.

In the pull-up operation of match line ML, the accumulated charges of capacitance element 70 are merely supplied to the corresponding match line, and the power supply node is isolated from the match line. Therefore, the pull-up current cannot flow from the power supply node to the ground node, and the current consumption can be small.

At time T3, the match line pulling-up operation ends, the activation of the search line ends, and the search result is determined and read out. Specifically, at time T3, pull-up instructing signal MLPU_n is driven to the H level, and isolation instructing signal MLI is set to the H level so that isolation gate circuit 30 attains the non-conductive state. Thus, each differential amplifier circuit 12 performs the differential amplification according to the charge confining scheme in response to the activation of match amplifier activating signal MAE. After the amplifying operation, signal ML_OUT indicative of the determination result is output via latch 16.

Concurrently with the amplifying operation of differential amplifier circuit 12, charge instructing signal CHA_n is activated and the charging operation of capacitance element 70 is performed.

At time T4, match amplifier activating signal MAE is made inactive, and latch instructing signal LAT is driven to the L level. Accordingly, latch 16 attains the latching state and one search cycle completes.

In the search cycle starting at time T5, the operation is performed in the case when match line ML is in the match state. In this case, capacitance element 70 supplies its accumulated charges via MOS transistor PQ11 to match line ML at time T6 after completion of the precharge operation by precharge transistor 14. Thereby, match line ML is held at the level of the charged voltage. When match line ML is in the match state, the raised voltage level is merely set by redistribution of the accumulated charges of capacitance element 70. A capacitance ratio between capacitance element 70 and the load capacitance of match line ML determines the voltage level of the match line, and the voltage amplitude of the match line can be sufficiently small.

When the activation of search lines SL and /SL and the pull-up operation of the match line are completed, isolation instructing signal MLI attains the L level at time T7, and isolation gate circuit 30 attains the non-conductive state. Then, match amplifier activating signal MAE is made active to cause the amplifying operation by the match amplifier. Then, latch instructing signal LAT attains the H level, and latch 16 produces signal ML_OUT at the H level indicating the match state. The charge operation of capacitance element 70 is performed via MOS transistor PQ70.

Match line ML is kept at the voltage level attained through the charging via capacitance element 70 in the last cycle starting at time T6. When a precharge operation is performed in a next search cycle starting at a time T9, the circuit for producing precharge voltage VML sets match line ML to the intermediate voltage level of precharge voltage VML. Therefore, the timing for charging capacitance element 70 may be sufficient to be during a period of the H level of pull-up instructing signal MLPU_n. The charge amount required for charging capacitance element 70 is sufficient to be the charge amount for causing a voltage rising to the voltage level to be sensible by differential amplifier circuit 12 on corresponding match line ML. Therefore, the charging period of capacitance element 70 can be laid within one search cycle sufficiently.

For the circuit for producing charge instructing signal CHA_n, it is sufficient to use the construction in which in the control circuit 8 shown in FIG. 8, match amplifier activating circuit 66 activates charge instructing signal CHA_n at the same timing as match amplifier activating signal MAE. Alternatively, charge instructing signal CHA_n may be activated at the same timing as the discharge instructing signal for discharging the match line to the voltage level as described previously.

In the construction shown in FIG. 19, each match line ML may be provided with a discharging transistor (60) for discharging corresponding match line ML to the ground voltage level according to a discharge instructing signal (DIS), similarly to the construction shown in FIG. 16. In this case, the circuit for producing precharge voltage VML is merely required to charge the match line. Therefore, the intermediate voltage generating circuit for generating precharge voltage VML can have a simple construction, and therefore, the simple construction of the intermediate voltage generating circuit and the reduced current consumption can be achieved similarly to the fourth embodiment.

According to the fifth embodiment of the invention, the accumulated charges of the capacitance element are used when pulling up the match line in the search operation. In the pull-up operation of the match line, therefore, a current path from the power supply node to the ground node is cut off to reduce the current consumption. Further, in the fifth embodiment, the same effects as the first to fourth embodiments can be achieved.

Sixth Embodiment

Figure 21:
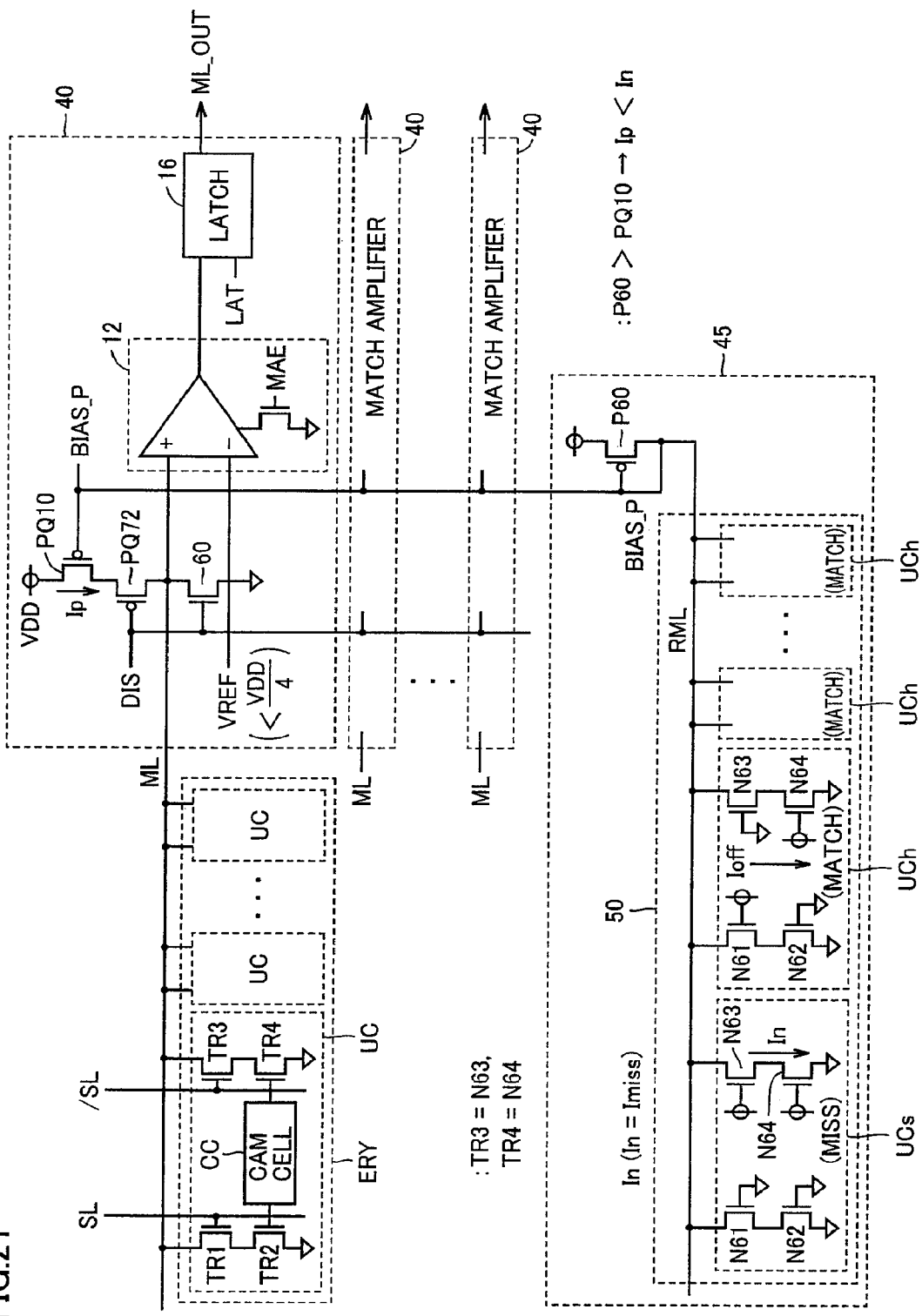
FIG. 21 schematically shows a main portion of a content addressable memory according to a sixth embodiment of the invention.

FIG. 21 shows a main portion of a content addressable memory according to a sixth embodiment of the invention. The content addressable memory shown in FIG. 21 differs from the content addressable memory shown in FIG. 14 in the following construction. An isolation gate circuit is not provided for differential amplifier circuit 12. Reference voltage VREF is normally applied to the negative input of the differential amplifier. Match line ML is always coupled to the positive input of the differential amplifier. In match amplifier 40, P-channel MOS transistors PQ10 and PQ72 for charging the match line are connected in series between the power supply node and match line ML. For discharging match line ML to the ground voltage level, N-channel MOS transistor 60 is arranged between match line ML and the ground node. MOS transistors PQ72 and 60 receive discharge instructing signal DIS at their gates. P-channel MOS transistor PQ10 receives bias voltage BIAS_P at its gate. This bias voltage BIAS_P is supplied from intermediate voltage generating circuit 45 having the same construction as that shown in FIG. 14.

Since intermediate voltage generating circuit 45 has the same construction as that shown in FIG. 14, corresponding portions are allotted the same reference numerals, and description thereof is not repeated. The construction of unit cell UC of entry ERY in the memory cell array as well as other constructions of latch amplifier 40 are the same as those in the content addressable memory shown in FIG. 14 so that corresponding portions are allotted the same reference numerals, and description thereof is not repeated.

In the construction shown in FIG. 21, the replica entry in intermediate voltage generating circuit 45 is in such a state that one bit of unit cell UCs is in the mismatch state, and the other unit cells UCh are in the match state. Through replica match line RML, MOS transistor P60 causes a current flow of a sum of one-bit pull-out current In and off-leakage currents of $((M-1) \cdot Ioff)$, where m represents a total number of replica unit cells UCh and UCs. MOS transistor P60 has a larger size than MOS transistor PQ10. Therefore, current Ip flowing through MOS transistor PQ10 is made smaller than one-bit pull-out current In, one-bit miss current Imiss, or a current of $(In+(M-1) \cdot Ioff)$ passing through the match line in the one-bit miss state. Reference voltage VREF is set to the voltage level of (VDD/4).

Figure 22:
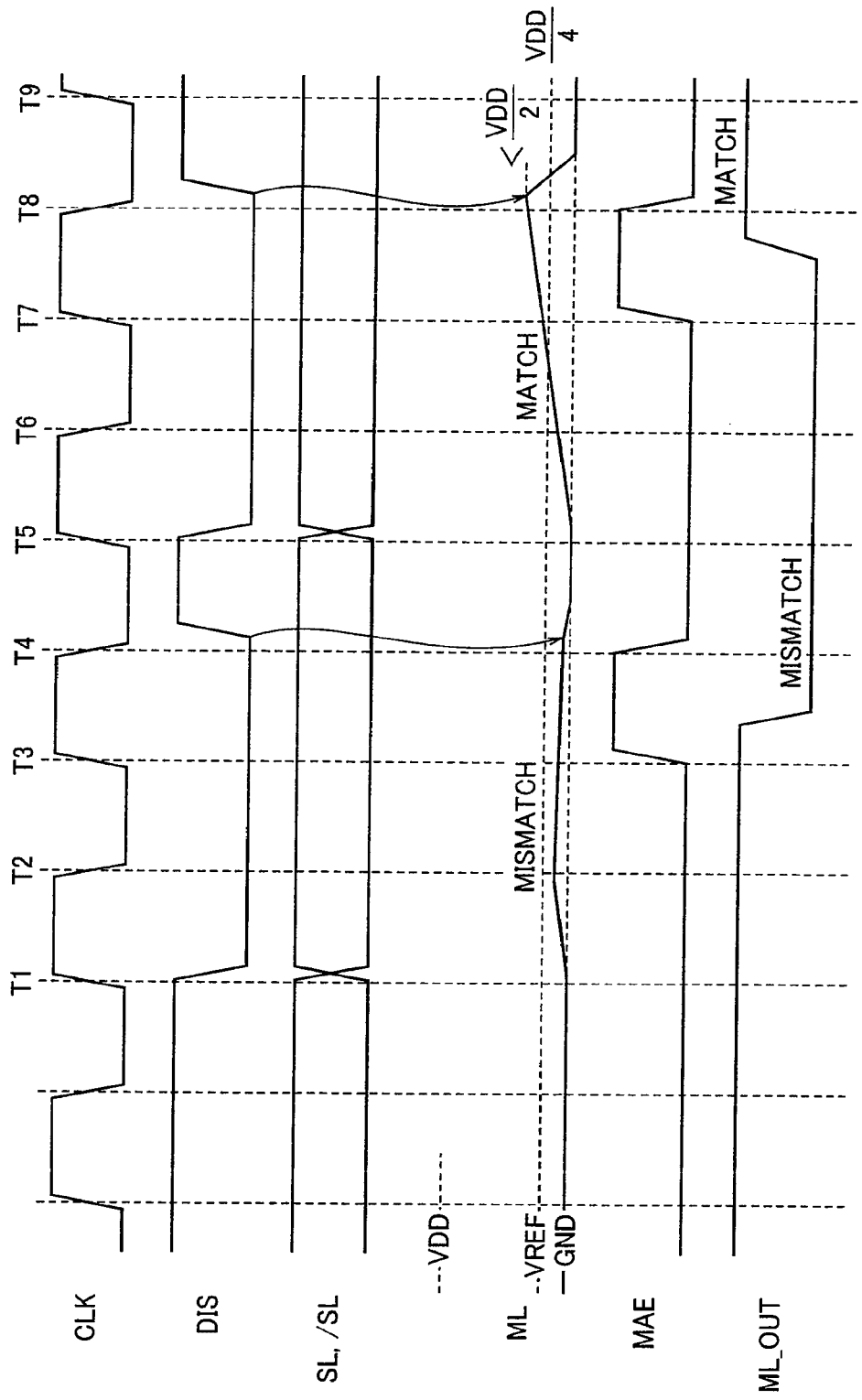
FIG. 22 is a timing chart representing an operation of the content addressable memory shown in FIG. 21.

FIG. 22 is a timing chart representing a search operation of the content addressable memory shown in FIG. 21. Referring to FIG. 22, description will now be given on a search operation of the content addressable memory shown in FIG. 21.

At or before time T1, discharge instructing signal DIS is at the H level. MOS transistor 60 is on, and match line ML is kept at the level of ground voltage GND. In this state, MOS transistor PQ72 is off, and the pull-up operation of match line ML is not performed.

At time T1, the search operation cycle starts. In the search cycle, match line ML is precharged to the ground voltage level so that search lines SL and /SL are driven to the voltage level corresponding to the search data simultaneously with the start of the search cycle. When the search cycle starts, discharge instructing signal DIS attains the L level, and MOS transistors 60 and PQ72 are turned on. Accordingly, each match line ML is supplied with pull-up current Ip via MOS transistors PQ10 and PQ72, and the voltage level thereof rises. Also, the voltage level of match line ML in the mismatch state lowers because its discharge current is larger than pull-up current Ip.

At time T3, match amplifier activating signal MAE is made active, and latch instructing signal LAT attains the H level (shown in FIG. 22), and determination on the voltage level of match line ML and output of a result of the determination are performed. When mismatch occurs, latch 16 generates the signal ML_OUT at the L level.

At time T4, when the determination and output of the search result are completed, match amplifier activating signal MAE is made inactive to stop the differential amplification of differential amplifier circuit 12. Latch instructing signal LAT attains the L level to set latch 16 to the latch state. At the time T4, discharge instructing signal DIS is driven to the H level according to deactivation of match amplifier activating signal MAE. Responsively, supply of pull-up current Ip stops, and match line ML is discharged to the ground voltage level.

In the search cycle starting at time T5, the states of search lines SL and /SL are set according to the next search data again. The precharge operation of match line ML ends so that MOS transistors PQ10 and PQ72 supply pull-up current Ip. When match line ML is in the match state, a discharge path of match line ML is not present, and pull-up current Ip raises the voltage level of the match line in the match state.

At time T7, when the potential of match line ML rises above reference voltage VREF, match amplifier activating signal MAE is made active, and the determination and output of the search result are performed. During this determination and output of the search result, pull-up current Ip is likewise supplied so that the voltage level of match line ML rises.

At time T8, the determination and output of the search result end, and match amplifier activating signal MAE is made inactive. Discharge instructing signal DIS is driven to the H level so that the supply of pull-up current Ip to match line ML stops, and match line ML is discharged to the ground voltage level.

In the content addressable memory shown in FIG. 21, a precharging transistor (14) shown in FIG. 14 is not employed. At the start of the search cycle, therefore, it is not necessary to precharge the plurality of match lines (only supply of the pull-up current of a restricted current value is performed), so that it is possible to reduce a transient current due to the simultaneous precharging of the plurality of match lines.

Reference voltage VREF is set to the level of (voltage VDD)/4 or lower (VDD/4 in FIG. 22). Therefore, the pull-up level of the voltage in the high level direction on match line ML in the match state is set to the voltage level of VDD/2 or lower (VDD/2 in FIG. 22). In differential amplifier circuit 12, the amplitudes of the input signals at the high level and at the low level is made equal with respect to reference voltage VREF. The signal amplitude of match line ML can be set to VDD/2 or lower, and the current consumption can be reduced.

[Modification]

Figure 23:
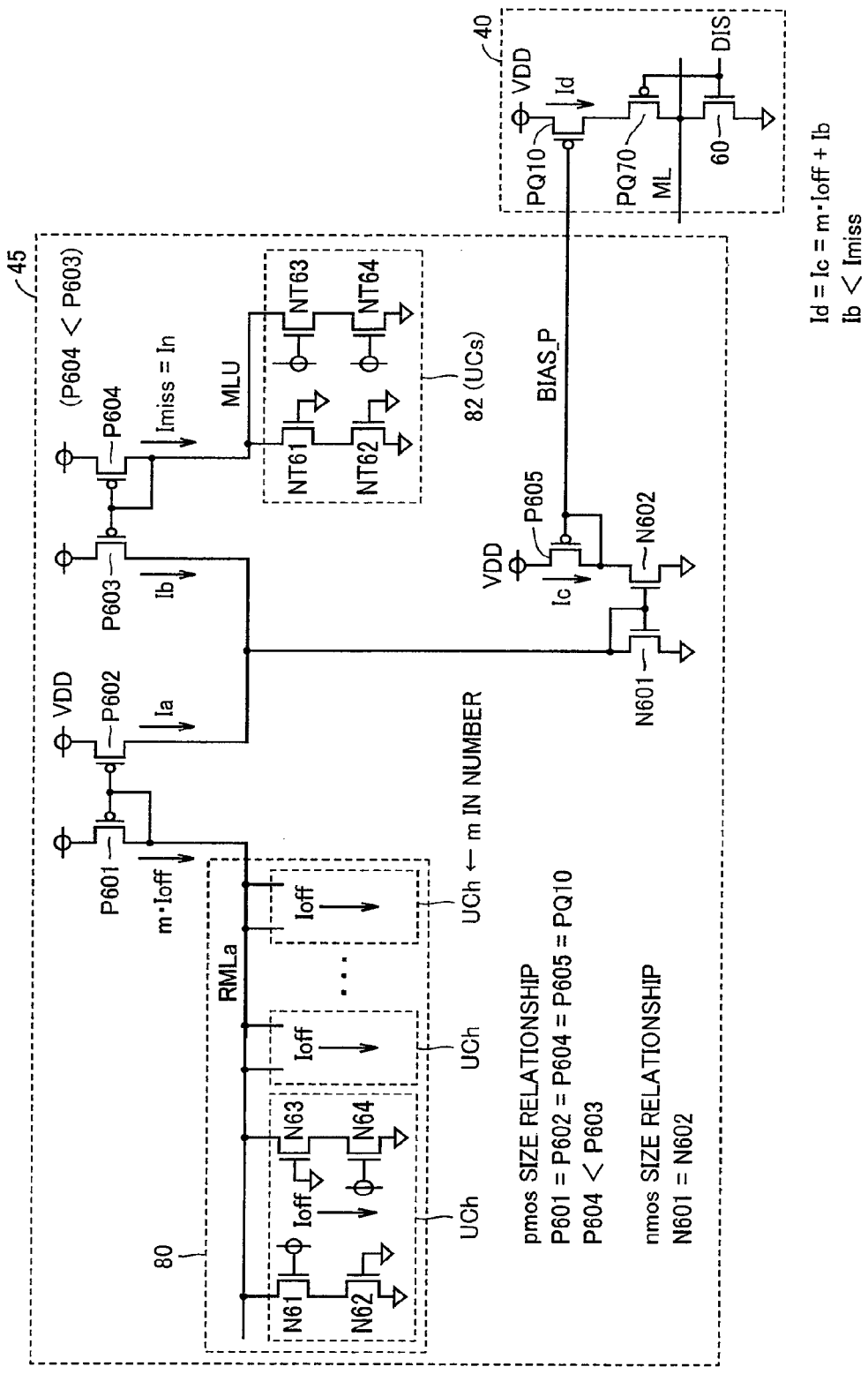
FIG. 23 schematically shows a construction of a modification of a bias voltage generating portion of the content addressable memory according to the sixth embodiment of the invention.

FIG. 23 shows a construction of a modification of bias voltage generating circuit 45 according to the sixth embodiment of the invention. In FIG. 23, bias voltage generating circuit 45 includes a replica entry 80 including the unit cells the same in construction as the unit cells in entry ERY all set to the match state in the memory cell array. Replica entry 80 includes such replica unit cells UCh that all bits are set to the match state. Each replica unit cell UCh causes a flow of off-leakage current Ioff.

Replica unit cell UCh includes a series connection of MOS transistors N61 and N62 as well as a series connection of MOS transistors N63 and N64. In each series connection, one of the MOS transistors is kept off, as in the unit cell in the match state. In each series connection, an off-leakage current flows. In one replica unit cell UCh, a total current of the off-leakage currents in the respective series connections of the replica unit cell simulates the off-leakage current in one unit cell in the match state.

MOS transistors N61 and N62 are the same in size as transistors TR1 and TR2 of unit cell UC shown in FIG. 21, respectively. MOS transistors N63 and N64 have the same sizes as transistors TR3 and TR4 in unit cell UC shown in FIG. 21, respectively. Replica unit cells UCh of the replica entry 80 are commonly coupled to a replica match line RMLa.

Bias voltage generating circuit 45 further includes a one-bit replica unit cell 82. This one-bit replica unit cell 82 is in the same state as unit cell UCs in the miss state. In FIG. 23, one-bit replica unit cell 82 includes a series connection of MOS transistors NT61 and NT62 as well as a series connection of MOS transistors NT63 and NT64. These MOS transistors NT61 and NT62 are set off, and MOS transistors NT63 and NT64 are set on. These MOS transistors NT61 and NT62 have the same sizes as transistors TR1 and TR2 of unit cell UC, respectively. MOS transistors NT63 and NT64 have the same sizes as transistors TR3 and TR4 of the unit cell, respectively. Therefore, one-bit miss current Imiss flows through a one-bit replica match line MLU of one-bit replica unit cell 82.

Bias voltage generating circuit 45 further includes a P-channel MOS transistor P601 that has a gate and a drain interconnected to each other and supplies a current from a power supply node to replica match line RMLa, and a P-channel MOS transistor P602 supplying a current Ia to a signal line 85. MOS transistors P601 and P602 form a current mirror circuit.

Bias voltage generating circuit 45 further includes a P-channel MOS transistor P604 supplying a current to one-bit replica unit cell 82, and a P-channel MOS transistor P603 supplying a current Ib to signal line 85. MOS transistor P604 has a gate and a drain interconnected to each other. MOS transistors P603 and P604 form a current mirror circuit.

MOS transistors P601 and P602 are the same in size (ratio of the channel width to the channel length), and supply currents of the same magnitude of (m·Ioff=Ia, where m represents the number of replica unit cells UCh and is equal to the number of unit cells in one entry ERY). MOS transistor P603 has a smaller size than MOS transistor P604. Therefore, P-channel MOS transistor P603 produces a mirror current smaller than one-bit miss current Imiss nearly equal to In (Ib<Imiss). Signal line 85 conducts a current of a sum of currents Ia and Ib flowing through MOS transistors P602 and P603, respectively. The current flowing through signal line 85 is expressed by the following equation:

$$Ia+Ib=m\cdot Ioff+Ib$$

Transistors P602 and P603 can have the sizes adjusted to pass, through signal line 85, a current smaller than the current that flows from the match line via the entry in the one-bit miss state.

$$Imiss+(m-1)\cdot Ioff > Ib+m\cdot Ioff > m\cdot Ioff$$

The following inequation is derived from the above relation:

$$Imiss - Ioff > Ib$$

Current Ib supplied by MOS transistor P603 is set to satisfy the above relationship. The current flowing through signal line 85 can be set larger than the off-leakage current of the entry in the match state and smaller than the discharging current (one-bit miss current) of the entry in the one-bit miss state. The upper limit of current Ib is equal to a difference between current In flowing through a path of the conductive transistor of the unit cell in the miss state in the entry in the one-bit miss state and off-leakage current Ioff/2 flowing through the series connection of the non-conductive transistors.

Bias voltage generating circuit 45 further includes an N-channel MOS transistor N601 discharging the current from signal line 85, an N-channel MOS transistor N602 and a P-channel MOS transistor P605 supplying a current to MOS transistor N602. MOS transistor N601 has a gate and a drain connected to each other. MOS transistors N602 and N601 form a current mirror circuit. MOS transistor P605 has a gate and a drain connected to each other.

MOS transistors N601 and N602 have the same size (the same ratio of the channel width to the channel length). Therefore, a current Ic flowing through MOS transistor N602 is equal in magnitude to the current flowing through signal line 85. Thus, MOS transistor P605 passes the current of the same magnitude as that flowing through MOS transistor N602. MOS transistor P605 has a gate and a drain connected to each other, and has a current/voltage converting function to produce bias voltage BIAS_P on its gate. MOS transistor PQ10 included in match amplifier 40 receives bias voltage BIAS_P at its gate.

MOS transistors P605 and PQ10 are the same in size. Therefore, a current Id flowing to match line ML via MOS transistors PQ10 and PQ70 is equal in magnitude to the current flowing through signal line 85.

Thus, each match line ML can be supplied with the current smaller than the current flowing through the match line in the one-bit miss (mismatch) state, and larger than the off-leakage current of the entry in the all-bit match state. Since the replica entry is used, variations in transistor parameter of the unit cells of the entry storing the data caused during the manufacturing can be reflected on the replica unit cells of the replica entry. Accordingly, the pull-up current and precharge current of a desired magnitude can be accurately supplied.

In the construction shown in FIG. 23, the number of replica unit cells UCh included in replica entry 80 may be (m−1), which is smaller by one than the number m of the unit cells included in entry ERY. Replica entry 80 and one-bit replica unit cell 82 can produce more precisely a current corresponding to the current that flows through the match line associated with the entry in the one-bit mismatch state including one-bit miss state unit cell.

Figure 24:
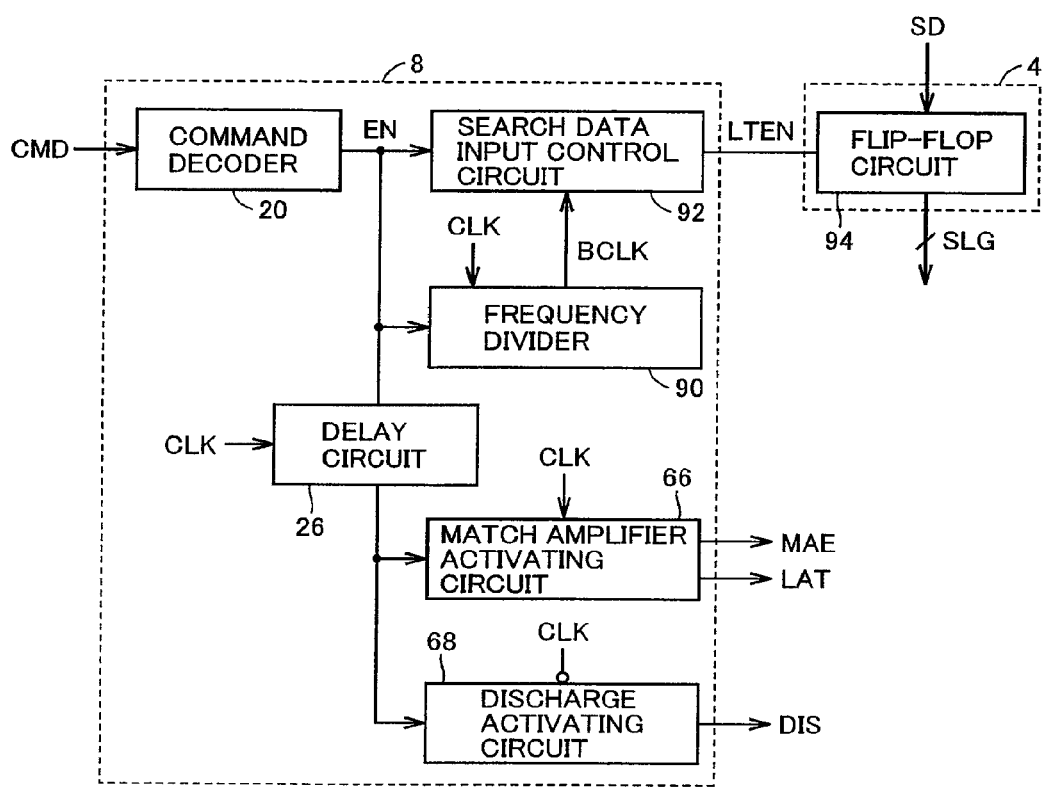
FIG. 24 schematically shows a construction of a control circuit of the content addressable memory according to the sixth embodiment of the invention.

FIG. 24 schematically shows a construction of control circuit 8 of the content addressable memory according to the sixth embodiment of the invention. In FIG. 24, control circuit 8 includes command decoder 20 for decoding externally supplied command CMD, a frequency divider 90 for frequency-dividing clock signal CLK according to search operation instruction EN supplied from command decoder 20, and a search data input control circuit 92 for producing a latch enable signal LTEN for search data input circuit 4 according to search operation instruction EN received from command decoder 20 and a frequency-divided clock signal BCLK received from frequency divider 90.

Search data input circuit 4 is formed of a flip-flop circuit 94, and is configured to take in and latch search data SD according to activation of latch enable signal LTEN, for driving a search line group (search data bus) SLG according to the taken search data.

Control circuit 8 includes delay circuit 26, match amplifier activating circuit 66 and discharge control circuit 68. Delay circuit 26 delays search operation instruction EN by one clock cycle. Match amplifier activating circuit 66 is made active according to the output signal of delay circuit 26, and produces match amplifier activating signal MAE and latch instructing signal LAT in synchronization with the rising of clock signal CLK. Discharge control circuit 68 produces discharge instructing signal DIS in response to the rising of clock signal CLK according to the output signal of delay circuit 26.

By using control circuit 8 shown in FIG. 24, search data input circuit 4 can operate in each search cycle to take in, latch and output the search data by flip-flop circuit 94.

In the construction of control circuit 8 shown in FIG. 24, transition of search data SD may be detected, to produce search operation instruction EN according to a signal indicating the detection of the search data transition.

Frequency divider 90 produces a frequency-divided clock signal CLK by dividing clock signal CLK by the factor of two in the timing chart of FIG. 22. However, the division ratio of frequency divider 90 and the number of delay clock cycle(s) of delay circuit 26 can be set to appropriate values depending on the number of clock cycles in one search cycle.

According to the sixth embodiment of the invention, as described above, the match line is precharged to the ground voltage level and, in the search operation, the match line is supplied with the current of a restricted value that is smaller than the one-bit pull-out current or one-bit miss current but is larger than an all-bit off-leakage current. Therefore, the voltage amplitude of the match line can be reduced, and the charging current of the match line can be reduced. For search lines SL and /SL, as shown in FIG. 24, flip-flop circuit 94 holds the search data. Therefore, when the search data having similar bit patterns are successively supplied, it is possible to reduce the number of search lines to be charged and discharged in the search data bus, and thereby the charging/discharging currents of the search lines can be reduced.

Seventh Embodiment

Figure 25:
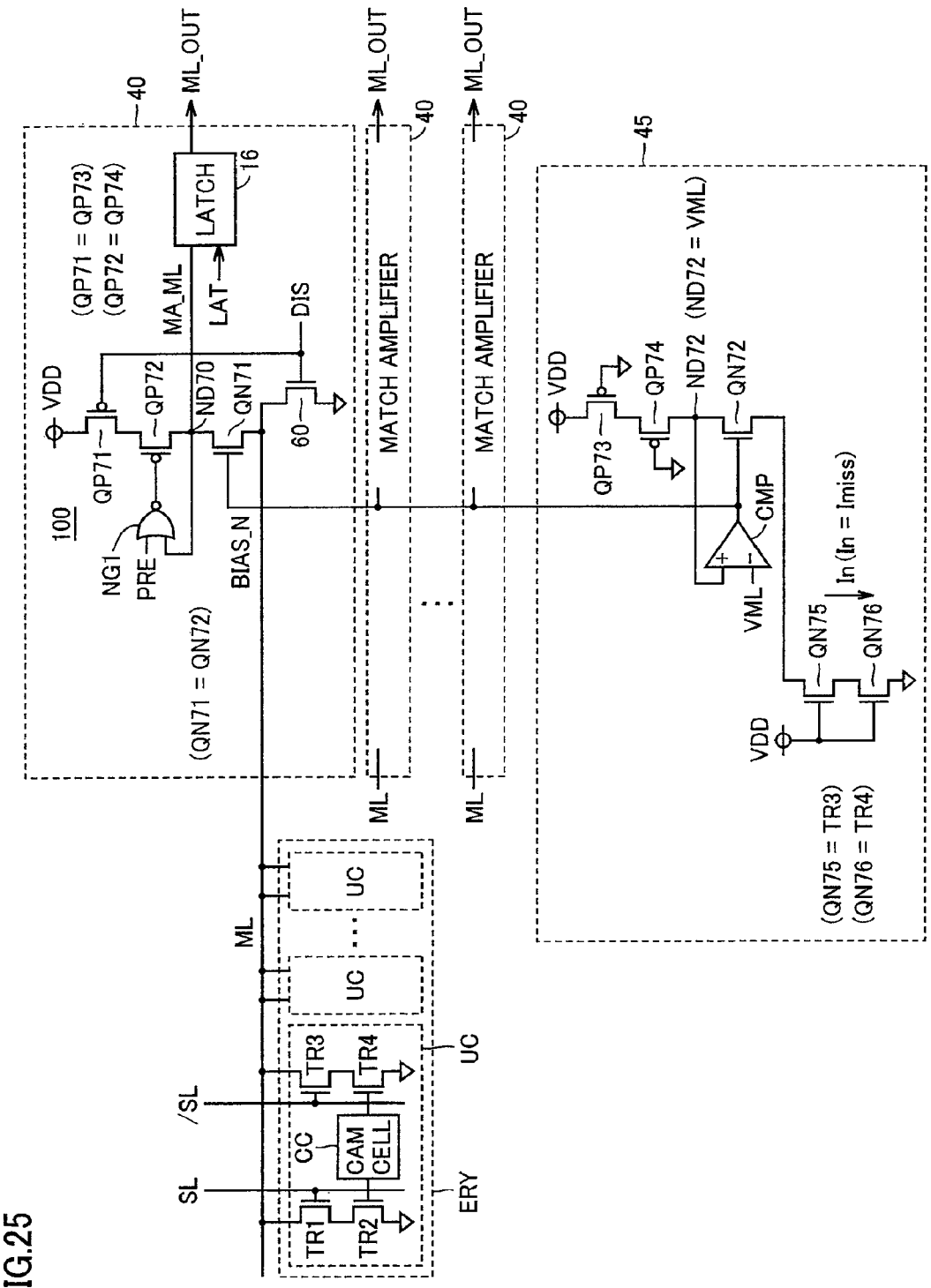
FIG. 25 schematically shows a main portion of a content addressable memory according to a seventh embodiment of the invention.

FIG. 25 shows a main portion of a content addressable memory according to a seventh embodiment of the invention. In the content addressable memory shown in FIG. 25, entry ERY in the memory cell array has the same construction as the entries ERY of the first to sixth embodiments already described. Corresponding portions are allotted the same reference numerals, and description thereof is not repeated.

Match amplifier 40 includes discharging transistor 60 for discharging match line ML to the ground voltage level according to discharge instructing signal DIS, and a pull-up/sense circuit 100 for producing an internal search determination result signal MA_ML. Pull-up/sense circuit 100 supplies a pulling-up current to match line ML, performs the search determination and produces an internal search determination result signal according to a result of the determination.

Pull-up/sense circuit 100 includes P-channel MOS transistors QP71 and QP72 connected in series between the power supply node and an internal node ND70, an N-channel MOS transistor QN71 connected between internal node ND70 and corresponding match line ML, and an NOR gate NG1 receiving internal search determination result signal MA_ML on internal node ND70 and precharge instructing signal PRE. NOR gate NG1 applies its output signal to MOS transistor QP72.

MOS transistor QP71 receives discharge instructing signal DIS on its gate, and MOS transistor QN71 receives a bias voltage BIAS_N on its gate.

Match amplifier 40 further includes latch 16 for latching output signal MA_ML of pull-up/sense circuit 100 according to latch instructing signal LAT. Match amplifier 40 does not have a differential amplifier circuit, and the current consumption thereof can be small.

Bias voltage generating circuit 45 includes P-channel MOS transistors QP73 and QP74 connected in series between the power supply node and a node ND72, a comparator CMP for comparing the voltage on node ND72 with precharge voltage VML, an N-channel MOS transistor QN72 connected at a first conduction node to node ND72, and N-channel MOS transistors QN75 and QN76 connected in series between a second conduction node of MOS transistor QN72 and the ground node. N-channel MOS transistor QN72 has a gate receiving an output signal of comparator CMP.

MOS transistors QP73 and QP74 have gates coupled to the ground node, and are normally kept conductive. MOS transistors QP73 and QP74 are the same in size (the ratio of the channel width to the channel length) as MOS transistors QP71 and QP72 included in match amplifier 40, respectively.

MOS transistors QN75 and QN76 have gates both coupled to the power supply node, and are normally kept on. MOS transistors QN75 and QN76 have the same sizes as MOS transistors TR3 and TR4 included in unit cell UC, respectively. Therefore, MOS transistors QN75 and QN76 pass one-bit pull-out current In at the maximum.

In the construction of bias voltage generating circuit 45, comparator CMP compares precharge voltage VML at the intermediate voltage level with the voltage of node ND72. When the voltage level of node ND72 is higher than precharge (intermediate) voltage VML, the output signal of comparator CMP becomes high. Accordingly, the conductance of MOS transistor QN72 increases, the current passing from node ND72 to MOS transistors QN75 and QN76 increases, and the voltage level of node ND72 lowers. When the voltage level of node ND72 is lower than precharge voltage VML, the output signal of comparator CMP attains a low level. Accordingly, the conductance of MOS transistor QN72 decreases, and the amount of the current flowing through MOS transistor QN72 is reduced to suppress the potential lowering of node ND72. Thus, comparator CMP adjusts the conductance of MOS transistor NQ72 such that node ND72 is kept at the level of precharge-voltage VML. Precharge voltage VML is at the level not exceeding half the power supply voltage.

In match amplifier 40, MOS transistors QP71 and QP72 are the same in size (ratio of the channel width to the channel length) as MOS transistors QP73 and QP74, respectively. MOS transistors QN71 and QN72 have the same size. MOS transistor NQ71 receives output voltage BIAS_N of comparator CMP on its gate. In match amplifier 40, therefore, signal MA_ML on node ND70 is kept substantially at the level of precharge voltage VML when corresponding entry ERY is in the one-bit miss (mismatch) state. When the voltage level of match line ML becomes equal to that of node ND70, MOS transistor QN is turned off. Therefore, the voltage level of match line ML does not exceed the voltage level of node ND70, and therefore, the voltage level of match line ML is set to the voltage. VML or lower.

MOS transistors QP71 and QP72 are configured to have such sizes that they have capabilities of driving a current smaller than the current flowing through the match line of the entry in the one-bit mismatch state (i.e., a current smaller a sum (Imiss+(m−1)·Ioff) of the one-bit miss current and the off-leakage currents of the remaining unit cells).

Figure 26:
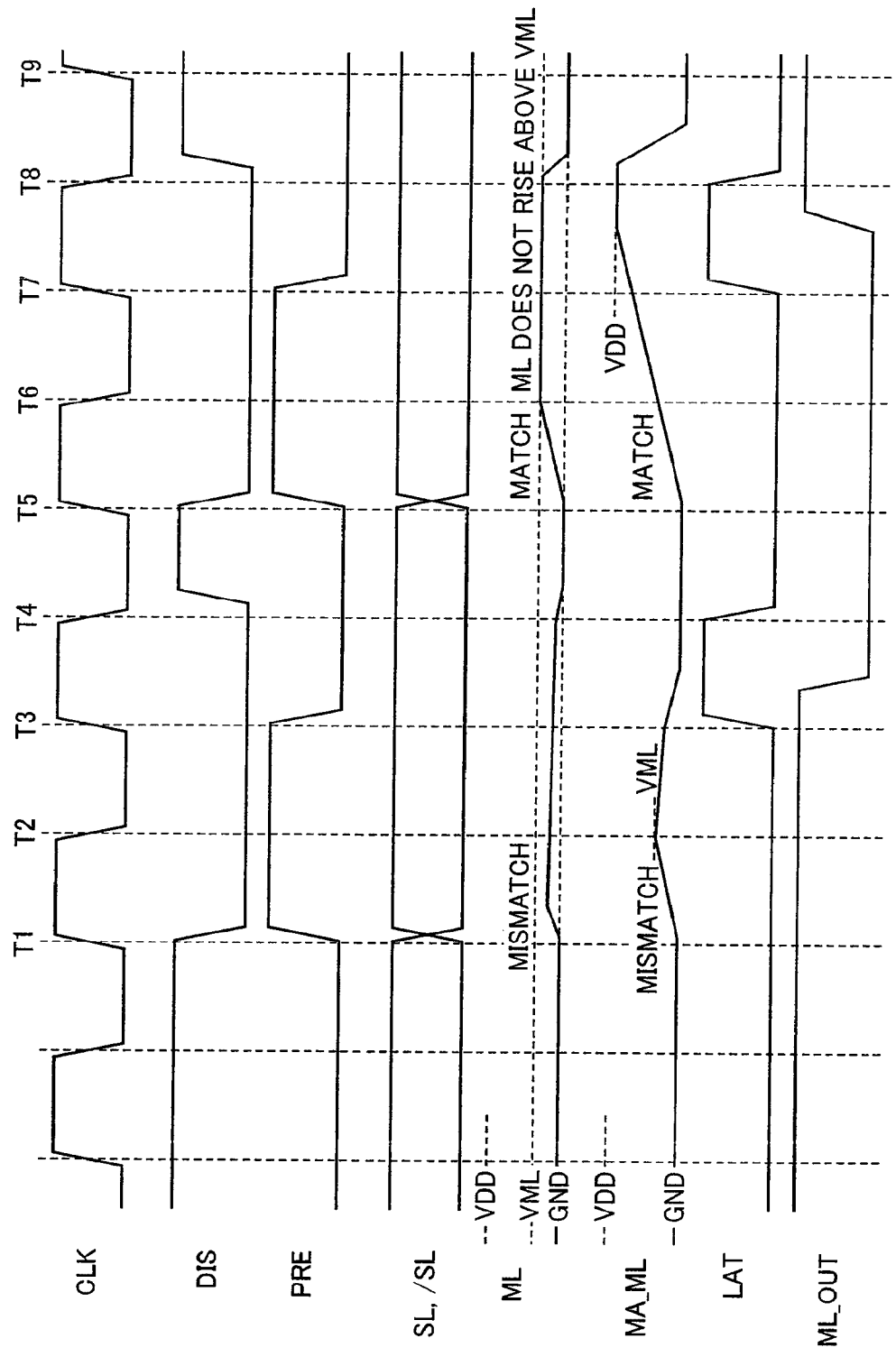
FIG. 26 is a timing chart representing an operation of the content addressable memory shown in FIG. 25.

FIG. 26 is a timing chart representing a search operation of the content addressable memory shown in FIG. 25. Referring to FIG. 26, the search operation of the content addressable memory shown in FIG. 25 will now be described.

Before time T1, precharge instructing signal PRE is at the L level. Discharge instructing signal DIS is at the H level, and match line ML is precharged to the ground voltage level. Then, MOS transistor QP71 is off, and node ND70 is discharged to the ground voltage level as match line ML is discharged, and is kept at the ground voltage level.

Before time T1, discharge instructing signal DIS is at the H level, and discharge transistor 60 precharges match line ML to the ground voltage level. MOS transistor QP71 is off, and node ND70 is at the ground voltage level.

At time T1, the search cycle starts. Discharge instructing signal DIS attains the L level, discharge transistor 60 is turned off and MOS transistor QP71 is turned on. Precharge instructing signal PRE attains the H level, and the output signal of NOR gate NG1 attains the L level. Accordingly, node ND70 is supplied with a current via MOS transistor QP71 and QP72, and the voltage level of node ND70 rises. The current supplied via MOS transistors QP71 and QP72 is supplied to match line ML via MOS transistor QN71. When entry ERY corresponding to match line ML is in the mismatch state, match line ML is discharged via unit cell UC in the miss state. The current supplied via MOS transistors QP71 and QP72 is equal to the one-bit miss current or lower, and the voltage level of match line ML does not reach precharge voltage VML and will be discharged to the level of ground voltage GND at a faster timing.

MOS transistor QN71 receives bias voltage BIAS_N on its gate, and keeps node ND70 at the level of precharge voltage VML when one-bit pull-out current In passes through corresponding match line ML. When the number of the unit cells in the miss state in entry ERY is larger than one bit, node ND70 is driven to the voltage level lower than precharge voltage VML. Therefore, node ND70 has the voltage at the level of up to precharge voltage VML when the corresponding entry is in the mismatch state.

At time T3, the search determination operation is performed, and latch 16 attains the through state according to latch instructing signal LAT, and generates the output signal ML_OUT at the L level (the voltage (up to VML) on node ND70 is at a level sufficiently lower than the input logical threshold voltage of latch 16).

In the latch operation, precharge instructing signal PRE is made inactive at time T3. Therefore, the voltage level of node ND70 is the input voltage level that is determined as the L level by NOR gate NG1, and NOR gate NG1 produces the output signal at the H level. Accordingly, MOS transistor QP72 is turned off, and the voltage level of node ND70 further decreases. Search result indicating signal ML_OUT produced from latch 16 is reliably set to the L level.

Precharge instructing signal PRE is driven to the L level at time T3, so that the voltage level of match line ML lowers. Even if the lowered voltage level of match line ML does not reach ground voltage GND, match line ML will be driven to the ground voltage level when latch 16 enters the latch state and discharge instructing signal DIS attains the H level in the cycle starting at time T4. Accordingly, signal MA_ML on node ND70 is discharged to the ground voltage level (MOS transistor QP72 is off). Thus, the precharging of match line ML and node ND70 is completed.

In a search cycle at time T5, the search operation is executed on next search data. When discharge instructing signal DIS is driven to the L level and precharge instructing signal PRE is driven to the H level, MOS transistors QP71 and QP72 are turned on. Accordingly, a current is supplied to node ND70, and is further supplied to match line ML via node ND 70, so that the voltage level of signal MA_ML on node ND70 rises. MOS transistor QN71 receives bias voltage BIAS_N on its gate, and MOS transistors QN72 and QN71 have the same size. Therefore, MOS transistor QN71 passes the one-bit miss (pull-out) current at the maximum. When the potential of match line ML in the match state rises, the source and drain of MOS transistor QN71 attain the same voltage according to the source follower operation, and MOS transistor QN71 is turned off. Thus, the potential rising of match line ML is suppressed, and match line ML is kept at the level of up to precharge voltage VML.

In this state, MOS transistors QP71 and QP72 are on, and supply the current to node ND70. Therefore, the voltage level of signal MA_ML on node ND70 will finally rise to the level of power supply voltage VDD.

In a clock cycle starting at time T7, latch instructing signal LAT attains the H level so that output signal ML_OUT produced from latch 16 attains the H level indicative of the match state.

At time T7, even when precharge instructing signal PRE is at the L level, the signal MA_ML on node ND70 is at a sufficiently high voltage level, and the output signal of NOR gate NG1 is at the L level. MOS transistor QP72 maintains conductive, and the voltage level of signal MA_ML on node ND70 can be accurately determined to produce search result indicating signal ML_OUT.

MOS transistor QN71 operates in the source follower mode according to its bias voltage BIAS_N, and is turned off when a gate to source voltage becomes equal to the threshold voltage. Therefore, even in the state where the signal MA_ML on node ND70 rises to the level of power supply voltage VDD, MOS transistor QN71 turns non-conductive when the voltage level of match line ML rises, to suppress rising of the voltage level of match line ML to precharge voltage VML or higher.

In the construction shown in FIG. 25, the load capacitance of internal node ND70 of match amplifier 40 is much smaller than the parasitic capacitance of match line ML. Therefore, the charging current of internal node ND70 is smaller in quantity than the charging current that flows to charging match line ML, and accordingly, the current consumption in the search operation can be further reduced.

According to the seventh embodiment of the invention, as described above, the match amplifier produces the search result indicating signal by charging the internal node while suppressing the potential rising of the match line to the amplitude of the intermediate voltage or lower (VML≦VDD/2) by MOS transistor QN71 that receives bias voltage BIAS_N on its gate. Therefore, the occupation area and power consumption of the match amplifier can be small, and the current consumption in the search result determining operation can be sufficiently small.

For the circuit for generating the control signal in the seventh embodiment, the construction of the control circuit shown in FIG. 24 can be employed. For the circuit producing precharge instructing signal PRE, such a construction can be employed, by which precharge instructing signal PRE is to the H level during a period of one clock cycle according to search operation instruction EN supplied from the command decoder shown in FIG. 24.

Eighth Embodiment

Figure 27:
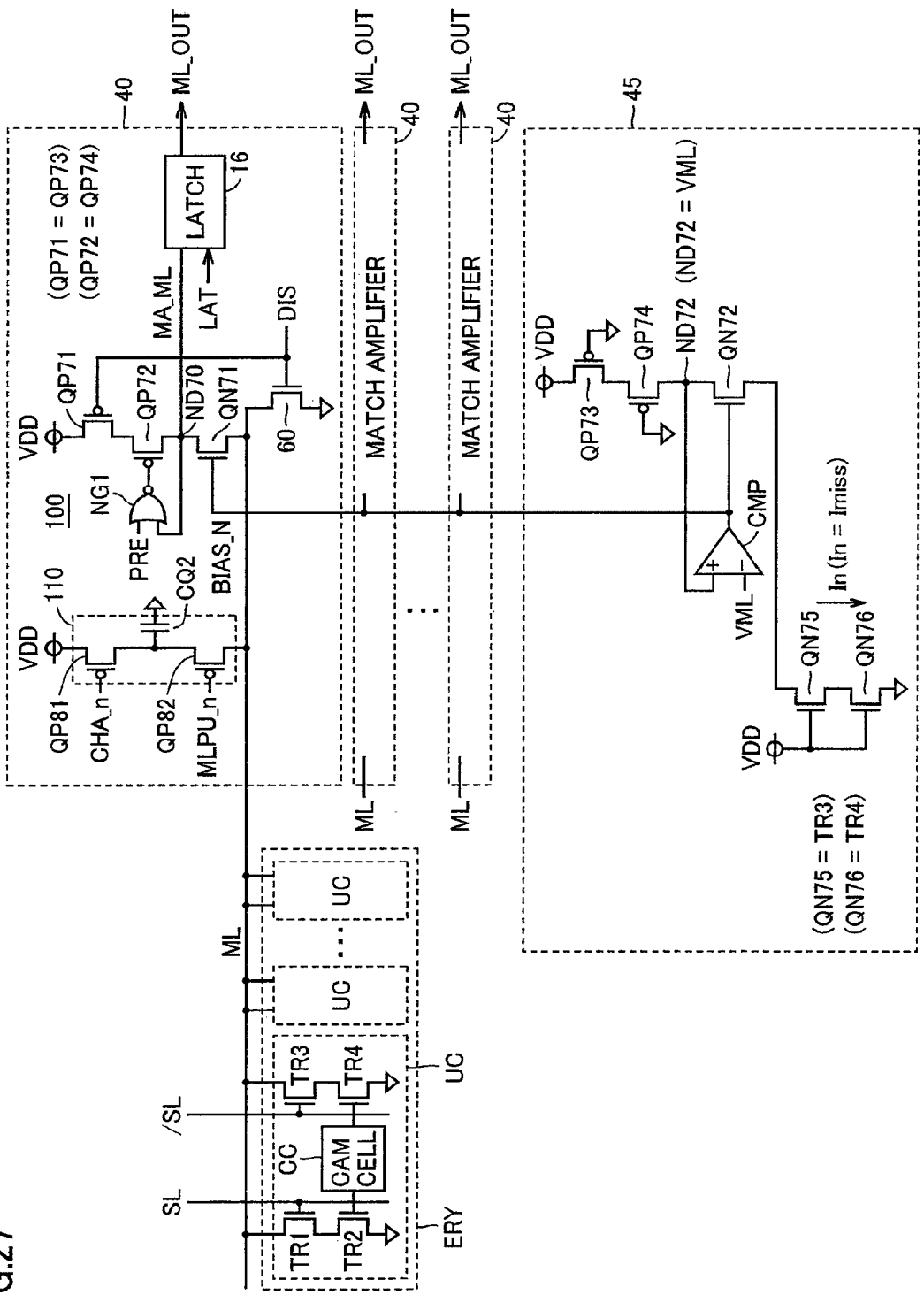
FIG. 27 schematically shows a main portion of a content addressable memory according to an eighth embodiment of the invention.

FIG. 27 shows a main portion of a content addressable memory according to an eighth embodiment of the invention. The content addressable memory shown in FIG. 27 differs from the content addressable memory shown in FIG. 25 in the following construction. Match amplifier 40 is provided with a charge-up circuit 110 for supplying charging electric charges to match line ML according to pull-up current supply instructing signal MLPU_n. Charge-up circuit 110 includes P-channel MOS transistors QP81 and QP82 connected in series between the power supply node and match line ML, and a capacitance element CQ2 connected to a connection node between MOS transistors QP81 and QP82.

Other constructions of the content addressable memory shown in FIG. 27 are the same as those of the content addressable memory shown in FIG. 25. Corresponding portions are allotted the same reference numerals, and description thereof is not repeated.

Figure 28:
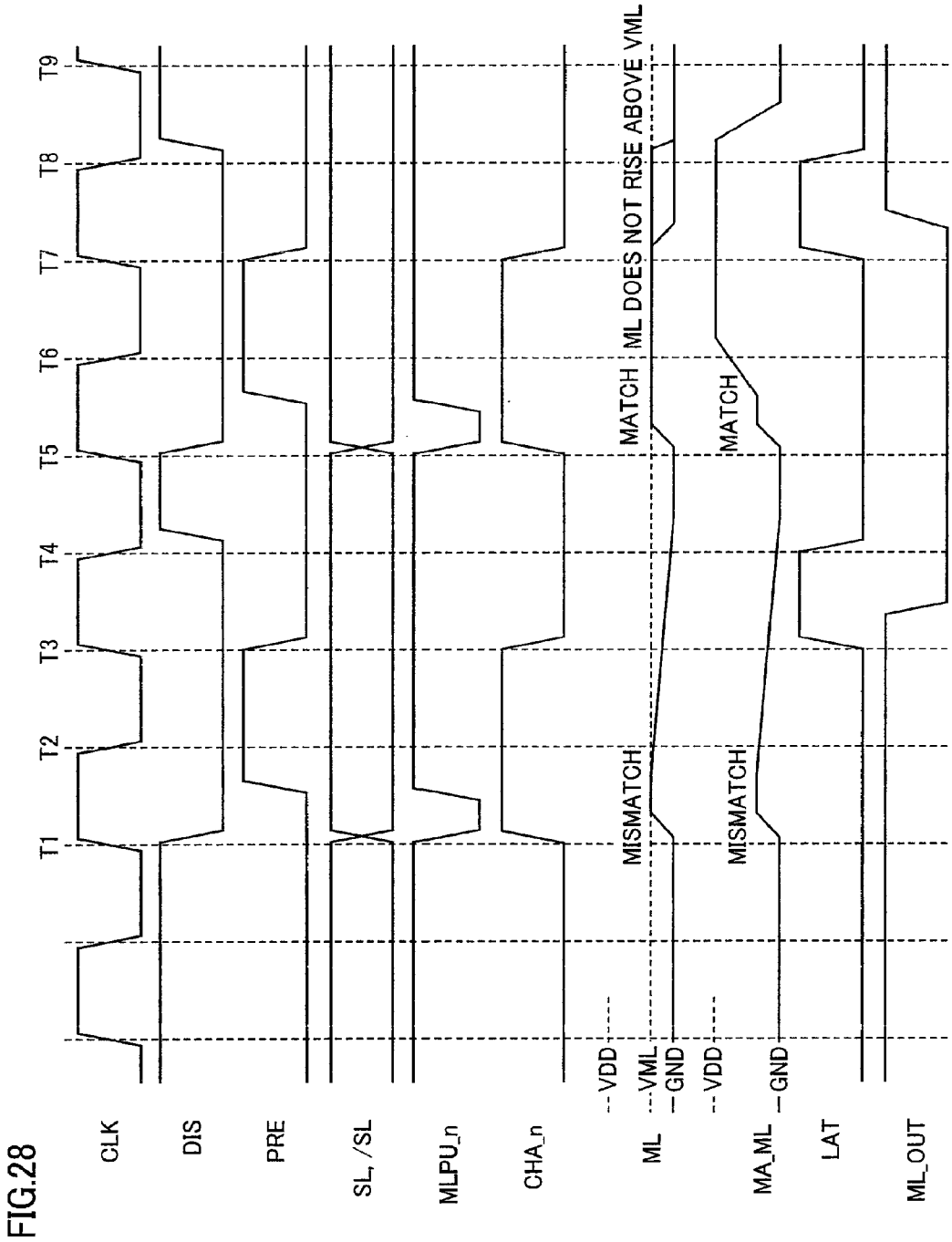
FIG. 28 is a timing chart representing an operation of the content addressable memory shown in FIG. 27.

FIG. 28 is a timing chart representing the search operation of the content addressable memory shown in FIG. 27. Referring to FIG. 28, the search operation of the content addressable memory shown in FIG. 27 will now be described.

Before time T1, precharge instructing signal PRE is at the L level, and discharge instructing signal DIS is at the H level. Therefore, match line ML and signal ML_MA on internal node ND70 are at the ground voltage (GND) level. Latch 16 is in the latch state. The timing chart of FIG. 28 shows the case in which search result indicating signal ML_OUT at the H level is produced.

At time T1, the search cycle starts. Discharge instructing signal DIS attains the L level, MOS transistor 60 is turned off and MOS transistor QP71 is turned on. At this time, precharge instructing signal PRE is still at the L level. Therefore, the output signal of NOR gate NG1 is at the H level, and MOS transistor QP72 is in the off state.

Pull-up current supply instructing signal MLPU_n attains the L level, and charge instructing signal CHA_n attains the H level. Responsively, capacitance element CQ2 is isolated from the power supply node, and the charged (accumulated) charges in capacitance element CQ2 are transmitted to match line ML and node ND70. By adjusting the capacitance value of capacitance element CQ2, the voltage level of match line ML can be set to a voltage level lower than the intermediate voltage level of precharge voltage VML.

At this time, pull-up current supply instructing signal MLPU_n rises to the H level, MOS transistor QP82 is turned off and the pull-up operation effected by charge-up circuit 110 on match line ML is completed. The pull-up operation by charge-up circuit 110 is performed utilizing capacitance element CQ2 and match line ML and signal MA_ML on node ND70 are rapidly driven to the predetermined precharge voltage level.

In a search cycle starting at time T1, precharge instructing signal PRE attains the H level between times T1 and T2 so that NOR gate NG1 generates the output signal at the L level, and MOS transistor QP72 is turned on. Responsively, the pull-up current is supplied to match line ML via MOS transistors QP71, QP72 and QN72.

In the above operation, when entry ERY corresponding to match line ML is in the mismatch state, a current larger than the pull-up current supplied by pull-up/sense circuit 100 is discharged to the ground node, and the voltage level of match line ML lowers.

At time T3; precharge instructing signal PRE attains the L level. At this time, node ND70 is at the L level, and NOR gate NG1 supplies the output signal at the H level, so that MOS transistor QP72 is turned of Node ND70 is discharged to the ground voltage level from MOS transistor QN71 via unit cell UC in the miss state in entry ERY. In this state, latch instructing signal LAT attains the H level, and latch 16 attains the through state. Node ND70 is at the ground voltage level, and latch 16 outputs signal ML_OUT at the L level according to internal search instructing signal MA_ML.

In a cycle starting at time T4, precharge instructing signal T4 attains the H level again. Accordingly, match line ML is precharged to the ground voltage level, and node ND70 is discharged to the ground voltage level (MOS transistor QP72 is off).

In a period between times T3 and T5, charge instructing signal CHA_n attains the L level, and capacitance element CQ2 is charged to accumulate electric charges.

In the search cycle starting at time T5, operations similar to the previous search cycle are performed. Specifically, capacitance element CQ2 of match line ML charges match line ML and internal node ND70 to raise the voltage levels thereof. When the charge-up operation is completed, pull-up current supply instructing signal MLPU_n attains the H level, and the charge-up operation is completed.

Then, precharge instructing signal PRE attains the H level, NOR gate NG1 generates the output signal at the L level and accordingly, MOS transistor QP72 is turned on. When entry ERY corresponding to match line ML is in the match state, a path of discharging match line ML is not present. Therefore, MOS transistors QP71 and QP72 charge the node ND70 to raise finally the voltage level of internal search instructing signal MA_ML to the level of power supply voltage VDD. Even when node ND70 is charged to the power supply voltage level, MOS transistor QN71 prevents the voltage level of match line ML from exceeding precharge voltage VML.

At time T7, precharge instructing signal PRE attains the L level. However, node ND70 is already at the H level, and the output signal of NOR gate NG1 is at the L level. Therefore, signal MA_ML on node ND70 is kept at the H level. At time T7, latch instructing signal LAT attains the H level, latch 16 enters the through state to produce signal ML_OUT at the H level corresponding to signal MA_ML on node ND70.

During this period, match line ML has no discharging path, and is kept at the level of precharge voltage VML. At time T8, the latch operation of the output signal is performed. Latch instructing signal LAT attains the L level, and latch 16 attains the latch state. Also, discharge instructing signal DIS attains the L level, match line ML is discharged to the ground voltage level and node ND70 is likewise discharged to the level of ground voltage. Accordingly, the output signal of NOR gate NG1 attains the H level, and MOS transistor QP72 is turned off. Thus, node ND70 and match line ML are reliably discharged to the ground voltage level.

Charge-up circuit 110 pulls up match line ML to the predetermined voltage level, using capacitance element CQ2, and accordingly, the voltage levels of match line ML and internal node ND70 can be rapidly changed, to perform the search operation faster. Capacitance element CQ2 is used for the charging, and the voltage VDD on the power supply node is not consumed during charging of match line ML. Therefore, occurrence of power supply noises is suppressed when pulling up the match line. It is necessary to perform the charging of capacitance element CQ2 merely over a clock cycle period during the period between times T3 and T5 and between times T7 and T8. Therefore, the charging of capacitance element CQ2 is performed slowly, which can reduce the peak current.

Figure 29:
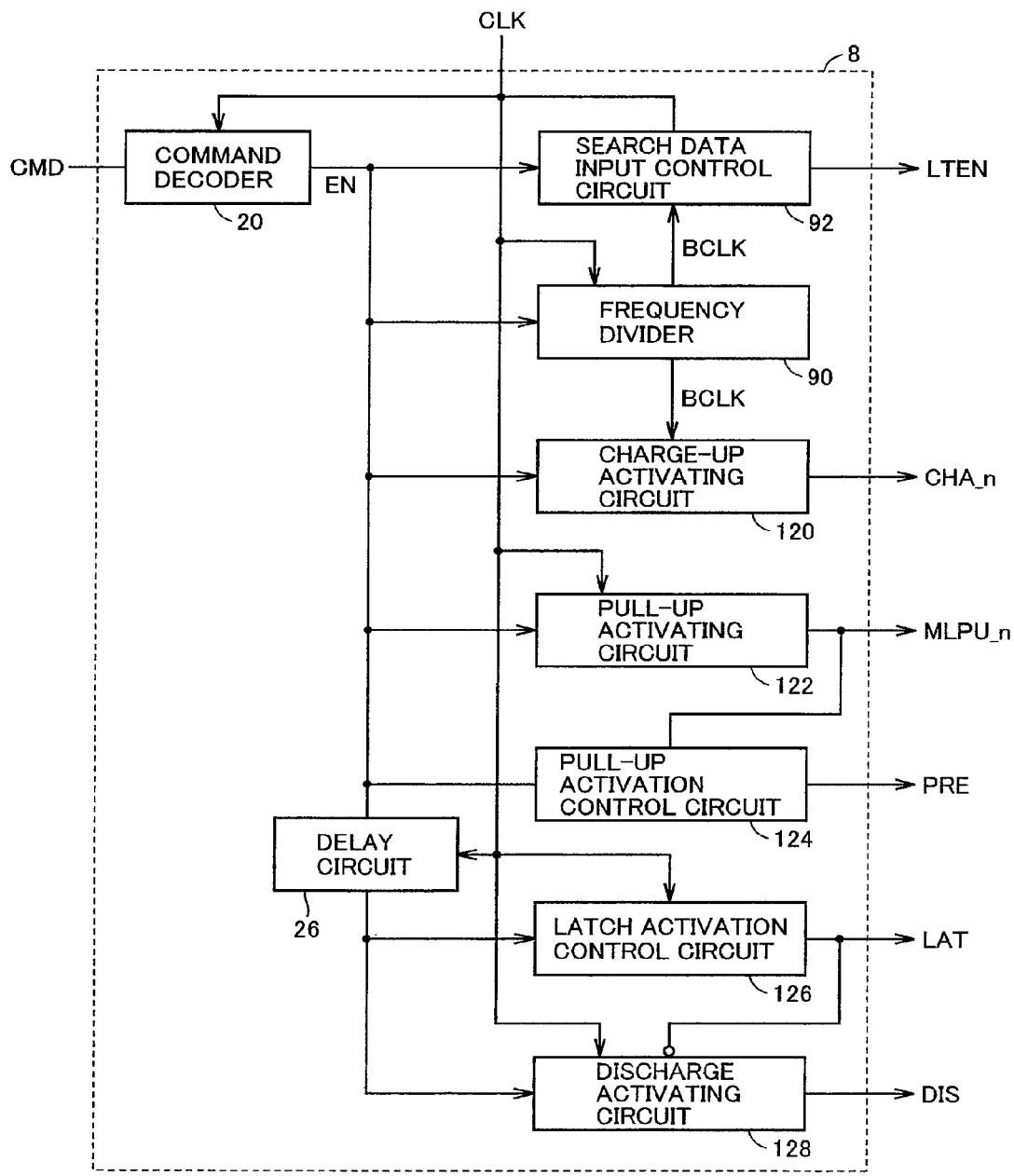
FIG. 29 schematically shows a construction of a control signal generating portion of the content addressable memory according to the eighth embodiment of the invention.

FIG. 29 shows an example of a construction of a circuit for generating the control signals in the content addressable memory according to the eighth embodiment of the invention. In FIG. 29, control circuit 8 includes command decoder 20 for decoding command CMD in synchronization with clock signal CLK, a frequency divider 90 for frequency-dividing clock signal CLK according to the activation of search operation instruction EN received from command decoder 20, and a search data input control circuit 92 for producing search latch instructing signal LTEN to the search data input circuit according to frequency-divided clock signal BCLK of frequency divider 90 and the search operation instruction.

Control circuit 8 further includes a charge-up activating circuit 120 for producing charge instructing signal CHA_n according to frequency-divided clock signal BCLK of frequency divider 90 and search operation instruction EN, a pull-up activating circuit 122 for producing pull-up current supply instructing signal MLPU_n in the form of a predetermined one-shot pulse according to search operation instruction EN and clock signal CLK, and a pull-up activation control circuit 124 for producing precharge instructing signal PRE. Pull-up activation control circuit 124 activates (produces) search operation instruction EN in response to falling of pull-up current supply control signal MLPU_n received from pull-up activating circuit 122 when search operation instruction EN is active.

Control circuit 8 further includes delay circuit 26 for delaying search operation instruction EN by a period of one clock cycle, a latch activation control circuit 126 for maintaining latch instructing signal LAT at the H level for a predetermined period according to the pulse signal from delay circuit 26 and clock signal CLK, and a discharge activating circuit 128 for maintaining discharge instructing signal DIS at the H level for a predetermined period in response to the falling of latch instructing signal LAT received from latch activation control circuit 126.

Frequency divider 90, search data input control circuit 92, command decoder 20 and delay circuit 26 have the same constructions as those in the control circuit shown in FIG. 24. Charge-up activating circuit 120 drives and maintains charge instructing signal CHA_n to the H level for a period of half a clock cycle of frequency-divided clock signal BCLK when search operation instruction EN is active.

Pull-up activating circuit 122 has the construction of the one-shot pulse generating circuit, and maintains pull-up current supply instructing signal MLPU_n at the L level for a predetermined period after the search operation starts. Pull-up activation control circuit 124 maintains precharge instructing signal PRE at the H level in response to the rising of pull-up instructing signal MLPU_n to the H level until clock signal CLK rises subsequently.

When the output signal of delay circuit 26 is active, latch activation control circuit 126 maintains latch instructing signal LAT at the H level during the H level of clock signal CLK. When latch instructing signal LAT falls to the L level, discharge activating circuit 128 drives discharge instructing signal DIS to the H level, and maintains the H level until clock signal CLK rises subsequently (when delay circuit 26 is active).

According to the eighth embodiment of the invention, as described above, the pull-up operation is performed on the match line, using the accumulated (charged) charges of the capacitance element. In addition to the effects of the seventh embodiment, the match line can be rapidly driven to the predetermined voltage level. For pulling up the match line, the charged electric charges of the capacitance element are utilized, and the production of power supply noises can be suppressed when the match lines are pulled up.

Ninth Embodiment

Figure 30:
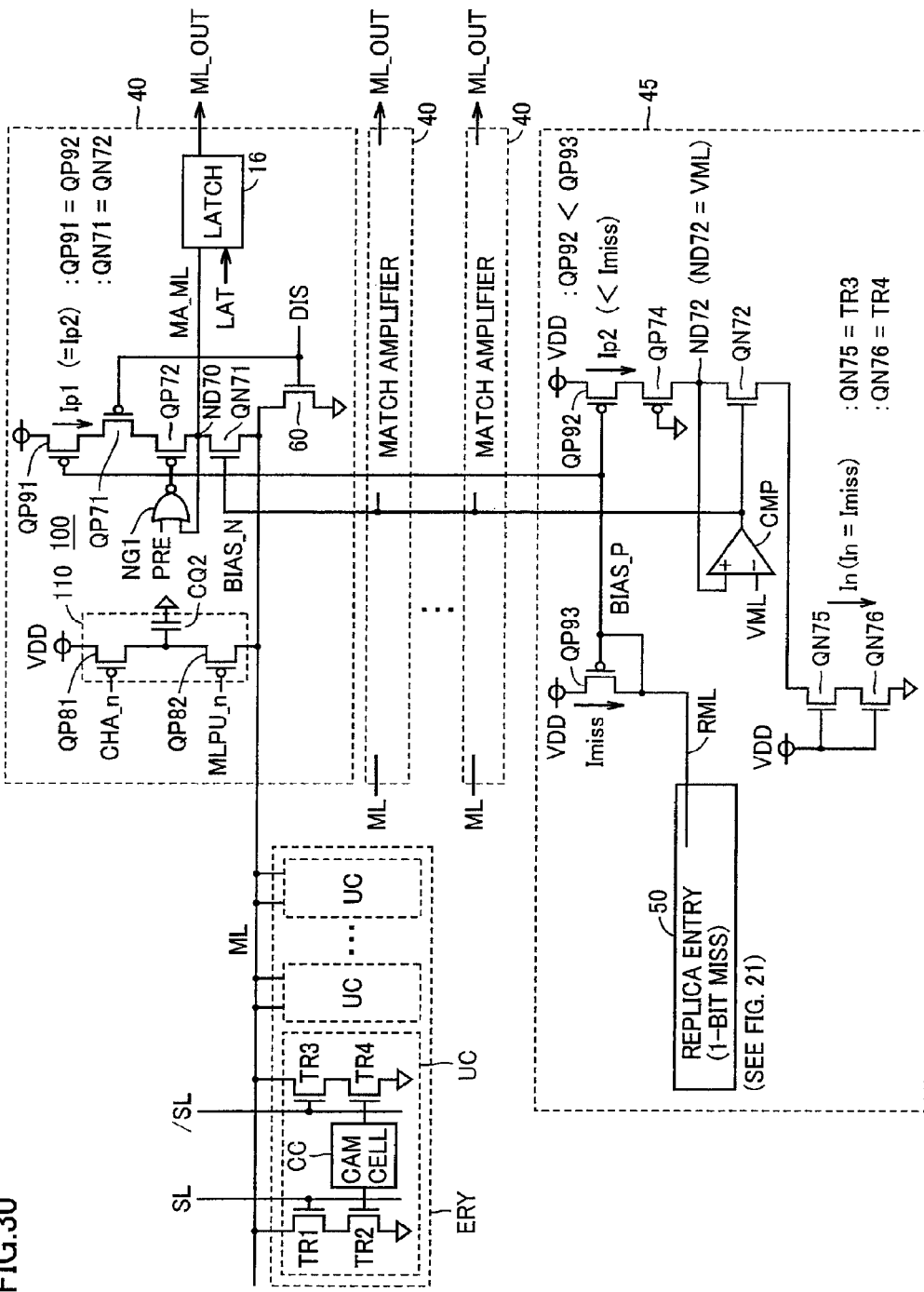
FIG. 30 schematically shows a main portion of a content addressable memory according to a ninth embodiment of the invention.

FIG. 30 shows a main portion of a content addressable memory according to a ninth embodiment of the invention. The content addressable memory shown in FIG. 30 differs from the content addressable memory shown in FIG. 27 in constructions of bias voltage generating circuit 45 and latch amplifier 40.

Specifically, bias voltage generating circuit 45 is provided with replica entry 50 including unit cells having one-bit unit cell in the miss state. This replica entry 50 has the same internal construction as replica entry 50 in FIG. 21. Replica match line RML arranged for replica entry 50 is supplied with a current via a P-channel MOS transistor QP93 that has a gate and a drain connected to each other. Therefore, a current IMISS supplied from MOS transistor QP93 has substantially the same magnitude as the match line current discharged via replica entry 50 including the replica unit cells having the one-bit in the miss state, and is equal to a sum of one-bit miss current Imiss in entry ERY and the off-leakage current flowing through the remaining unit cells in the match state.

This bias voltage generating circuit further includes a P-channel MOS transistor QP92 forming a current mirror circuit with MOS transistor QP93. MOS transistor QP92 supplies a current to MOS transistor QP74. Other constructions of bias voltage generating circuit 45 are the same as those of the bias voltage generating circuit shown in FIG. 27. Corresponding portions are allotted the same reference numerals, and description thereof will not be repeated.

MOS transistor QP92 is smaller in size than MOS transistor QP93. Therefore, MOS transistor QP92 passes a current Ip2 smaller than a current IMISS flowing through MOS transistor QP93, and smaller than the current flowing through the match line in the one-bit mismatch state.

Match amplifier 40 includes a P-channel MOS transistor QP91 receiving a gate voltage BIAS_P of MOS transistor QP93 on its gate and supplying a current to MOS transistor QP71. MOS transistor QP91 is the same in size as MOS transistor QP92. These MOS transistors QP91 and QP92 each form a current mirror circuit with MOS transistor QP93, and pass currents Ip1 (=IP2) of the same magnitude.

Other constructions of match amplifier 40 are the same as those of the match amplifier shown in FIG. 27. Corresponding portions are allotted the same reference numerals, and description thereof will not be repeated.

In the construction of the content addressable memory shown in FIG. 30, bias voltage BIAS_P corresponding to the current equal to or smaller than the match line current in the one-bit miss state is produced, using replica entry 50. Similarly to the construction shown in FIG. 21, even with variations in parameters of unit cells UC in entry ERY of the memory cell array, the current flowing through unit cell UC can be corrected. For example, it is assumed that the variations in process parameters cause the current flowing through the P-channel MOS transistor to increase above a normal magnitude, and also cause the current flowing through the N-channel MOS transistor to decrease below a normal magnitude. In this case, the miss current flowing through unit cell UC in the miss state becomes small in entry ERY. In this case, however, current In flowing through the N-channel MOS transistor likewise decreases in replica entry 50, and accordingly, currents Ip2 and Ip1 flowing through MOS transistors QP92 and QP91, respectively, decrease. In entry ERY storing the actual data, therefore, even in the search miss, the charging current quantity for match line ML is adjusted according to the variations in the discharging current, and the accurate search operation can be achieved.

As shown in FIG. 30, the current of the same magnitude as the miss current of entry ERY storing one-bit miss data is caused to flow, using replica entry 50. Accordingly, current Ip1 flowing through P-channel MOS transistor QP91 can be smaller than match line current IMISS (including an off-leakage current) in the one-bit mismatch state. Thus, the match line can be charged accurately regardless of variations in process parameters, and the accurate search operation can be achieved.

According to the ninth embodiment of the invention, as described above, the bias voltage generating circuit produces the match line current in the one-bit miss state, using the replica entry, and adjusts the match line charging current of the pull-up/sense circuit in the match amplifier. Therefore, the search operation can be accurately performed regardless of the variations in process parameters. Further, the effects similar to those of the eighth embodiment can be achieved.

The effects by this construction using the replica entry can likewise be achieved in the sixth embodiment shown in FIG. 21.

Tenth Embodiment

Figure 31:
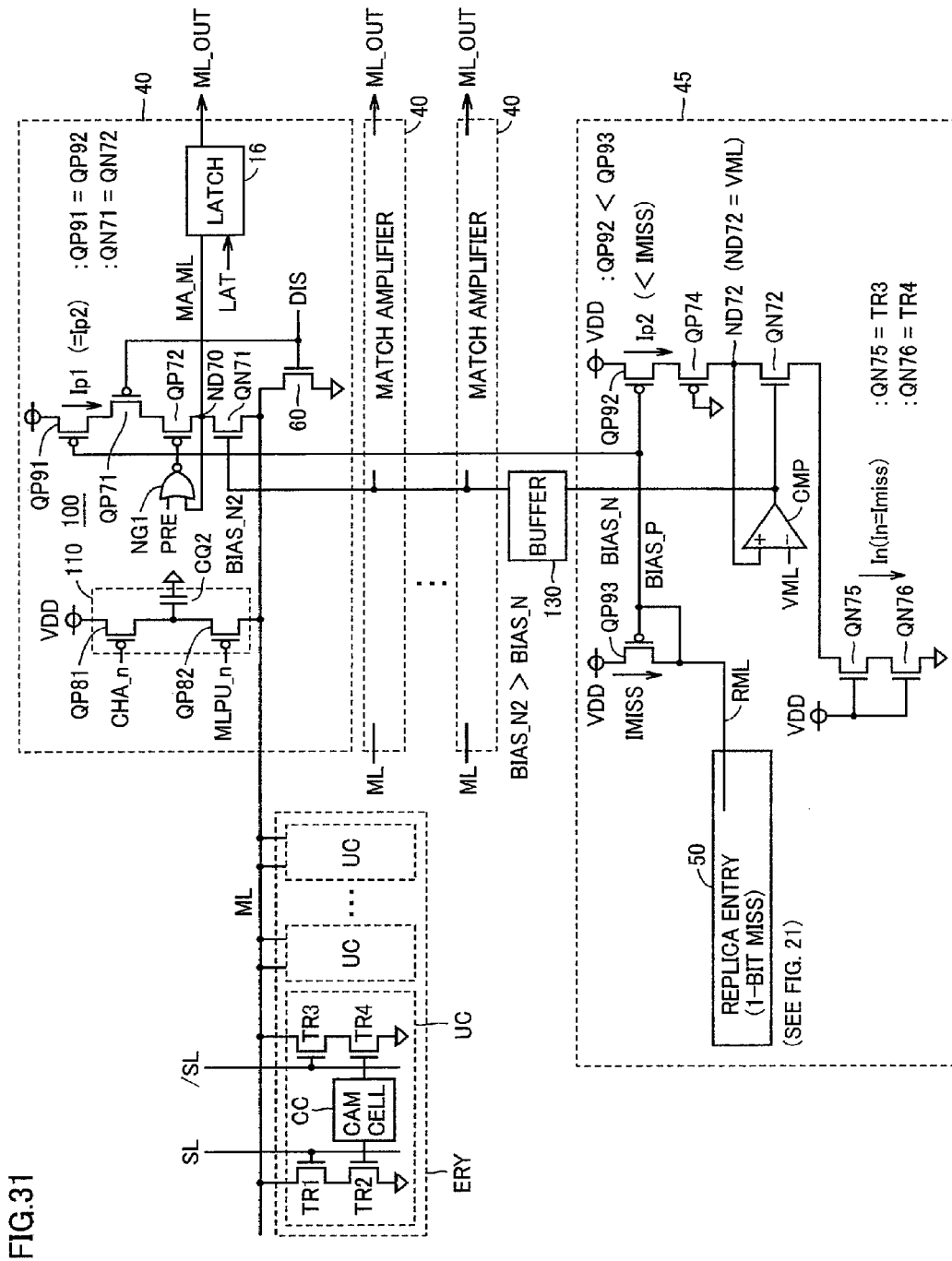
FIG. 31 schematically shows a main portion of a content addressable memory according to a tenth embodiment of the invention.

FIG. 31 shows a main portion of a content addressable memory according to a tenth embodiment of the invention. The construction of the content addressable memory shown in FIG. 31 differs from the construction of the content addressable memory shown in FIG. 30 in the following construction. The content addressable memory in FIG. 31 includes a buffer 130 for converting the level of bias voltage BIAS_N produced by bias voltage generating circuit 45. Buffer 130 converts bias voltage BIAS_N into a bias voltage BIAS_N2 having a slightly boosted level, and voltage BIAS_N2 produced by the level conversion is applied, as the bias voltage, to the gate of N-channel MOS transistor QN71 of each match amplifier 40. Other constructions of the content addressable memory shown FIG. 31 are the same as those of the content addressable memory shown in FIG. 30. Corresponding portions are allotted the same reference numerals, and description thereof is not repeated.

Bias voltage BIAS_N2 is at the voltage level slightly higher by a voltage ΔV than bias voltage BIAS_N provided from bias voltage generating circuit 45. Voltage ΔV is 100 mV or lower. When the gate potential of N-channel MOS transistor QN71 lowers below a desired value, the conductance of MOS transistor QN71 lowers, and the current flowing through match line ML is restricted. Node ND70 is charged by a current component thus restricted, and the voltage level of signal MA_ML on node ND70 rises. When the search result is the miss, match line ML is driven toward the ground voltage level. However, there is a possibility that internal node ND70 in match amplifier 40 is not driven to the ground voltage level due to the restricted current component described above, but attains the H level to cause a malfunction of erroneously determining the state as the match state. Therefore, bias voltage BIAS_N2 applied to the gate of MOS transistor QP71 is set to the voltage level slightly higher than the desired value BIAS_N. Thus, it is possible to suppress a malfunction that may be caused by lowering of bias voltage BIAS_N2 toward the ground voltage due to noises, and the accurate search operation can be achieved.

This embodiment can also achieve the similar effects as the eighth and ninth embodiments.

Figure 32:
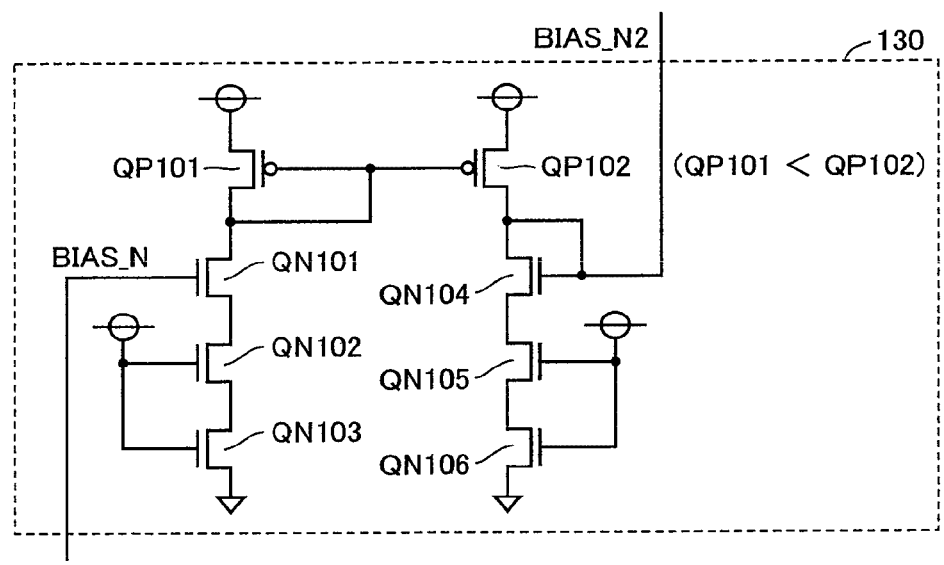
FIG. 32 shows an example of a construction of a buffer shown in FIG. 31.

FIG. 32 shows an example of a construction of buffer 130 shown in FIG. 31. In FIG. 32, buffer 130 includes P-channel MOS transistors QP101 and QP102 coupled to the power supply node, N-channel MOS transistors QN101-QN103 connected in series between MOS transistor QP101 and the ground node, and N-channel MOS transistors QN104-QN106 connected in series between MOS transistor QP102 and the ground node.

MOS transistors QP101 and QP102 form a current mirror circuit. P-channel MOS transistor QP101 has a gate and a drain connected to each other, and serves as a master stage of the current mirror circuit. MOS transistor QN101 receives bias voltage BIAS_N on its gate. MOS transistor QN104 has a gate and a drain connected to each other, and produces level-converted bias voltage BIAS_N2 at its gate. MOS transistors QN102, QN103, QN105 and QN106 have gates coupled to the power supply node. These N-channel MOS transistors QN101-QN106 have the same size. MOS transistor QP101 has a smaller size than MOS transistor QP102.

In the construction of buffer 130 shown in FIG. 32, MOS transistor QN101 operates as a constant current supply according to its bias voltage BIAS_N, and supplies the current to N-channel MOS transistors QN102 and QN103. The current flowing through MOS transistor QN101 is supplied via MOS transistor QP101. MOS transistor QP102 generates a mirror current of the current flowing through MOS transistor QP101. MOS transistor QP102 has a larger size than MOS transistor QP101. Therefore, MOS transistor QP102 causes a flow of a larger current than MOS transistor QP101 does.

The current is discharged from MOS transistor QP102 to the ground node via MOS transistors QN104-QN106. MOS transistor QN104 has a gate and a drain connected together, and produces on its gate a signal subjected to the current/voltage conversion, i.e., bias voltage BIAS_N2. MOS transistor QN104 passes a larger current than MOS transistor QN101. MOS transistors QN101 and QN104 have the same size. Therefore, MOS transistor QN104 produces bias voltage BIAS_N2 at a higher level than bias voltage BIAS_N.

In buffer 130, MOS-transistors QN101-QN106 are formed in the same manufacturing steps as the MOS transistors employed for discharging the match line of the replica entry. Thus, it is possible to compensate for variations in transistor characteristics due to process variations, and bias voltage BIAS_N2 can be set to a voltage level of a desired value.

According to the tenth embodiment of the invention, as described above, the buffer raises the level of the bias voltage to be supplied to the gate of the MOS transistor that supplies the current to the match line. Therefore, the accurate search operation can be performed even when noises occur towards the ground direction on the bias voltage.

The effects similar to those of the ninth embodiment can be also achieved.

Eleventh Embodiment

Figure 33:
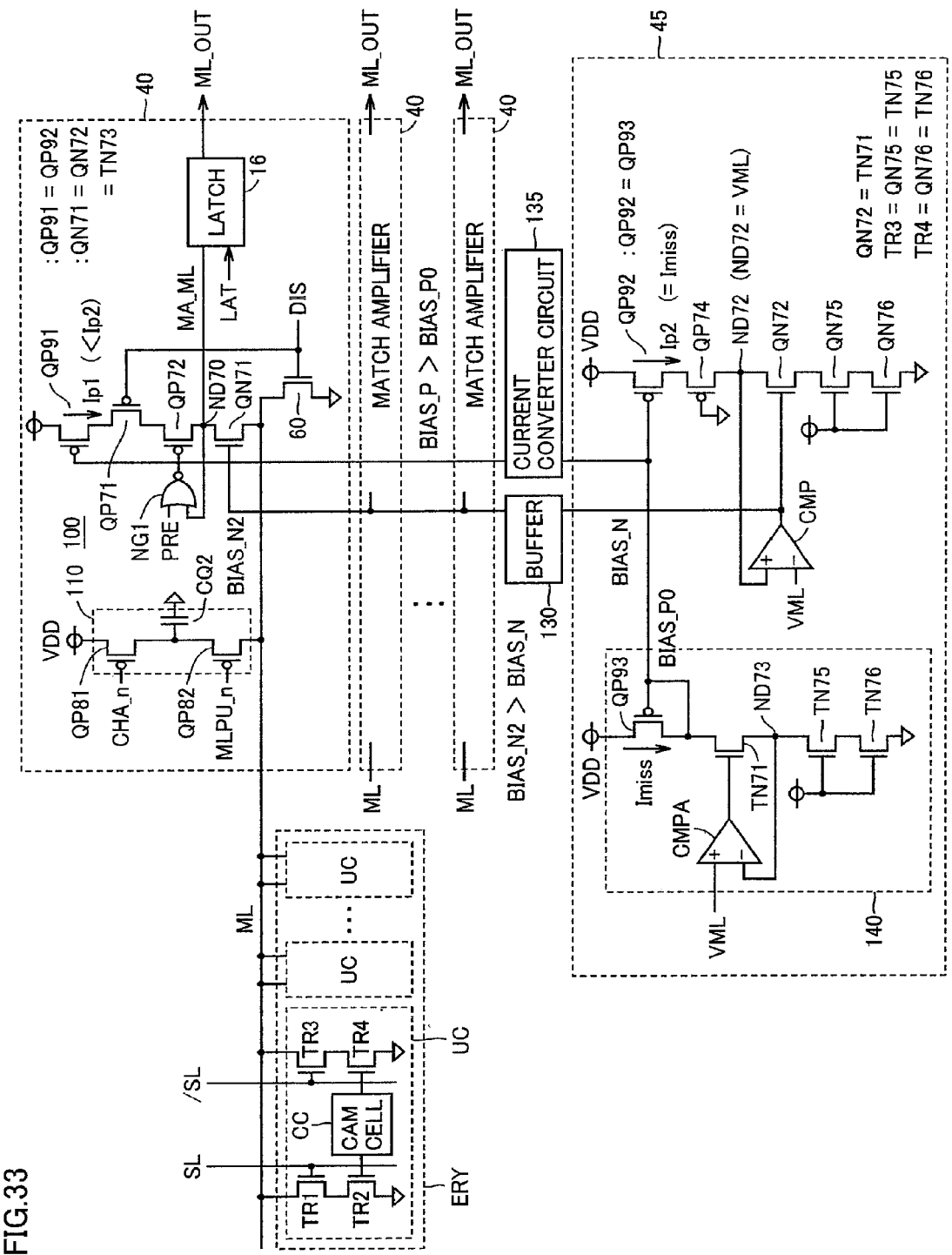
FIG. 33 schematically shows a main portion of a content addressable memory according to an eleventh embodiment of the invention.

FIG. 33 shows a main portion of the content addressable memory according to the eleventh embodiment of the invention. The content addressable memory shown in FIG. 33 differs from the content addressable memory shown in FIG. 31 in the following construction. Bias voltage generating circuit 45 includes a constant current circuit 140 that produces a bias voltage BIAS_P0 to be applied to the gate of MOS transistor QP92. There is also provided a current converter circuit 135 that performs the level conversion on bias voltage BIAS_P0 to apply the level-converted voltage to the gate of MOS transistor QP91 in match amplifier 40. Match amplifier 40 and entry ERY in the memory cell array shown in FIG. 33 have the same constructions as those shown in FIG. 33. Other constructions of bias voltage generating circuit 45 are the same as those shown in FIG. 31. Corresponding portions are allotted the same reference numerals, and description thereof is not repeated.

Constant current circuit 140 includes P-channel MOS transistors QP93 and TN71 connected in series between the power supply node and an internal node ND73, N-channel MOS transistors TN75 and TN76 connected in series between internal node ND73 and the ground node, and a comparing circuit CMPA for comparing the voltage on internal node ND73 and intermediate voltage VML. Comparing circuit CMPA adjusts the gate potential of MOS transistor TN71 according to a result of the comparison.

MOS transistor QP93 has a gate and a drain connected to each other, forms a current mirror circuit with MOS transistor QP92. 3 MOS transistors QP92 and QP93 have the same size, and pass the currents of the same magnitude.

MOS transistors TN75 and TN76 have gates coupled to the power supply node, and are always on. MOS transistors TN75 and TN76 have the same sizes as transistors TR3 and TR4 or transistors TR1 and TR2 in unit cell UC, respectively, and pass one-bit pull-out current In (Imiss).

Comparing circuit CMPA has a positive input receiving precharge voltage VML and a negative input coupled to internal node ND73. Through the feedback control of comparing circuit CMPA and MOS transistor TN71, the voltage level of internal node ND73 is set equal to the level of intermediate voltage (precharge voltage) VML. Therefore, the voltage of node ND73 accurately is held at the level of precharge voltage VML even when variations occur in power supply voltage VDD. Thus, one-bit pull-out current In (=Imiss) can be accurately produced without an influence of the variations in power supply voltage.

In constant current circuit 140, therefore, MOS transistor QP93 passes the current of the same magnitude as the current flowing when the one-bit unit cell in the miss state passes one-bit pull-out current In (Imiss) through match line ML. Therefore, bias voltage BIAS_P0 produced by MOS transistor QP93 is at the voltage level corresponding to the one-bit pull-out current. MOS transistor QP92 has the same size as MOS transistor QP93, and current Ip2 is the same in magnitude as one-bit pull-out current In (=Imiss).

Current converter circuit 135 performs the level conversion on bias voltage BIAS_P0 to raise its voltage level slightly. Thereby, match amplifier 40 can pass, through MOS transistor QP91, current Ip1 that is smaller than one-bit pull-out current In and is larger than a total current IOFF of the off-leakage current of all the bits.

This bias voltage generating circuit 45 holds the internal node connected to the replica search transistors at the level of precharge voltage VML of the match line. Thus, it is possible in the match line precharge state to produce stably the current of a magnitude nearly equal to that of the current discharged by the one-bit unit cell in the miss state so that the amplitude of the match line can be restricted more accurately to reduce the current consumption.

Construction 1 of Current Converter Circuit

Figure 34:
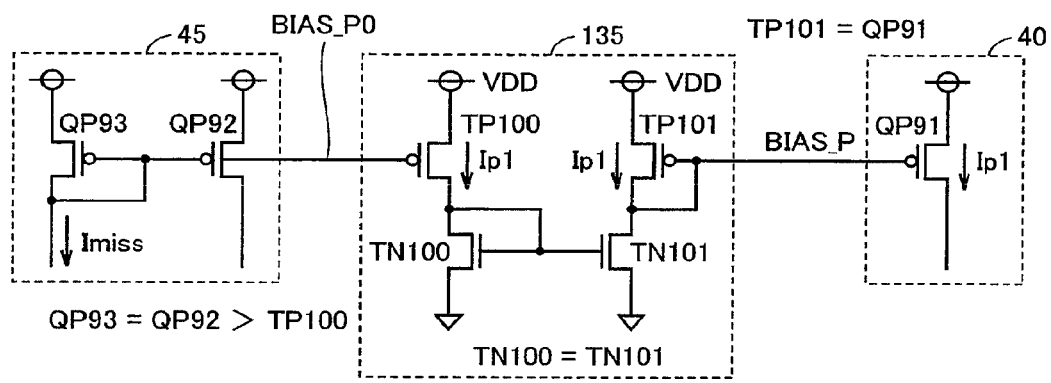
FIG. 34 shows an example of a construction of a current converter circuit shown in FIG. 33.

FIG. 34 shows an example of a construction of current converter circuit 135 shown in FIG. 33. In FIG. 34, current converter circuit 135 includes a P-channel MOS transistor TP100 that is coupled to the power supply node and receives bias voltage BIAS_P0 on its gate, and an N-channel MOS transistor TN100 receiving a current from MOS transistor TP100.

Constant current circuit (140) produces bias voltage BIAS_P0. MOS transistor TN100 has a gate and a drain connected to each other.

Current converter circuit 135 further includes an N-channel MOS transistor TN101 and a P-channel MOS transistor TP101 supplying a current from the power supply node to MOS transistor TN101. MOS transistor TN101 form a current mirror circuit with MOS transistor TN100. MOS transistor TP101 has a gate and a drain connected to each other.

MOS transistor TP101 produces bias voltage BIAS_P on its gate, and applies bias voltage BIAS_P to the gate of MOS transistor QP91 of match amplifier 40.

In bias voltage generating circuit 45, MOS transistors QP92 and QP93 are the same in size (ratio of channel length L over channel width W, W/L), and pass current Imiss of the same magnitude. MOS transistor TP100 is smaller in size than MOS transistors QP92 and QP93. Therefore, current Ip flowing through MOS transistor TP is smaller than current Imiss driven by the replica search transistor.

MOS transistors TN100 and TN101 are the same in size, and pass the currents of the same magnitude. MOS transistor TN101 is supplied with a current from MOS transistor TP101, and current Ip1 flows through MOS transistor TP101. MOS transistors TP101 and QP91 are the same in size, and pass the currents of the same magnitude. Thus, match amplifier 40 can supply, as the pull-up current, the current smaller than the one-bit pull-out current to the match line.

Construction 2 of Current Converter Circuit

Figure 35:
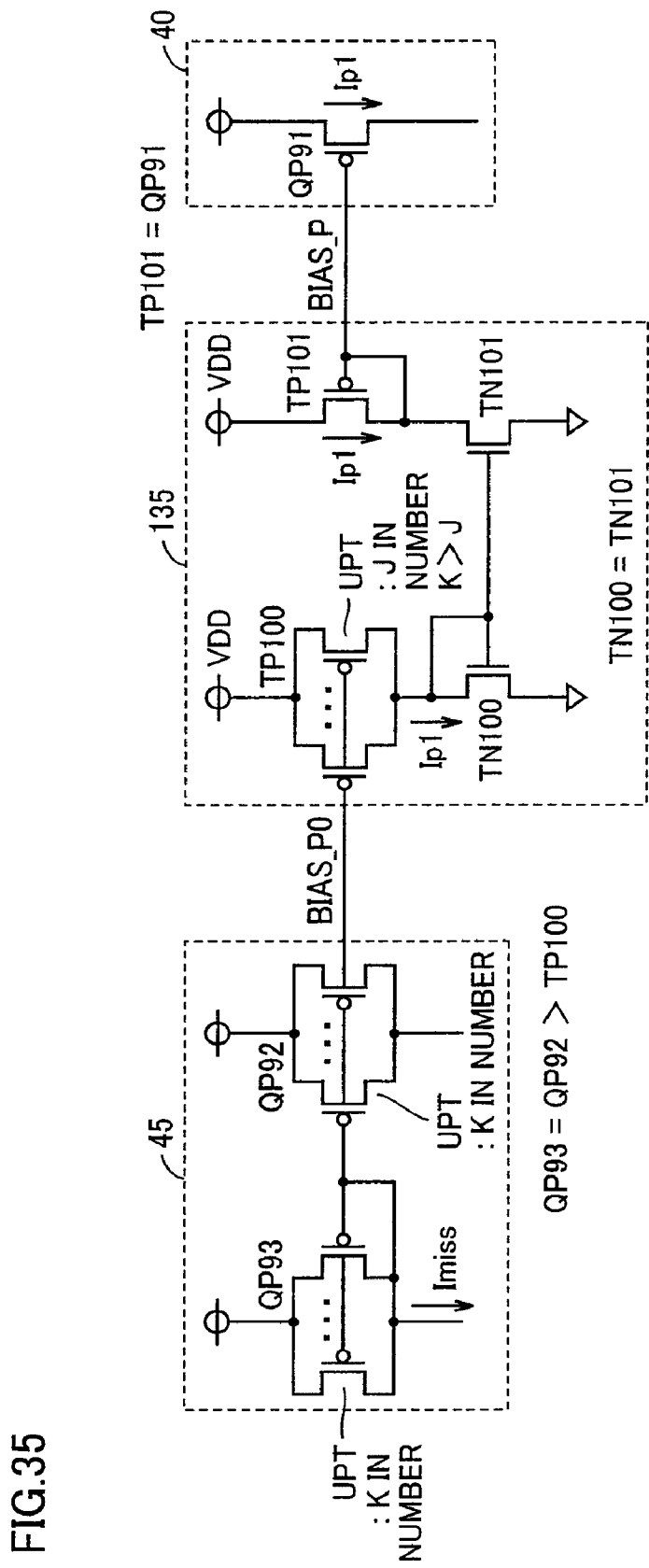
FIG. 35 shows another construction of the current converter circuit shown in FIG. 33.

FIG. 35 shows a construction of a modification of the current converter circuit shown in FIG. 33. In the construction shown in FIG. 35, each of MOS transistors QP92 and QP93 is formed of a parallel connection of K unit P-channel MOS transistors UPT, and passes the one-bit pull-out current. MOS transistor TP101 in current converter circuit 135 is formed of a parallel connection of unit P-channel MOS transistors of J in number smaller than K (J<K). Other constructions of current converter circuit 135 are the same as those shown in FIG. 34. Corresponding portions are allotted the same reference numerals, and description thereof is not repeated.

Unit transistor UPT has a channel width and a channel length each set to a unit value. Therefore, a total channel width of MOS transistor TP101 is smaller than a total channel width of each of MOS transistors QP93 and QP92. Accordingly, current Ip1 flowing through MOS transistor TP101 can be smaller than the current flowing through each of MOS transistors QP92 and QP93. By merely adjusting the number of unit transistors, a relationship (a mirror ratio) between current Imiss (=In) and current Ip1 can be set. Thus, the match line pull-up current can be set to a desired value without any influence of variations in manufacturing parameters.

Construction of Buffer

Figure 36:
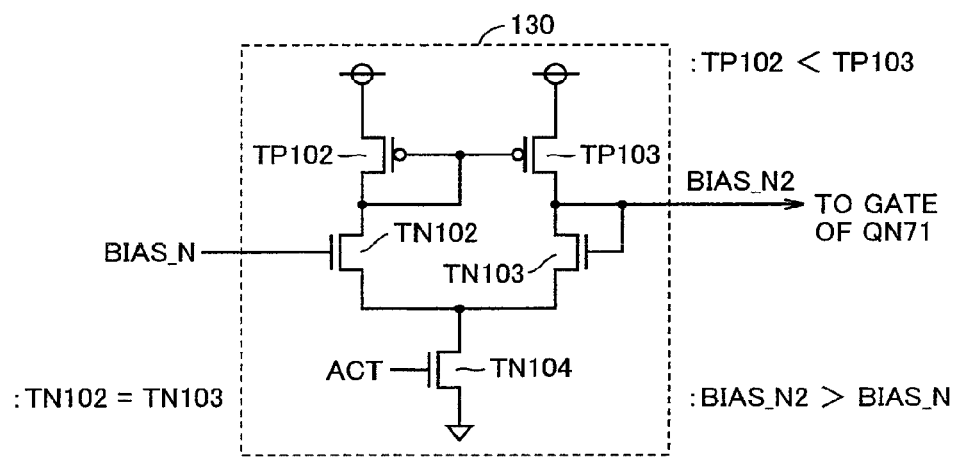
FIG. 36 shows an example of a construction of a buffer shown in FIG. 33.

FIG. 36 shows a construction of buffer 130 shown in FIG. 33. In the construction shown in FIG. 33, buffer 130 may be configured using the construction shown in FIG. 32. Alternatively, the buffer shown in FIG. 36 can be applied to the buffer shown in FIG. 33.

Referring to FIG. 36, buffer 130 includes a P-channel MOS transistor TP102 having a gate and a drain connected to each other, and is supplied with a current from the power supply node, and an N-channel MOS transistor TN102 receiving a bias voltage BIAS_N on its gate and supplied with a current from MOS transistor TP102. Bias voltage generating circuit (45) supplies bias voltage BIAS_N.

Buffer 130 includes a P-channel MOS transistor TP103 supplied with a current from the power supply node, an N-channel MOS transistor TN103 supplied with a current from MOS transistor TP103, and an N-channel MOS transistor TN104 connected between a ground and a common source of MOS transistors TN102 and TN103.

P-channel MOS transistor TP103 form a current mirror circuit with MOS transistor TP102. MOS transistor TN103 has a gate and a drain connected to each other. MOS transistor TN104 receives an activation signal ACT on its gate.

MOS transistor TP102 is smaller in size than MOS transistor TP103. MOS transistor TP103 passes a larger current (a mirror ratio being larger than unity). MOS transistors TN102 and TN103 are the same in size. MOS transistor TN104 controls the activation of buffer 130 according to activation signal ACT. A quantity of current supplied from MOS transistor TN103 to MOS transistor TN103 is larger than an quantity of a current supplied from TP102 to MOS transistor TN102. Therefore, the potential of the gate of MOS transistor TN103 is higher than the gate potential of MOS transistor TN102. Accordingly, bias voltage BIAS_N2 can be higher than bias voltage BIAS_N by 100 mV or so.

Sources of MOS transistors TN102 and TN103 are commonly connected to transistor TN104. Therefore, MOS transistors TN103 and TN104 have the same source potentials, and bias voltage BIAS_N2 can be accurately produced according to a difference between the respective current amounts flowing through transistors TN102 and TN103.

The effect of buffer 135 is the same as that of the tenth embodiment shown in FIG. 31, and the noise margin for the lowering of the bias voltage can be increased.

In the buffer 135 shown in FIG. 36, in order to adjust the mirror ratio through adjustment of the sizes of MOS transistors TP102 and TP103, the parallel connections of the unit transistors may be employed as shown in FIG. 35, with the number of the unit transistors in each parallel connection adjusted for adjusting the mirror ratio.

[Modification]

Figure 37:
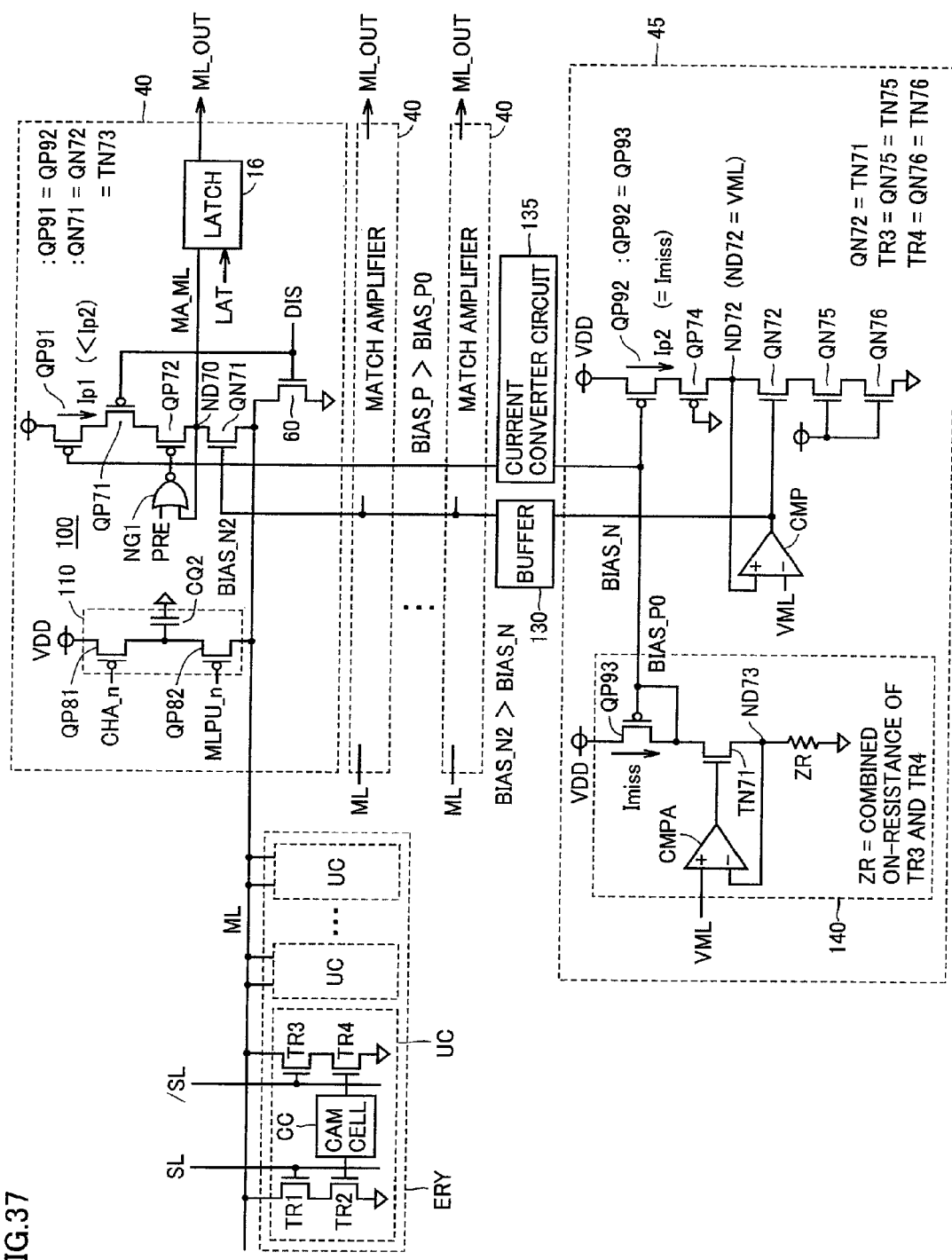
FIG. 37 schematically shows a main portion of a content addressable memory of a modification of the eleventh embodiment of the invention.

FIG. 37 shows a construction of a modification of the eleventh embodiment of the invention. The content addressable memory shown in FIG. 37 differs from the content addressable memory shown in FIG. 33 in the following construction. In a constant current circuit 140 shown in FIG. 37, a resistance element ZR is employed instead of MOS transistors TN75 and TN76. This resistance element ZR has the resistance of the same value as the combined on-resistance of MOS transistors TR1 and TR2 or transistors TR3 and TR4 in the discharging path of the unit cell in the miss state when match line ML is at the voltage VML.

Other constructions shown in FIG. 37 are the same as those of the content addressable memory in FIG. 33. Corresponding portions are allotted the same reference numerals, and description thereof is not repeated.

Resistance element ZR has a resistance value equal to a combined on-resistance value of the series of search MOS transistors in the unit cell, and thus has a low resistance value. Therefore, even when resistance element ZR is formed of a metal interconnection line, the occupation area thereof is small, and increase in circuit occupation area can be suppressed. By employing resistance element ZR implemented by the metal interconnection line or the like, it is possible to implement the resistance element being small in variations of process parameter, and accordingly a constant current of a desired magnitude can be stably produced.

According to the eleventh embodiment of the invention, as described above, the constant current circuit is used to pass the one-bit pull-out current under the state when the match line voltage is at the level of the precharge voltage, and the mirror current of the passing current is used to adjust the quantity of the pull-up current supplied to the match line in the match amplifier. Therefore, the match line can accurately and stably pass the current equal to or smaller than the current flowing in the one-bit miss state, or one-bit miss current.

Effects similar to those of the tenth embodiment can be also achieved.

Twelfth Embodiment

Figure 38:
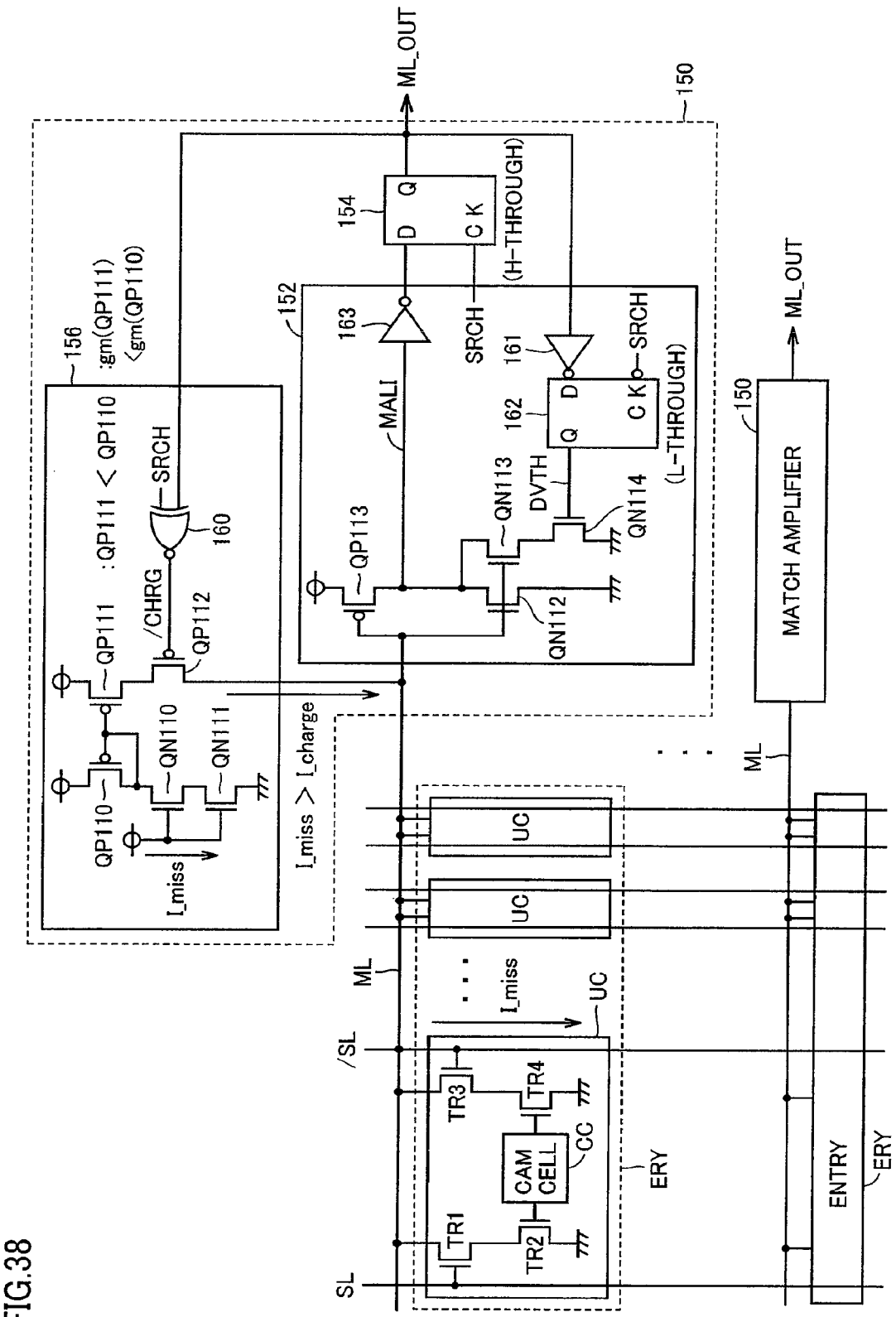
FIG. 38 schematically shows a main portion of a content addressable memory according to a twelfth embodiment of the invention.

FIG. 38 shows a construction of a content addressable memory according to a twelfth embodiment of the invention. In the content addressable memory shown in FIG. 38, match amplifier 150 arranged corresponding to each respective match line ML is different in construction from the match amplifiers in the embodiments described previously. Each match amplifier arranged corresponding to a respective match line ML has the same construction as the others, and FIG. 38 representatively shows the construction of match amplifier 150 arranged for one match line.

According to the search result in the last search cycle, match amplifier 150 according to the twelfth embodiment charges corresponding match line ML and in addition, sets the potential level determination reference for this match line. Specifically, match amplifier 150 includes a sense circuit 152 for sensing the potential level of match line ML, a latch circuit 154 for latching the output signal of sense circuit 152 according to a search instructing signal SRCH, and a charge circuit 156 for selectively supplying a charge current I_charge to corresponding match line ML in the search operation. Charge circuit 156 controls the supply of charging current according to output signal ML_OUT of latch circuit 154.

Latch circuit 154 receives search instructing signal SRCH on its clock input CK. When search instructing signal SRCH is at the H level, latch circuit 154 attains the through state, to output a signal received at its D input from a Q output.

Sense circuit 152 includes a P-channel MOS transistor QP113 connected between the power supply node and an internal signal line MALI and having a gate coupled to corresponding to match line ML. Sense circuit 152 also includes an N-channel MOS transistor QN112 connected between the internal signal line and the ground node and having a gate coupled to corresponding match line ML.

Sense circuit 152 further includes an inverter 163 receiving the signal MALI from MOS transistors QP113 an QN112, to produces an output signal to input D of D-latch circuit 154, and an inverter 161 receiving the output signal from output Q of D-latch circuit 154. Sense circuit 152 further includes a D-latch circuit 162 receiving the output signal of inverter 161 at its input D, and N-channel MOS transistors QN113 and QN114 connected in series between an internal signal line MALI and the ground node.

D-latch circuit 162 attains the latch state when search instructing signal SRCH applied to clock input CK is at the H level, and attains the through state when search instructing signal SRCH is at the L level.

MOS transistor QN113 has a gate coupled to match line ML. MOS transistor QN114 receives on its gate an output signal DVTH from output Q of D-latch circuit 162.

In sense circuit 152, MOS transistors QP113 and QN112-QN114 form an inverter buffer for sensing the potential of corresponding match line ML, and the input logical threshold voltage of this inverter buffer is corrected according to output signal DVTH of D-type latch circuit 162. When MOS transistor QN114 is conductive (signal DVTH is at the H level), the input logical threshold voltage of this inverter buffer is low. When MOS transistor QN114 is non-conductive, the input logical threshold voltage of the inverter buffer is high. Therefore, the potential determination reference for match line ML is adjusted according to a result of the search in the immediately preceding cycle.

Charge circuit 156 includes P-channel MOS transistors QP110 and QP111 each coupled to the power supply node. MOS transistors QP110 and QP111 form a current mirror circuit. Charge circuit 156 further includes N-channel MOS transistors NQ110 and NQ111 connected between MOS transistor QP110 and the ground node, an EXNOR circuit 160 receiving the output signal of D-type latch circuit 154 and search instructing signal SRCH, and a P-channel MOS transistor QP112 connected between MOS transistor QP111 and match line ML. MOS transistor QP112 receives on its gate an output signal /CHRG of EXNOR circuit 160.

MOS transistors QN110 and QN111 have gates coupled to the power supply node, and are normally on. MOS transistors QN110 and QN111 are the same in size as transistors TR3 and TR4 or transistors TR1 and TR2 for match line discharging included in unit cell UC, respectively, and pass a current of the same magnitude as one-bit miss current Imiss flowing through one unit cell UC in the miss state (assuming that an off-leakage current in the unit cell in the mismatch state is neglected (In=Imiss)).

MOS transistor QP110 has a gate and a drain connected to each other, and operates as a master stage of the current mirror circuit. MOS transistor QP110 is larger in size (a ratio of a channel width to a channel length) than MOS transistor QP111 (a transconductance gm(QP111) of MOS transistor QP111 is smaller than a transconductance gm(QP110) of MOS transistor QP110). Therefore, when MOS transistor QP112 is on, charging current I_charge supplied to corresponding match line ML is set to a smaller value than one-bit miss current Imiss (although it is set to a larger value than a total of off-leakage currents IOFF of all the bits).

In the search operation, charge circuit 156 likewise operates to turn on selectively P-channel MOS transistor QP112 to charge match line ML according to search result (ML_OUT) in the last search cycle.

Figures 39, 40:
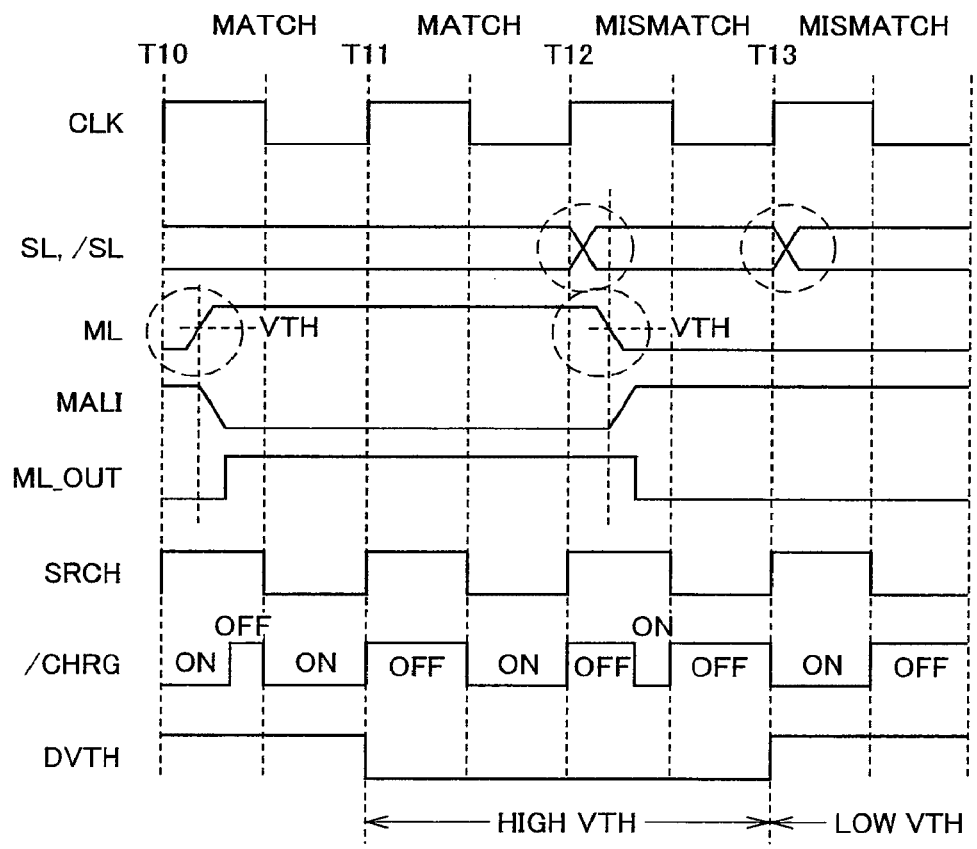
FIG. 39 illustrates, in a table form, operation logic of a charge circuit shown in FIG. 34.
FIG. 40 is a timing chart representing an operation of the content addressable memory shown in FIG. 38.

FIG. 39 shows, in a table form, operation logic of charge circuit 156 shown in FIG. 38. In the search operation, search instructing signal SRCH attains the H level. When the search result in the last search cycle indicates the match state and the signal ML_OUT is at the H level, EXNOR circuit 160 produces the output signal at the H level. Accordingly, MOS transistor QP112 is turned off to stop the charging of match line ML (current I_charge is off in the table). Conversely, when the search result in the last search cycle indicates the mismatch state and the signal ML_OUT is at the L level, EXNOR circuit 160 produces the output signal at the L level. Accordingly, MOS transistor QP112 is turned on to supply current I_charge to corresponding match line ML (current I_charge is on in the table).

In the standby state, search instructing signal SRCH is set to the L level. When the signal ML_OUT in the last search cycle is at the H level indicative of the match state, EXNOR circuit 160 produces output signal /CHRG at the L level. Accordingly, MOS transistor QP112 is turned on to supply the current to match line ML. When the mismatch state is detected in the last search cycle, the output signal /CHRG of EXNOR circuit 160 is at the H level. In this state, therefore, MOS transistor QP112 is in the off state or non-conductive state.

In the search operation, therefore, when the determination result in the last or immediately preceding search cycle indicates the mismatch state and there is a possibility that the corresponding match line is charged in the currently performed search cycle, the current is supplied to corresponding match line ML. During the standby state, the match line that exhibits the match state in the last search cycle is charged to be kept at the H level. The match line that exhibits the mismatch state is not charged during the standby, and corresponding match line ML is kept at the low level of ground voltage attained in the search operation. This is done for preparing for the state transition of the match line in the next search cycle.

FIG. 40 is a timing chart representing an operation of match amplifier 150 shown in FIG. 38. Referring to FIG. 40, the operation of the content addressable memory shown in FIG. 38 will now be described.

The search data on search lines SL and /SL is exchanged for each clock cycle. It is now assumed that match line ML is kept at the ground voltage level.

When the search cycle starts at a time T10 and search instructing signal SRCH attains the H level, EXNOR circuit 160 produces the output signal at the L level as shown in the operation logic table of FIG. 39, and MOS transistor QP112 is turned on. In the search cycle starting at time T10, when the search data matches the stored data, a discharge path is not present for the corresponding match line ML, and the voltage level of match line ML rises. Search instructing signal SRCH is at the H level, and D-type latch circuit 162 is in the latch state. According to search result indicating signal ML_OUT in the last cycle, the signal DVTH applied from D-type latch circuit 162 is at the H level. Therefore, an input logic threshold voltage VTH of sense circuit 152 is at a low voltage level. When match line ML is charged to have the voltage level raised from the ground voltage level, the signal transmitted from sense circuit 152 to internal signal line MALI attains the H level at a faster timing in accordance with input logic threshold voltage VTH at a low voltage level.

When search instructing signal SRCH is at the H level, D-type latch circuit 154 enters the through state to take in and output the signal on internal signal line MALI provided via inverter 163. In this state, therefore, output signal ML_OUT of D-type latch circuit 154 changes according to the signal on internal signal line MALI when search instructing signal SRCH is at the H level. When search instructing signal SRCH is the L level, D-type latch circuit 154 enters the latch state to latch the taken signal and hold the search result.

During the search period of search instructing signal SRCH being at the H level, therefore, when the voltage level of match line ML rises and the voltage level of internal signal line MALI lowers, the signal ML_OUT applied from D-type latch circuit 154 attains the H level according to the output signal of inverter 163. Therefore, the signal /CHRG applied from EXNOR circuit 160 attains the H level, and the charging of match line ML temporarily stops.

When the search period expires and search instructing signal SRCH attains the L level, EXNOR circuit 160 produces the output signal /CHRG at the L level again, and match line ML is charged. In this state, D-type latch circuit 154 is in the latch state. Match line ML thus charged attains the power supply voltage level. D-type latch circuit 154 is in the latch state, and its output signal ML_OUT does not change even when match line ML is charged.

At this time, output signal DVTH of D-type latch circuit 162 is at the H level. Therefore, input logic threshold voltage VTH of sense circuit 152 is low.

In the search cycle starting at a time T11, the search operation for the search data is performed again. In this search cycle, when the result of the search in the last cycle indicates in the match state, output signal DVTH of D-type latch circuit 162 attains the L level according to the rising of search instructing signal SRCH, and MOS transistor QN114 is turned off. Accordingly, input logic threshold voltage VTH of sense circuit 152 is set to a high voltage level.

In the search cycle, when search instructing signal SRCH attains the H level, output signal /CHRG of EXNOR circuit 160 attains the H level. Thereby, MOS transistor QP112 is turned off, and the operation of charging match line ML stops. According to the search result, match line ML is in the match state, and is not discharged, and the signal on internal signal line MALI keeps the L level.

When the search period expires and search instructing signal SRCH attains the L level, D-type latch circuit 154 enters the latch state to hold its output signal ML_OUT at the H level. In charge circuit 156, EXNOR circuit 160 produces output signal /CHRG at the L level. Accordingly, MOS transistor QP112 charges match line ML, and match line ML keeps the power supply voltage level. In entry ERY, unit cells UC, e.g., of 72-288 bits are connected, and off-leakage currents flow through these unit cells in the match state when match line ML is in the match state. When the number of the search data bits is large, the total off-leakage current becomes innegligibly large. This supply of charge current I_charge suppresses the voltage lowering of the match line, which may be caused by the off-leakage currents of the entry in the match state.

In the search cycle starting at a time T12, when the search data does not match the stored data of the entry (in the mismatch state), and search instructing signal SRCH attains the H level, match line ML is discharged through unit cell UC in the miss state, and the voltage level of the match line lowers. Accordingly, the signal on internal signal line MALI rises to the H level, and output signal ML_OUT of D-type latch circuit 154 lowers to the L level. In charge circuit 156, the output signal /CHRG of EXNOR circuit 160 attains the L level, and accordingly, MOS transistor QP112 is turned on. Thereby, current I_charge is temporarily supplied to match line ML. However, current I_charge supplied via MOS transistor QP112 is smaller than discharging current Imiss of match line ML in the mismatch state, and match line ML holds the L level. At this time, input logic threshold voltage VTH of sense circuit 152 is at a high voltage level. Therefore, the voltage lowering of match line ML is sensed at a faster timing, and the voltage level of internal signal line MALI lowers. D-type latch circuit 154 is in the through state, and output signal ML_OUT thereof changes according to the signal on internal signal line MALI. Even when match line ML has not been charged, the discharging current larger than the charging current is passed, so that the voltage level of the match line lowers fast.

When search instructing signal SRCH attains the L level, D-type latch circuit 154 enters the latch state, and the output signal ML_OUT thereof is kept at the L level according to the search result of the current search cycle. Accordingly, output signal /CHRG of EXNOR circuit 160 is kept at the H level. Therefore, match line ML holds the discharged state at the ground voltage level.

In a cycle starting at a time T13, when search instructing signal SRCH rises to the H level, output signal /CHRG of EXNOR circuit 160 attains the L level, and charge current I_charge is supplied to match line ML. At this time, D-type latch circuit 162 produces output signal DVTH at the H level to set input logic threshold voltage VTH of sense circuit 152 to the low voltage level. Charging current I_charge supplied from charge circuit 156 is smaller than the current Imiss (=In) flowing through the one-bit of unit cell in the miss state. Therefore, the voltage level of match line ML is substantially kept at the ground voltage level, and the signal on internal signal line MALI is also kept at the L level. In this state, match line ML and search result indicating signal ML_OUT keep the same state as that in the last search cycle.

As shown within a broken line circle, when the state changes from the mismatch state to the match state or vice versa, match line ML changes its voltage level, and the charging or discharging is performed. The charging or discharging of search lines SL and /SL is performed in the cycle where the bit of the search data changes. Therefore, the current consumption can be reduced by reducing the number of times of the voltage transition on these search lines and the match lines.

FIG. 41 shows, in a table form, the charge consumption per search cycle. For a comparison, FIG. 41 also shows the charge consumption in the cases when the match line and the search lines are precharged to the level of power supply voltage VDD and when precharged to ground voltage GND.

In FIG. 41, M and N represent the numbers of the match lines and the search lines, respectively. Cm and Cs represent a capacitance per match line and a capacitance per search line, respectively.

When the voltage transition occurs on only one match line and the VDD precharge scheme is employed, the match line changes from the level of power supply voltage VDD to the ground voltage level. Therefore, the charge consumption in this case is equal to $(M-1) \cdot Cm \cdot V$, where V represents a voltage difference between power supply voltage VDD and ground voltage GND.

When the match line is precharged to ground voltage GND, the match line causing the voltage transition changes from the ground voltage level to the power supply voltage level. The other match lines keep the level of ground voltage GND. Therefore, the charge consumption per search cycle is $Cm \cdot V$. In the embodiment, when the mismatch and the match occur alternately on one match line, the charges of $(\frac{1}{2}) \cdot Cm \cdot V$ are consumed per search cycle. However, when the match or mismatch state continues without causing the state transition, the charge consumption is zero (the voltage level of the match line does not change).

When the number of the match lines causing the voltage transition are (M/2), the charge consumption per search cycle is $(M/2) \cdot Cm \cdot V$ in either the VDD precharge scheme or the ground voltage (GND) precharge scheme. In the eleventh embodiment, when the match and miss alternately occur, the charge consumption per search cycle is $(M/4) \cdot Cm \cdot V$. When the match or miss continue, the charge consumption is zero.

Since the search line is charged/discharged in each search cycle according to either the VDD precharge scheme or the GND precharge scheme, charges of $N \cdot Cs \cdot V$ are consumed. In this embodiment, when the match and mismatch of the search data alternately occur, the charge consumption on the search line in question is $(N/2) \cdot Cs \cdot V$. When the search data are continuously the same, the charge consumption is zero.

In the twelfth embodiment of the invention, as described above, charge consumption on the match line and the search line is zero in the search cycle when the match state or mismatch state continue.

In the search operation, the match line(s) attaining the match state are usually fewer than the match lines in the mismatch state. In general, the state transition does not occur on many match lines in the search operation. Therefore, the current consumption can be reduced by the twelfth embodiment in which the match lines are selectively charged/discharged based on the search result in the last cycle.

According to the table in FIG. 41, the voltage amplitudes of the match line and the search line are equal to power supply voltage V (=VDD) in the twelfth embodiment. However, match line ML in the match state may be at the intermediate voltage level of VDD/2 or lower, as is done in the constructions of the sixth to eleventh embodiments.

[Modification]

Figure 42:
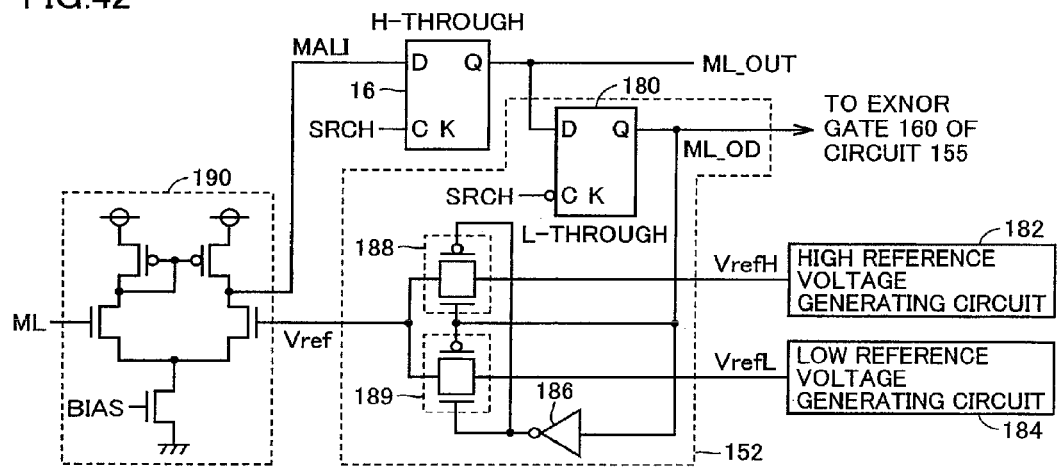
FIG. 42 shows a main portion of a modification of the twelfth embodiment of the invention.

FIG. 42 shows a main portion of a content addressable memory according to the twelfth embodiment of the invention. FIG. 42 shows a construction of a sense circuit of one match amplifier. The match amplifier includes charge circuit 156, similarly to the construction shown in FIG. 38.

In FIG. 42, sense circuit 152 includes a differential amplifier circuit 190 for comparing the voltage on match line ML with a reference voltage Vref. Differential amplifier circuit 190 is of a current mirror type, and has an operation current defined according to a bias voltage BIAS. The output signal of differential amplifier circuit 190 is applied to an input D of D-type latch circuit 16. D-type latch circuit 16 takes in the signal at the input in synchronization with the rising of search instructing signal SRCH, and outputs a search result indicating signal ML_OUT. D-type latch circuit 16 attains the latch state when search instructing signal SRCH applied to clock input CK attains the L level.

Sense circuit 152 further includes a transmission gate 188 receiving a reference voltage VrefH from a high reference voltage generating circuit 182 and a transmission gate 189 receiving a reference voltage VrefL from a low reference voltage generating circuit 184.

Reference voltage generating circuits 182 and 184 are arranged commonly to the match amplifiers arranged for the respective match line. Reference voltage VrefH is higher than reference voltage VrefL.

Transmission gates 188 and 189 are selectively turned on according to the output signals of a D-type latch circuit 180 and an inverter 186. Specifically, when an output signal ML_OD of D-type latch circuit 180 is at the H level, transmission gate 188 is conductive, and transmission gate 189 is non-conductive. When output signal ML_OD of D-type latch circuit 180 is at the L level, transmission gate 189 is conductive, and transmission gate 188 is non-conductive. The reference voltages selected by transmission gates 188 and 189 are used as a reference for determining the match line voltage level in differential amplifier circuit 190.

Sense circuit 152 further includes D-type latch circuit 180 that takes in search result indicating signal ML_OUT applied from D-type latch circuit 16 in synchronization with the falling of search instructing signal SRCH, and inverter 186 inverting the output signal of D-type latch circuit 180. D-type latch circuit 180 enters the latch state when search instructing signal SRCH attains the H level. Output signal ML_OD of D-type latch circuit 180 is applied to EXNOR circuit 160 in charge circuit 156 shown in FIG. 38.

Figure 43:
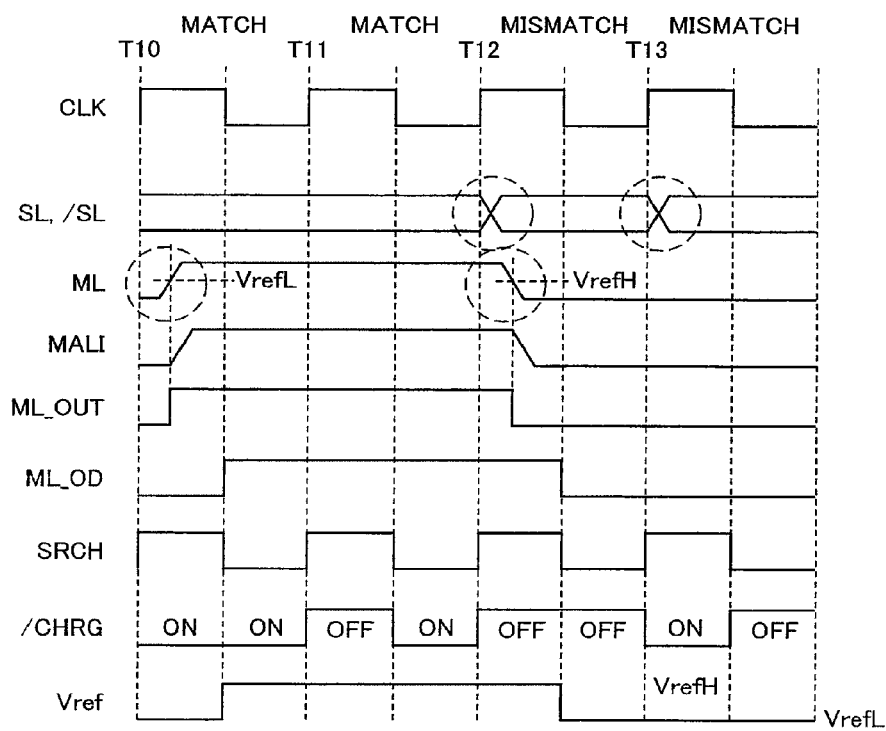
FIG. 43 is a timing chart representing an operation of a match amplifier shown in FIG. 42.

FIG. 43 is a timing chart representing an operation of the match amplifier shown in FIG. 42. Referring to FIG. 43, description will now be given on the operation of the match amplifier shown in FIG. 42 and particularly the operation of sense circuit 152.

When the search result indicates the mismatch state in a cycle before a cycle starting at time T10, D-type latch circuit 180 produces output signal ML_OD at the L level. In this state, transmission gate 189 is conductive, and transmits, as a reference voltage of differential amplifier circuit 190, reference voltage VrefL received from low reference voltage generating circuit 184. At this time, output signal /CHRG of the EXNOR circuit in the pull-up current supply circuit (not shown in FIG. 42) is at the L level, and the current is supplied to the match line.

In the cycle starting from time T10, when the search data matches the stored data, the voltage level of match line ML rises. When the voltage level of match line ML exceeds reference voltage VrefL, output signal MALI of differential amplifier circuit 190 attains the H level, and output signal ML_OUT of D-type latch circuit 16 attains the H level. When search instructing signal SRCH falls to the L level in synchronization with clock signal CLK in this cycle, D-type latch circuit 180 enters the through state to produce output signal ML_OD at the H level. For holding the voltage level of the match line in the match state, the signal /CHRG is kept at the L level. In response to the rising of output signal ML_OD of D-type latch circuit 180, transmission gate 189 is turned off, and transmission gate 188 is turned on. Thereby, reference voltage VrefH supplied from high reference voltage generating circuit 182 is supplied as the reference voltage to differential amplifier circuit 190.

In the cycle starting at time T11, when match line ML is in the match state, the match amplifier does not change its state.

In the cycle starting at time T12, clock signal CLK and search instructing signal SRCH rise to the H level and the search operation is performed. In this cycle, when the search result indicates the mismatch state, the voltage level of match line ML lowers. At this time, reference voltage Vref of differential amplifier circuit 190 is at the high voltage level (VrefH). Therefore, output signal MALI of differential amplifier circuit 190 attains the L level at a faster timing after the potential of match line ML lowers, and search result indicating signal ML_OUT applied from D-type latch circuit 16 attains the definite state at a faster timing.

In this cycle, when search instructing signal SRCH attains the L level in synchronization with the falling of clock signal CLK, D-type latch circuit 180 produces output signal ML_OD at the L level. Accordingly, transmission gate 189 is tuned on, and transmission gate 189 is turned off so that low reference voltage VrefL is set as reference voltage Vref of differential amplifier circuit 190. In the cycle starting at time T12, the result of the search performed in the last search cycle indicates the match state, and the signal /CHRG is held at the H level. Therefore, the pull-up current is not supplied to the match line.

In the cycle starting at time T13, the result of the search performed in the last search cycle indicates the mismatch state, and the pull-up current is supplied at the start of the search operation in this cycle. However, the search result indicates the mismatch in this cycle, and the voltage level of match line ML is held at the L level. Accordingly, search result indicating signal ML_OUT and output signal ML_OD of D-type latch circuit 180 are kept at the L level.

Reference voltage Vref of differential amplifier circuit 190 is set according to the search result of the last search cycle, whereby the reference voltage of the differential amplifier circuit can be set to the voltage level close to the voltage level of the match line. Accordingly, the search result can be determined at a faster timing, and the search operation speed can be increased.

According to the twelfth embodiment of the invention, as described above, the charging of the match line is selectively performed according to the result of the last search cycle, so that the current consumption can be further reduced. The input logic threshold voltage of the sense circuit is adjusted according to the search result in the last search cycle. Therefore, the input logic threshold voltage can be set to the voltage level close to the voltage level of the match line, and the voltage changes on the match line can be sensed at a faster timing.

Thirteenth Embodiment

Figure 44:
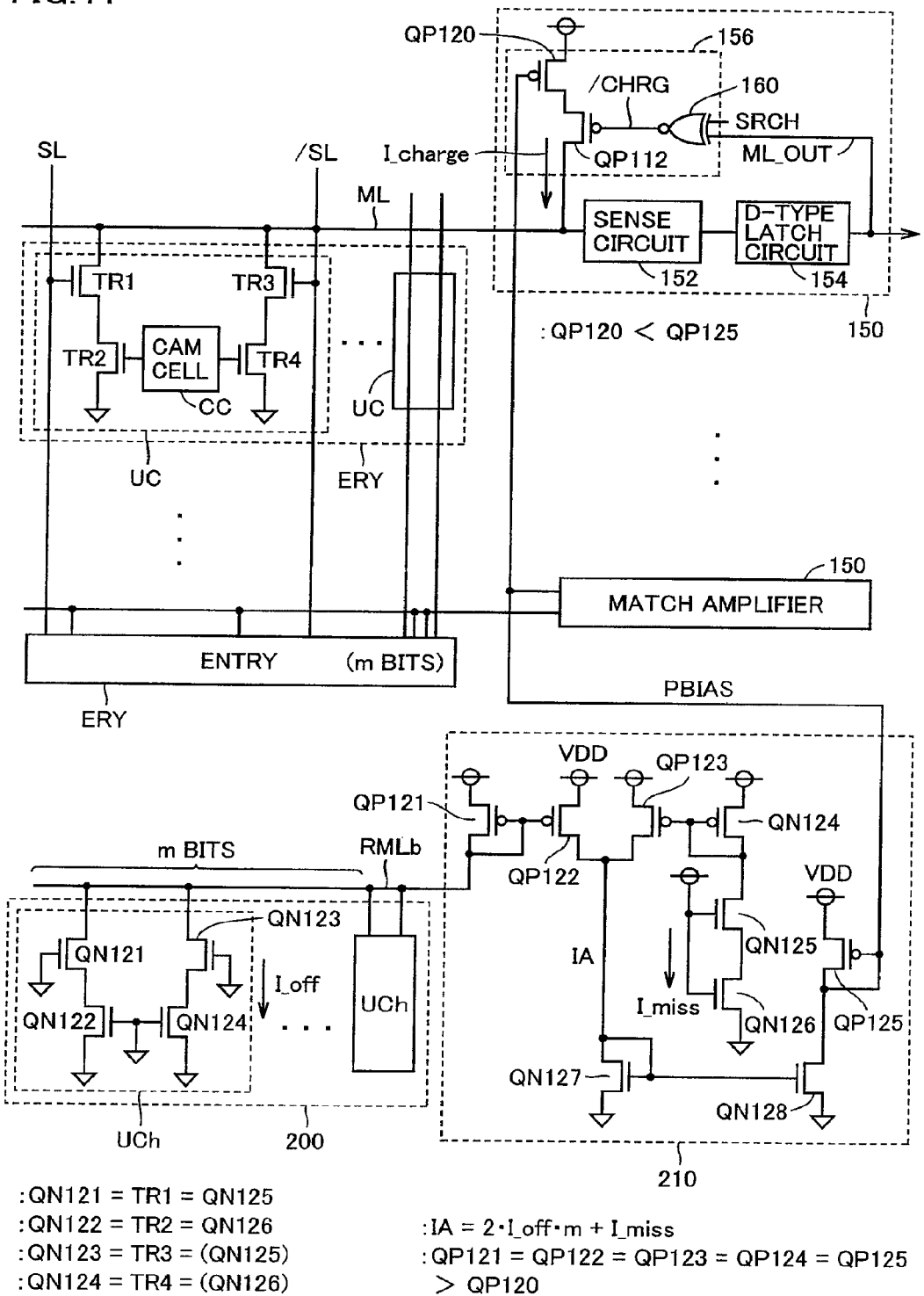
FIG. 44 schematically shows a main portion of a content addressable memory according to a thirteenth embodiment of the invention.

FIG. 44 shows a main portion of a content addressable memory according to a thirteenth embodiment of the invention. In FIG. 44, match amplifier 150 includes sense circuit 152, D-type latch circuit 154 and charge circuit 156 similarly to the twelfth embodiment. Charge circuit 156 differs from charge circuit 156 shown in FIG. 33 in the following construction. P-channel MOS transistors QP120 and QP112 are arranged in series between the power supply node and match line ML. MOS transistor QP120 receives a bias voltage PBIAS on its gate. MOS transistor QP112 receives an output signal /CHRG of EXNOR circuit 160 on its gate.

For producing bias voltage PBIAS, a replica entry 200 and a bias voltage generating circuit 210 are provided. Replica entry 200 includes replica unit cells UCh each having a discharging path of the same construction as unit cell UC in the match state of entry ERY in the memory cell array.

Replica unit cells UCh includes N-channel MOS transistors QN121 and QN122 connected in series between a replica match line RMLb and the ground node, and N-channel MOS transistors QN123 and QN124 connected in series between replica match line RMLb and the ground node. These MOS transistors QN121-QN124 are the same in size (ratio of channel width W to channel length L) as transistors TR1-TR3 in unit cell UC. Each of MOS transistors QN121-QN124 is turned off when it receives the ground voltage on its gate. Therefore, off-leakage current 2·I_off (=Ioff) flows through replica unit cell UCh. This magnitude of the off-leakage current is the same as that of the current flowing through unit cell UC in the match state. Off-leakage current I_off represents an off-leakage current flowing through one discharging path in the unit cell.

Bias voltage generating circuit 210 includes a P-channel MOS transistor QP121 supplying a current to replica match line RMLb. MOS transistor QP121 has a gate and a drain connected to each other. Bias voltage generating circuit 210 further includes P-channel MOS transistors QP122 and QP124. MOS transistor QP122 forms a current mirror circuit with MOS transistor QP121. MOS transistor QP124 is coupled to the power supply node, and has a gate and a drain connected to each other.

Bias voltage generating circuit 210 further includes N-channel MOS transistors QN125 and QN126 connected in series between MOS transistor QP124 and the ground node, and a P-channel MOS transistor QP123 forming a current mirror circuit with MOS transistor QP124. MOS transistors QN125 and QN126 have gates connected to the power supply node, and are normally kept on.

Bias voltage generating circuit 210 further includes N-channel MOS transistors QN127 and QN128 as well as a P-channel MOS transistor QP125. MOS transistors QN127 has a gate and a drain connected to each other, and receives a total current IA of the currents supplied from MOS transistors QP122 and QP123. MOS transistor QN128 form a current mirror circuit with MOS transistor QN127. MOS transistor QP125 has a gate and a drain connected to each other, supplies a current from the power supply node to MOS transistor QN128 and converts the supplied current into a voltage to produce bias voltage PBIAS.

MOS transistors QN125 and QN126 are the same in size as transistors TR1 and TR2 or transistors TR3 and TR4 in the series connection in unit cell UC of entry ERY. Therefore, MOS transistors QN125 and QN126 pass one-bit pull-out current I_miss (=In) of the same magnitude as the current discharged through the series connection of transistors in the on state of unit cell UC in the miss state.

This one-bit pull-out current I_miss is supplied via MOS transistor QP124. All MOS transistors QP121-QP125 are the same in size. Therefore, the current supplied from MOS transistor QP123 is pull-out current I_miss (=In) of the one-bit unit cell in the miss state. MOS transistor QP121 supplies an off-leakage current for the replica unit cells UCh of m bits to replica match line RMLb. Therefore, the current thus supplied is equal to 2·m·I_off.

MOS transistor QP122 supplies a mirror current of the current supplied by MOS transistor QP121. Therefore, the total current can be expressed by (2·I_off·m+I_miss (=m·Ioff+In)). MOS transistor QN127 discharges this current IA. The mirror current of current IA flows through MOS transistor QN128. MOS transistor QP125 produces bias voltage PBIAS corresponding to the current flowing through MOS transistor QN128.

MOS transistor QP120 is smaller in size (transconductance gm) than MOS transistor QP125. For example, MOS transistor QP120 has half times the transconductance gm of MOS transistor QP125. MOS transistor QP120 passes current I_charge equal to or smaller than half the current IA. Thereby, match line ML can be supplied with a current that is smaller than one-bit miss current Imiss or one-bit pull-out current I_miss (=In) but is larger than total off-leakage current IOFF (=2·m·I_off) of the entry in the match state.

As shown in FIG. 44, the variations in transistor parameters of unit cells UC in entry ERY can be reflected, using replica entry 200. Specifically, MOS transistors QN125 and QN126 are formed to be subjected to the same parameter variations as transistors TR1-TR4 of unit cell UC in entry ERY (they are formed in a neighboring region through the same manufacturing steps). The value of current IA can be adjusted according to the variations in pull-out current I_miss in the miss state. For example, when off-leakage current I_off of the unit cell in the entry storing the data increases, current IA likewise increases. Accordingly, the current value of charge current I_charge supplied from charge circuit 156 is increased, and the variations in off-leakage current for match line ML can be compensated for. Therefore, even in the case when match line ML is to be kept at the H level according to the search result in the last search cycle, match line ML can be accurately kept at the H level.

When one-bit pull-out current I_miss (=In) lowers, total current IA lowers, and charge current I_charge can be reduced. Thereby, it is possible to prevent the decrease of the lowering speed of the voltage level of the match line corresponding to the entry in the mismatch state, so that the increases in search cycle can be prevented.

As described above, the thirteenth embodiment of the invention uses the replica entry formed of the unit cells in the match state as well as the replica unit cell corresponding to the one-bit miss state unit cell, to produce the bias voltage for generating the charging current to the match line. Therefore, the variations in transistor parameter can be accurately compensated for, and the charging current of the match line can be adjusted. The effects by the construction using the replica entry to generate the charging current to the match line are likewise achieved in the tenth and eleventh embodiments already described, and the variations in transistor parameter can be compensated for to produce the current at a desired level.

The same effects can be achieved as in the eleventh and twelfth embodiments.

Fourteenth Embodiment

Figure 45:
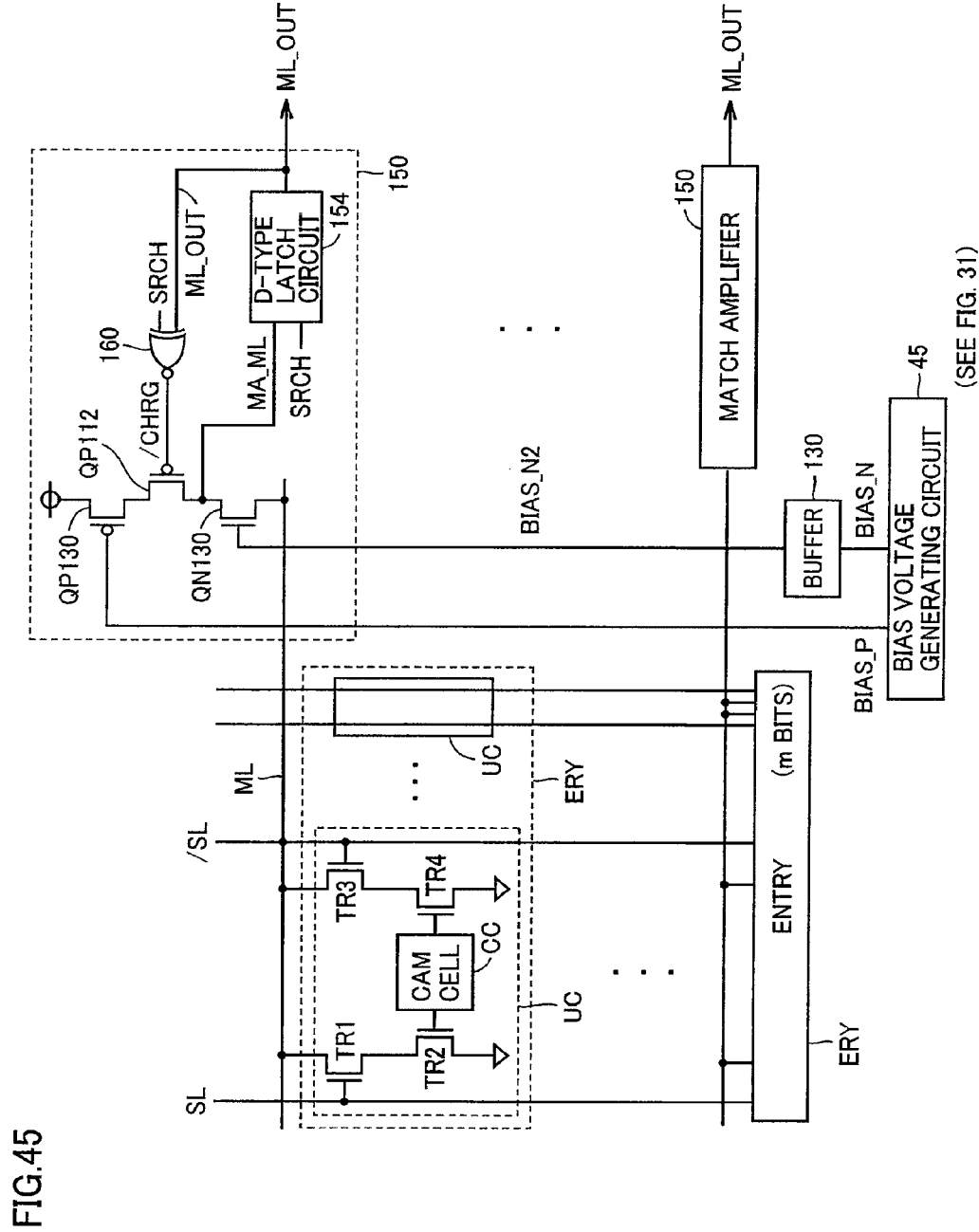
FIG. 45 schematically shows a main portion of a content addressable memory according to a fourteenth embodiment of the invention.

FIG. 45 shows a main portion of a content addressable memory according to a fourteenth embodiment of the invention. The construction of the content addressable memory shown in FIG. 45 corresponds to a combination of the tenth and thirteenth embodiments. In FIG. 45, match amplifier 150 includes MOS transistors QP130, QP112 and QN130 connected in series between the power supply node and match line ML, D-type latch circuit 154 for latching an internal search result signal MA_ML on a connection node between MOS transistors QP112 and QN130, and an EXNOR circuit 160 for producing a charge instructing signal /CHRG. D-type latch circuit 154 latches the signal received on its D-input according to a search instructing signal SRCH. EXNOR circuit 160 receives output signal ML_OUT of D-type latch circuit 154 and search instructing signal SRCH, and applies charge instructing signal /CHRG to the gate of MOS transistor QP112.

MOS transistor QP130 has a gate receiving bias voltage BIAS_P from bias voltage generating circuit 45. MOS transistor QN130 has a gate receiving bias voltage BIAS_N2 from buffer 130. These bias voltage generating circuits 45 and 130 have the same construction as bias voltage generating circuits 45 and 130 shown in FIG. 31.

Memory cell array has a plurality of entries ERY, and match lines ML are arranged corresponding to entries ERY, respectively. Entry ERY includes unit cells UC of m bits. Unit cell UC has the same construction as the unit cells in the first to twelfth embodiments, and includes a CAM cell CC for storing the data and search MOS transistors TR1-TR4 for comparing the search data and the stored data.

Bias voltage generating circuit 45 shown in FIG. 45 produces bias voltage BIAS_P to the gate of P-channel MOS transistor QP130 included in match amplifier 150. MOS transistor QP130 supplies a current smaller in value than the current (I_miss or Imiss) flowing through the one-bit miss state unit cell, and is larger than the total (IOFF) of off-leakage currents I_off of the unit cells of m bits in the match state in the corresponding entry. P- and N-channel MOS transistors QP112 and QN130 are connected in series between MOS transistor QP130 and match line ML. MOS transistor QN130 receives bias voltage BIAS_N2 from buffer 130. MOS transistors QP130 and QN130 correspond to MOS transistors QP91 and QN71 shown in FIG. 31, respectively.

In the construction shown in FIG. 45, MOS transistor QN130 operates in the source follower mode in according to bias voltage BIAS_N2. Therefore, corresponding match line ML attains the voltage level equal to or lower than the voltage VML ($\leq$DD/2), and the voltage rising of the match line is suppressed. Accordingly, the potential of internal node MA_ML rises fast, and the determination result signal MA_ML can be driven fast to the definite state (power supply voltage level).

In the construction shown in FIG. 45, the signal /CHRG to MOS transistor QP112 is produced according to search result indicating signal ML_OUT in the last cycle. Therefore, it is possible to control supply/cut-off of the charging current to corresponding match line ML in the search operation according to the result of search/determination in the last search cycle.

Figure 46:
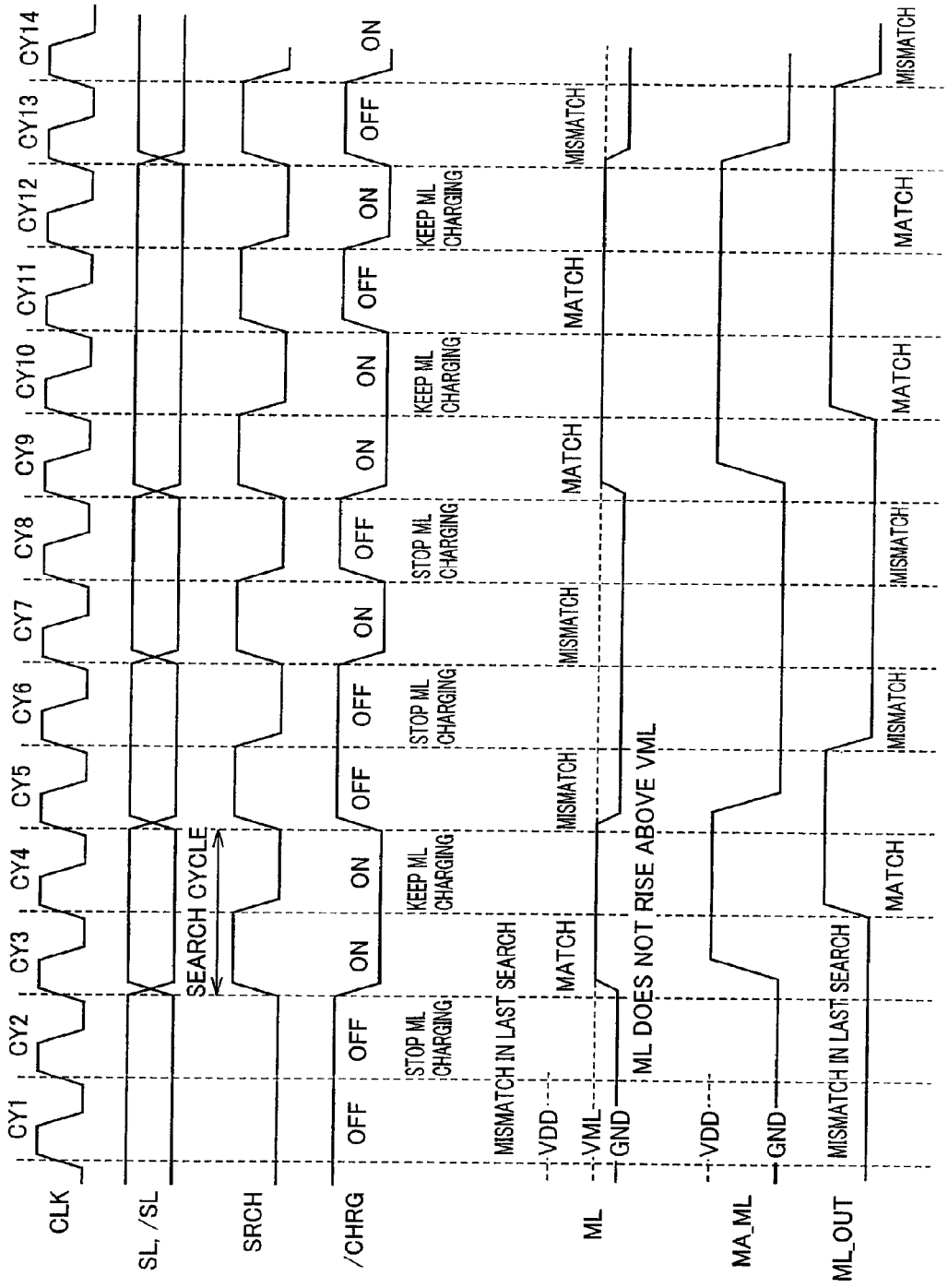
FIG. 46 is a timing chart representing an operation of the content addressable memory shown in FIG. 45.

FIG. 46 shows an operation of a content addressable memory shown in FIG. 45. Referring to FIG. 46, the operation of the content addressable memory shown in FIG. 45 will now be described.

In the search operation shown in FIG. 46, two cycles of clock signal CLK define one search cycle. However, the search cycle may be equal to one cycle of clock signal CLK, similarly to the twelfth embodiment.

It is assumed that the result of the determination in the last search cycle indicates the mismatch state in cycles CY1 and CY2 of clock signal CLK. According to this assumption, match line ML is kept at the ground voltage level, internal search result signal MA_ML is at the ground voltage level and output signal ML_OUT of D-type latch circuit 154 is at the L level.

In a clock cycle CY3, the search operation is performed according to new search data. In this cycle, when search instructing signal SRCH attains the H level, EXNOR circuit 160 produces the signal /CHRG at the L level. Accordingly, MOS transistor QP112 is turned on to charge match line ML. In the operation of charging the match line ML, MOS transistor QN130 suppresses the voltage level of match line ML to or below intermediate voltage VML, as described in the tenth embodiment. MOS transistor QN130 performs a decoupling operation according to bias voltage BIAS_N2 applied from buffer 130. Thus, the voltage level of internal search result signal MA_ML rises, and finally attains the level of power supply voltage VDD.

In a clock cycle CY4, when search instructing signal SRCH attains the L level, search result indicating signal ML_OUT applied from D-type latch circuit 154 rises to the H level. At this time, output signal /CHRG of EXNOR circuit 160 is held at the L level, and the charging operation is performed on the match line. However, the source follower operation of MOS transistor QN130 holds match line ML at the level of voltage VML or lower. Thus, match line ML is kept at the predetermined voltage level, using the off-leakage currents of the unit cells of all bits on match line ML.

In a clock cycle CY5, the search data changes, and search instructing signal SRCH attains the L level again. Since the search result in the last cycle indicates the match state, signal ML_OUT is at the H level, and EXNOR circuit 160 produces the output signal /CHRG at the H level, so that MOS transistor QP112 is turned of to stop the charging of match line ML. In this cycle, when the search result of the search data indicates the mismatch state, match line ML is discharged to lower its voltage level. Accordingly, the voltage level of internal search result signal MA_ML lowers.

In a clock cycle CY6, when search instructing signal SRCH falls to the L level, D-type latch circuit 154 produces output signal ML_OUT at the L level. Output signal /CHRG of EXNOR circuit 160 keeps the H level, and the charging of match line ML is stopped. Therefore, match line ML is kept at the ground voltage level.

Then, the search is performed according to the next search data in a clock cycle CY7. In the case where the result of search for the search data indicates the mismatch state, the charging current is discharged via the unit cell in the miss state of the entry coupled to match line ML even when EXNOR circuit 160 produces output signal /CHRG at the L level. Therefore, match line ML keeps the ground voltage level. Accordingly, search result indicating signal ML_OUT likewise attains the L level according to the voltage level of internal signal line MA_ML.

In a clock cycle CY8, when search instructing signal SRCH attains the L level, MOS transistor QP112 is turned on. Responsively, match line ML is charged to raise its voltage level. Also, the voltage level of internal search result signal MA_ML rises.

In a clock cycle CY10, D-type latch circuit 150 produces output signal ML_OUT at the H level. In this case, search instructing signal SRCH is at the L level, and output signal /CHRG of EXNOR circuit 160 keeps the L level and match line ML is charged. Accordingly, match line ML is kept at the level of intermediate voltage (precharge voltage) VML.

In a clock cycle CY11, the search operation is performed again. When search result is the match state, EXNOR circuit 160 produces output signal /CHRG at the H level to stop the charging of match line ML. When search instructing signal SRCH attains the L level, the signal /CHRG attains the L level. Responsively, match line ML is charged through MOS transistor QN130, and keeps its voltage level.

In a clock cycle CY13, the search operation is performed again. When the search result indicates the mismatch state, the signal /CHRG is at the H level, and the discharging of match line ML is not performed. Accordingly, the voltage levels of match line ML and internal signal line MA_ML lower to the ground voltage level, and search result indicating signal ML_OUT lowers to the L level in a next clock cycle CY14. At this time, the signal /CHRG attains the L level again, and match line ML is charged.

Therefore, when the last search result indicates the match state, the current supplying to match line ML is stopped in the search operation. Only when the last search result indicates the mismatch state, the charge current is supplied to the match line in the search operation. Thereby, the number of times of charging match line ML can be reduced, and the current consumption can be reduced. When the search result in the last cycle indicates the mismatch state, match line ML is at the ground voltage level and it may possibly need to raise its voltage level, the current is supplied to the match line in the search operation, and thus the search operation can be performed fast.

For the match line, it is not necessary to perform the pre-charging in each search cycle, and the current consumption can be reduced. Similarly to the tenth embodiment, the quantity of charging current of match line ML is adjusted using bias voltages BIAS_P and BIAS_N2, and the charging current is supplied to the match line via MOS transistor QN130. Therefore, the voltage level of match line ML can be restricted to the level of voltage VML or lower. Accordingly, the voltage amplitude of the match line can be reduced, and the current consumption in the search operation can be significantly reduced, similarly to the tenth embodiment. Since the sensing of the match and mismatch states are performed according to the charging/discharging of internal signal line MA_ML of a small interconnection load, the fast search operation can be achieved.

Meanwhile, in the fourteenth embodiment, the current converter circuit shown in FIG. 37 may be provided for level-converting bias voltage BIAS_P.

Fifteenth Embodiment

Figure 47:
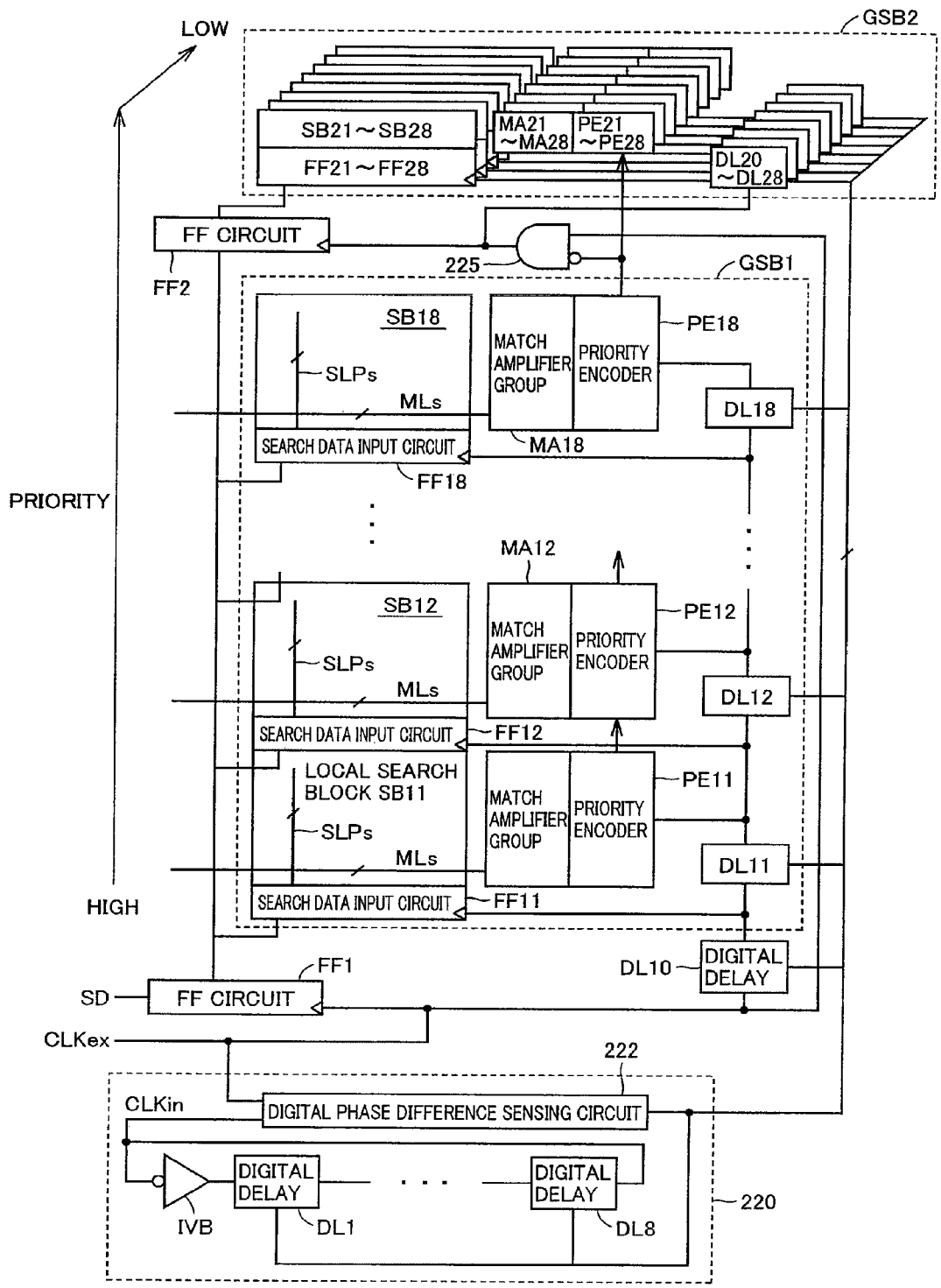
FIG. 47 schematically shows a whole construction of a content addressable memory according to a fifteenth embodiment of the invention.

FIG. 47 schematically shows a construction of a content addressable memory according to the fifteenth embodiment of the invention. In FIG. 47, a CAM cell array including CAM cells (unit cells) is divided into two global search blocks GSB1 and GSB2. Although not clearly shown, the CAM cell array includes a plurality of entries as already described. Global search block GSB1 includes a plurality of local search blocks SB11-SB18, and global search block GSB2 includes a plurality of local search blocks SB21-SB28. Each of local search blocks SB11-SB18 and SB21-SB28 is provided with a match line group MLs formed of a plurality of match lines ML, and is also provided with a search line group (search data bus) SLPs formed of a plurality of search line pairs. Each match line group MLs includes match lines ML of 1 K in number. Search line pair group SLPs includes search line pairs SLP of 144 bits.

For local search blocks SB11-SB18, there are provided match amplifier groups MA11-MA18 as well as priority encoders PE11-PE18, respectively. Each of match amplifier groups MA11-MA18 includes match amplifiers arranged corresponding to the match lines in the corresponding local search blocks, respectively. The match amplifier may be any one of the match amplifiers in the first to thirteenth embodiments, or may also be substantially the same as a conventional match amplifier. By using the match amplifier in any embodiment already described, the search operation can be performed fast with low current consumption. Even when the match amplifier the same in construction as the conventional match amplifier is employed, it can achieve the effects of the construction of the content addressable memory according to the fifteenth embodiment per se.

Each of priority encoders PE11-PE18 selects the match line of the highest priority from corresponding match amplifier groups MA11-MA18 according to a predetermined priority rule, and produces the information on the selected match line.

In FIG. 47, local search block SB11 has the highest priority, and the priority decreases as approaching local search block SB18. Global search block GSB1 has a higher priority than global search block GSB2. In global search block GSB2, the priority successively lowers as approaching local search block SB28 from local search block SB21.

For local search blocks SB11-SB18, search data input circuits FF11-FF18 each formed of a flip-flop are arranged, respectively. These search data input circuits FF11-FF18 commonly receive the search data from an FF circuit FF1 receiving externally applied search data SD. Search data input circuits FF11-FF18 drive search line groups SLs of corresponding search blocks SB11-SB18 according to the received search data, respectively.

Search data input circuit (FF circuit) FF1 takes in and outputs the received data according to an externally applied clock signal CLKex. Therefore, the search data supplied to search data input circuits (FF circuits) FF11-FF18 are updated in each cycle of external clock signal CLKex.

Global search block GSB1 is further provided with cascaded digital delay circuits DL10-DL18 for successively delaying external clock signal CLKex. Delay clock signals supplied from digital delay circuits DL10-DL17 are applied to search data input circuits FL11-FL18 as search data take-in clock signals, respectively. According to the delay clock signals applied from digital delay circuits DL11-DL18, respective local search blocks SB11-SB18 execute the search, determination of search result and production of search result indication. For example, the output signals of digital delay circuits DL11-DL18 are used as search instructing signal SRCH as described in the twelfth embodiment. Accordingly, search blocks SB11-SB18 perform the search, determination of the search result and output of search result determination with the start timing staggered successively.

In global search block GSB2, search data input circuits FF21-FF28 are arranged corresponding to local search blocks SB21-SB28, respectively. Also, match amplifier groups MA21-MA28 and priority encoders PE21-PE28 are also arranged corresponding to local search blocks SB21-SB28, respectively. Digital delay circuits DL20-DL28 concatenated together are arranged for controlling the search operations of the respective search blocks.

For adjusting the delay times of digital delay circuits DL10-DL18 and DL20-DL28, a delay control circuit 220 is arranged.

Delay control circuit 220 includes a digital phase difference detecting circuit 222 for detecting a phase difference between external clock signal CLKex and an internal clock signal CLKin to produce a delay control signal corresponding to a phase difference, cascaded digital delay circuits DL1-DL8, and an inverter buffer IVB for inverting the output signal of digital delay circuit DL8 in the final stage to apply the inverted signal to digital delay circuit DL1 in the initial stage. Inverter buffer IVB and digital delay circuits DL1-DL8 form a ring oscillator. Digital delay circuit DL8 produces internal clock signal CLKin.

Digital phase difference detecting circuit 222 adjusts the delay times of digital delay circuits DL1-DL8 to equalize the phases of external clock signal CLKex and internal clock signal CLKin, to adjust the delay times of digital delay circuits DL10-DL18 and DL20-DL28 provided corresponding to the respective local search blocks.

For global search block GSB2, there are arranged a search data input circuit (FF circuit) FF2 receiving the search data supplied from search data input circuit (FF circuit) FF1 as well as a gate circuit 225 receiving the output signal of priority encoder PE18 and external clock signal CLKex.

Priority encoder PE18 has the lowest priority in the global search block. Therefore, when priority encoder PE18 generates a signal at the L level, this indicates the state in which stored data matching the search data is not found in global search block GSB1. Therefore, global search block GSB2 executes the search operation when the match detection is not accomplished in global search block GSB1.

The output signal of gate circuit 225 is applied as a clock signal to digital delay circuits DL20-DL28. When gate circuit 225 is enabled (when priority encoder PE18 produces the output signal at the L level), local search blocks SB21-SB28 in global search block GSB2 successively perform the search operation according to the staggered operation start timing in accordance with the clock signal applied via gate circuit 225.

Search data input circuit (FF circuit) FF2 likewise takes in the search data supplied from FF circuit FF1 according to the output signal of gate circuit 225, and applies the data thus taken in, as the search data, to search data input circuits FF21-FF28 of local search blocks SB21-SB28.

Figure 48:
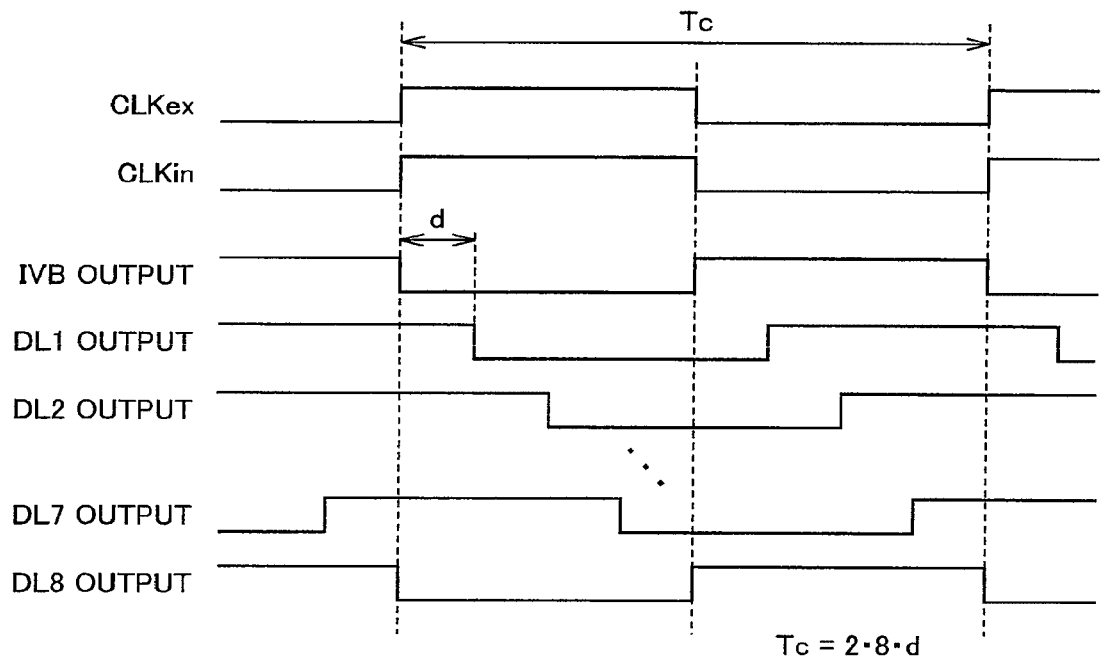
FIG. 48 is a timing chart representing an operation of a delay control circuit of the content addressable memory shown in FIG. 47.

FIG. 48 is a timing chart representing the operation of delay control circuit 220 shown in FIG. 47. Referring to FIG. 48, the operation of delay control circuit 220 shown in FIG. 47 will now be described.

As described above, digital phase difference detecting circuit 222 adjusts the delay times of digital delay circuits DL1-DL8 to equalize the phases of external clock signal CLKex and internal clock signal CLKin.

When clock signals CLKex and CLKin are the same in phase, the output signal of inverter buffer IVB changes in synchronization with external clock signal CLKex according to internal clock signal CLKin. The delay time of inverter buffer IVB, in this example, assumes a negligible value as compared with the delay times of digital delay circuits DL1-DL8. When the output signal of inverter buffer IVB changes, each of digital delay circuits DL1-DL8 changes the logical state of its output signal with a delay time d. Therefore, when internal and external clock signals CLKin and CLKex matches in phase with each other, a cycle time Tc of internal clock signal CLKin is equal to d·2·8 (internal and external clock signals CLKin and CLKex have the same cycle period).

Digital delay circuits DL1-DL8 and digital delay circuits DL10-DL18 and DL20-DL28 have the same constructions. Therefore, the same delay time as the delay time of digital delay circuits DL1-DL8 can be set in digital delay circuits DL10-DL18 and DL20-DL28.

Each of digital delay circuits DL1-DL8, DL10-DL18 and DL20-DL28 is formed of a buffer circuit (inverters in two stages) having a variable current source that can change an operation current. The operation current value of each digital delay circuit is adjusted according to the phase difference information detected by digital phase difference detecting circuit 222, and thereby delay time, d, is adjusted.

As described above, the clock signal for defining the operation cycles of local search blocks SB11-SB18 is supplied using digital delay circuits DL10-DL18. Thus, in global search block GSB1, the search operation and search result determining operation can be successively performed by local search blocks SB11-SB18 with the delay time d of digital delay circuits DL10-DL18, respectively, and the peak current can be small. The same holds for global search block GSB2.

The search lines are divided according to the local search blocks so that the interconnection load capacitance of the search line can be small, and the charging/discharging currents of the search line can be small. Further, the search line can be driven fast according to the search data.

Figure 49:
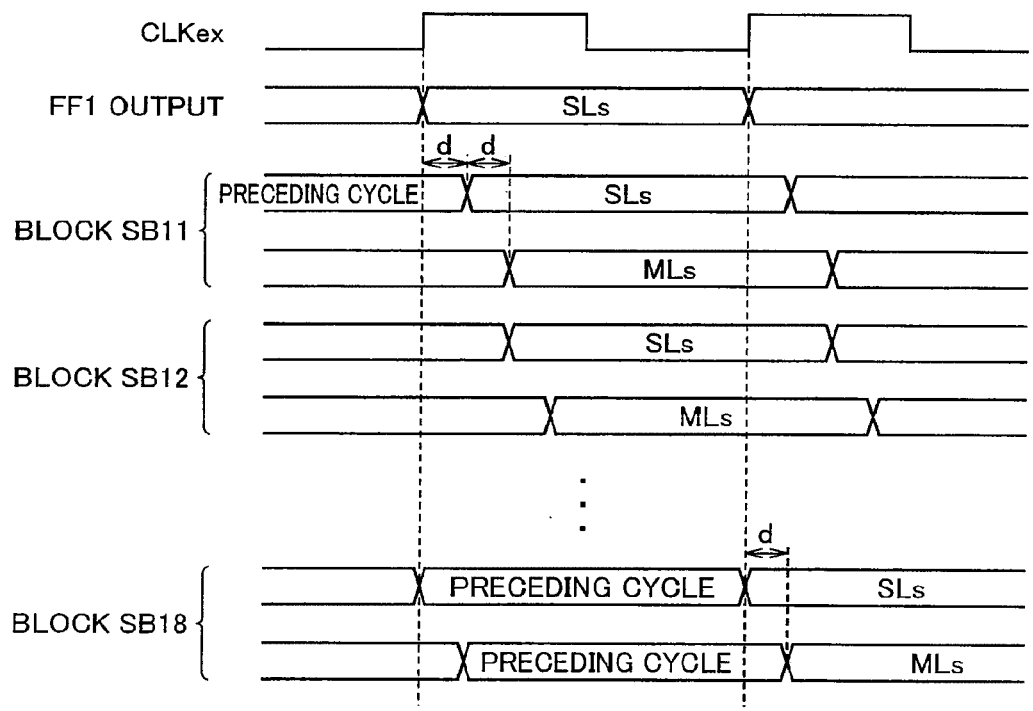
FIG. 49 is a timing chart representing an operation of the content addressable memory shown in FIG. 47.

FIG. 49 is a timing chart representing the operation of the content addressable memory shown in FIG. 47. Referring to FIG. 49, the operation of the content addressable memory shown in FIG. 47 will now be described.

As shown in FIG. 49, when external clock signal CLKex attains the H level, the output signal of search data input circuit (FF circuit) FF1 is updated and decided. Then, search data input circuit FF11 for local search block SB11 takes in the received data according to the output signal of digital delay circuit DL10, and drives internal search data line group SLPs according to the search data. Accordingly, match amplifier group MA11 and priority encoder PE11 are made active according to the output signal of digital delay circuit DL11 after elapsing of delay time d of digital delay circuit DL11 and the search data is compared with the stored data, and the search result is determined.

In parallel with the match line driving in local search block SB11, in local search block SB12, supplied data is taken in by search data input circuit FF12 according to the output signal of digital delay circuit DL11, corresponding search data line group SLPs is driven according to the search data. Subsequently, the search operation is internally performed in search block SB11 according to the output signal of digital delay circuit DL12 after elapsing of time d.

Thereafter, local search blocks SB11, ... SB17 (not shown) successively execute the search operation. Each of search data input circuits FF11-FF17 takes in the search data supplied from search data input circuit FF1 in synchronization with the rising of the output signal of the corresponding digital delay circuit (the rising of external clock signal CLKex), and enters the latch state. In local search block SB18 in the final stage, search data input circuit FF18 enters the latch state according to the output signal of digital delay circuit DL17 (not shown) in the preceding stage, and drives search line group SLBs according to the search data. Then, match amplifier group MA18 is activated when time d elapses.

The priority successively lowers in the direction from local search block SB1 toward local search block SB18. In any one of the local search blocks in global search block GSB1, when the match state is detected, the output signal of priority encoder PE18 in the final stage attains the H level, and the output signal of gate circuit 225 is fixed to the L level. This inhibits the transmission of the clock signal to global search block GSB2, and stops the search operation therein. At this time, search data input circuit (FF circuit) FF2 does not latch the received search data.

The search lines are divided into a plurality of global blocks to implement a block division construction. When the match is detected in the global search line block of a higher priority, the search operation of the global search line block of a lower priority is stopped. Accordingly, the current consumption can be reduced.

Figure 50:
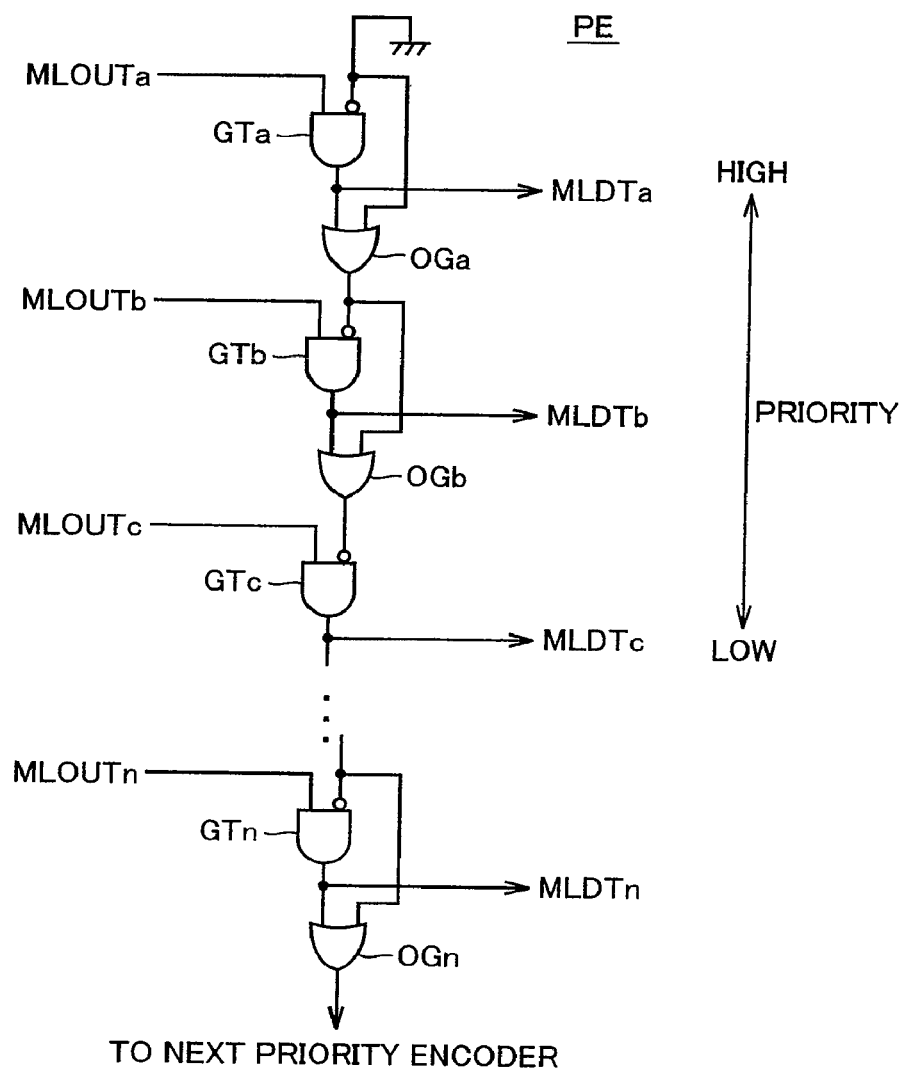
FIG. 50 shows an example of a construction of a priority encoder shown in FIG. 47.

FIG. 50 shows an example of constructions of priority encoders PE11-PE18 and PE21-PE28. In FIG. 50, priority encoder indicated by PE is a representative example of the constructions of priority encoders PE11-PE18 and PE21-PE28. FIG. 50 shows, by way of example, an arrangement of the priority encoder having the highest priority.

In FIG. 50, determination result outputs MLOUTa-MLOUTn correspond to the search result indicating signals produced for the respective match lines from the match amplifiers in the corresponding match amplifier group.

Priority encoder PE includes gate circuits GTa-GTn arranged corresponding to determination result outputs MLOUTa-MLOUTn of the match lines, respectively, and OR gates OGa-OGn receiving the output signals of gate circuits GTa-GTn, respectively. Gate circuits GTa-GTn receive, on the complementary inputs, the output signals of corresponding OR gates OGa-OG(n−1) in the preceding stage, and receive, on the non-inverted inputs, the output signals of the corresponding match amplifiers. OR gate OGn in the final stage applies the output signal to priority encoder PE of the next higher priority. The complementary input of gate circuit GTa is coupled to the ground node.

Output MLOUTa has the highest priority, and output MLOUTn has the lowest priority. Each of gate circuits GTa-GTn produces the signal at the H level when search result indication MLOUT received from the corresponding match line is at the H level indicating the match state and the output signal of the corresponding OR gate is at the L level. Each of gate circuits GTa-GTn fixes its output signal at the L level when the signal received at its complementary input attains the H level.

The complementary input of gate circuit GTa is fixed at the ground voltage level (because the shown priority encoder has the highest priority). However, when a local search block of a higher priority is arranged with respect to priority encoder PE, the complementary input of gate circuit GTa of priority encoder PE is supplied with an output signal of OR gate OGn in the final stage of the priority encoder in the preceding stage, instead of the ground voltage.

Match line data MLDTa-MLDTn supplied from gate circuits GTa-GTn may be further encoded to produce information designating the address of the match line in the match state. Match line data MLDTa-MLDTn may be used as word line drive signals to drive a word line of a table memory to the selected state so that the data may be read from the corresponding word line (the outputs of gate circuits GTa-GTn are coupled to the word lines of the table memory).

In priority encoder PE shown in FIG. 50, it is assumed that output signals MLOUTb and MLOUTc are both at the H level, and signal MLOUTa is at the L level. In this case, gate circuit GTa produces the output signal at the L level, and OR gate OGa produces the output signal at the L level. Therefore, gate circuit GTb produces match line data MLDTb at the H level. When match line data MLDTb attains the H level, OR gate OGb produces the output signal at the H level. In this state, gate circuit GTc holds its output signal MLDTc at the L level even when corresponding match line data MLOUTc is at the H level. All the output signals of the OR gates of lower priorities are at the H level, and the outputs of the gate circuits of the lower priorities attain the L level. Therefore, when the match is detected from the match line of a higher priority, the match line information on the match line of the detected highest priority is driven to the active state, and the other match line data is set to indicate the search-miss state.

The priority encoder shown by way of example in FIG. 50 is used for each of priority encoders PE11-PE18 shown in FIG. 47. Accordingly, when the priority encoder of the higher priority among priority encoders PE11-PE18 shown in FIG. 47 detects the match, the match line data supplied from the priority encoders of priorities lower than the detected priority are all kept at the L level indicating the mismatch state (the output signal of OR gate is set to the H level).

The OR gate in the final stage of priority encoder PE18 provides the output signal at the H level when the match state is sensed in global search block GSB1. Thereby, the output signal of gate circuit 225 shown in FIG. 47 is fixed at the L level to inhibit the transmission of the clock signal to global search block GSB2. Since the search operation in global search block GSB2 is inhibited, the number of the operating local search blocks can be reduced, and the current consumption can be reduced.

In the construction shown in FIG. 47, each of global search blocks GSB1 and GSB2 includes eight local search blocks. However, the local search blocks included in one global search block are not restricted to such number of eight, and another number of local search blocks may be used. Also, more global search blocks than two global search blocks GSB1 and GSB2 may be employed. The number of the digital delay circuits included in delay control circuit 220 is set according to the number of the local search blocks included in the global search block.

The circuit for generating the bias voltage or the reference voltage may be arranged commonly to the global search blocks, and may also be arranged for each global search block separately and individually. For the control signal controlling the activation and search operation of the local search block, when search instruction signal SRCH may be employed as is done in the eleventh to fourteenth embodiments, the signal supplied from the digital delay circuit can be used as such search instructing signal. When a match amplifier activating signal, a precharge instructing signal and/or the like are used alternatively, it is sufficient to produce the operation control signal for each local search block with the operation timing adjusted based on the output signals of the corresponding digital delay circuits.

Sixteenth Embodiment

Figure 51:
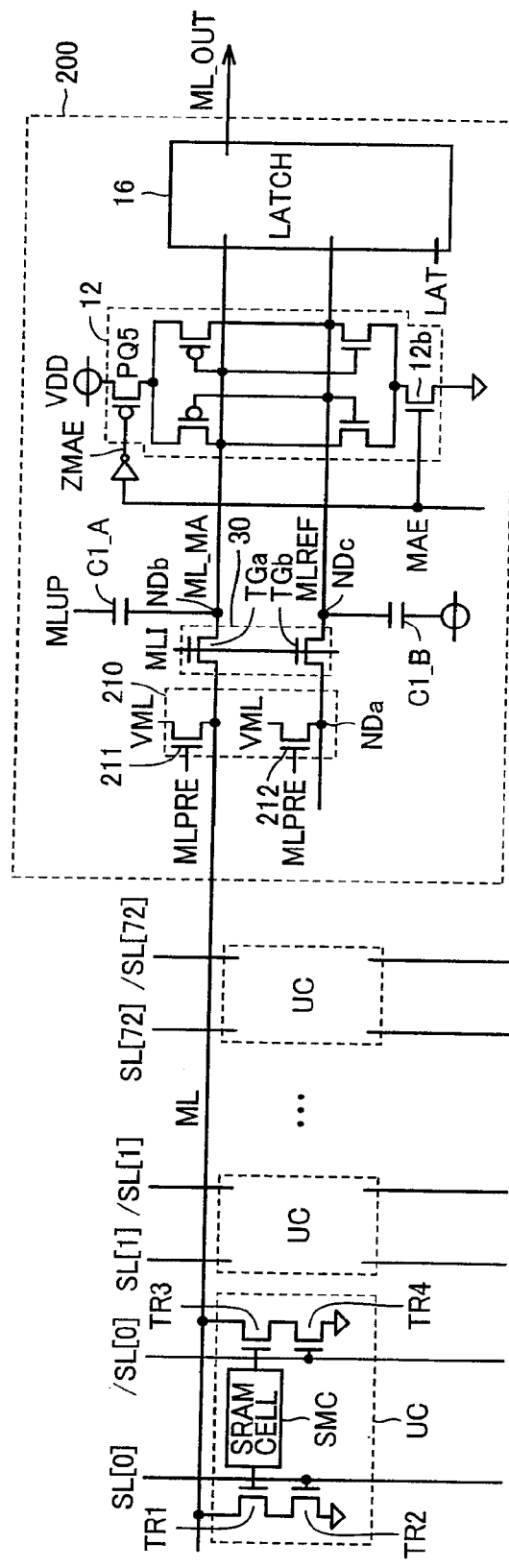
FIG. 51 shows a main portion of a CAM according to a sixteenth embodiment of the invention.
Figure 61:
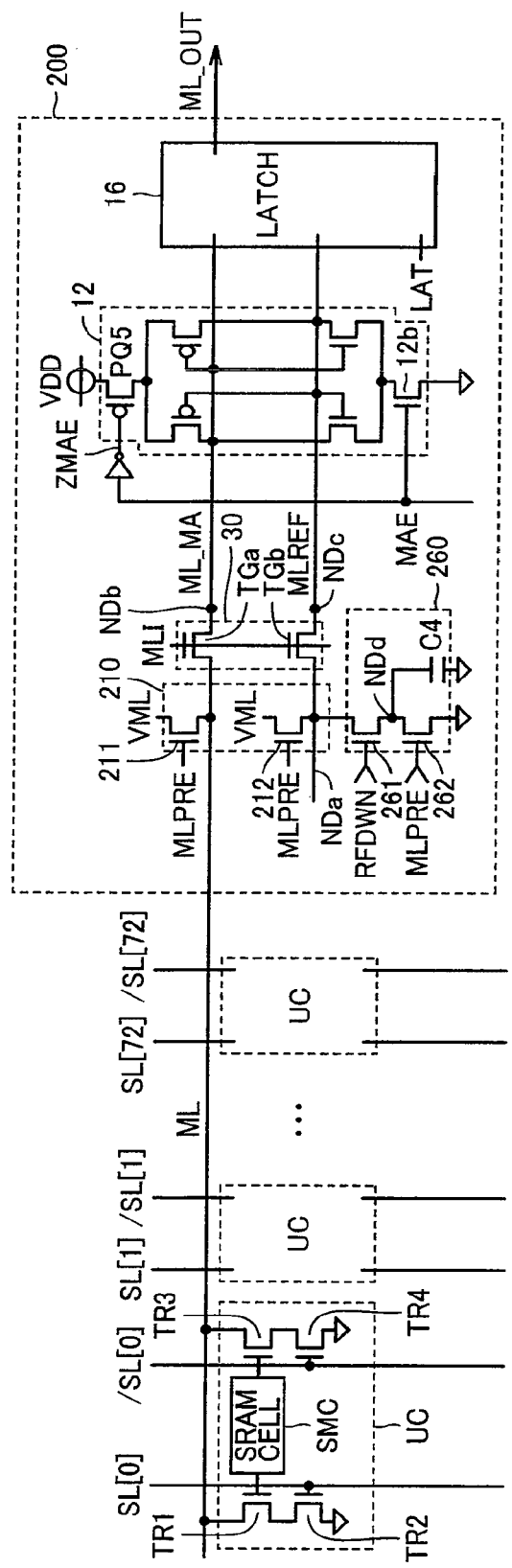
FIG. 61 schematically shows a main portion of a CAM according to a nineteenth embodiment of the invention.

FIG. 51 schematically shows a main portion of a content addressable memory according to a sixteenth embodiment of the invention. FIG. 51 representatively shows a match amplifier 200 arranged corresponding to match line ML. Match line ML is coupled to unit cells UC arranged in parallel. FIG. 61 shows, by way of example, search data of 73 bits on search lines SL[0] and /SL[0]-SL[72] and /SL[72].

In unit cell UC of the construction shown in FIG. 51, the CAM cell storing the data is formed of an SRAM cell, which is connected to gates of MOS transistors TR1 and TR3 nearer to match line ML. MOS transistors TR2 and TR4 are coupled to search lines SL[0] and /SL[0], respectively. Alternatively, unit cell UC may be configured such that the SRAM cell is coupled to MOS transistors TR2 and TR4, and search lines SL[0] and /SL[0] is coupled to MOS transistors TR1 and TR3, respectively. Two memory cells may be used in place of one SRAM cell SMC to implement a construction of the unit cell storing ternary data. The construction of unit cell UC is not restricted to that shown in FIG. 51, and the construction of the unit cell in the first embodiment shown in FIGS. 2 and 3 may be employed.

Match amplifier 200 includes a precharge circuit 210 and an isolation gate circuit 30. Precharge circuit 210 precharges match line ML and reference voltage node NDa to the level of precharge voltage VML not exceeding the intermediate voltage according to a precharge instructing signal MLPRE. Isolation gate circuit 30 isolates match line ML and reference voltage node NDa from internal nodes (first and second nodes) NDb and NDc according to isolation instructing signal MLI, respectively.

Precharge circuit 210 includes N-channel MOS transistors 211 and 212 that transmit precharge voltage VML to match line ML and reference voltage node NDa according to precharge instructing signal MLPRE, respectively. Isolation gate circuit 30 includes transfer gates TGa and TGb arranged for match line ML and reference voltage node NDa, respectively.

Match amplifier 200 further includes amplifier circuit 12 and latch 16. Amplifier circuit 12 is made active in response to the activation of match amplifier activating signal MAE, to differentially amplify the signals ML_MA and MLREF on internal nodes NDb and NDc. Latch 16 latches the output signal of amplifier circuit 12 according to latch instructing signal LAT.

Amplifier circuit 12 is substantially the same in construction as differential amplifier circuit 12 shown in FIG. 10. Amplifier circuit 12 differentially amplifies and latches voltages ML_MA and MLREF on internal nodes NDb and NDc. Latch 16 is the same in construction as the latch shown in FIG. 10. When latch instructing signal LAT is at the H level, latch 16 attains the through state, and produces search result indicating signal ML_OUT according to the output signal of amplifier circuit 12.

Match amplifier 200 further includes capacitance elements C1_A and C1_B provided corresponding to first and second internal nodes NDb and NDc, respectively. Capacitance element C1_A boosts the voltage level of internal node NDb through the charge pump operation (capacitive coupling) according to a boost instructing signal MLUP. Capacitance element C1_B is connected between internal node NDc and the power supply node. Capacitance element C1_B is the same in capacitance value as capacitance element C1_A, and is employed for balancing a capacitance load between internal nodes NDb and NDc.

Figure 52:
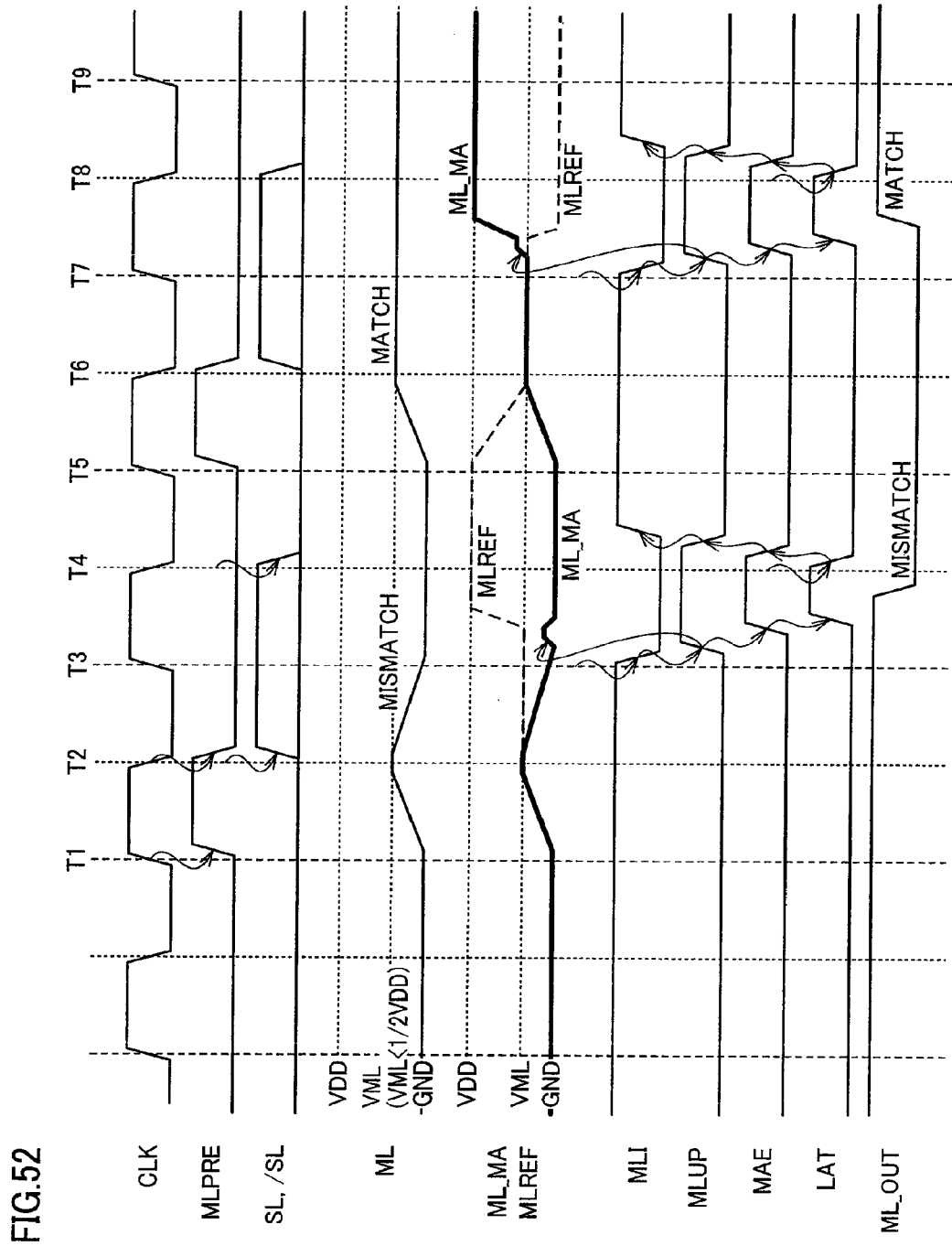
FIG. 52 is a timing chart representing an operation of a match amplifier shown in FIG. 51.

FIG. 52 is a timing chart representing an operation of the content addressable memory shown in FIG. 51. Referring to FIG. 52, the search operation of the content addressable memory shown in FIG. 51 will now be described.

Before starting the search operation, match line ML is at the level of ground voltage GND. Isolation instructing signal MLI is at the H level, and isolation gate circuit 30 is conductive. Latch instructing signal LAT is at the L level, and latch 16 is in the latch state and produces the signal ML_OUT at the H level, for example.

At time T1, the search cycle starts. According to the start of the search operation, precharge instructing signal MLPRE is kept at the H level for half the cycle period of clock signal CLK. Accordingly, match line ML and reference voltage node NDa are precharged to the level of intermediate voltage VML. Precharge voltage VML is at the level between intermediate voltage VDD/2 and the ground voltage. Through the precharge operation by precharge circuit 210, the voltages ML_MA and MLREF of internal nodes NDb and NDc each are also precharged to the intermediate voltage level.

When clock signal CLK falls to the L level at time T2, precharge instructing signal MLPRE attains the L level. Responsively, precharge circuit 210 is made inactive to complete the operation of precharging the match line ML and reference voltage node NDa. After the completion of the precharge operation, the search data is transmitted onto search lines SL and /SL (generically representing SL[0] and /SL[0]-SL[72] and /SL[72]), and the voltage levels thereon change according to the search data. When the search data does not match the stored data of unit cells UC coupled to match line ML (in the case of the mismatch state), match line ML is discharged via at least one unit cell UC, and has the voltage level thereof lowered. According to this voltage level lowering of match line ML, the level of voltage ML_MA on internal node NDb lowers. Voltage MLREF on internal node NDc is at the level of intermediate voltage VML.

When the voltage level of match line ML sufficiently lowers, isolation instructing signal MLI attains the L level to turn isolation gate circuit 30 non-conductive at time T3.

In response to the non-conduction of isolation gate circuit 30, boost instructing signal MLUP is driven to the H level. Internal node NDb is in the electrically floating state (match amplifier activation instructing signal MAE is inactive). Therefore, through the capacitive coupling by capacitance element C1_A, the level of voltage ML_MA on node NDb rises. The increase of voltage ML_MA on internal node NDb may be equal to or smaller than half an absolute value (|VML−GND|) of a difference between intermediate voltage VML and ground voltage GND. In the case of the mismatch state, this boosting operation reliably maintains the voltage difference between voltage ML_MA and precharge voltage VML on respective nodes NDb and NDc.

Then, match amplifier activating signal MAE is activated. Responsively, amplifier circuit 12 is activated to amplify differentially and latch the voltages ML_MA and MLREF. In the mismatch state, the voltage MLREF on node NDc is driven to the level of power supply voltage VDD, and voltage ML_MA on internal node NDb is driven to the level of ground voltage. When the amplifying operation of amplifier circuit 12 is made active, latch instructing signal LAT attains the H level. Responsively, latch 16 enters the through state, and search result indicating signal ML_OUT produced from latch 16 attains the L level indicating the mismatch state.

At time T4, the search operation is completed, and search lines SL and /SL are precharged to the ground voltage level. Latch instructing signal LAT is driven to the L level to keep latch 16 in the latch state. When latch 16 enters the latch state, match amplifier activating signal MAE becomes inactive, and amplifier circuit 12 is made inactive. Then, boost instructing signal MLUP is driven to the L level, and subsequently isolation instructing signal MLI is driven to the H level to render isolation gate circuit 30 conductive. When boost instructing signal MLUP is driven to the L level, through the capacitive coupling of capacitance element C1_A, the voltage level of internal node NDb drops. However, when isolation gate circuit 30 is conductive, due to the charges supplied from match line ML at the ground voltage level, the voltage level of internal node NDb is held at the ground voltage level.

Voltage MLREF on internal node NDc keeps the level of power supply voltage VDD amplified by amplifier circuit 12.

When a next search cycle starts at time T5. Precharge instructing signal MLPRE attains the H level, to precharge match line ML and reference voltage node NDa to the level of precharge voltage VML.

At time T6, the search data is transmitted to search lines SL and /SL to change the voltage levels of search lines SL and /SL.

When the search data matches the data held in all unit cells UC in the corresponding entry, the discharging path is not present for match line ML, and match line ML is kept at the level of precharge voltage VML.

When clock signal CLK rises to the H level at time T7, isolation instructing signal MLI is driven to the L level to turn isolation gate circuit 30 non-conductive. Subsequently, boost instructing signal MLUP is driven to the H level. Responsively, through the capacitive coupling of capacitance element C1_A, the level of voltage ML_MA on internal node NDb is raised to exceed precharge voltage VML. Accordingly, a voltage difference is developed between internal nodes NDb and NDc. According to the activation of match amplifier activating signal MAE, amplifier circuit 12 can differentially amplify and latch these voltages ML_MA and MLREF. When latch instructing signal LAT is then driven to the H level, latch 16 enters the through state, to drive output signal ML_OUT to the H level indicative of the match state.

When clock signal CLK falls at time T8, the match determination period expires, and latch instructing signal LAT attains the L level. Then, match amplifier activating signal MAE becomes inactive. Accordingly, boost instructing signal MLUP is driven to the L level, and subsequently isolation instructing signal MLI is driven to the H level. Responsively, isolation gate circuit 30 turns conductive to couple internal node NDb to match line ML.

When isolation gate circuit 30 turns conductive to couple match line ML to internal node NDb, the voltage on match line ML attains the same voltage level as signal voltage ML_MA on internal node NDb. FIG. 52 does not show this voltage change. When the next search cycle starts, internal node NDb and match line ML are driven to the level of precharge voltage VML according to precharge instructing signal MLPRE. Since a parasitic capacitance of match line ML is much larger than that of internal node NDb, voltage ML_MA lowers to the voltage level close to precharge voltage VML when isolation gate circuit 30 turns conductive. In this case, isolation gate circuit 30 may have a decouple function to allow transmission of up to intermediate voltage VML. (A difference between the H level of isolation instructing signal MLI and the threshold voltage of isolation gate TGa is set to a level of intermediate voltage VML.)

Figure 53:
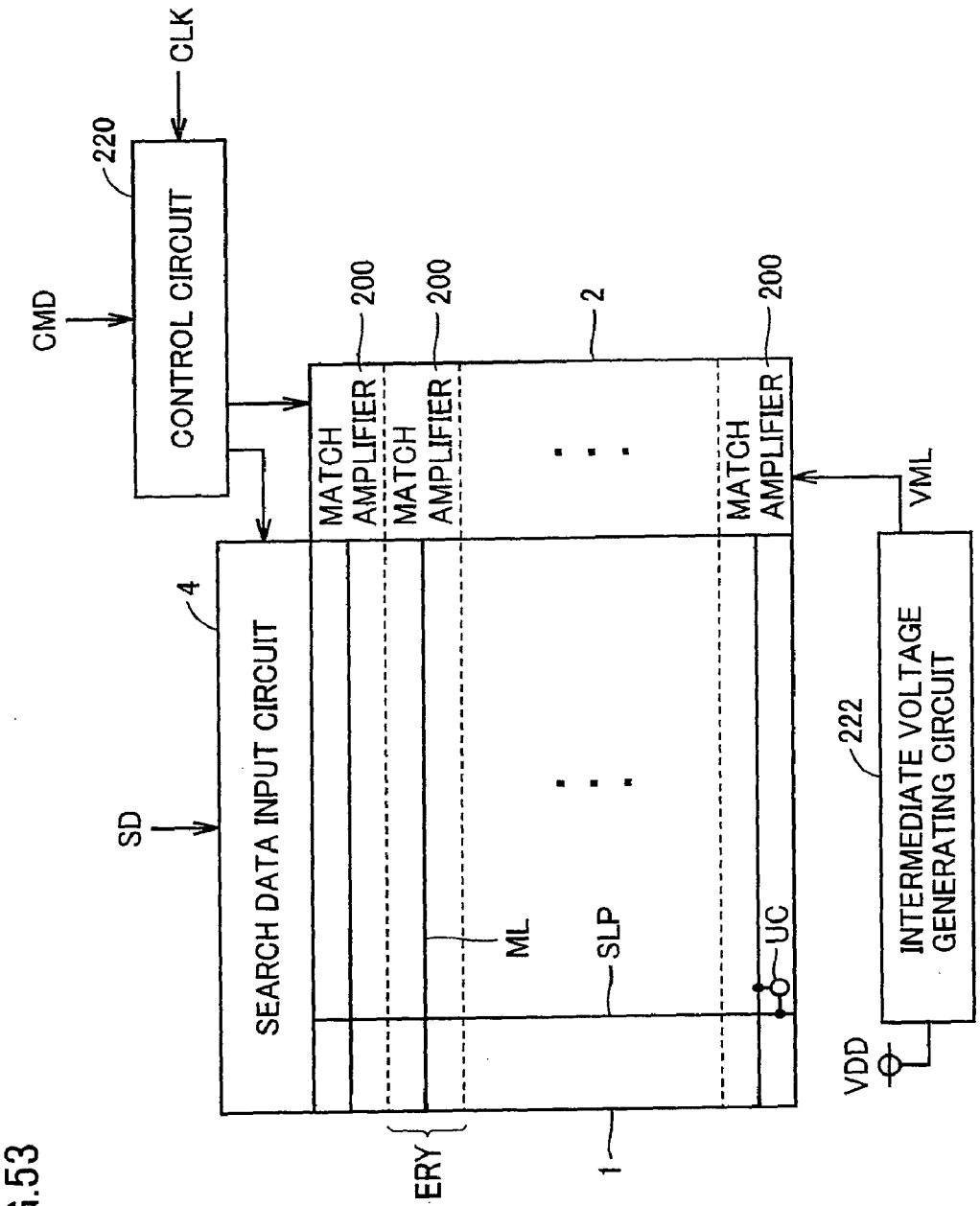
FIG. 53 schematically shows a whole construction of the CAM according to the sixteenth embodiment of the invention.

FIG. 53 schematically shows a whole construction of the content addressable memory according to the sixteenth embodiment of the invention. The content addressable memory shown in FIG. 53 is substantially the same in construction as the content addressable memory shown in FIG. 1 except for the reference numerals or characters. Specifically, memory cell array 1 includes unit cells UC arranged in rows and columns, and is divided into a plurality of entries ERY. Match lines ML are arranged corresponding to the respective entries ERY, and match amplifiers 200 are arranged corresponding to the respective match lines ML.

Match amplifier 200 arranged corresponding to each match line ML configures match determining circuit 2. An intermediate voltage generating circuit 222 commonly supplies, as a precharge voltage, the intermediate voltage VML to match amplifiers 200.

Control circuit 220 performs the operation control so as to achieve the operation instructed by command CMD that is supplied in synchronization with clock signal CLK.

Figure 54:
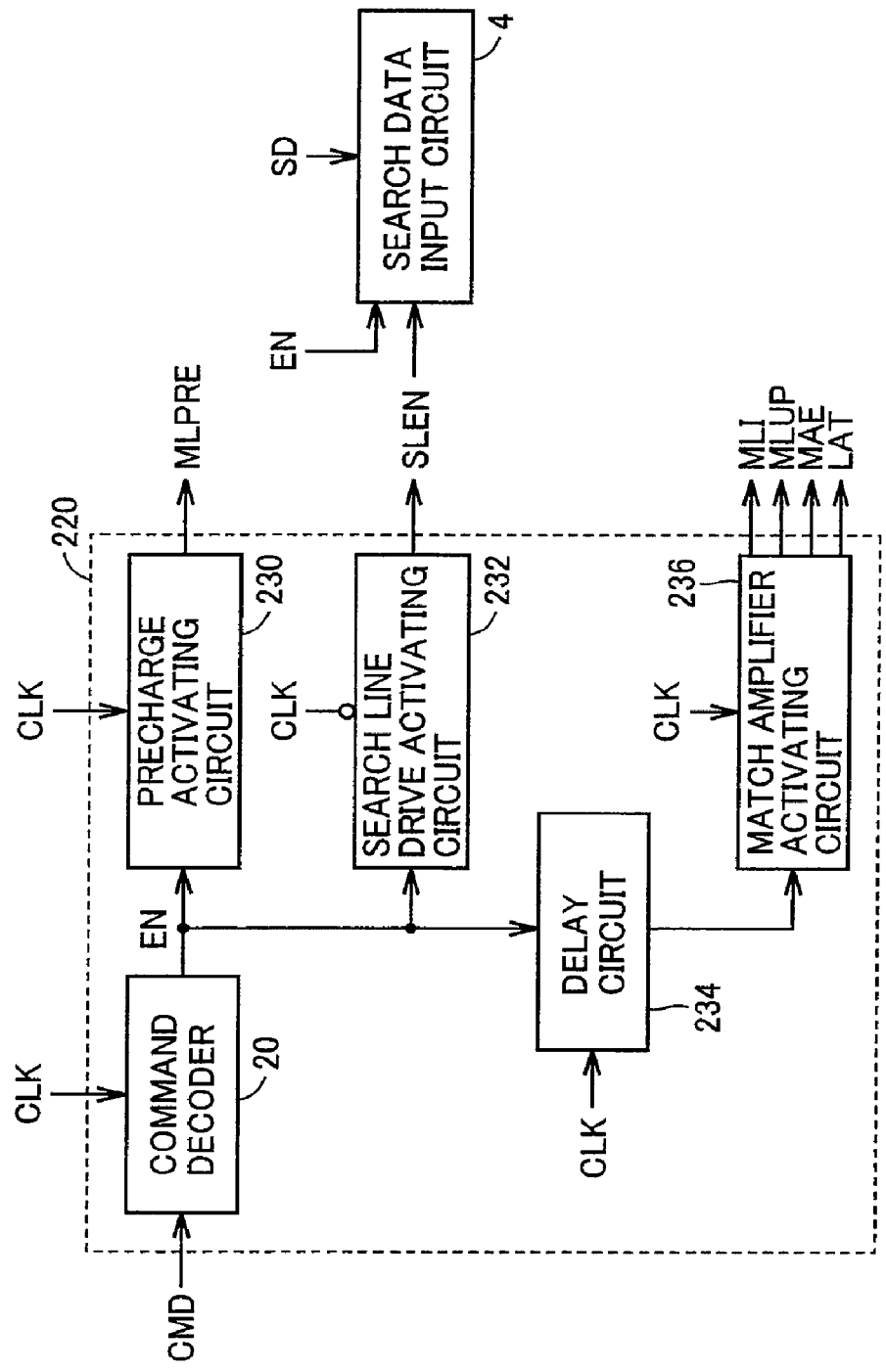
FIG. 54 schematically shows a construction of a portion for generating control signals shown in FIG. 51.

FIG. 54 schematically shows an example of a construction of control circuit 220 shown in FIG. 53. Control circuit 220 in FIG. 54 is the same in construction as the control circuit shown in FIG. 18. Specifically, control circuit 220 in FIG. 54 includes command decoder 20, a precharge activating circuit 230, a search line drive activating circuit 232, a delay circuit 234 and a match amplifier activating circuit 236, similarly to the construction shown in FIG. 18.

Command decoder 20 decodes externally supplied command CMD in synchronization with clock signal CLK. Precharge activating circuit 230 produces precharge instructing signal MLPRE according to search operation instruction EN received from command decoder 20 and clock signal CLK. When search operation instruction EN is active, search line drive activating circuit 232 holds search line activating signal SLEN activating the search line in the active state for a period of the L level of clock signal CLK. Delay circuit 234 delays search operation instruction EN by one clock cycle of clock signal CLK.

Match amplifier activating circuit 236 sequentially activates isolation instructing signal MLI, boost instructing signal MLUP, match amplifier activating signal MAE and latch instructing signal LAT in this order in response to rising of clock signal CLK to the H level when the output signal of delay circuit 234 is active. When clock signal CLK falls then, match amplifier activating circuit 236 first deactivates latch instructing signal LAT, then deactivates match amplifier activating signal MAE and thereafter sequentially deactivates boost instructing signal MLUP and isolation instructing signal MLI.

Match amplifier activating circuit 236 is formed of, e.g., a series of set/reset flip-flops, which are sequentially driven to the set state, and then are sequentially deactivated. With such construction, the control signals shown in FIG. 52 for match amplifiers 200 can be activated and deactivated in a predetermined sequence.

According to the sixteenth embodiment of the invention, as described above, the amplifying operation is performed while the match line is isolated from the amplifier circuit of the match amplifier to confine the charges. The capacitance element for boosting the internal node (first node) connected to the amplifier circuit is not required to boost an entire of a match line, so that the capacitance element can have a reduced size, and the occupation area of the match amplifier can be small. Also, the boost instructing signal generating portion (match amplifier activating circuit 236) for driving the capacitance element is just required to drive a small capacitance, and the load to be driven thereby is small so that the current consumption can be small. Since the amplification is performed according to the charge confining scheme, the load of the amplifier circuit is small, and the load capacitance of the node having the voltage full-swinging is small, and accordingly the current consumption in the amplifying operation can be small. Further, the amplifying operation can be performed fast.

According to the timing chart shown in FIG. 52, match line ML is precharged to the intermediate voltage level only at the start of the search. However, this precharge operation may be configured to be performed during standby before the search operation and to be completed at the start of the search operation.

Seventeenth Embodiment

Figure 55:
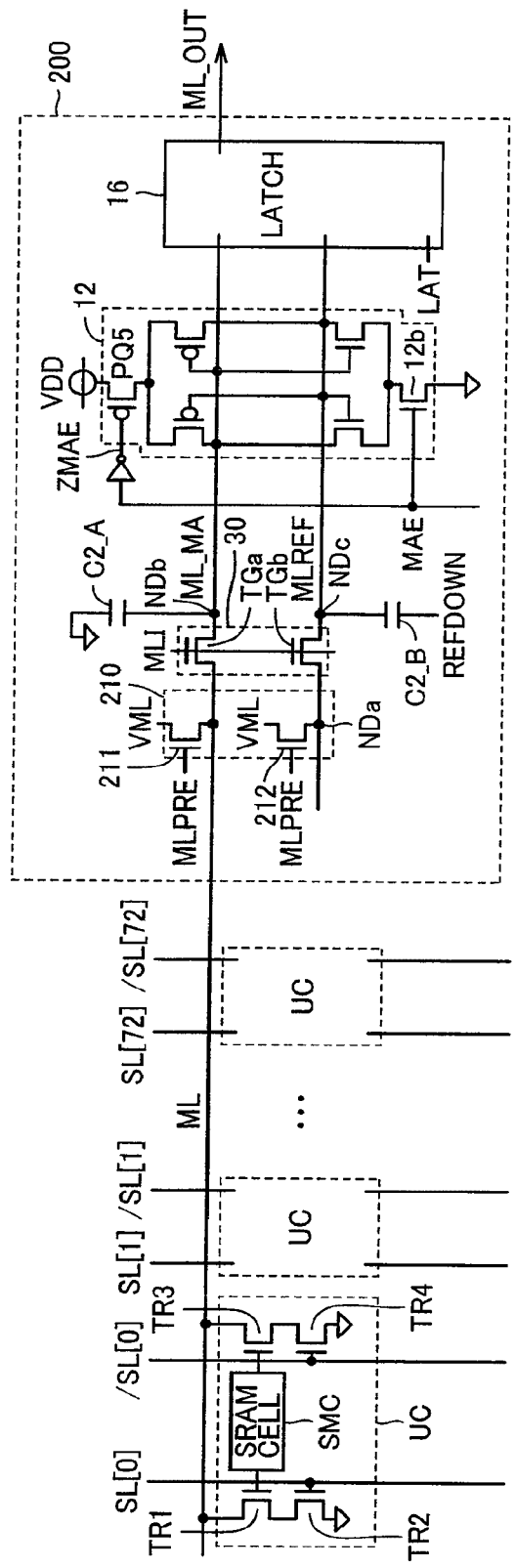
FIG. 55 schematically shows a main portion of a CAM according to a seventeenth embodiment of the invention.

FIG. 55 schematically shows a main portion of a content addressable memory according to a seventeenth embodiment of the invention. The content addressable memory shown in FIG. 55 differs from the content addressable memory shown in FIG. 51 in the following construction. In match amplifier 200, a capacitance element C2_A is connected at one electrode to internal node NDb coupled to match line ML, and to the ground at the other electrode. Capacitance element C2_A functions as a capacitance for accumulating charges transmitted from match line ML. A capacitance element C2_B is provided for internal node NDc producing the reference voltage. Capacitance element C2_B receives a reference voltage down instructing signal REFDOWN on its other electrode, and lowers reference voltage MLREF on internal node NDc through its capacitive coupling (charge pump operation).

Other constructions of the content addressable memory shown in FIG. 55 are the same as those shown in FIG. 51. Corresponding portions are allotted the same reference numerals, and description thereof is not repeated.

Figure 56:
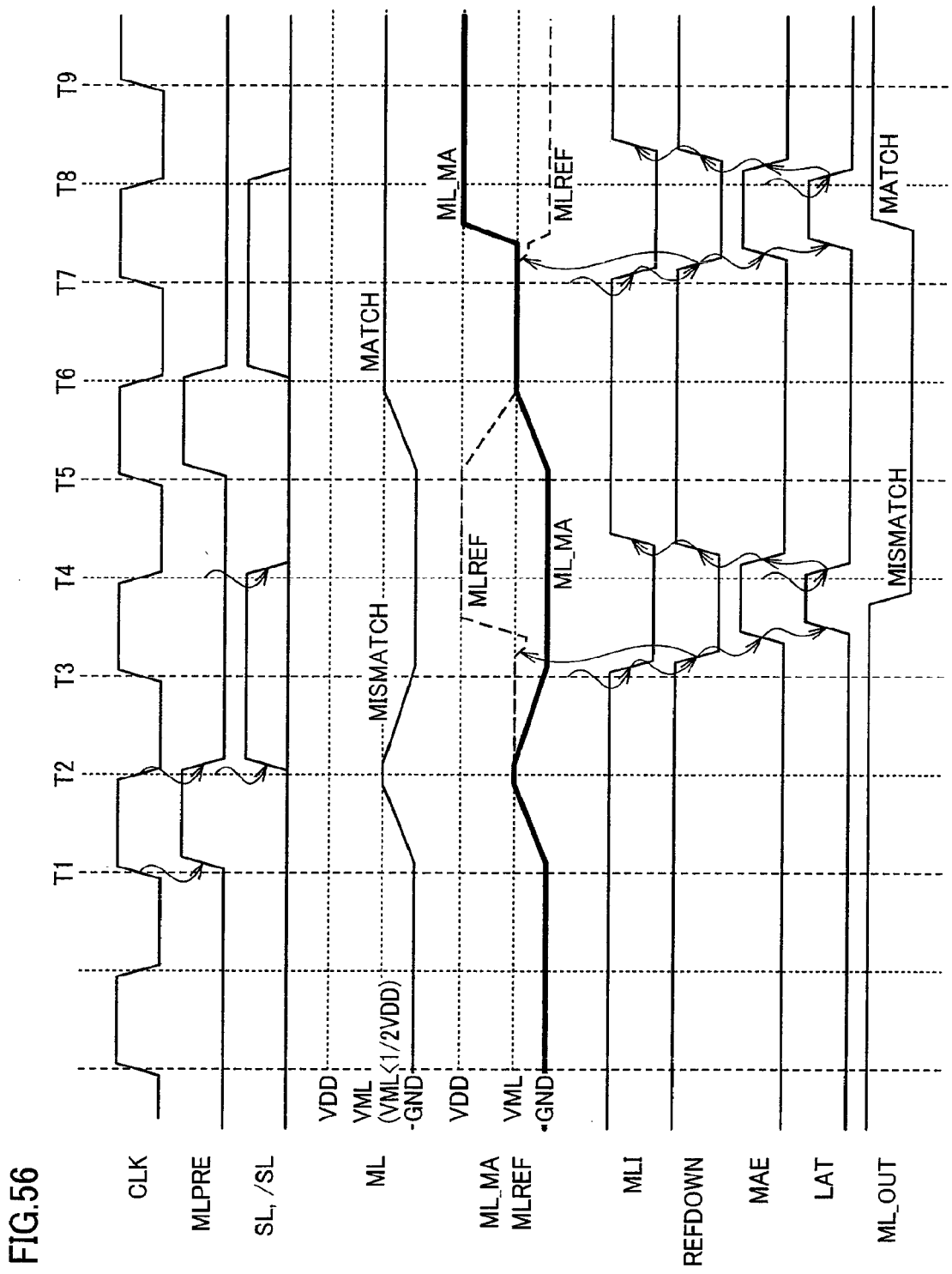
FIG. 56 is a timing chart representing an operation of a match amplifier shown in FIG. 55.

FIG. 56 is a timing chart representing a search operation of the construction shown in FIG. 55. Referring to FIG. 56, the operation of the circuits shown in FIG. 55 will now be described.

The operations from time T1 to time T3 are the same as those of the search operation in the sixteenth embodiment represented in FIG. 52. Before the search data is transferred to search lines SL and /SL, match line ML and reference voltage node NDa are charged to the voltage level of intermediate voltage VDD/2 or lower (according to on match line precharge instructing signal MLPRE at time T1). At this time, isolation gate circuit 30 is conductive, and internal node NDc is likewise precharged to the level of precharge voltage VML of intermediate voltage VDD/2 or lower.

At time T2, the search data is transferred. Upon mismatch, match line ML is discharged to have a lowered voltage level. Isolation gate circuit 30 in conductive, and accordingly voltage ML_MA on internal node NDb lowers. Reference voltage MLREF on internal node NDc is kept at the level of precharge voltage VML.

AT time T3, isolation instructing signal MLI is driven to the L level to turn isolation gate circuit 30 non-conductive. Then, reference voltage down instructing signal REFDOWN is driven from the H level to the L level. Responsively, through capacitive coupling of capacitance element C2_B, the voltage MLREF on internal node NDc lowers. This capacitance value of capacitance element C2_B is determined such that the voltage on internal node NDc may attain the level equal to or lower than half a difference of |VML−GND| between precharge voltage VML and ground voltage GND.

The voltage MLREF on internal node NDc does not lower below the level of voltage ML_MA on internal node NDb. Then, match amplifier activating signal MAE is made active to activate amplifier circuit 12. Through differential amplification of amplifier circuit 12, voltage ML_MA on internal node NDb is driven to the ground voltage level. Also, reference voltage MLREF on internal node NDc is driven to and latched at the level of power supply voltage VDD. Then, latch instructing signal LAT is made active to set latch 16 to the through state so that output signal ML_OUT is driven to the L level indicating the mismatch state.

At time T4, this determining operation is completed, and latch instructing signal LAT is driven to the L level. Responsively, latch 16 enters the latch state, and output signal ML_OUT is kept at the L level. Then, match amplifier activating signal MAE is driven to the L level to deactivate amplifier circuit 12.

Thereafter, reference voltage down instructing signal REFDOWN is driven to the L level. At this time, internal node NDc is in the electrically floating state, and the voltage MLREF on node NDc slightly rises. However, isolation instructing signal MLI is driven to the H level and isolation gate circuit 30 is conductive. Therefore, redistribution of the charges compensates for the voltage rising on node NDc caused through the capacitive coupling, and internal node NDc is kept substantially at the level of power supply voltage VDD. In this case, reference voltage MLREF may be kept at the voltage level higher than power supply voltage VDD. Since the search operation is performed while reference voltage MLREF is accurately precharged to the level of precharge voltage VML according to precharge instructing signal MLPRE in the next search cycle, no particular problem in operation occurs.

Reference voltage down instructing signal REFDOWN may be driven to the H level when match amplifier activating signal MAE is in the active state at the H level. In this state, internal node NDc is not in the electrically floating state, amplifier circuit 12 rapidly absorbs the voltage change caused by the capacitive coupling of capacitance element C2_B.

A next search cycle starts at time T5. Specifically, precharge instructing signal MLPRE attains the H level, and match line ML, reference node NDa and internal nodes NDb and NDc are precharged to the level of precharge voltage VML.

At time T6, search data is transferred to search lines SL and /SL. In this search operation, match line ML is not discharged as it in the match state. Thus, match line ML is kept at the level of precharge voltage VML. Therefore, match amplifier 200 holds the voltages ML_MA and MLREF on internal nodes NDb and NDc at the level of precharge voltage VML.

At time T7, isolation instructing signal MLI is driven to the L level, and isolation gate circuit 30 turns non-conductive. Then, reference voltage down-conversion instructing signal REFDOWN is driven to the L level. Through the capacitive coupling of capacitance element C2_B, level of voltage MLREF on internal node NDc lowers. Voltage ML_MA on internal node NDb is at the level of precharge voltage VML. Therefore, a voltage difference is developed between internal nodes NDb and NDc. By activating match amplifier activating signal MAE, amplifier circuit 12 differentially amplifies the voltages on nodes NDb and NDc. Accordingly, the voltage ML_MA is driven to the level of power supply voltage VDD, and voltage MLREF is driven to the level of ground voltage. Then, latch instructing signal LAT is driven to the H level. Responsively, latch 16 enters the through state. Output signal ML_OUT of latch 16 attains the H level indicating the match state, and the determination can be performed accurately.

When the search/determination operation is completed, search lines SL and /SL are driven to the ground voltage level at time T8. Latch instructing signal LAT is driven to the L level. Responsively, latch 16 enters the latch state, and output signal ML_OUT thereof is kept at the H level. Then, match amplifier activating signal MAE is driven to the L level. Thereafter, reference voltage down instructing signal REFDOWN is driven to the H level, and then isolation instructing signal MLI is driven to the H level. Accordingly, isolation gate circuit 30 turns conductive to connect internal node NDc to reference voltage node NDa. In this case, isolation gate circuit 30 turns conductive in response to the rising of reference voltage down instructing signal REFDOWN, to cause the redistribution of charges even when the capacitive coupling of capacitance element C2_B raises the voltage level of node NDc. Accordingly, internal node NDc is kept at the ground voltage level.

Through a series of these operations, the search/determination operation is completed. At time T9, the control stands by for a next search operation.

In this seventeenth embodiment also, match line precharge instructing signal MLPRE is driven to and maintained at the H level for a predetermined period (half a clock cycle period), for precharging match line ML and reference voltage node NDa only at the start of the search operation. However, this precharge operation may be performed during standby, i.e., when the search operation is not performed (in a period after search lines SL and /SL are driven to the ground voltage level).

In the seventeenth embodiment, the sensing operation (amplifying operation) is performed in such a state that isolation gate circuit 30 is confining the charges on internal nodes NDb and NDc. The load capacitances of internal nodes NDb and NDc are smaller than the load capacitance of the whole match line ML connected to unit cells UC. Therefore, capacitance element C2_B that lowers the level of voltage MLREF on internal node NDc can have a sufficiently small capacitance value. This can reduce an occupation area of match amplifier 200.

Capacitance element C2_A of internal node NDb is arranged for securing a capacitive balance between internal nodes NDb and NDc. Therefore, the capacitance value of capacitance element C2_A can be merely equal to that of capacitance element C2_B, and the occupation area thereof can be sufficiently small. The load capacitances of nodes NDb and NDc are small, and the driving capacitance of amplifier circuit 12 is small so that the sense operation can be performed fast with low power consumption.

The CAM according to the seventeenth embodiment is the same in whole construction as the CAM shown in FIG. 53.

Figure 57:
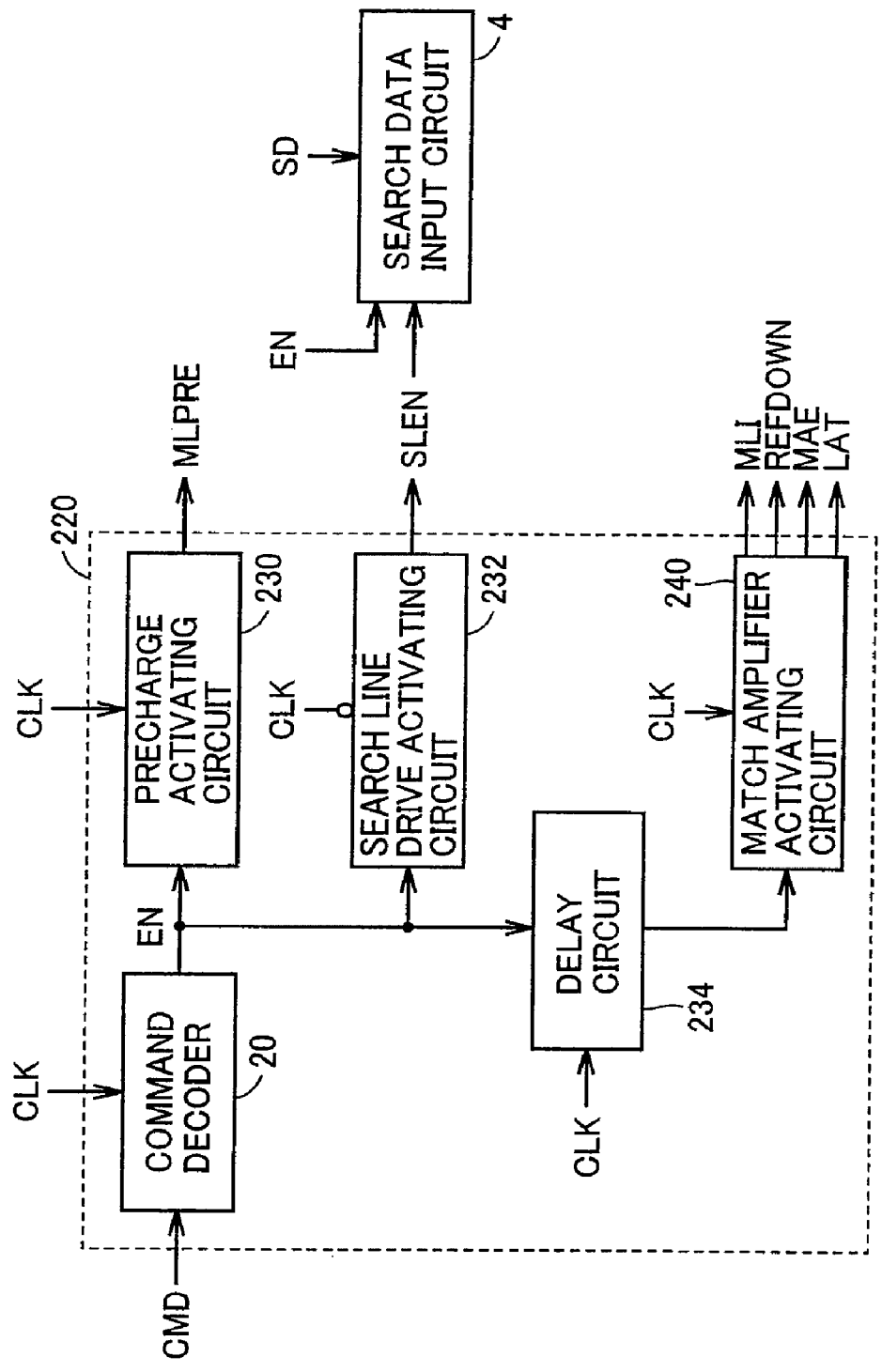
FIG. 57 schematically shows a construction of a portion for generating a control signal shown in FIG. 55.

FIG. 57 schematically shows a construction of a portion generating control signals in the seventeenth embodiment of the invention. Control signal generating circuit 220 shown in FIG. 57 differs from control signal generating circuit 220 shown in FIG. 54 in the following construction. A match amplifier activating circuit 240 for activating the match amplifier according to the output signal of delay circuit 234 produces reference voltage down instructing signal REFDOWN instead of pull-up instructing signal MLUP. This match amplifier activating circuit 240 operates in synchronization with clock signal CLK, and is activated according to the output signal of delay circuit 234. Accordingly, match amplifier activating circuit 240 sequentially activates and deactivates isolation instructing signal MLI, reference voltage down instructing signal REFDOWN, sense amplifier activating signal MAE and latch instructing signal LAT. Reference voltage down instructing signal REFDOWN is the same in waveform as pull-up instructing signal MLUP in the control signal generating circuit shown in FIG. 54 except for that the polarities are inverted. Therefore, match amplifier activating circuit 240 in the seventeenth embodiment can be implemented by substantially the same construction as match amplifier activating circuit 236 shown in FIG. 54. An inverted signal of pull-up instructing signal MLUP is produced as reference voltage down instructing signal REFDOWN.

For other constructions, control signal generating circuit 220 shown in FIG. 57 is substantially the same as the control signal generating circuit shown in FIG. 54. Corresponding portions are allotted the same reference numerals, and description thereof is not repeated.

According to the seventeenth embodiment of the invention, as described above, the match amplifier for sensing the voltage level of the match line confines the match line voltage and the comparison reference voltage on the internal nodes. This reference voltage level is lowered through a capacitive coupling by a voltage level equal to or smaller than half precharge voltage VML, and the sensing operation is performed. Therefore, in the search/determination operation, a voltage difference can be developed between the match line and the reference voltage node, to perform accurately the determining operation. A driving load of the amplifier circuit in the match amplifier is sufficiently small, and the occupation area of the match amplifier can be sufficiently small. The sensing operation can be performed fast with low power consumption.

Eighteenth Embodiment

Figure 58:
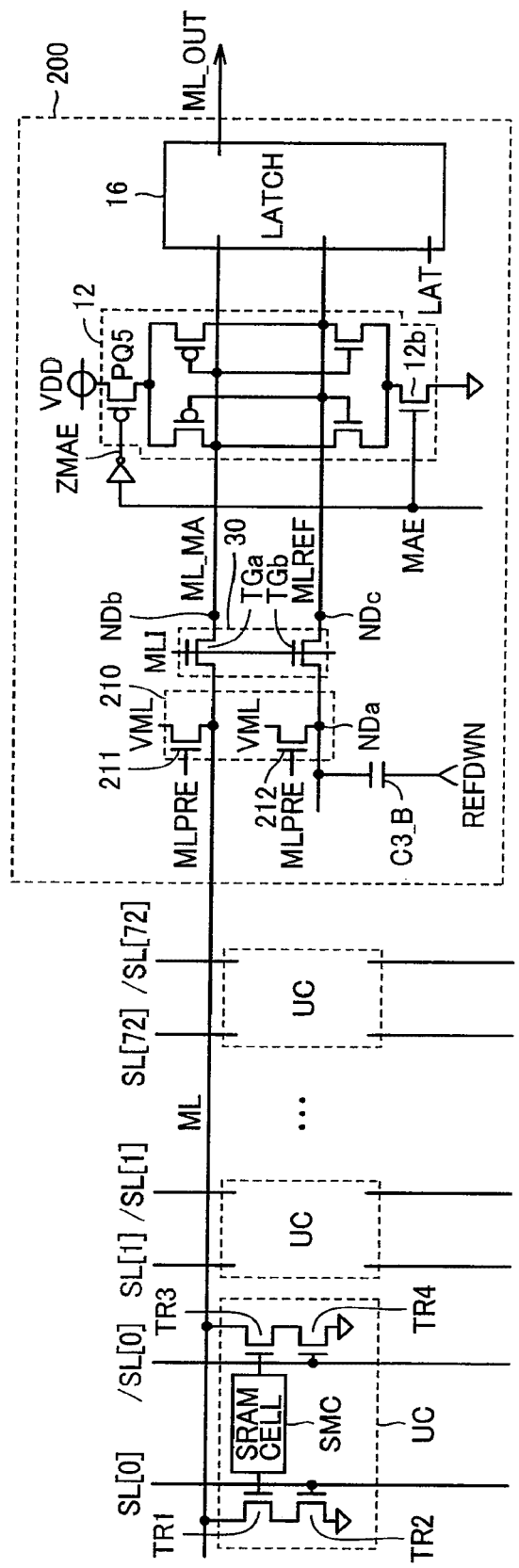
FIG. 58 schematically shows a main portion of a CAM according to an eighteenth embodiment of the invention.

FIG. 58 schematically shows a main portion of a CAM according to an eighteenth embodiment of the invention. In the construction of the CAM shown in FIG. 58, match amplifier 200 has a construction different from that of match amplifier 200 shown in FIG. 55. Specifically, a capacitance element C3_B is connected to reference voltage node NDa. Capacitance element C3_B lowers the precharge voltage level of reference voltage node NDa through the capacitive coupling according to a level-down instructing signal RFDWN. A capacitive element is not provided for internal nodes NDb band NDc. Match amplifier 200 shown in FIG. 58 is the same in construction as match amplifier 200 shown in FIG. 55. The same portions are allotted the same reference numbers, and description thereof is not repeated. The arrangement of unit cells UC including the CAM cells are the same as that of unit cells UC for match line ML in the CAM shown in FIG. 55.

In the construction of the CAM shown in FIG. 58, precharge level VML (VML<VDD/2) of reference voltage node NDa is lowered by a certain voltage level in the search operation. Thereafter, isolation gate circuit 30 confines the charges of the potential of match line ML and of the reference voltage at the lowered level on internal nodes NDb and NDc. Thus, the sensing operation can be performed fast with low power consumption.

Figure 59:
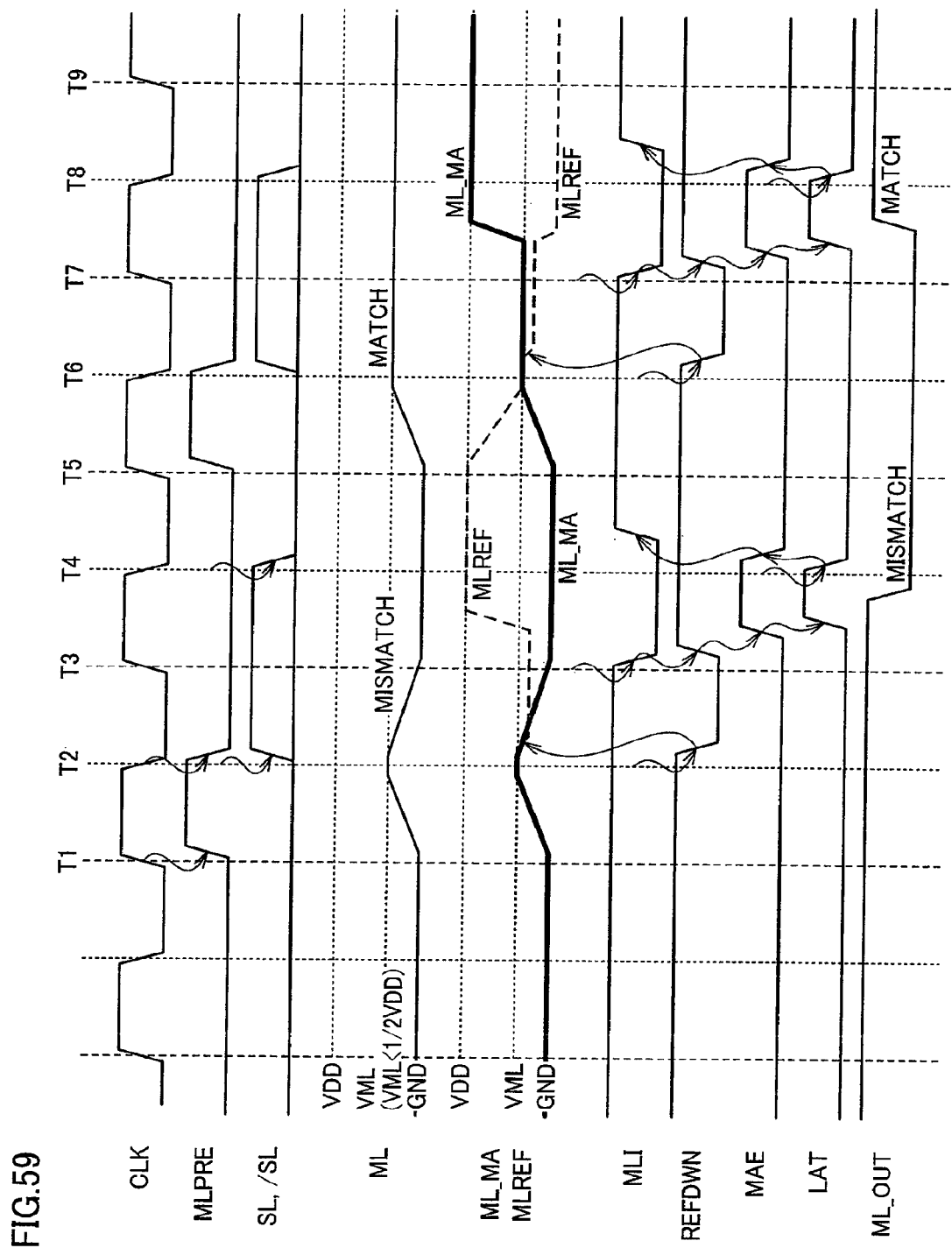
FIG. 59 is a timing chart representing an operation of a match amplifier shown in FIG. 58.

FIG. 59 is a timing chart representing an operation of the match amplifier shown in FIG. 58. In the search cycle between times T1 and T4, FIG. 59 shows waveforms corresponding to the search result being the mismatch. In the search cycle between times T5 and T8, FIG. 59 shows waveforms corresponding to the search result being the match. Referring to FIG. 59, an operation of match amplifier 200 shown in FIG. 58 will now be described.

At time T1, the search cycle starts. Precharge instructing signal MLPRE is driven to the H level and precharge circuit 210 precharges match line ML and reference voltage node NDa to the level of precharge voltage VML. At this time, isolation gate circuit 30 is conductive (isolation instructing signal ML is at the H level), and internal nodes NDb and NDc are precharged to the level of precharge voltage VML.

At time T2, match line precharge instructing signal MLPRE attains the L level to start the search operation. Search lines SL and /SL are driven according to the search data. In the case of mismatch, match line ML is discharged. At this time, level-down instructing signal REFDWN is driven to the L level according to the start of the search operation. Therefore, through the capacitive coupling of capacitance element C3_B, the voltage level of reference voltage node NDa lowers from precharge voltage VML. The quantity of the voltage level drop of reference voltage node NDa is equal to or smaller than half a difference between precharge voltage VML and ground voltage GND. Therefore, even when the level of voltage MLREF lowers, the voltage MLREF is higher than the voltage ML_MA of match line ML.

The changes in voltage on match line ML and reference voltage node NDa are transmitted to internal nodes NDb and NDc via isolation gate circuit 30.

At time T3, isolation instructing signal MLI is driven to the L level, and isolation gate circuit 30 turns non-conductive. When isolation gate circuit 30 changes to the non-conductive state, level-down instructing signal REFDWN is driven to the H level. Through the capacitive coupling of capacitance element C3_B, the voltage level of reference voltage node NDa rises. However, isolation gate circuit 30 is non-conductive, and voltage MLREF on internal node NDc holds the level lowered at time T2.

Then, match amplifier activating signal MAE is made active. Amplifier circuit 12 is made active to amplify differentially voltages MLREF and ML_MA on internal node NDb and NDc. Since the search result is the mismatch state, the voltage MLREF is driven to the level of power supply voltage VDD, and voltage ML_MA is driven to the ground voltage level. Then, latch instructing signal LAT is driven to the H level, and latch 16 enters the through state. Responsively, output signal ML_OUT of latch 16 is driven to the L level to indicate the mismatch state.

When the search operation is completed at time T4, latch instructing signal LAT is driven to the L level, and then match amplifier activating signal MAE is driven to the L level. Accordingly, latch 16 enters the latch state, and amplifier circuit 12 is made inactive. After the deactivation of the match amplifier, isolation instructing signal MLI is driven to the H level to turn isolation gate circuit 30 conductive.

Match line ML is already discharged to the ground voltage level, and voltage ML_MA on internal node NDb is kept at the level of ground voltage even when isolation gate circuit 30 turns conductive. Internal node NDc is connected to reference voltage node NDa. The charges are redistributed between internal node NDb and reference voltage node NDa. In this case, the voltage level changes according to the ratio between the parasitic capacitance (the capacitance of capacitance element C3_B and the interconnection capacitance) of reference voltage node NDa and the parasitic capacitance (the gate capacitance of the transistors of amplifier circuit 12 and the coupling capacitance) of internal node NDc. FIG. 59 shows a state in which voltage MLREF is kept at the level of power supply voltage VDD. In the case where the capacitive coupling increases the voltage level of reference voltage node NDa when isolation gate circuit 30 is non-conductive, the quantity of voltage rising is larger than the quantity of voltage lowering. At the time of voltage rising, the parasitic capacitance coupled to reference voltage node NDa is smaller than that at the time of voltage lowering. Therefore, even when isolation gate circuit 30 is made conductive to redistribute the charges between nodes NDc and NDa, the quantity of changes in voltage is small, and it can be supposed that nodes NDa and NDc are kept at the power supply voltage level.

Even when voltage MLREF changes to the voltage level between precharge voltage VML and power supply voltage VDD after isolation gate circuit 30 is made conductive, no particular problem occurs (because reference voltage node NDa is precharged to the level of precharge voltage VML at the start of the next search cycle).

The next search cycle starts at time T5, and precharge instructing signal MLPRE is driven to the active state. Responsively, MOS transistors 211 and 212 of precharge transistor 210 precharge match line ML and reference voltage node NDa to the level of precharge voltage VML.

At time T6, the search data is transmitted to search lines SL and /SL and the voltage levels thereof change. In the case of the match state, the discharging path for match line ML is not present. Therefore, match line ML is kept at the level of precharge voltage VML. Also, at the start of the search operation, level-down instructing signal REFDWN is driven to the L level. Responsively, through the capacitive coupling of capacitance element C3_B, the voltage level of reference voltage node NDa drops. The quantity of voltage drop of reference voltage node NDa is equal to a level between precharge voltage VML and ground voltage GND. Isolation gate circuit 30 is conductive and transmits the voltage levels of match line ML and reference voltage node NDa to internal nodes NDb and NDc, respectively.

At time T7, isolation instructing signal MLI is driven to the L level in synchronization with the rising of clock signal CLK. Responsively, isolation gate circuit 30 is made non-conductive, so that the charges are confined on internal nodes NDb and NDc. After isolation gate circuit 30 turns into the non-conductive state, level-down instructing signal REFDWN is driven to the H level. In this case, through the capacitive coupling of capacitance element C3_B, the voltage level of reference voltage node NDa changes. However, isolation gate circuit 30 is non-conductive, and the level of voltage MLREF on internal node NDc does not change.

Then, sense amplifier activating signal MAE is made active, and the voltages ML_MA and MLREF on internal nodes NDb and NDc are differentially amplified. Accordingly, voltage ML_MA is driven to the level of power supply voltage VDD, and voltage MLREF is driven to the ground voltage level.

Then, latch instructing signal LAT is driven to the H level to set latch 16 to the through state. Responsively, output signal ML_OUT of latch 16 is driven to the H level indicative of the match state.

At time T8, the determining operation is completed, and latch instructing signal LAT is driven to the L level to set latch 16 to the latch state. Output signal ML_OUT of latch 16 keeps the H level. Thereafter, sense amplifier activating signal MAE is made inactive, and then isolation instructing signal MLI is made inactive (or driven to the H level). Accordingly, isolation gate circuit 30 turns conductive to couple internal nodes NDb and NDc to match line ML and reference voltage node NDa, respectively. In this case, match line ML is at the level of precharge voltage VML, and the level of voltage ML_MA lowers according to the capacitance ratio between internal node NDb and match line ML. FIG. 59 does not clearly show this voltage change.

The level of voltage MLREF is likewise set according to the capacitance ratio between internal node NDc and reference voltage node NDa. However, this change in voltage MLREF is also not shown.

Even when isolation gate circuit 30 turns conductive to change the voltage levels of nodes NDa, NDb and NDc, no particular problem occurs in connection with the next search operation. This is because according to precharge instructing signal MLPRE, match line ML, reference voltage node NDa and internal nodes NDb and NDc are precharged to the level of precharge voltage VML at the start of the next search cycle.

In the construction according to the eighteenth embodiment of the invention, a capacitance element is not provided for internal nodes NDb and NDc. Therefore, internal nodes NDb and NDc do not require a capacitance element for maintaining a capacitive balance. This further reduce an occupation area of match amplifier 200. Internal nodes NDb and NDc are not provided with a capacitance element (except for parasitic capacitances). Therefore, it is possible to reduce the capacitance of the nodes on which the voltage full-swings in the amplifying operation of amplifier circuit 12, and the current consumption can be reduced.

The voltage lowering of reference voltage node NDa caused by down instructing signal REFDWN is performed concurrently with the transmission of the search data to search lines SL and /SL. However, the sense operation by amplifier circuit 12 can be performed immediately after the transition of isolation gate circuit 30 to the non-conductive state. Thereby, match amplifier 200 can start the sensing operation at a faster timing.

Figure 60:
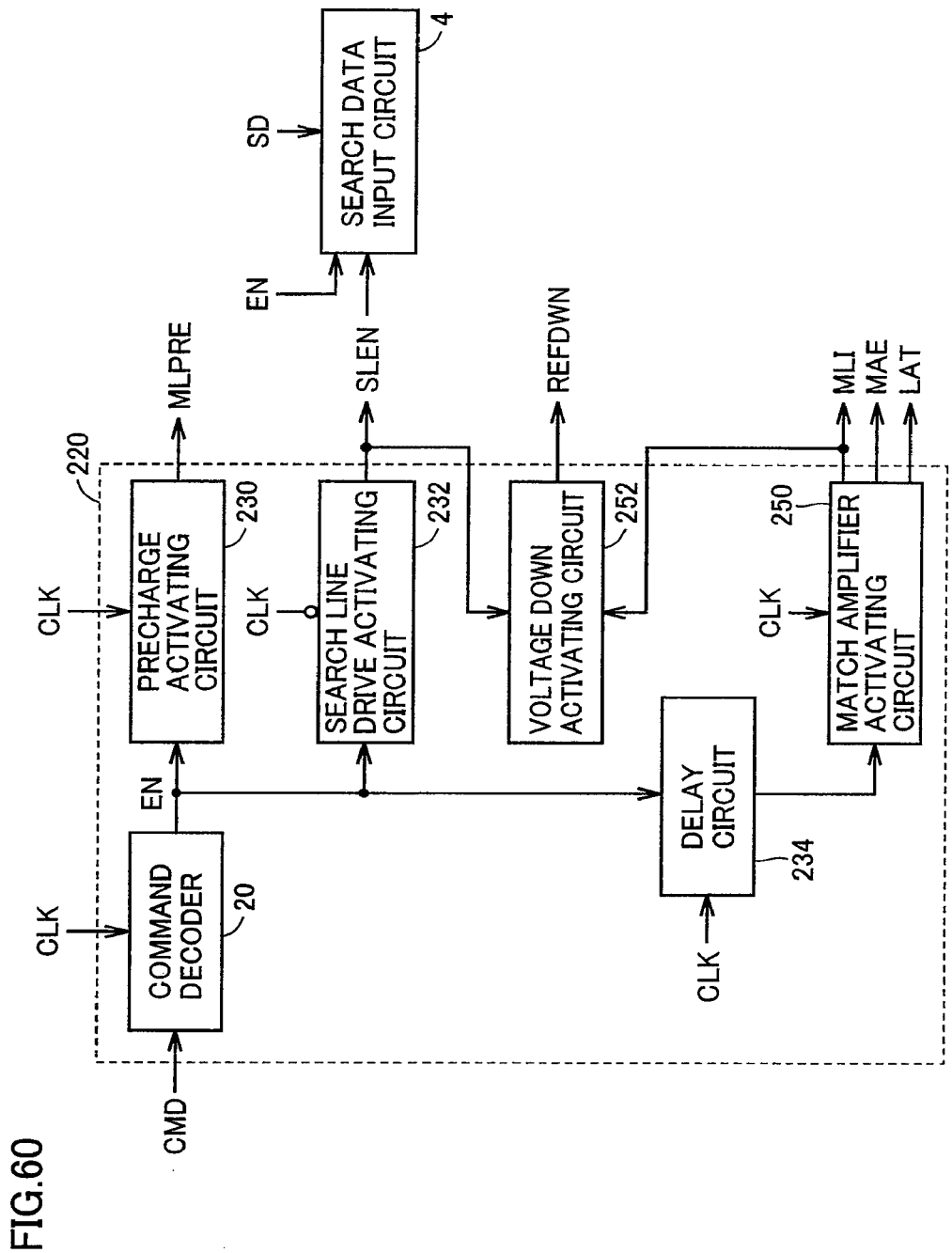
FIG. 60 schematically shows a construction of a portion for generating control signals shown in FIG. 58.

FIG. 60 schematically shows a construction of a portion of the control signals of the CAM shown in FIG. 58. In FIG. 60, control signal generating circuit 220 differs from the control signal generating circuit shown in FIG. 57 in the following construction. A match amplifier activating circuit 250 sequentially activates or deactivates isolation instructing signal MLI, sense amplifier activating signal MAE and latch instructing signal LAT according to the output signal of delay circuit 234 and clock signal CLK.

A down activating circuit 252 drives reference voltage down instructing signal REFDWN to the L and H levels according to isolation instructing signal MLI and search operation activating signal SLEN, respectively. Specifically, down activating circuit 252 drives the down instructing signal REFDWN to the L level when search operation activating signal SLEN becomes active to start the search operation. When isolation instructing signal MLI attains the L level, down activating circuit 252 drives the down instructing signal REFDWN to the H level. Down activating circuit 252 can be implemented using, e.g., a set/reset flip-flop.

Match amplifier activating circuit 250 activates or deactivates, according to a delay enable signal applied from delay circuit 234, isolation instructing signal MLI, sense amplifier activating signal MAE and latch instructing signal LAT in a predetermined sequence in synchronization with clock signal CLK after elapsing of one clock cycle from the application of search operation command CMD.

Other constructions of control signal generating circuit 220 shown in FIG. 60 are the same as those of the control signal generating circuit shown in FIG. 57. Corresponding portions are allotted the same reference numerals, and description thereof is not repeated.

According to the eighteenth embodiment of the invention, as described above, the capacitive coupling lowers the voltage level of the reference voltage node that produces the comparison reference voltage of the match line, and then the voltage level of the match line is sensed with the charges confined. Therefore, it is no necessary to arrange a capacitance element for the sense nodes of the amplifier circuit performing the sense operation, and the occupation area can be small. Further, the load capacitance of the amplifier circuit performing the sense operation can be reduced, and the fast sensing and the low power consumption can be achieved.

Nineteenth Embodiment

FIG. 61 shows a main portion of a CAM according to a nineteenth embodiment of the invention. FIG. 61 representatively shows unit cells UC corresponding to one match line ML as well as corresponding match amplifier 200. Match amplifiers each being substantially the same in construction as match amplifier 200 shown in FIG. 61 are arranged corresponding to match lines ML, respectively.

Match amplifier 200 shown in FIG. 61 differs from match amplifier 200 shown in FIG. 58 in the following construction. For reference voltage node NDa, there is arranged a voltage down circuit 260 that lowers the voltage level of precharge voltage VML on reference voltage node NDa according to level-down instructing signal RFDWN. Voltage down circuit 260 includes a capacitance element C4, and N-channel MOS transistors 261 and 262 controlling the charging/discharging of capacitance element C4.

N-channel MOS transistor 262 discharges one electrode node (NDd) of capacitance element C4 to the ground voltage level according to precharge instructing signal MLPRE. MOS transistor 261 couples the one electrode node NDd of capacitance element C4 to reference voltage node NDa according to level-down instructing signal RFDWN. MOS transistor 212 of precharge circuit 210 precharges reference voltage node NDa to precharge voltage VML. The quantity of charges accumulated on reference voltage node NDa is determined by the parasitic capacitance of reference voltage node NDa and the voltage level of precharge voltage VML. Capacitance element C4 for precharging node NDd to the ground voltage level is coupled to reference voltage node NDa, and the charges move between reference voltage node NDa and capacitance element C4 to lower precharge voltage VIAL on reference voltage node NDa according to the capacitance values of parasitic capacitances of reference node NDa and internal node NDc as well as the capacitance value of capacitance element C4.

Other constructions of match amplifier 200 shown in FIG. 61 as the same as those of match amplifier 200 shown in FIG. 58. Corresponding portions are allotted the same reference numerals, and description thereof is not repeated. The construction and arrangement of the unit cells coupled to match line ML are the same as those shown in FIG. 58. Corresponding portions are allotted the same reference numerals, and description thereof is not repeated.

Figure 62:
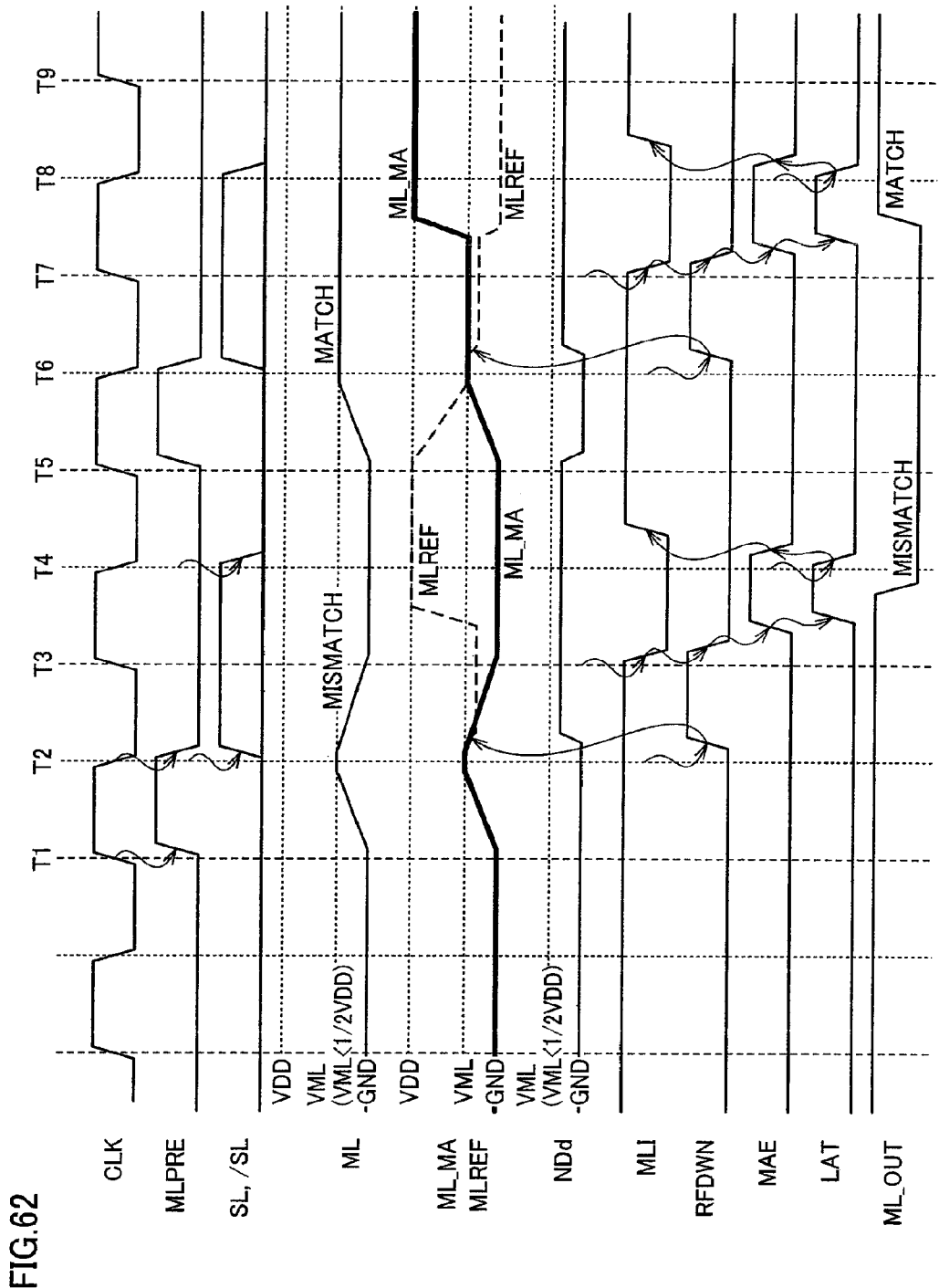
FIG. 62 is a timing chart representing an operation of a match amplifier shown in FIG. 61.

FIG. 62 is a timing chart representing the operation of match amplifier 200 shown in FIG. 61. Referring to FIG. 62, the operation of match amplifier 200 shown in FIG. 61 will now be described.

In the search cycle from time T1 to time T4, the mismatch determination is performed. In the search cycle from time T5 to time T9, the match determination is performed.

When the search cycle starts at time T1, precharge instructing signal MLPRE attains the H level. Responsively, precharge circuit 210 precharges match line ML and reference voltage node NDa to the voltage level of precharge voltage VML (of VDD/2 or lower). At this time, isolation gate circuit 30 is conductive and internal nodes NDb and NDc are precharged to the level of precharge voltage VML.

In voltage down circuit 260, MOS transistor 262 is turned on to couple node NDd to the ground node according to precharge instructing signal MLPRE so that the accumulated charges in capacitance element C4 are discharged.

When the search operation starts at time T2, search lines SL and /SL are driven according to the search data. In the mismatch state, match line ML is discharged to have a lowered voltage level. At this time, level-down instructing signal RFDWN is driven to the H level. Responsively, MOS transistor 261 is turned in voltage down circuit 260, and couples one electrode (NDd) of capacitance element C4 to reference voltage node NDa. Accordingly, capacitance element C4 is charged with the charges accumulated on reference voltage node NDa. Through the movement of the charges, the voltage levels of nodes NDa and NDc lower. The quantity of the voltage lowering is equal to a level of the voltage VML/2 intermediate between precharge voltage VML and ground voltage GND, and nodes NDa and NDc attain the voltage levels between the ground voltage and precharge voltage VML.

Internal node NDb is coupled to match line ML via isolation gate circuit 30, and the level of voltage ML_MA lowers with the voltage lowering of match line ML.

When clock signal CLK rises at time T3, isolation instructing signal MLI is driven to the L level and responsively, isolation gate circuit 30 turns non-conductive. Then, level-down instructing signal RFDWN is driven to the L level to turn off MOS transistor 261. In this state, charges corresponding to voltages ML_MA and MLREF are confined on internal nodes NDb and NDc.

Then, match amplifier activating signal MAE is made active and the voltages ML_MA and MLREF on internal nodes NDb and NDc are amplified differentially. In this differentially amplifying operation, according to the capacitance value of capacitance element C4, the voltages on nodes NDa and NDc lower to the voltage between precharge voltage VML and ground voltage GND. Thus, the voltage difference that can be sensed by amplifier circuit 12 is developed between nodes NDc and NDb, and the sensing operation can be accurately performed. After the completion of the sensing operation, latch instructing signal LAT attains the H level, and latch 16 produces output signal ML_OUT at the L level to indicate the mismatch state.

When the search/determination operation ends, the driving of search lines SL and /SL ends, and search lines SL and /SL are driven to the ground voltage level. Latch instructing signal LAT attains the L level, and match amplifier activating signal MAE becomes inactive. Latch 16 enters the latch state, and output signal ML_OUT is kept at the L level. Amplifier circuit 12 keeps the inactive state, and nodes NDb and NDc attain the floating state at the levels of ground voltage and power supply voltage to, respectively.

Thereafter, isolation instructing signal MLI is driven to the H level so that isolation gate circuit 30 is made conductive. Responsively, internal nodes NDb and NDc are connected to match line ML and reference voltage node NDa, respectively. Match line ML is at the ground voltage level, and voltage ML_MA is kept at the level of ground voltage. Level-down instructing signal RFDWN is at the L level, reference voltage node NDa is in the floating state and voltage MLREF on internal node NDc is kept substantially at the level of power supply voltage VDD. Through movement of charges, nodes NDc and NDa may be driven to the voltage levels lower than power supply voltage VDD.

One electrode node (NDd) of capacitance element C4 is kept at the voltage level attained through the charging in the cycle starting at time T2.

The search cycle starts at time T5 again, and precharge instructing signal MLPRE is activated (or driven to the H level). Accordingly, match line ML and internal node NDb are precharged to the level of precharge voltage VML. Reference voltage node NDa and internal node NDc are precharged to the level of precharge voltage VML. The one electrode node (NDd) of capacitance element C4 is discharged to the ground voltage level.

The search operation starts at time T6. In this case, the voltage levels of search lines SL and /SL change according to the search data. In the match state, match line ML is not discharged, and match line ML is kept at the level of precharge voltage VML. Concurrently with this search operation, level-down instructing signal RFDWN attains the H level, and one electrode node NDd of capacitance element C3 is coupled to reference voltage node NDa via MOS transistor 261. Responsively, charges move to lower the voltage levels of reference voltage node NDa and internal node NDc. The quantity of this lowering of voltage MLREF is equal to a voltage level intermediate between precharge voltage VML and ground voltage GND.

At time T7, isolation instructing signal MLI attains the L level in synchronization with the rising of clock signal CLK, and subsequently level-down instructing signal RFDWN is driven to the L level. Responsively, one electrode node NDd of capacitance element C4 is isolated from reference voltage node NDa. Isolation gate circuit 30 is made non-conductive to confine the charges on internal nodes NDb and NDc. In this case, the precharge voltage on internal node NDb is at the level of VML, and voltage MLREF of internal node NDc is at a level intermediate between precharge voltage VML and ground voltage GND. Therefore, a sufficient voltage level is developed between nodes NDb and NDc.

Then, match amplifier activating signal MAE is activated so that amplifier circuit 12 differentially amplifies the voltages ML_MA and MLREF. Thereby, voltage ML_MA on internal node NDb and voltage MLREF on internal node NDc are driven to and latched at power supply voltage VDD and the ground voltage level, respectively.

Then, latch instructing signal LAT is driven to the H level. Responsively, latch 16 enters the through state, and produces output signal ML_OUT at the H level.

At time T8, the search/determination operation is completed, and latch instructing signal LAT and match amplifier activating signal MAE are sequentially driven to the L level. Amplifier circuit 12 is made inactive, and internal nodes NDb and NDc attain the floating state at the levels of power supply voltage VDD and ground voltage GND, respectively.

Thereafter, isolation instructing signal MLI rises to the H level to turn isolation gate circuit 30 conductive. Responsively, internal node NDb is coupled to match line ML, and internal node NDc is coupled to reference voltage node NDa. Match line ML has a capacitance larger than a parasitic capacitance of node NDb. Therefore, when isolation gate circuit 30 does not have a decoupling function, the charge distribution is performed between match line ML at the level of precharge voltage VML and internal node NDb at the power supply voltage level according to the capacitance values thereof. In this case, the voltage level of internal node NDb lowers from the power supply voltage level, but FIG. 62 does not clearly show this voltage change. When the charge distribution occurs, match line ML attains a voltage level higher than precharge voltage VML, and voltage ML_MA on internal node NDb attains the level lower than power supply voltage VDD. When the charges move, the voltage level of match line ML finally becomes equal to the level of voltage ML_MA on internal node NDb.

However, where the difference between the voltage level of isolation instructing signal MLI and the threshold voltage of isolation gates TGa and TGb of isolation gate circuit 30 is a level slightly higher than precharge voltage VML, these isolation gates TGa and TGb operate as decoupling transistors. In this case, match line ML is kept at the level of precharge voltage VML, and voltage ML_MA on internal node NDb is kept at the level of power supply voltage VDD.

After the end of search/determination operation, level-down instructing signal RFDWN is at the L level, and one electrode node NDd of capacitance element C4 holds the charged state.

In this nineteenth embodiment, capacitance element C4 in the voltage down circuit lowers the voltage level of reference voltage node NDa through the charge redistribution. Therefore, the lowered voltage level of reference voltage node NDa does not depend on the voltage level of power supply voltage VDD, and reference voltage node NDa can be set to the voltage level that is set by the stable capacitance value of capacitance element C4. (Instructing signal RFDWN or REFDOWN has the amplitude of the level of power supply voltage VDD.) Therefore, the sensing operation can be performed stably.

Specifically, when the voltage level of comparison reference voltage MLREF changes depending on power supply voltage VDD in the search operation, there causes a change in voltage difference between internal nodes NDb and NDc attained when the voltage level of match line ML is confined. Thus, variations occur in voltage difference between the sense nodes of amplifier circuit 12, and a sense margin lowers so that it may possibly be impossible to ensure the accurate sensing operation. The voltage level of comparison reference voltage MLREF is set by redistributing the charges, using capacitance element C4. The quantity of the voltage change depends on the capacitance value of capacitance element C4 and the capacitance value of the parasitic capacitances of nodes NDa and NDc, and does not depend on the amplitude of the level-down instructing signal, i.e., the power supply voltage. Thereby, at the start of the amplifying operation of amplifier circuit 12, the voltage level of node NDc can be accurately set so that the fast and stable sense operation can be achieved.

For the construction of the circuit for generating the control signals in the nineteenth embodiment, the construction of control signal generating circuit 220 shown in FIG. 60 can be used. The control signal RFDWN is produced by inverting the signal polarities of down instructing signal REFDWN applied from voltage down activating circuit 252 shown in FIG. 60.

In this nineteenth embodiment, precharge instructing signal MLPRE may be made active in the standby state during which the search operation is not performed.

According to the nineteenth embodiment of the invention, as described above, the level of the comparison reference voltage is set by the charge redistribution using the capacitance element. Therefore, the voltage level of the comparison reference voltage can be accurately set in the sensing operation, and the stable sensing operation can be ensured. The sensing operation is performed in the charge confining scheme, and the effects similar to those of the eighteenth embodiment can be also achieved.

Twentieth Embodiment

Figure 63:
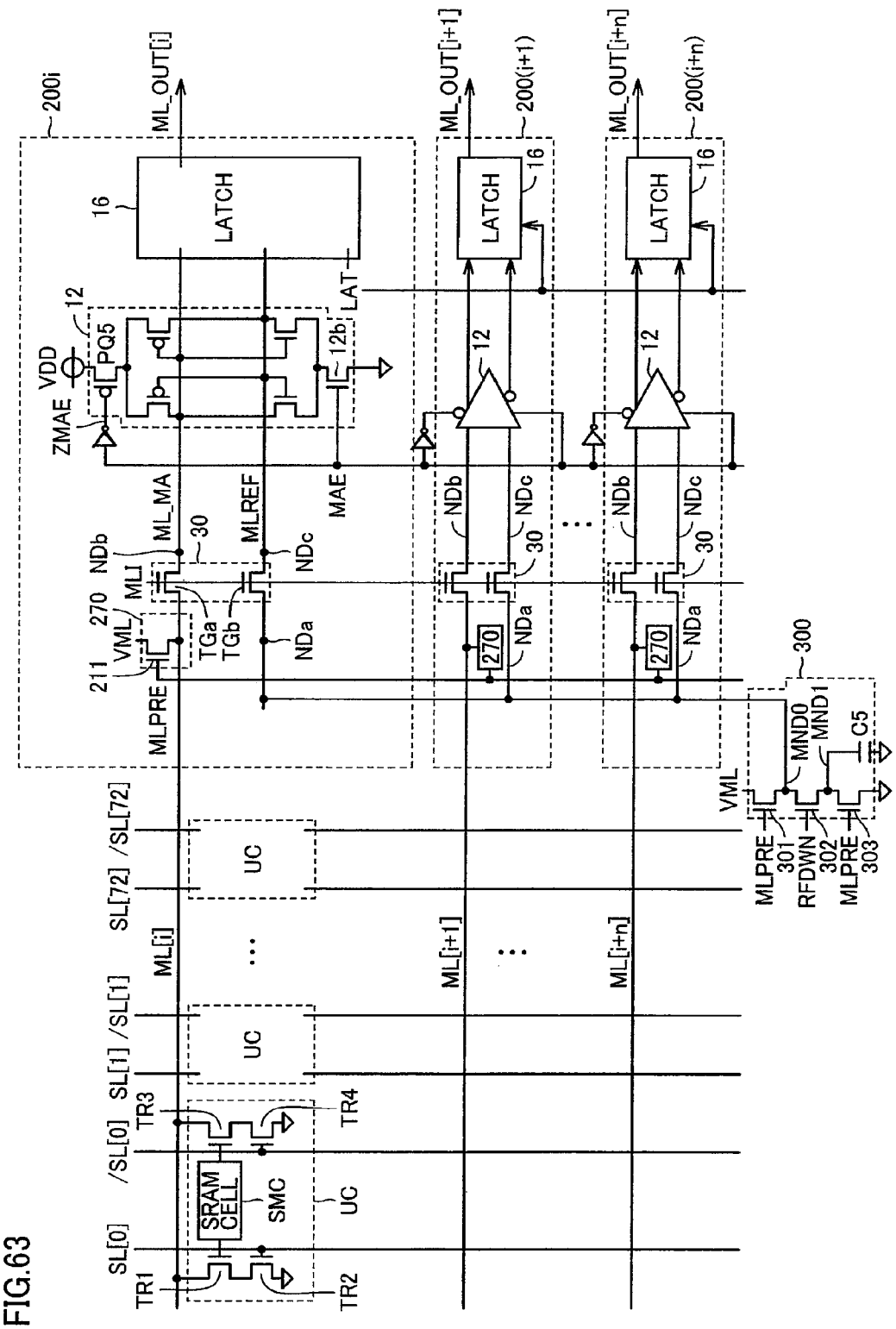
FIG. 63 shows a main portion of a CAM according to a twentieth embodiment of the invention.

FIG. 63 schematically shows a main portion of a CAM according to a twentieth embodiment of the invention. In FIG. 63, the CAM cell array is provided with n match lines ML[i]-ML[i+n]. A plurality of unit cells UC are connected to each match line, but FIG. 63 representatively shows only unit cells UC connected to match line ML[i].

Match amplifiers 200i-200(i+n) are arranged corresponding to match lines ML[i]-ML[i+n], respectively. Each of match amplifiers 200i-200(i+n) includes a precharge circuit 270 for precharging a corresponding match line, amplifier circuit 12, and latch 16 for latching an output of amplifier circuit 12. Similarly to the embodiments described heretofore, amplifier circuit 12 amplifies the potentials on internal nodes NDb and NDc in response to match amplifier activating signal MAE. Latch 16 enters the through state and latch state according to latch instructing signal LAT, and latches the output signal of corresponding amplifier circuit 12.

Precharge circuit 270 includes only precharge transistor 211 for precharging a corresponding match line ML (ML[i]-ML[i+n]). Match amplifiers 200i-200(i+n) each are not provided with a precharging transistor (212) individually.

In each of match amplifiers 200i-200(i+n), isolation gate circuit 30 is arranged at the stage preceding amplifier circuit 12. In FIG. 63, amplifier circuit 12 in each of match amplifiers 200i-200(i+n) is represented by a circuit having complementary and positive control nodes and output nodes producing complementary signals. Amplifier circuit 12 in each match amplifier is the same in construction. Amplifier circuit 12 of each of match amplifiers 200(i+1)-200(i+n) receives a complementary match amplifier activating signal ZMAE on its complementary control node via the inverter.

A main voltage down circuit 300 is provided commonly to and to be shared by match amplifiers 200i-200(i+n). Main voltage down circuit 300 includes a capacitance element C5 and MOS transistors 301-303. MOS transistor 301 precharges an output node MND0 to the level of precharge voltage VML according to precharge instructing signal MLPRE. MOS transistor 302 couples output node MND0 to one electrode node (MND1) of capacitance element C5 according to level-down instructing signal RFDWN. MOS transistor 303 discharges one electrode node MND1 of capacitance element C5 to the ground voltage level according to precharge instructing signal MLPRE. Output node MND0 of main voltage down circuit 300 is commonly connected to reference voltage nodes NDa of match amplifiers 200i-200(i+n). Capacitance element C5 has a capacitance value equal to or smaller than half a combined parasitic capacitance of these reference voltage nodes NDa, and lowers the voltages by a voltage level (VML/2) intermediate between precharge voltage VML and ground voltage GND, for these match amplifiers 200i-200(i+n).

FIG. 63 is a timing chart representing the operations for the search and determination of the CAM, and this timing chart is the same as that shown in FIG. 62. For the control circuit for producing various control signals, the construction substantially the same as the control signal generating circuit shown in FIG. 60 can be utilized. Therefore, the CAM according to the twentieth embodiment of the invention performs substantially the same search and determination operations as those in the nineteen the embodiment of the invention, and the description thereof is not repeated.

In the construction of the CAM shown in FIG. 63, the plurality of match amplifiers 200i-200(i+n) share the circuit for lowering comparison reference voltage MLREF to a voltage level intermediate between precharge voltage VML and ground voltage GND in the operation of sensing the voltage level of the match line. Thereby, as compared with the construction in which an individual and separate voltage down circuit is arranged for each amplifier, the occupation area can be reduced. Also, the similar effects as those of the eighteenth embodiment can be achieved.

Twenty-First Embodiment

Figure 64:
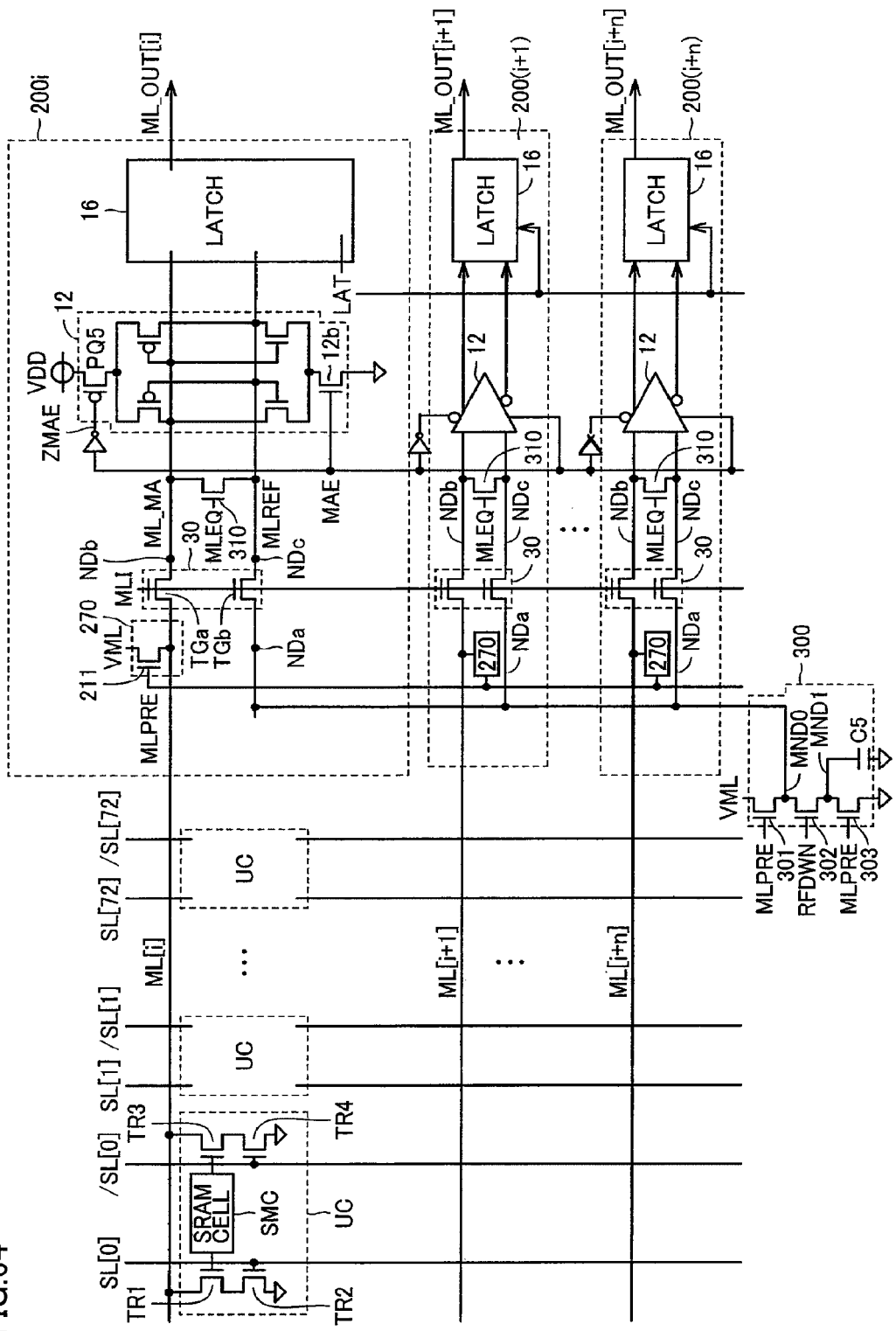
FIG. 64 schematically shows a main portion of a CAM according to a twenty-first embodiment of the invention.

FIG. 64 schematically shows a construction of a CAM according to a twenty-first embodiment of the invention. The CAM shown in FIG. 64 differs from the CAM shown in FIG. 63 in the following construction. In each of match amplifiers 200i-200(i+n), an N-channel MOS transistor 310 rendered conductive in response to an equalize instructing signal MLEQ is arranged between internal nodes NDb and NDc. Other constructions of the CAM shown in FIG. 64 are the same as those of the CAM shown in FIG. 63. Corresponding portions are allotted the same reference numerals, and description thereof is not repeated.

By using equalizing MOS transistors 310 in match amplifiers 200i-200(i+n), it is possible to reduce the time required for restoring match line ML, internal voltage ML_MA and comparison reference voltage MLREF to precharge voltage VML.

Figure 65:
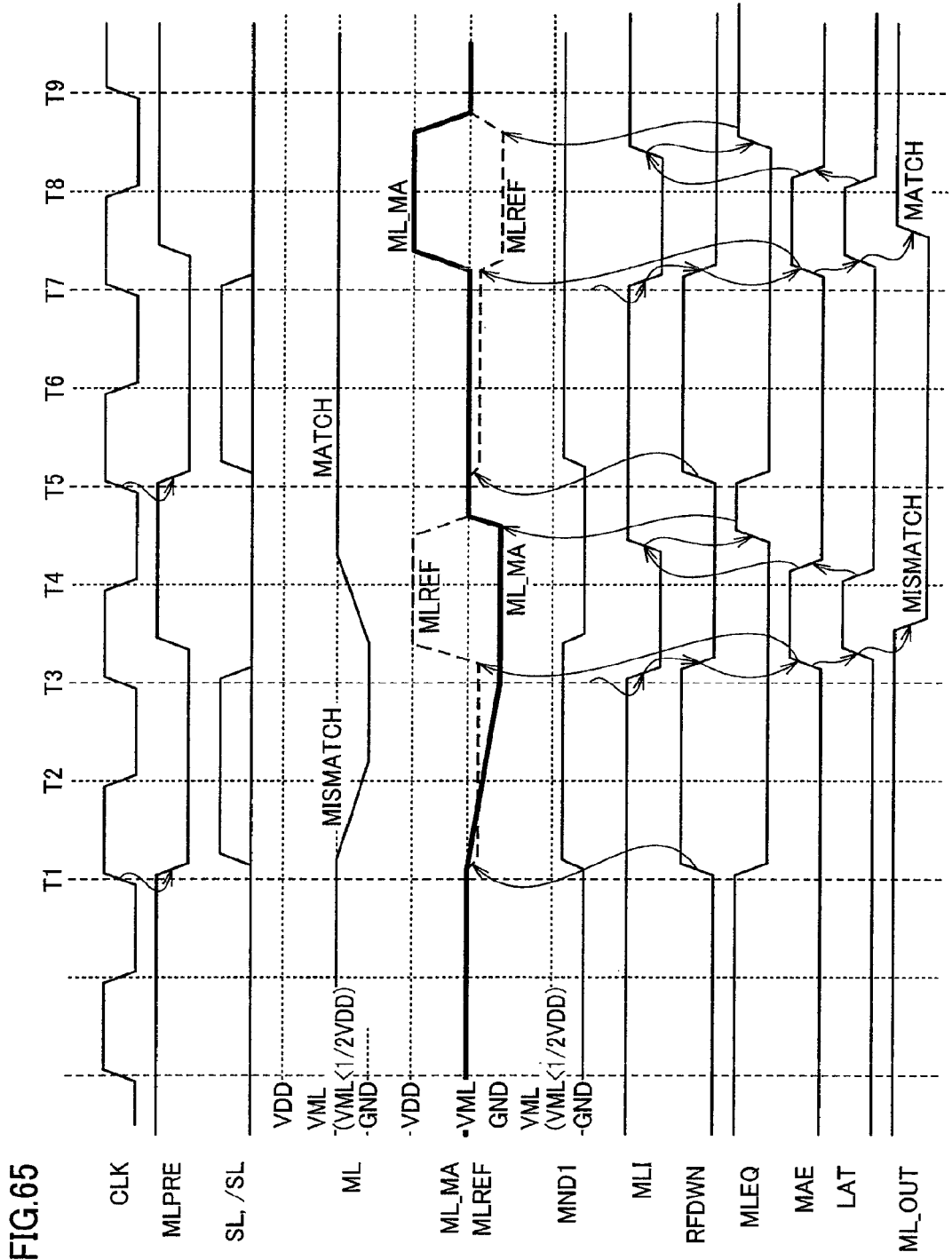
FIG. 65 is a timing chart representing an operation of a match amplifier shown in FIG. 64.

FIG. 65 is a timing chart representing the search operation of the CAM shown in FIG. 64. Referring to FIG. 65, the operation of the CAM shown in FIG. 64 will now be described.

In the timing chart of FIG. 65, the precharge operation is performed during the standby state. Thus, precharge instructing signal MLPRE is kept active except a period in which the search operation is performed and search lines SL and /SL are driven according to the search data.

In the timing chart of FIG. 65 also, the search/determination cycle from time T1 to time T4 is performed in the case of the mismatch state, and the match state is sensed in the search/determination cycle from time T5 to time T8.

Before time T1, precharge instructing signal MLPRE is at the H level, and match line ML and internal nodes NDb and NDc are precharged to the level of precharge voltage VML. In this state, precharge instructing signal MLPRE causes main voltage down circuit 300 to discharge one electrode node MND1 of capacitance element C5 to the ground voltage level.

Also, equalize instructing signal MLEQ is at the H level, and equalizing MOS transistor 310 is conductive. Therefore, the voltages ML_MA and MLREF are equalized to the level of precharge voltage VML.

At time T1, the search cycle starts so that match line precharge instructing signal MLPRE is deactivated (driven to the L level), and equalize instructing signal MLEQ is also deactivated (driven to the L level). Accordingly, the precharge operation and equalize operation on match line ML (ML[i]-ML[i+n]) ends. Match line ML attains the electrically floating state at the level of precharge voltage VML.

Then, search lines SL and /SL are driven according to the search data. When the search result indicates the mismatch, match line ML is discharged to the ground voltage level. Concurrently with this search operation, level-down instructing signal RFDWN attains the H level, and one electrode node MND1 of capacitance element C5 is coupled to reference voltage node NDa in each of match amplifiers 200i-200(i+n) via output node MND0. Responsively, the voltage level on reference voltage node NDa lowers in each of match amplifiers 200i-200(i+n). Since isolation gate circuit 30 is still conductive, the voltage MLREF of internal node NDc of each of match amplifiers 200i-200(i+n) lowers from the level of precharge voltage VML.

When a voltage difference between voltage ML_MA on match line ML and comparison reference voltage MLREF sufficiently increases, isolation instructing signal MLI is driven to the L level at time T3. Accordingly, isolation gate circuit 30 is made non-conductive in each of match amplifiers 200i-200(i+n), and confines the charges on internal nodes NDb and NDc.

When isolation instructing signal MLI attains the L level, level-down instructing signal RFDWN also attains the L level so that MOS transistor 302 in main voltage down circuit 300 is turned off. Thereby, one electrode node MND1 of capacitance element C5 attains the voltage level set through the redistribution of the charges.

At time T3, the voltage level of match line ML is already driven to the voltage level corresponding to the search result. Therefore, the search operation ends at this time point, and search lines SL and /SL are deactivated (driven to the ground voltage level).

In this state, precharge instructing signal MLPRE is made active again and match lines ML are precharged to the level of precharge voltage VML. Main voltage down circuit 300 discharges one electrode node MND1 of capacitance element C5 via MOS transistor 303 to the ground voltage level. MOS transistor 301 in main voltage down circuit 300 charges each reference voltage node NDa to the level of precharge voltage VML.

After isolation instructing signal MLI is driven to the L level, match amplifier activating signal MAE is activated, and then latch instructing signal LAT is driven to the H level. Accordingly, each of match amplifiers 200i-200(i+n) performs the sensing operation by amplifier circuit 12. In the match amplifier for the mismatch state, latch 16 produces output signal ML_OUT at the L level. At subsequent time T4, latch instructing signal LAT is driven to the L level according to the falling of clock signal CLK, and then sense amplifier activating signal MAE is driven to the L level, to complete the sensing operation.

Thereafter, isolation instructing signal MLI attains the H level, and isolation gate circuit 30 in each of match amplifiers 200i-200(i+n) is made conductive. Accordingly, internal nodes NDb of match amplifiers 200i-200(i+n) is coupled to corresponding match lines ML[i]-ML[i+n], and reference voltage nodes NDa are coupled to corresponding internal nodes NDc. At this time, equalize instructing signal MLEQ attains the H level to turn on equalizing MOS transistor 310. In each of match amplifiers 200i-200(i+n), therefore, voltages ML_MA and MLREF on respective nodes NDb and NDc already driven to the levels of power supply voltage VDD and ground voltage GND are rapidly driven to the level of precharge voltage VML.

When the search operation starts again at time T5, match line precharge instructing signal MLPRE attains the L level, equalize instructing signal MLEQ attains the L level and match line ML attains the electrically floating state at the level of precharge voltage VML. Level down instructing signal RFDWN attains the H level, and one electrode node MND1 of capacitance element C5 in main voltage down circuit 300 is coupled to each of reference voltage nodes NDa of match amplifiers 200$i$-200($i$+n). Thereby, voltage MLREF on node NDc in each of match amplifiers 200$i$-200($i$+n) is driven to the level lower than precharge voltage VML.

The search operation is performed, and the voltage levels of search lines SL and /SL are driven to the levels corresponding to the search data. In the match state, match line ML is at the level of precharge voltage VML. Through the voltage down operation, voltage MLREF is kept at the level intermediate between precharge voltage VML and ground voltage GND, and a sufficient potential difference is already ensured between the sense nodes of amplifier circuit 12.

At time T7, the search operation is completed, and then the determining operation is performed. Thus, isolation instructing signal MLI is driven to the L level, and isolation gate 30 in each of match amplifiers 200$i$-200($i$+n) is made non-conductive. Accordingly, match lines ML[i]-ML[i+n] are isolated from nodes NDb of corresponding match amplifiers 200$i$-200($i$+n), respectively. In this state, the search operation is completed, and search lines SL and /SL are driven to the ground voltage level.

When isolation instructing signal MLI is driven to the L level, level-down instructing signal RFDWN is driven to the L level again, and one electrode node MND1 of capacitance element C5 is isolated from output node MND0 of main voltage down circuit 300.

In this state, match amplifier activating signal MAE is made active, and amplifier circuit 12 performs the differential amplification. Then, latch instructing signal LAT is driven to the H level, and latch 16 is set to the through state, to drive output signal ML_OUT to the H level indicative of the match state.

Concurrently with this sensing operation, match line precharge instructing signal MLPRE attains the H level again, and match line ML is driven to the level of precharge voltage VML. In main voltage down circuit 300, one electrode node MND1 of capacitance element C5 is discharged to the ground voltage level via MOS transistor 303. In each of match amplifiers 200$i$-200($i$+n), isolation gate circuit 30 is non-conductive, and this precharging operation exerts no adverse effect on the amplifying operation.

When the voltage level of output signal ML_OUT of latch 16 is then definite, the search operation ends at time T8. Specifically, latch instructing signal LAT is driven to the L level, and then match amplifier activating signal MAE is deactivated. Thereafter, isolation instructing signal MLI attains the H level, and isolation gate circuit 30 in each of match amplifiers 200$i$-200($i$+n) is made conductive. Accordingly, match lines ML[i]-ML[i+n] are coupled to internal nodes NDb of corresponding match amplifiers 200$i$-200($i$+n), respectively. In each of match amplifiers 200$i$-200($i$+n), internal node NDc is coupled to reference voltage node NDa.

MOS transistor 301 of main voltage down circuit 300 has precharged reference voltage node NDa to the level of precharge voltage VML according to precharge instructing signal MLPRE. Therefore, in each of match amplifiers 200$i$-200($i$+n), through the movement of charges, the voltage levels of internal nodes NDb and NDc change. In this operation, match line equalize instructing signal MLEQ attains the H level, and equalizing MOS transistor 310 is turned on to drive fast the voltage levels of nodes NDb and NDc to the level of precharge voltage VML.

At time T9, the determination cycle is completed, and the standby state starts.

In each of match amplifiers 200$i$-200($i$+n), as described above, the internal nodes are equalized using equalizing MOS transistor 310. Concurrently with the sensing operation, the match line and reference voltage node NDa are precharged while keeping the isolation gate circuit in the non-conductive state. Therefore, the internal nodes of match amplifiers 200$i$-200($i$+n) and the match lines can be precharged fast. Consequently, it is possible to reduce the time required for precharging the internal nodes of match amplifiers 200$i$-200($i$+n) and to reduce the length of the cycle period of the search/determination, and the fast search/determination can be achieved.

Figure 66:
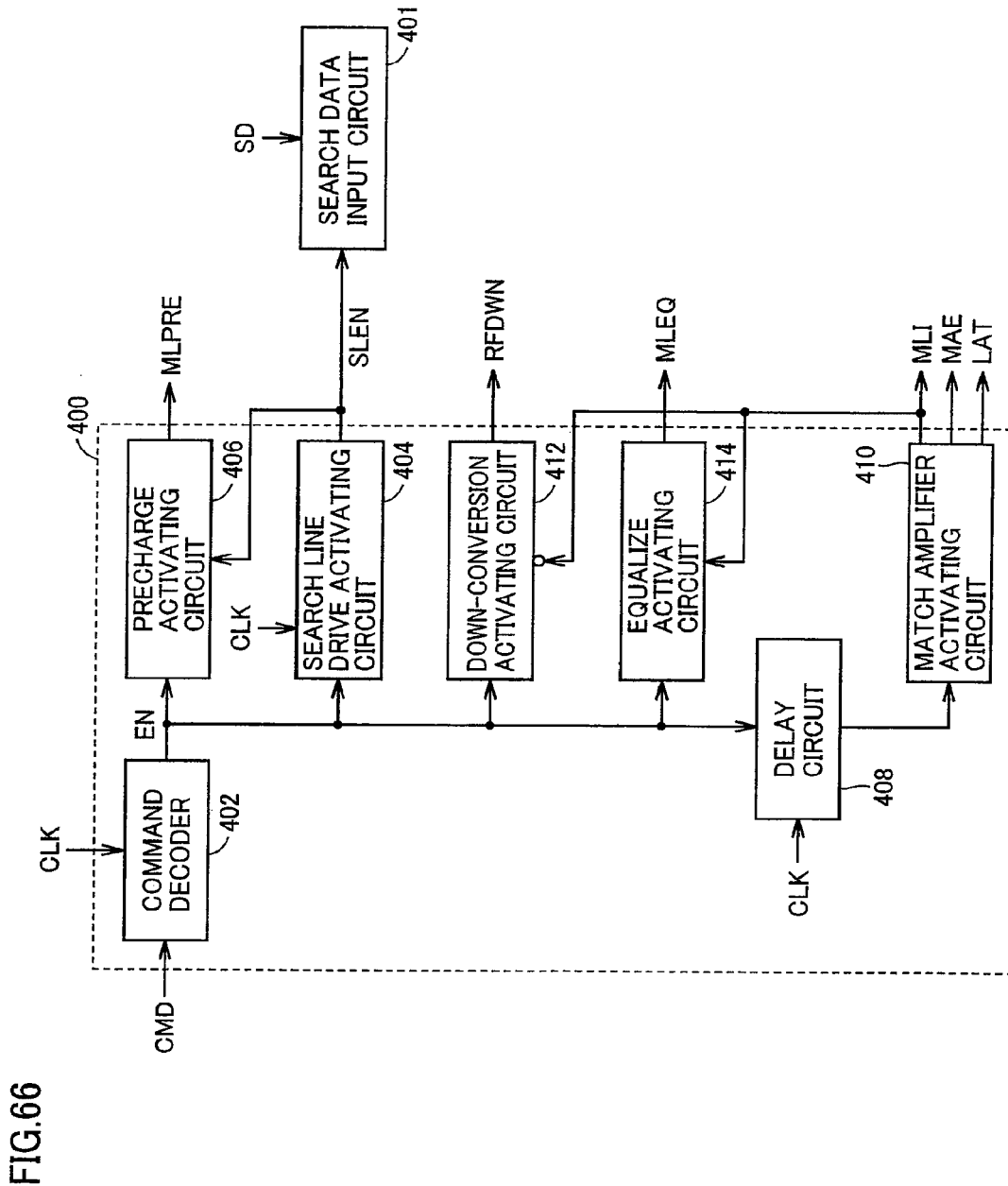
FIG. 66 schematically shows a construction of a portion generating a control signal shown in FIG. 61.

FIG. 66 schematically shows a construction of a portion for generating control signals of the CAM shown in FIG. 64. In FIG. 66, a control signal generating circuit 400 includes a command decoder 402 for decoding command CMD to produce search operation instruction EN according to a result of the decoding, and a delay circuit 408 for delaying search operation instruction EN. Command decoder 402 takes in command CMD at the rising of clock signal CLK, for example and decodes the command thus taken in. Delay circuit 408 delays search operation instruction EN applied from command decoder 402 by one cycle period of clock signal CLK.

Control signal generating circuit 400 further includes a precharge activating circuit 406 for producing match line precharge instructing signal MLPRE, a search line drive activating circuit 404 for producing search operation activating signal SLEN and a match amplifier activating circuit 410 for producing signals MLI, MAE and LET.

When search operation instruction EN applied from command decoder 402 is active, search line drive activating circuit 404 activates search operation activating signal SLEN for one cycle period of clock signal CLK. A search data input circuit 401 is enabled according to the activation of search operation activating signal SLEN, and drives the search line according to search data SD when made active.

Precharge activating circuit 406 deactivates precharge instructing signal MLPRE in response to the activation of search operation instruction EN applied from command decoder 402, and activates precharge instructing signal MLPRE in response to the deactivation of search operation activating signal SLEN applied from search line drive activating circuit 404.

Match amplifier activating circuit 410 sequentially activates and deactivates isolation instructing signal MLI, sense amplifier activating signal MAE and latch instructing signal LAT according to the output signal of delay circuit 408.

Control signal generating circuit 400 further includes a voltage down activating circuit 412 for producing level-down instructing signal RFDWN, and an equalize activating circuit 414 for producing equalize instructing signal MLEQ. Voltage down activating circuit 412 deactivates (drives to the L level) level-down instructing signal RFDWN according to the falling of isolation instructing signal MLI provided from match amplifier activating circuit 410, and drives the level-down instructing signal RFDWN to the H level in response to the activation of search operation instruction EN.

Equalize activating circuit 414 drives equalize instructing signal MLEQ to the H level in response to the rising of isolation instructing signal MLI, and drives equalize instructing signal MLEQ to the L level according to the activation of search operation instruction EN.

According to the twenty-first embodiment of the invention, as described above, the sense nodes confining the charges are equalized during standby in each match amplifier. Therefore, when another search operation starts after completion of a search operation, the match lines and the sense nodes (internal nodes NDb and NDc) can be driven fast to the level of predetermined precharge voltage VML. Thus, the sensing operation of each match amplifier can be started at a faster timing, and the determination period can be reduced. Further, similar effects as those of the twentieth embodiment can be achieved also.

The construction in which the equalize transistors are provided for the sense nodes (internal nodes NDb and NDc) of amplifier circuit 12 may be applied to the constructions in the sixteenth to nineteenth embodiments shown in FIG. 51 and later.

The invention can be applied to the content addressable memory capable of searching the storage information according to the search data, to determine the match/mismatch with the storage information. In particular, when the invention can be used for the construction in which an IP address is decoded for routing a transfer path in a communication router handling search data of a large bit width, the router can be achieved that can reduce a footprint and power consumption. Alternatively, the content addressable memory according to the invention may be used in a circuit construction for determining cache miss/hit in a cache controller or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A content addressable memory comprising:
a plurality of entries each having a plurality of content addressable memory cells;
a plurality of match lines, arranged corresponding to the respective entries, each coupled to the content addressable memory cells in a corresponding entry;
a search data bus coupled in parallel to the entries and transferring search data in parallel to the entries; and
a plurality of match amplifiers, arranged corresponding to the respective match lines, each including (i) a precharge circuit for precharging a reference voltage node and a corresponding match line to a precharge voltage level, (ii) an amplifier circuit having a first node receiving a voltage on the corresponding match line and a second node coupled to said reference voltage node, comparing the voltages on the first and second nodes, and producing a signal indicating a result of comparison, (iii) an isolation gate for isolating the corresponding match line and said reference voltage node from the first and second nodes of said amplifier circuit before activation of said amplifier circuit, respectively, and (iv) a capacitance element for boosting said first node according to a boost instructing signal before the activation of said amplifier circuit after isolation by said isolation gate.

* * * * *